United States Patent [19]
Takasugi

[11] Patent Number: 5,369,618
[45] Date of Patent: Nov. 29, 1994

[54] SERIAL ACCESS MEMORY

[75] Inventor: Atsushi Takasugi, Tokyo, Japan

[73] Assignee: Oki Electric Industry Co., Ltd., Tokyo, Japan

[21] Appl. No.: 978,699

[22] PCT Filed: Jun. 3, 1992

[86] PCT No.: PCT/JP92/00717
§ 371 Date: Feb. 2, 1993
§ 102(e) Date: Feb. 2, 1993

[87] PCT Pub. No.: WO92/22068
PCT Pub. Date: Dec. 10, 1992

[30] Foreign Application Priority Data
Jun. 4, 1991 [JP] Japan ................................ 3-133074

[51] Int. Cl.$^5$ .............................................. G11C 13/00
[52] U.S. Cl. .......................... 365/230.01; 365/230.03; 365/230.08
[58] Field of Search ...................... 365/230.01, 230.03, 365/230.04, 230.06, 230.08, 189.01, 189.12, 73, 77

[56] References Cited
U.S. PATENT DOCUMENTS
5,193,071  3/1993  Umina et al. ................... 365/189.01

FOREIGN PATENT DOCUMENTS
58-68284    4/1983  Japan .............................. G11C 8/00
63-225990   9/1988  Japan ............................. G11C 11/34
63-268188  11/1988  Japan ............................. G11C 11/34
2289992    11/1990  Japan ............................. G11C 11/41
3237684    10/1991  Japan ............................. G11C 11/41

Primary Examiner—Terrell W. Fears
Attorney, Agent, or Firm—Edward D. Manzo; Ted K. Ringsred

[57] ABSTRACT

An object of this invention is to designate the route of movement of each serial pointer by external addresses, whereby a desired series of successive data out of successive bit data can be accessed in a serial manner. Serial address controls are provided to permit free control of the route of each pointer output by external addresses so that only certain ranges of a group of master-slave flip-flops, which make up first and second pointers for the generation of serial addresses, can be designated as desired.

45 Claims, 96 Drawing Sheets

DETERMINATION OF LEADING ADDRESS

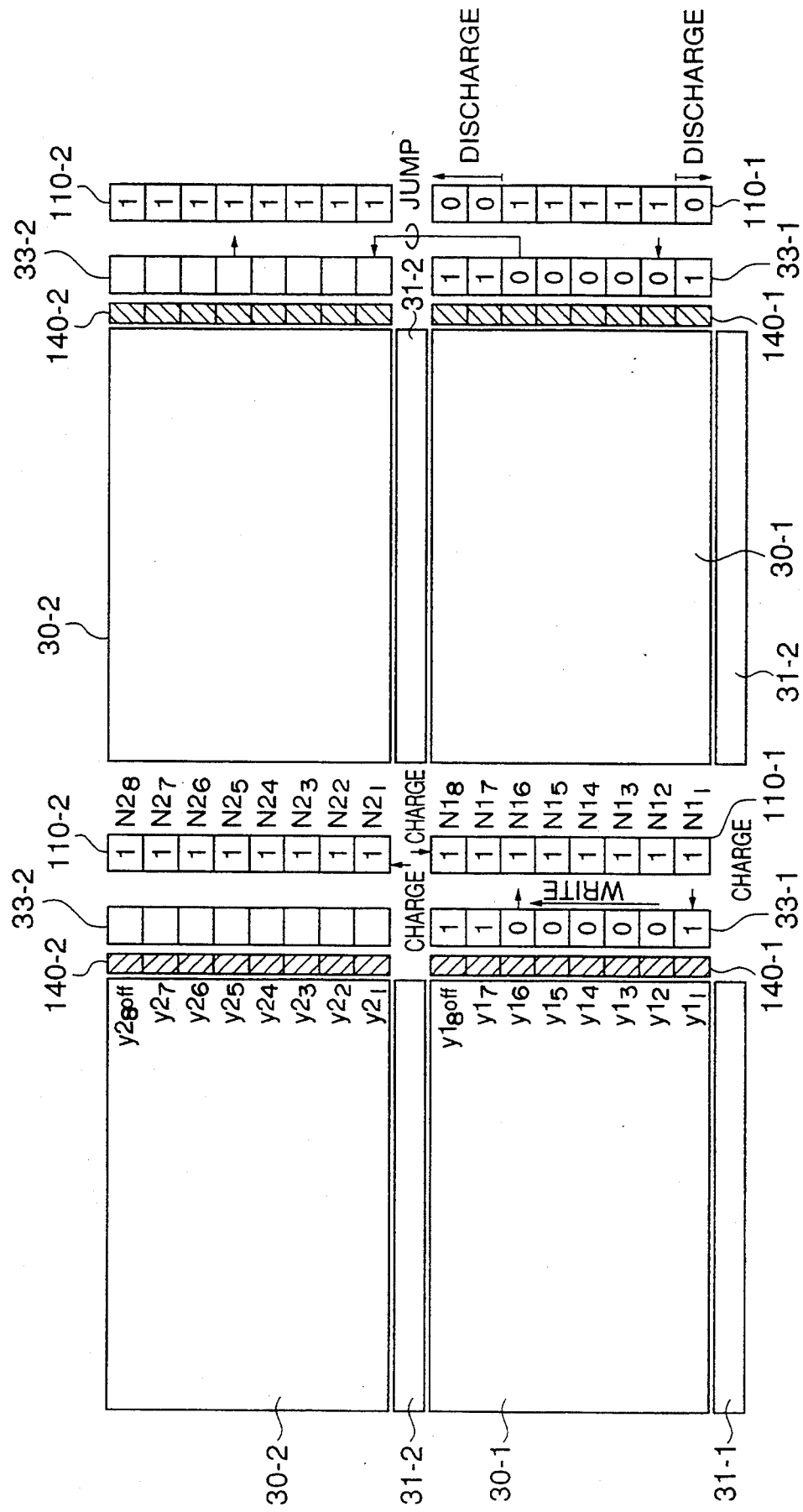

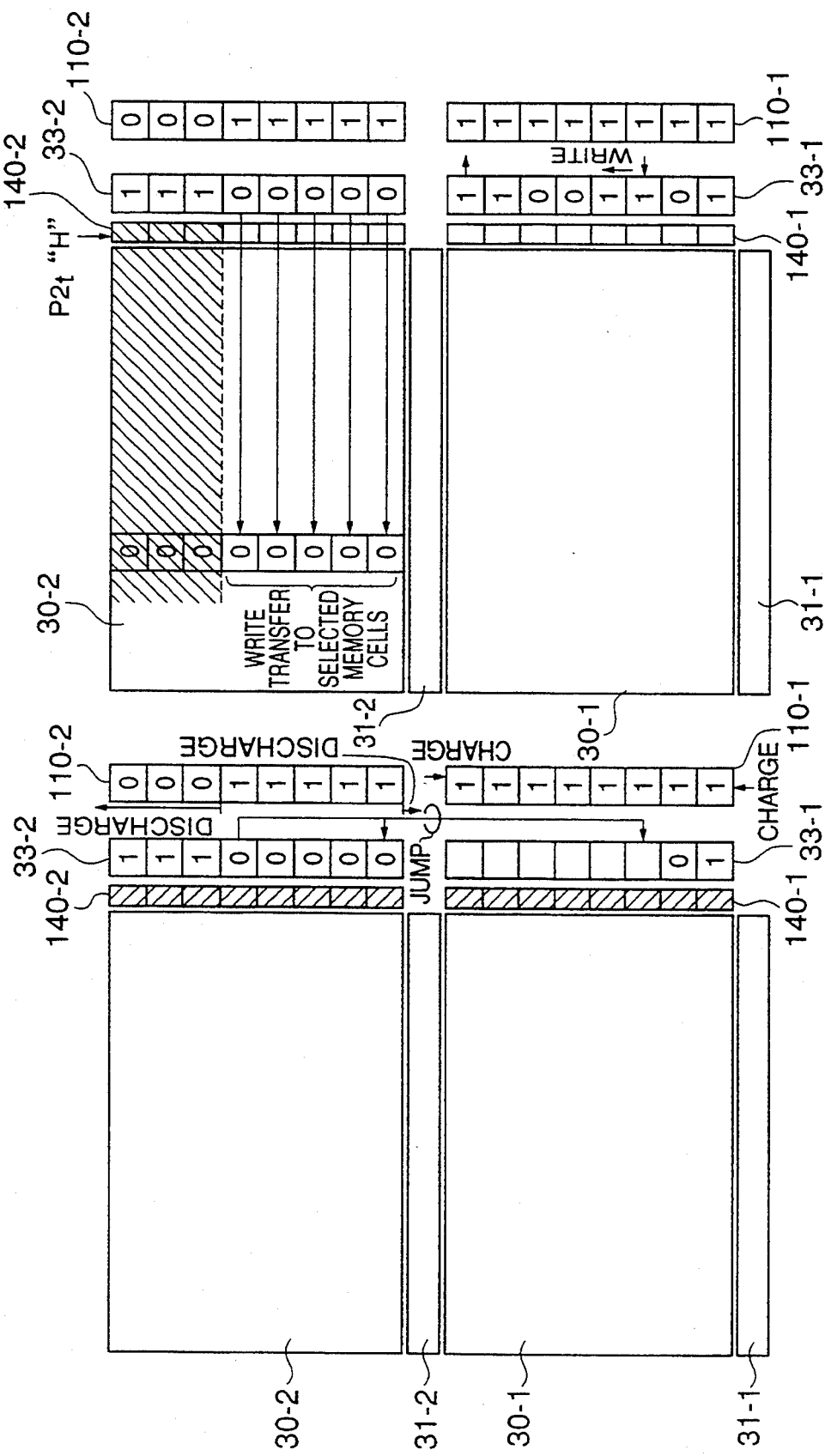

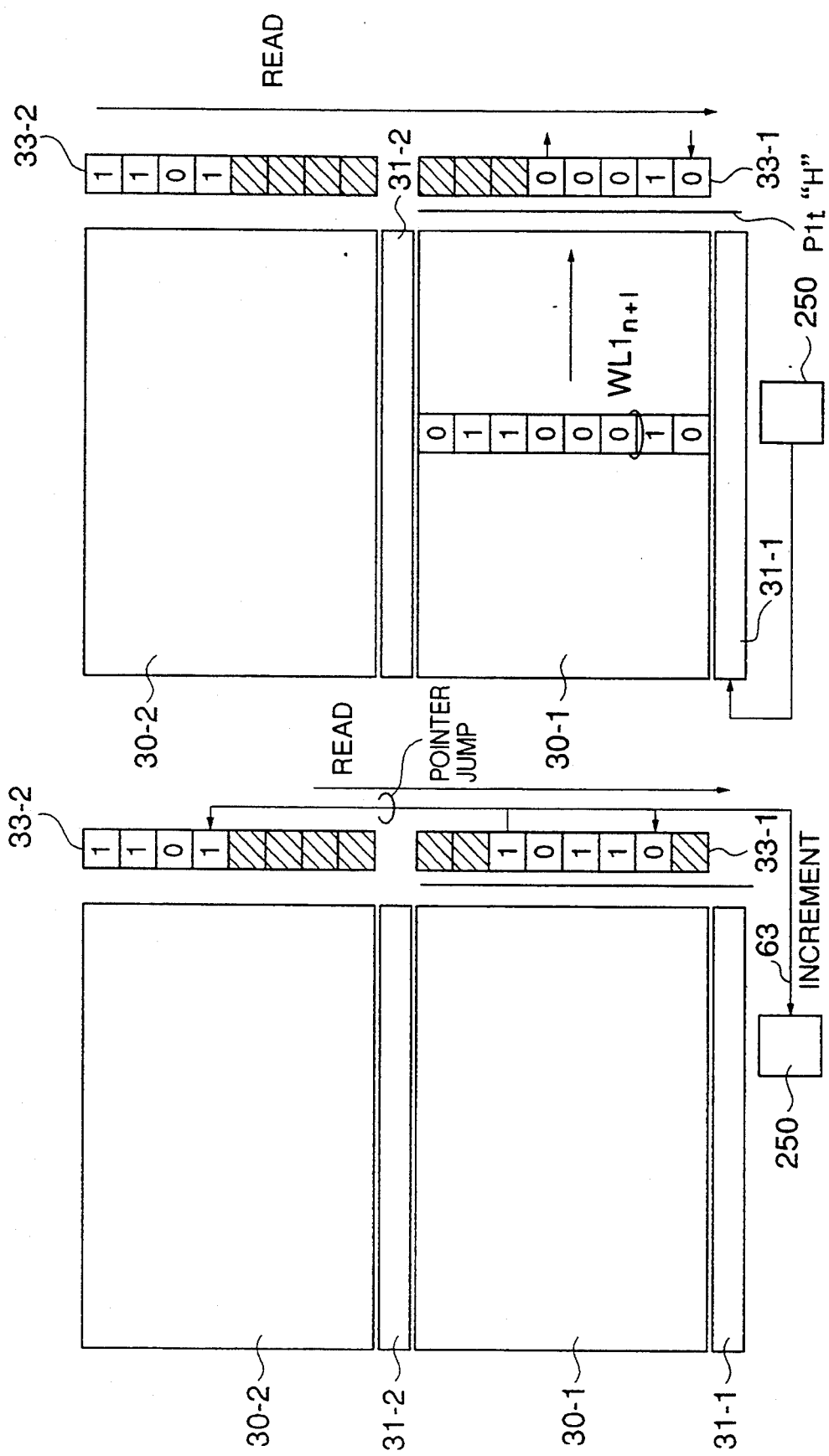

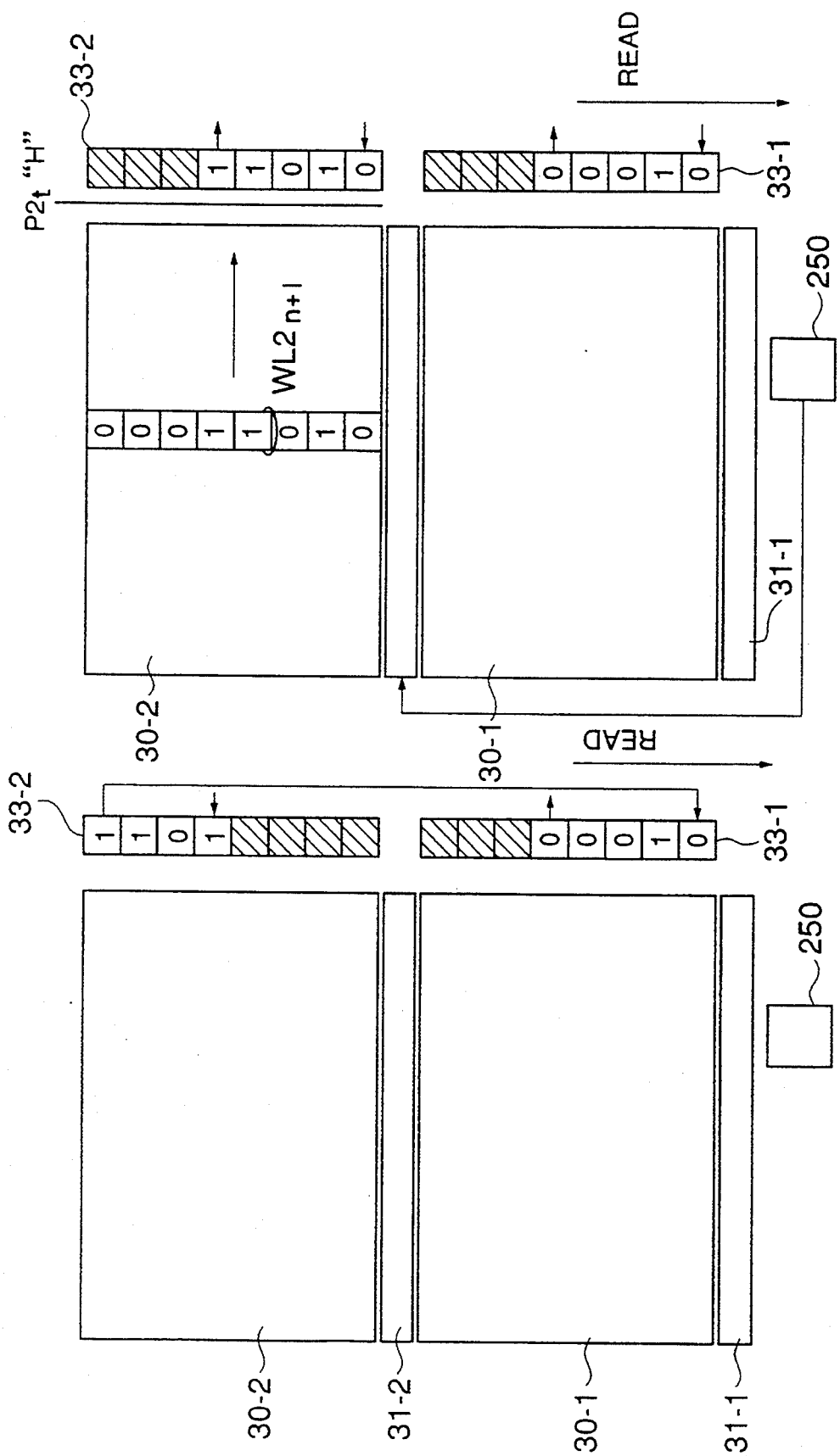

20-1, 20-2: SERIAL ACCESS MEANS

SERIAL ACCESS MEMORY

TECHNICAL FIELD

This invention relates to a serial I/O serial access memory useful in a speech processing unit, an image processing unit, a computer system or the like.

BACKGROUND ART

Speech processing units, image processing units, computer systems equipped with a central processing unit (CPU), and the like require a large-capacity memory for the storage of data. This memory is desired to permit high-speed writing and reading and also to have a low production cost. As memories capable of satisfying these requirements, serial access memories are now receiving attention. They are introduced in "Variety of Field-Memory-Dedicated 1M Chips Now Available for VTRs and TVs" Nikkei Electronics, 421, 147–162, NIKKEI McGRAW-HILL, INC., May 18, 1987. To facilitate the understanding of the present invention, the construction and operation of a popular serial memory will hereinafter be described with reference to FIG. 1 through FIG. 4.

FIG. 1 is a simplified block diagram of the popular serial access memory. Different from general DRAMs, a serial access memory permits high-speed serial input and serial output without sequential input of Y addresses (column addresses). To continuously perform a serial output or serial input, the serial access memory has two memory banks A1,A2 of the same construction.

The memory banks A1,A2 are provided with (m,n) memory matrices 10-1,10-2, X addressing means 11-1,11-2 and serial access means 20-1,20-2, respectively. The memory matrices 10-1,10-2 have m word lines WL1-1 to WL1-$m$,WL2-1 to WL2-$m$ and n bit lines BL1-1 to BL1-$n$, BL2-1 to BL2-$n$, respectively. Although not illustrated, there are memory cells disposed in the vicinity of intersections of the word lines and the bit lines and connected to the adjacent word lines and bit lines, respectively. These plural word lines WL1-1 to WL1-$m$,WL2-1 to WL2-$m$ are selected by the X addressing means 11-1,11-2 which decode X addresses (row addresses). By this word line selection, unillustrated plural memory cells connected, for example, to the word lines WL1-$j$,WL2-$j$ ($j$=natural number of 1−m) are electrically connected with adjacent bit lines BL1-1 to BL1-$n$, BL2-1 to BL2-$n$ so that the plural memory cells are accessed by the serial access means 20-1,20-2 of n×1 bits which automatically generate serial addresses on the basis of a serial clock signal CLK. Incidentally, the respective bit lines BL1-1 to BL2-$n$ are illustrated as single lines in FIG. 1 with a view toward simplifying their description. In truth, however, each bit line is formed of a pair of bit lines BL,$\overline{BL}$ which develop a potential in a complementary relation in an active state as illustrated in FIG. 2. The memory matrices 10-1,10-2 and X addressing means 11-1,11-2 of the serial access memory has substantially the same circuit construction and performs substantially the same circuit operation as conventional general-purpose memory circuits, for example, DRAM circuits, so that its further description is omitted. Using FIG. 2, the serial access means 20-1,20-2 in FIG. 1 will hereinafter be described in detail.

FIG. 2 is a circuit diagram of the serial access means 20-1,20-2 in FIG. 1.

The serial access means 20-1 has transfer means 21-1 to 21-1$n$ which are connected to the plurality of paired bit lines BL1-1,$\overline{BL1-1}$ to BL1-$n$,$\overline{BL1-n}$ of the memory matrix 10-1, respectively. The transfer means 21-11 to 21-1$n$ are each composed of a pair of NMOS transistors. Describing in detail about the connection between the transfer means 21-11 and the paired bit lines BL1-1,$\overline{BL1-1}$, a first electrode which is the source or drain of one of the NMOS transistors of the transfer means 21-11 is connected to one of the bit lines, i.e., the bit lines BL1-1 and a first electrode of the other NMOS transistor is connected to the other bit line $\overline{BL1-1}$. The other transfer means is connected with its corresponding bit lines in a similar manner.

The gate electrodes of all the NMOS transistors of the transfer means 21-1 are commonly connected so that a signal Pt can be applied to all the gate electrodes practically at the same time to on-off control the NMOS transistors. When the signal Pt is high in level, all the NMOS transistors are in a conductive state so that the transfer means 21-11 to 21-1$n$ can transfer the potentials of the respective paired bit lines BL1-1,$\overline{BL1-1}$ to BL-$n$,$\overline{BL1-n}$ (hereinafter simply called "bit lines BL1-1 to BL-$n$38 for the sake of brevity) to a corresponding data register 22-1.

The data register 22-1 has the circuit construction that reverse parallel-connected two inverters are provided in sets as many as the number of the bit lines. The data register 22-1 has a function to temporarily hold data DA for the bit lines BL1-1 to BL1-$n$. Switching means 23-1 is composed of plural two-input NOR gates, which select pointer outputs responsive to the signal Pd, and plural data-transferring transistors which are on-off controlled by outputs of the two-input NOR gates.

Connected to an input side of the switching output 23-1 is a pointer 24-1, to which Y addressing means 27-1 is connected further. The pointer 24-1 is composed of plural elements 24-1$_1$ to 24-1$_n$ which are in turn formed of groups of shift registers, and has a function to sequentially increment +1 by +1 by the clock signal CLK. The Y addressing means 27-1 has a function to decide the leading address of a serial access on the basis of Y addresses fed from a Y address bus 28 and is composed of plurality of elements 27-1$_1$ to 27-1$_n$.

The serial access means 20-2 is composed, like the serial access means 20-1, of transfer means 21-2 on-off controlled by the signal Pt, a data register 22-2, switching means 23-2 on-off controlled by the signal Pd to perform transfer of data DA, a pointer 24-2 composed of elements 24-2$_1$ to 24-2$_n$, and Y addressing means 27-2 composed of elements 27-2$_1$ to 27-2$_2$.

The elements 24-1$_1$ to 24-1$_n$,24-2$_1$ to 24-2$_n$ of the pointers 24-1,24-2 are connected in the form of a ring through signal lines 25,26, so that each pointer output moves in a cyclic manner by the clock signal CLK.

FIG. 3(1) through FIG. 3(4) illustrate a serial read operation of FIG. 1, while FIG. 4(1) through FIG. 4(4) are concept diagrams showing a serial write operation (in-series writing operation) of FIG. 1.

In the read cycle shown in FIG. 3(1) through FIG. 3(4), to access the memory bank A1 during an access to the memory bank A2 in the serial access memory of FIG. 1, a word line WL1$_i$ on the memory matrix 10-1 is selected by the X addressing means 11-1 [FIG. 3(1)], and string data are transferred to the data register 22-1 through the bit line BL1 [FIG. 3(2)] (this is called "read transfer"). In the course of the subsequent access to the memory bank A1, the memory bank A2 is prepared for the next access [FIG. 3(3) and FIG. 3(4)].

In the write cycle depicted in FIG. 4(1) through FIG. 4(4), the data DA which have been written in the data register 22-1 in advance are written in the memory matrix 10-1 during an access to the memory bank A2, said access being performed subsequent to completion of writing of data to the data register 22-1 of the memory bank A1 (this is called "write transfer") [FIG. 4(3)].

Speedup of an access is achieved by subjecting the memory matrices 10-1,10-2 and the serial access means 20-1,20-2 to a pipeline operation, that is, operating them alternately.

Incidentally, the Y addressing means 27-1 in FIG. 2 has a function to decide the leading address AD of a serial access. As soon as the leading address AD is decided, logical level "1" is set at any one of the elements $24\text{-}1_1$ to $24\text{-}1_n, 24\text{-}2_1$ to $24\text{-}2_n$ of the pointers 24-1,24-2. By the clock signal CLK, this logical level is shifted 1 bit by 1 bit in an ascending order and moves in a cyclic manner through the signal lines 25,26, whereby a serial access is performed.

The serial access memory of the above construction is, however, accompanied by the problem to be described below.

The conventional serial access memory can access to successive data at a high speed by a pipeline operation. However, the pointers 24-1,24-2 which are adapted to generate serial addresses are shifted 1 bit by 1 bit in an ascending order by the clock signal CLK. When extraction, movement or the like of an image is conducted in image processing, for example, it is therefore impossible to skippingly access certain parts of a series of successive data, thereby making it unable to fetch them as a series of successive data or to write them as new data. This is disadvantageous and inconvenient in use.

DISCLOSURE OF THE INVENTION

An object of this invention is to provide a serial access memory which has overcome the problem of the conventional techniques that a desired series of successive data out of successive bit information cannot be accessed.

To overcome the problem described above, a first aspect of the present invention provides the following means in a serial access memory having a first and second memory matrices with memory cells thereof connected to plural word lines and bit lines, first and second X addressing means for selecting word lines of the first and second memory matrices on the basis of an X address, a first and second data registers for performing parallel/serial interconversion of data for the first and second memory matrices on the basis of each serial address, first and second transfer means for performing switching of transfer of data between the first and second memory matrices and the first and second data registers, first and second pointers composed of plural master-slave flip-flops, respectively, and adapted to generate serial addresses for the first and second data registers, respectively, and Y addressing means for designating a leading address of a serial access for each of the first and second data registers on the basis of a Y address supplied thereto, whereby partitioned access to the first and second memory matrices is feasible.

In the first aspect of the present invention, the serial access memory is provided with a first group of switching means for connecting input sides of the respective flip-flops of the first pointer with a first line adapted to transfer pointer outputs therethrough; a second group of switching means for connecting output sides of the respective flip-flops of the first pointer with a second line adapted to transfer pointer outputs therethrough; a third group of switching means for connecting input sides of the respective flip-flops of the second pointer with the second line; a fourth group of switching means for connecting output sides of the individual flip-flops of the second pointer with the first line; and address means for selecting one switching means from each of the first, second, third and fourth groups of switching means on the basis of the Y address.

In a second aspect of the present invention, the first aspect of the present invention is additionally provided with an address generator for switching the X address and feeding same to said first or second X addressing means; and a write transfer control for controlling, based on pointer outputs from the first and second lines, the address switching operation of the address generator and switching operations of said first and second transfer means, whereby a read transfer from memory cells in the first and second memory matrices to the first and second data registers is performed before a write transfer from the first and second data registers to the memory cells in the first and second memory matrices.

A third aspect of the present invention is constructed so that said first and second transfer means have a switching circuit for opening or closing connections between the first and second memory matrices and the first and second data registers, whereby outputs of said address means are subjected to a logical operation and on the basis of the results of the logical operation, only accessed bits in the switching circuit are controlled in an open state upon write transfer from the first and second data registers to the first and second memory matrices.

In a fourth aspect of the present invention, the first and second transfer means according to the first aspect of the present invention are constructed as follows. Namely, the first and second transfer means comprise switching controls having signal lines, along which plural switching elements are connected in series via individual nodes, and adapted to subject outputs of said address means to a logical operation so that the individual switching elements are on-off controlled based on the results of the logical operation; charge/discharge circuits for charging or discharging the signal lines on the basis of a charge/discharge signal; and switching circuits for transferring, based on a switching signal and signals on the respective nodes, only accessed bits in the first and second data registers upon write transfer from the first and second data registers to the first and second memory matrices.

In a fifth aspect of the present invention, the serial access memory of the first aspect of the present invention further comprises amplifiers provided at intermediate locations of the first and second lines, respectively, whereby pointer outputs are amplified.

In a sixth aspect of the present invention, the serial access memory of the first aspect of the present invention further comprises an X address generator for generating an X address, which is incremented by a pointer output from the second line, and inputting same to the first or second X addressing means.

In a seventh aspect of the present invention, the serial access memory of the first aspect of the present invention further comprises an address counter for generating an X address, which is incremented by a pointer output from the second line, and feeding same to said first or second X addressing means; and an initial value input circuit for fetching an initial address in the address counter responsive to a reset signal.

In an eighth aspect of the present invention, the Y addressing means in the first aspect of the present invention has been eliminated and, instead, a leading bit serial address fetch circuit for fetching each output of said address means to set a start address of the first or second pointer is provided.

In a ninth aspect of the present invention, the serial access memory of the first aspect of the present invention is provided with at least three memory matrices of a similar type to the first and second memory matrices and a like number of corresponding access means, and inputs and outputs of the respective pointers are mutually connected via said groups of switching means and the lines.

In a tenth aspect of the present invention, the first and second transfer means in the first aspect of the present invention are constructed in the following manner. Namely, the first and second transfer means is provided with switching controls for storing serial addresses accessed from the first and second pointers, respectively; and switching circuits for transferring, based on a switching signal and output signals from the switching controls, only accessed bits in the first and second data registers upon write transfer from the first and second data registers to the first and second memory cells.

In an eleventh aspect of the present invention, the serial access memory of the second aspect of the present invention further comprises an arbiter provided in the write transfer control, said arbiter being adapted to temporarily hold the execution of a switching operation of said first and second transfer means at a predetermined timing.

In a twelfth aspect of the present invention, the first and second transfer means of the fourth aspect of the present invention are provided with a first and second equalizers, respectively, and each of the first and second equalizers has plural switching elements connected in series with the switching elements and on-off controlled by a charging signal.

In a thirteenth aspect of the present invention, the serial access memory of the fourth or twelfth aspect of the present invention comprises a charging circuit connected to the signal lines, said charging circuit being operated based on a charging signal.

In a fourteenth aspect of the present invention, the serial access memory of the tenth aspect of the present invention further comprises serial write transfer masking means for applying, responsive to an external signal, a mask to prescribed bits of serial addresses outputted from the first and second pointers.

In a fifteenth aspect of the present invention, a serial access memory has a first and second memory matrices with memory cells thereof connected to plural word lines and bit lines, first and second X addressing means for selecting word lines of the first and second memory matrices on the basis of an X address, a first and second data registers for performing parallel/serial interconversion of data for the first and second memory matrices on the basis of each serial address, first and second transfer means for performing switching of transfer of data between the first and second memory matrices and the first and second data registers, and first and second pointers composed of plural master-slave flip-flops, respectively, and adapted to generate serial addresses for the first and second data registers, respectively, whereby partitioned access to the first and second memory matrices is feasible. The serial access memory is provided with such means as will be described next.

Namely, the serial access memory further comprises a first group of switching means for connecting input sides of the respective flip-flops of the first pointer with a first line adapted to transfer pointer outputs therethrough, a second group of switching means for connecting output sides of the respective flip-flops of the first pointer with a second line adapted to transfer pointer outputs therethrough, a third group of switching means for connecting input sides of the respective flip-flops of the second pointer with the second line, a fourth group of switching means for connecting output sides of the individual flip-flops of the second pointer with the first line, Y addressing means for decoding in a time-sharing manner Y addresses to be fed, and address selector means for selecting outputs of said Y addressing means on the basis of address selection signals. Based on outputs from said address selector means, leading addresses of a serial access are designated for the first and second pointers, respectively, and the first, second, third or fourth group of switching means are selected.

In a sixteenth aspect of the present invention, The first, second, third or fourth group of switching means in the fifteenth aspect of the present invention are simultaneously selected by selectively controlling said address selector means in accordance with a common control signal.

In a seventeenth aspect of the present invention, a serial access memory has a first and second memory matrices with memory cells thereof connected to plural word lines and bit lines, first and second X addressing means for selecting word lines of the first and second memory matrices on the basis of an X address, a first and second data registers for performing parallel/serial interconversion of data for the first and second memory matrices on the basis of each serial address, first and second transfer means for performing switching of transfer of data between the first and second memory matrices and the first and second data registers, first and second pointers composed of plural master-slave flip-flops, respectively, and adapted to generate serial addresses for the first and second data registers, respectively, and Y addressing means for designating a leading address of a serial access for each of the first and second data registers on the basis of a Y address supplied thereto, whereby partitioned access to the first and second memory matrices is feasible. The serial access memory is provided with such means as will be described next.

Namely, the individual flip-flops of the first and second pointers are divided into plural blocks and said Y addressing means designates leading addresses of a serial access block by block for the first and second pointers. The serial access memory is provided with first switching means for connecting an input side of each block of the first pointer with a first line adapted to transfer each pointer output therethrough, second group switching means for connecting an output side of each block of the first pointer with a second line adapted to transfer each pointer output therethrough, third switching means for connecting an input side of each block of the second pointer with the second line, fourth switching means for connecting an output side of each block of the second pointer with the first line, and address means for selecting said first, second, third or fourth switching means on the basis of the Y address.

In an eighteenth aspect of the present invention, the serial access memory of the seventeenth aspect of the present invention further comprises an address generator for switching the X address and feeding same to said first or second X addressing means; and a write transfer control for controlling, based on pointer outputs from the first and second lines, the address switching operation of the address generator and switching operations of said first and second transfer means, whereby a read transfer from memory cells in the first and second memory matrices to the first and second data registers is performed before a write transfer from the first and second data registers to the memory cells in the first and second memory matrices.

In a nineteenth aspect of the present invention, The first and second transfer means are constructed as will be set out next. Namely, the first and second transfer means are provided with switching controls having signal lines, along which switching elements as many as the number of the blocks are connected in series via individual nodes, and adapted to subject outputs of said address means to a logical operation so that the individual switching elements are on-off controlled based on the results of the logical operation;

charge/discharge circuits for charging or discharging the signal line based on a charge/discharge signal; and switching circuits for transferring, based on a switching signal and signals on the respective nodes, only accessed blocks in the first and second data registers upon block-by-block write transfer from the first and second data registers to the first and second memory matrices.

In a twentieth aspect of the present invention, the serial access memory of the seventeenth embodiment further comprises amplifiers provided at intermediate locations of the first and second lines, respectively, whereby pointer outputs are amplified.

In a twenty-first aspect of the present invention, the serial access memory of the seventeenth aspect of the present invention further comprises an X address generator for generating an X address incremented by a pointer output from the second line and inputting same to the first or second X addressing means.

In a twenty-second aspect of the present invention, the serial access memory of the seventeenth aspect of the present invention further comprises an address counter for generating an X address, which is incremented by a pointer output from the second line, and feeding same to said first or second X addressing means; and an initial value input circuit for fetching an initial address in the address counter responsive to a reset signal.

In a twenty-third aspect of the present invention, the Y addressing means in the seventeenth aspect of the present invention has been eliminated and, instead, a leading bit serial address fetch circuit for fetching outputs of said address means block by block to set start addresses of the respective blocks in the first or second pointer has been provided.

In a twenty-fourth aspect of the present invention, the first and second transfer means in the seventeenth aspect of the present invention are constructed in the following manner. Namely, the first and second transfer means comprises switching controls for storing serial addresses in blocks accessed from the first and second pointers, respectively; and switching circuits for transferring, based on a switching signal and output signals from the switching controls, only accessed blocks in the first and second data registers upon block-by-block write transfer from the first and second data registers to the first and second memory cells.

In a twenty-fifth aspect of the present invention, the first and second transfer means in the seventeenth aspect of the present invention are constructed in the following manner. Namely, the first and second transfer means comprises switching controls for storing bit-by-bit serial addresses accessed from the first and second pointers, respectively; and switching circuits for transferring, based on a switching signal and output signals from the switching controls, only accessed blocks in the first and second data registers upon write transfer from the first and second data registers to the first and second memory cells.

In a twenty-sixth aspect of the present invention, the first and second transfer means in the nineteenth aspect of the present invention are provided with a first and second equalizers, respectively, and each of the first and second equalizers has plural switching elements connected in series with the switching elements and on-off controlled by a charging signal.

In a twenty-seventh aspect of the present invention, the serial access memory of the nineteenth or twenty-sixth aspect of the present invention further comprises a charging circuit connected to the signal lines, said charging circuit being operated based on a charging signal.

In a twenty-eighth aspect of the present invention, the Y addressing means in the twenty-fourth aspect of the present invention has been eliminated and, instead, a leading bit serial address fetch circuit for fetching outputs of said address means block by block to set start addresses of the respective blocks in the first or second pointer has been provided.

In a twenty-ninth aspect of the present invention, the serial access memory of the twenty-fourth or twenty-eighth aspect of the present invention further comprises serial write transfer masking means for applying, responsive to an external signal, a mask to prescribed blocks of serial addresses outputted from the first and second pointers.

In a thirtieth aspect of the present invention, the Y addressing means in the twenty-fifth aspect of the present invention has been eliminated and, instead, a leading bit serial address fetch circuit for fetching outputs of said address means block by block to set start addresses of the respective blocks in the first or second pointer has been provided.

In a thirty-first aspect of the present invention, the serial access memory of the twenty-fifth or thirtieth aspect of the present invention further comprises serial write transfer masking means for applying, responsive to an external signal, a mask to prescribed bits of serial addresses outputted from the first and second pointers.

In a thirty-second aspect of the present invention, the serial access memory of the first, fourteenth or seventeenth aspect of the present invention is provided with the first and second data registers, the first and second transfer means, the first and second pointers and the Y addressing means, the first and second memory matrices are each provided with two sets of serial access means for conducting a serial access of Y addresses with respect to the corresponding memory matrix, and one of the two sets of serial access means is used exclusively for serial reading and the other serial access means is employed exclusively for serial writing.

In a thirty-third aspect of the present invention, one of the two sets of serial access means in the thirty-second aspect of the present invention decodes Y addresses and, based on the results of the decoding, performs a sequential serial access to the memory cells.

According to the first aspect of the present invention, the serial access memory is constructed as described above so that the address means selects one switching means in each of the first to fourth switching means groups upon reading data. As a result, the output routes of the first and second pointers for accessing data in a serial manner are controlled, thereby making it possible to designate the first and second pointers over certain ranges as desired. It is therefore possible to read a certain series of data from serially-successive data at a high speed.

According to the second aspect of the present invention, the address generators and the first and second transfer means are controlled prior to conducting a write transfer, so that memory cells to be written are selected and the data of the memory cells are read-transferred to the first and second data registers beforehand. Accordingly, bits desired to be updated, other than data not desired to be updated, can only be selectively write-transferred.

According to the third aspect of the present invention, the first and second transfer means control, in an open state, only unaccessed bits in the switching circuit at the time of a write transfer, whereby data which have been written in the data registers at particular successive addresses are write-transferred to desired memory cells. This makes it possible to perform selective write transfer of only data, which are desired to be updated, from the data registers to memory cells.

According to the fourth aspect of the present invention, the switching controls and charge/discharge circuits are controlled at the time of a write transfer. As a consequence, the switching circuits are turned on so that accessed bits in the first and second data registers are only transferred.

According to the fifth aspect of the present invention, the amplifiers amplify pointer outputs and transfer them at a high speed upon setting serial addresses. As a consequence, the operation speed of address setting has been improved.

According to the sixth aspect of the present invention, the X address generator produces X addresses which are incremented in accordance with pointer outputs from the second line. The X addresses are fed to the first and second X addressing means. As a result, X addresses are produced automatically and internally, whereby continuous operation of a simple serial access can be performed with ease.

According to the seventh aspect of the present invention, the initial value input circuit fetches in the initial address counter responsive to a reset signal. At the address counter, X addresses, which are incremented on the basis of the initial address so fetched, are generated and fed to the first and second X addressing means. As a result, it is possible to generate X addresses automatically and internally, whereby continuous operation of a simple serial access can be conducted easily.

According to the eighth aspect of the present invention, the leading bit serial address fetch circuit fetches outputs of the addressing means to set the start addresses (leading addresses) of the first and second pointers. The Y addressing means has therefore become unnecessary, leading to simplification in the circuit construction and a reduction in the pattern area.

According to the ninth aspect of the present invention, the switching means groups are controlled by the access means to transfer an output of each pointer to other pointers via the switching means groups and lines. It is therefore possible to select several successive bytes from the plural memory matrices and to conduct a serial high-speed access thereto.

According to the tenth aspect of the present invention, the switching control stores accessed serial addresses and, based on the results of the storage, closes switching circuits corresponding to the accessed bits at the time of a write transfer. This makes it possible to perform setting of routes for pointer outputs as desired so that only selected bits can be write-transferred.

According to the eleventh aspect of the present invention, the arbiter temporarily holds switching operation of the first and second transfer means and, after completion of a write transfer, operates the first and second transfer means to perform a read transfer. As a consequence, it is possible to reduce the timing limitation to activating control signals for the write transfer control.

According to the twelfth aspect of the present invention, the first and second equalizers perform at a high speed an equalizing operation to the signal lines at the time of a write transfer so that the charging speed by the charge/discharge circuits can be accelerated.

According to the thirteenth aspect of the present invention, the charging circuit charges the signal lines together with the charge/discharge circuits at the time of a write transfer, thereby permitting acceleration of the charging speed.

According to the fourteenth aspect of the present invention, the serial write transfer masking means applies, based on an external signal, a mask to the write transfer of desired bits out of serial-accessed successive bits subsequent to setting of a route for each pointer output as desired. As a result, the circuit operation at the time of a write transfer can be simplified.

According to the fifteenth aspect of the present invention, the Y addressing means decodes supplied Y addresses in a time-sharing manner. Based on an address selection signal, the address selector means distributes the results of the decoding by the Y addressing means after dividing the results in a plurality of portions, whereby leading addresses can be designated for the first and second pointers. The Y addressing means can therefore be commonly used, thereby making it possible to reduce the area required for the formation of the pattern of the Y addressing means.

According to the sixteenth aspect of the present invention, the address control means are selectively controlled by a common control signal immediately before a serial access, so that the first, second, third and fourth switching means groups are selected simultaneously. By this simultaneous selection, setting of the start address, end address and leading address of a serial access, for example, can be performed at the same time. The pointer routes for the serial access can therefore be set at once. This makes it possible to decrease the number of control signal lines.

According to the seventeenth aspect of the present invention, the Y addressing means selects the first, second, third and fourth switching means on the basis of a Y address, thereby serving to set pointer output routes block by block, each block consisting of plural bits. Based on the individual blocks in the first and second pointers, a serial access to the memory cells can be conducted block by block. It is therefore possible to reduce the pattern area for the first and second data registers.

According to the eighteenth aspect of the present invention, the write transfer control controls the address generator and the first and second transfer means to perform block-by-block selection of memory cell addresses to be written. Accordingly, block-by-block memory cell data to be written are read-transferred to the first and second data registers right before a serial write. The serial write is then conducted block by block so that the writing operation of only the selected blocks is performed.

According to the nineteenth aspect of the present invention, the switching control and charge/discharge circuit control each switching operation of the switching circuit and, based on block-by-block selection of addresses, only the selected blocks are write-transferred. It is therefore possible to reduce the circuit size.

According to the twentieth aspect of the present invention, the amplifiers amplify pointer outputs to accelerate a serial access upon block-by-block decision of the routes of the pointer outputs by block-by-block address selection.

According to the twenty-first aspect of the present invention, the X address generator increments the X address and feeds it to the first and second X addressing means. The first and second X addressing means select word lines on the basis of the X address so fed. Then, block-by-block address selection is performed to conduct a serial access block by block. Since generation of serial addresses can all be conducted internally, the circuit construction can be simplified and the pattern area can be reduced.

According to the twenty-second aspect of the present invention, an initial address is fetched to the address counter by the initial value input circuit. An X address generated from the address counter is incremented and then fed to the first and second X addressing means. By the first and second X addressing means, word lines are selected to perform a block-by-block access. As a result, the generation of serial addresses is all performed internally, thereby simplifying the circuit construction and reducing the pattern area.

According to the twenty-third aspect of the present invention, the leading bit serial address fetch circuit fetches outputs of the addressing means block by block to set the start addresses of blocks in the first and second pointers. As a consequence, a serial access is performed block by block. Owing to the omission of the Y addressing means, the pattern area can be reduced.

According to the twenty-fourth aspect of the present invention, the switching control controls the switching circuit to perform a serial write transfer block by block at a high speed.

According to the twenty-fifth aspect of the present invention, the switching control stores serial addresses accessed bit by accessed bit to control each switching operation for the switching circuit. Upon block-by-block write transfer, the switching circuit transfers only accessed bits in the first and second data registers. As a consequence, a block-by-block serial write transfer can be conducted at a high speed.

According to the twenty-sixth aspect of this invention, the first and second equalizers have the individual switching elements short-circuited by a charging signal at the time of a block-by-block write transfer to equalize the signal lines. The charging speed can therefore be accelerated.

According to the twenty-seventh aspect of the present invention, the charging circuit charges the signal lines at the time of a selective block-by-block write transfer. The charging speed can therefore be accelerated.

According to the twenty-eighth aspect of the present invention, the leading bit serial address fetch circuit fetches outputs of the addressing means block by block, whereby the start addresses of blocks in the first and second pointers are set to perform a block-by-block access. As a consequence, the circuit size can be reduced.

According to the twenty-ninth aspect of the present invention, the serial write transfer masking means applies a write transfer mask block by block on the basis of an external signal so that only the selected blocks are write-transferred.

According to the thirtieth aspect of the present invention, the leading bit serial address fetch circuit fetches outputs of the address means block by block to set the start registers of individual blocks in the first and second pointers. As a consequence, write transfer of unnecessary data can be prevented even when the access to each block has not been fully completed.

According to the thirty-first aspect of the present invention, the serial write transfer masking means applies a write transfer mask block by block so that only the selected blocks are write-transferred.

According to the thirty-second aspect of the present invention, pointer output routes are set as desired independently for the serial read only serial access means and for the serial write only serial access means. This permits simultaneous execution of a serial write and a serial read.

According to the thirty-third aspect of the present invention, one of the two serial access means decodes Y addresses and, based on the results of the decoding, performs a serial write or a serial read to memory cells in a simple manner. At the same time, the other serial access means can perform a serial read or serial write. As a consequence, a serial read and a serial write can be performed simultaneously by the relatively simple circuit construction.

BRIEF DESCRIPTION OF THE DRAWINGS

FIG. 30 diagrammatically shows a writing operation in FIG. 28 and FIG. 29;

FIG. 32 diagrammatically illustrates a further writing operation in FIG. 28 and FIG. 29;

FIG. 49 diagrammatically shows another operation of the address generator in FIG. 47;

FIG. 50 diagrammatically depicts a further operation of the address generator in FIG. 47;

BEST MODE FOR CARRYING OUT THE INVENTION

First Embodiment

Figure 5:
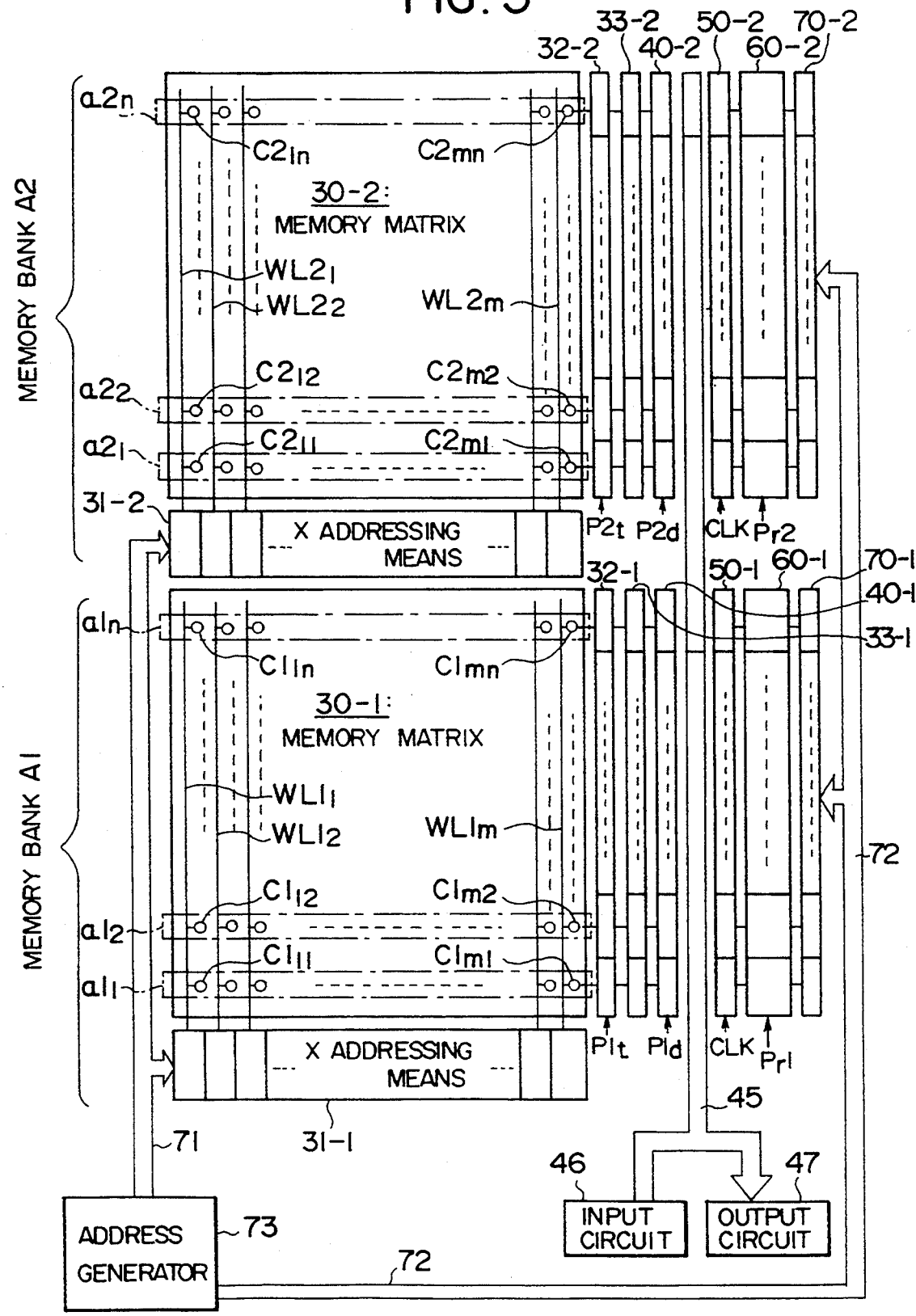
FIG. 5 is a simplified block diagram of a serial access memory according to a first embodiment of the present invention.

FIG. 5 is a simplified block diagram of a serial access memory according to the first embodiment.

Figure 1:
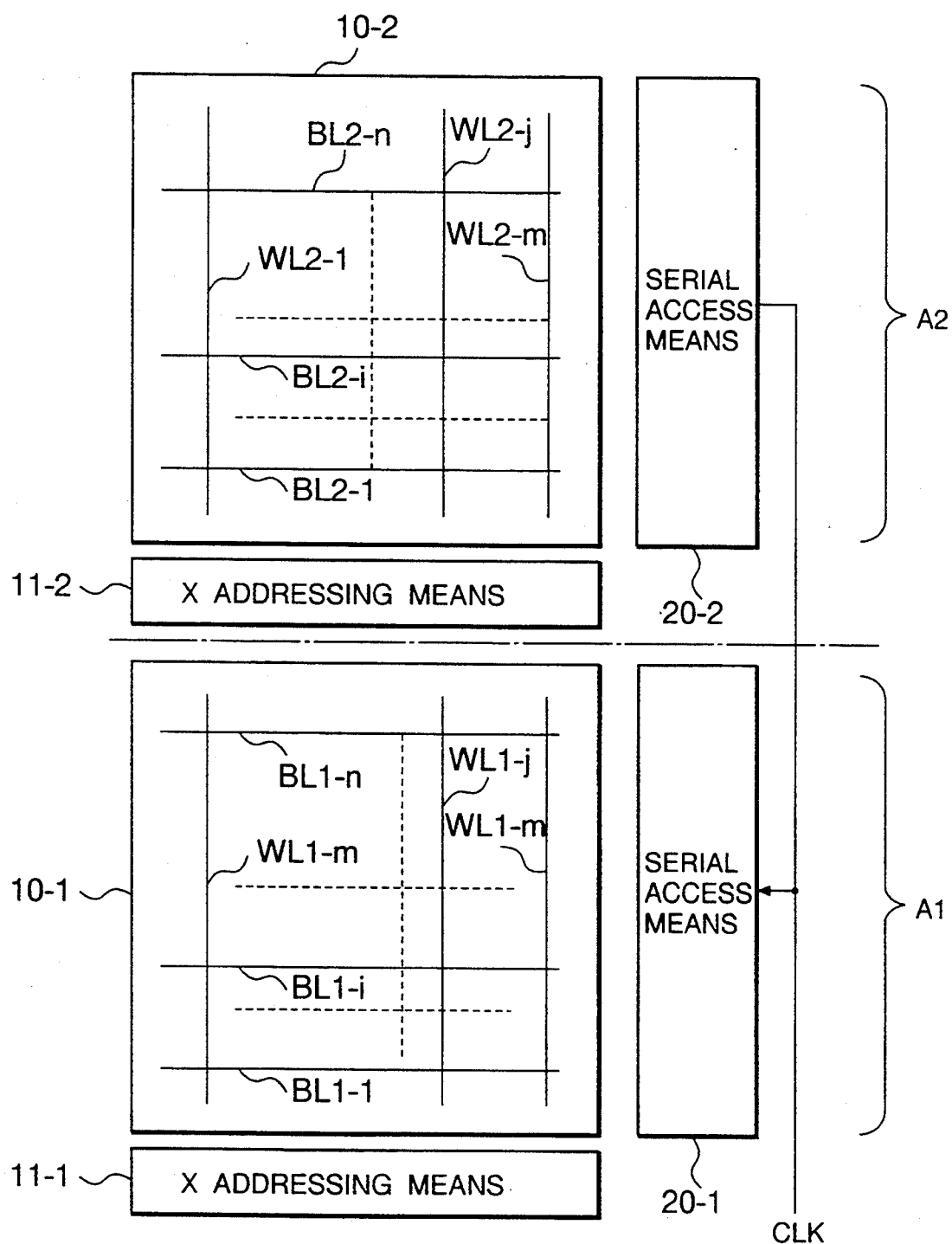
FIG. 1 is a simplified block diagram of a conventional serial access memory.

The serial access memory is composed, as in FIG. 1, of two memory banks A1,A2 having the same circuit.

The memory bank A1 is provided with a first memory matrix 30-1 which is composed of plural memory column units $a1_i$ ($i=1$ to n). Each memory column unit $a1_i$ is formed of m pieces of memory cells $Cl_{ji}$ connected to word lines $WL1_j$ (j: 1 to m), respectively. Connected to the word lines $WL1_j$ is first X addressing means 31-1 for X address decoding. The plural pieces of memory column units $a1_i$ are connected to a first data register 33-1 via first transfer means 32-1 which is on-off controlled by a signal $P1_t$. The data register 33-1 is in turn connected to a data bus 45 via switching means 40-1 which is on-off controlled by an inverted signal $P1_d$. Connected to the data bus 45 are an input circuit 46 for inputting data and an output circuit 47 for outputting data.

To the switching means 40-1, a first pointer 50-1 is connected. Connected to the first pointer 50-1 are a first serial address control 60-1 and first Y addressing means 70-1 for Y address decoding. The pointer 50-1 is composed of a group of shift registers which are each formed of a master-slave flip-flop. The pointer 50-1 functions to generate serial addresses and hence to on-off control the switching means 40-1. The serial address control circuit 60-1 is reset by a reset signal $Pr_1$ and functions to control operation of the pointer 50-1 according to an output from the Y addressing means 70-1.

The X addressing means 31-1 and Y addressing means 70-1 are connected to an address generator 73 via an X address bus 71 and a Y address bus 72, respectively.

The memory bank A2 is provided, like the memory bank A1, with a second memory matrix 30-2 which is composed of plural memory column units $a2_i$ ($i=1$ to n). Each memory column unit $a2_i$ is formed of memory cells $C2_i$ connected to word lines $WL2_j$ (j: 1 to m), respectively. Connected to the word lines $WL2_j$ is second X addressing means 31-2. The plural pieces of memory column units $a2_i$ are connected to a second data register 33-2 via second transfer means 32-2 which is on-off controlled by a signal $P2_t$. The data register 33-2 is in turn connected to the data bus 45 via switching means 40-2 which is on-off controlled by an inverted signal $P2_d$.

The switching means 40-2 is connected to a second pointer 50-2, to which a second serial address control 60-2, which is reset by a reset signal $Pr_2$, and second Y addressing means 70-2 are connected. The X addressing means 31-2 and Y addressing means 70-2 are connected to the address generator 73 via the X address bus 71 and the Y address bus 72, respectively.

Figure 6:
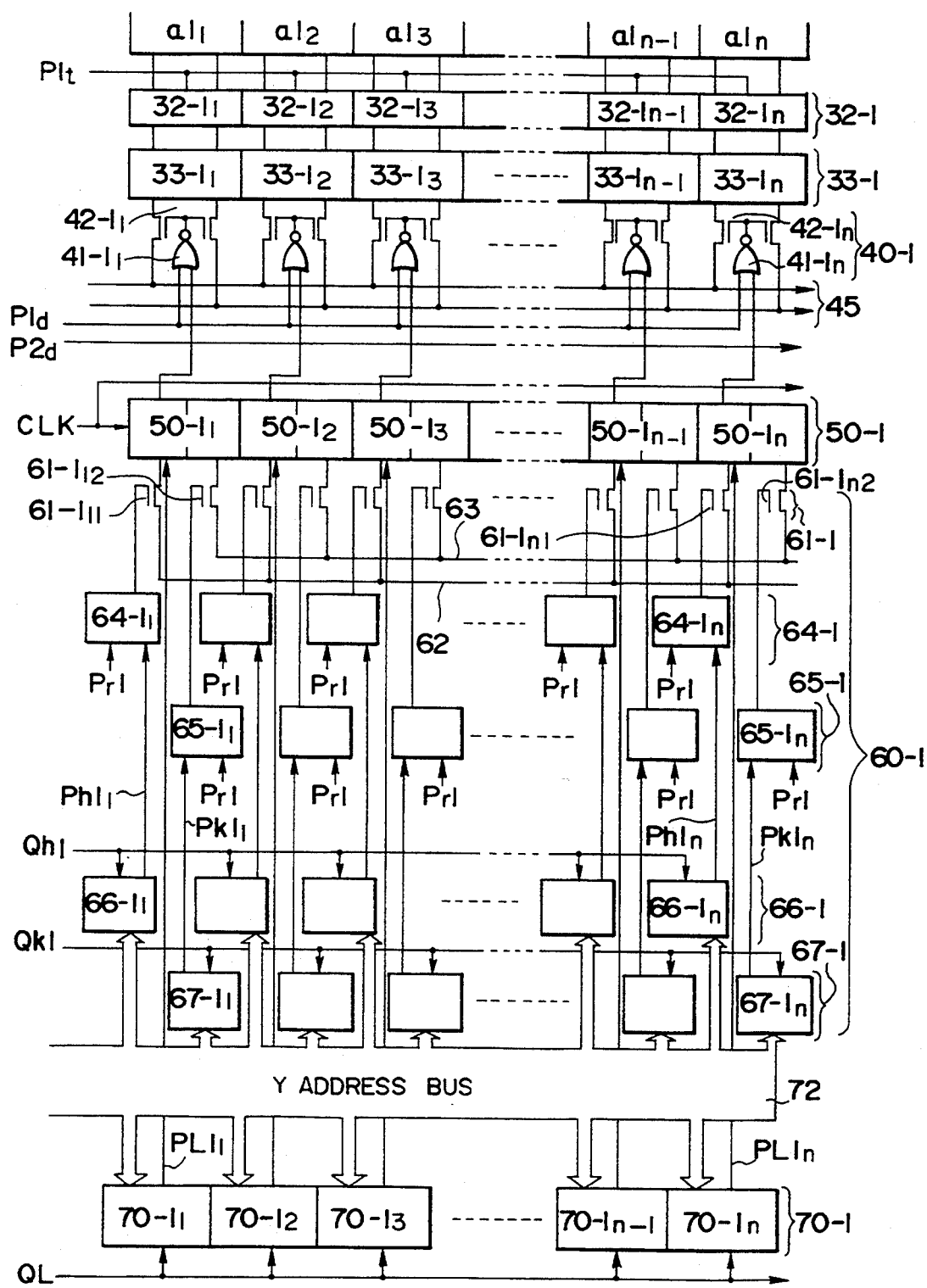
FIG. 6 is a fragmentary circuit diagram on a side of a memory bank A1 in FIG. 5.

FIG. 6 is a circuit diagram of serial access means, an essential part on the side of the memory bank A1 in FIG. 5.

The memory column units $a1_i$ (i=1 to n) are connected to the first data register 33-1, which is composed of plural registers $33-1_i$ (i=1 to n), via the first transfer means 32-1 which is composed of plural switches $32-1_i$ (i=1 to n) on-off controlled by the signal $P1_t$. Via the first switching means 40-1, the data register 33-1 is connected to the data bus 45 along which complementary data are transferred. The above construction is substantially the same as the data transfer means 21-1, the data register 22-1, the switching means 23-1 and the data DA in FIG. 2. Further, the switching means 40-1 has a function to open or close according to logical operation of an output signal from the first pointer 50-1 and the signal $P1_d$ and is composed of plural NOR gates $41-1_i$ (i=1 to n) and plural pairs of transistors $42-1_i$ (i=1 to n). This signal $P1_d$ takes low logical level during the period that serial access is being executed on the side of the memory bank A1 but takes high logical level during another period (namely, during the period in which the signal $P2_d$ is at low logical level). Incidentally, the pointer 50-1 is composed of plural master-slave flip-flops $50-1_i$ (i=1 to n) which are operated by a clock signal CLK. With respect to these master-slave flip-flops $50-1_i$, their construction and operation will be described subsequently with reference to FIG. 8.

The first serial address control 60-1, which controls the pointer 50-1, is composed of a group of switching means 61-1 and address means. The group of switching means 61-1 is formed of first and second groups of switching means (for example, NMOSTRs) $61-1_{11}, 61-1_{12}$ to $61-1_{n1}, 61-1_{n2}$ for connecting or cutting off a first and second lines 62,63 by which the individual flip-flops $50-1_1$ to $50-1_n$ are connected mutually. The address means is formed of a start address setting circuit 64-1, an end address setting circuit 65-1, a start address decoder 66-1 and an end address decoder 67-1. Connected to the serial address control 60-1 are a Y address bus 72 as well as Y address means 70-1 formed of plural latches $70-1_i$ (i=1 to n) which latch addresses on the Y address bus 72 by a latch signal Q1.

Input sides of the individual flip-flops $50-1_i$, which make up the pointer 50-1, are connected to the first line 62 via the transistors $61-1_{11}$ to $61-1_{n1}$ as the first group of switching means. Output sides of the flip-flops $50-1_i$ are connected to the second line 63 via the transistors $61-1_{12}$ to $61-1_{n2}$ as the second group of switching means. Output signals $PL1_i$ (i=1 to n) of the individual latches $70-1_i$, which make up the Y address means 70-1, are inputted to the flip-flops $50-1_i$ of the pointer 50-1, respectively. The Y address bus 72 is connected to the start address decoder 66-1 and also to the end address decoder 67-1. The start address decoder 66-1 is formed of plural latches $66-1_i$ (i=1 to n) which latch start addresses on the Y address bus 72 by a latch signal Qh1. Similarly, the end address decoder 67-1 is formed of plural latches $67-1_i$ (i=1 to n) which latch end addresses on the Y address bus 72 by a latch signal Qk1.

Outputs $Ph1_i$ (i=1 to n) of the individual latches $66-1_i$ are inputted to latches $64-1_i$ (i=1 to n) which make up the start address setting circuit 64-1. Outputs of the latches $64-1_i$ on-off control the transistors $61-1_{11}$ to $61-1_{n1}$. Further, outputs $Pkl_i$ (i=1 to n) of the individual latches $67-1_i$ are inputted to latches $65-1_i$ (i=1 to n) which make up the end address setting circuit 65-1. Outputs of the latches $65-1_i$ on-off control the transistors $61-1_{12}$ to $61-1_{n2}$. The latches $64-1_i, 65-1_i$ are each reset by a reset signal $P_r1$.

Figure 7:
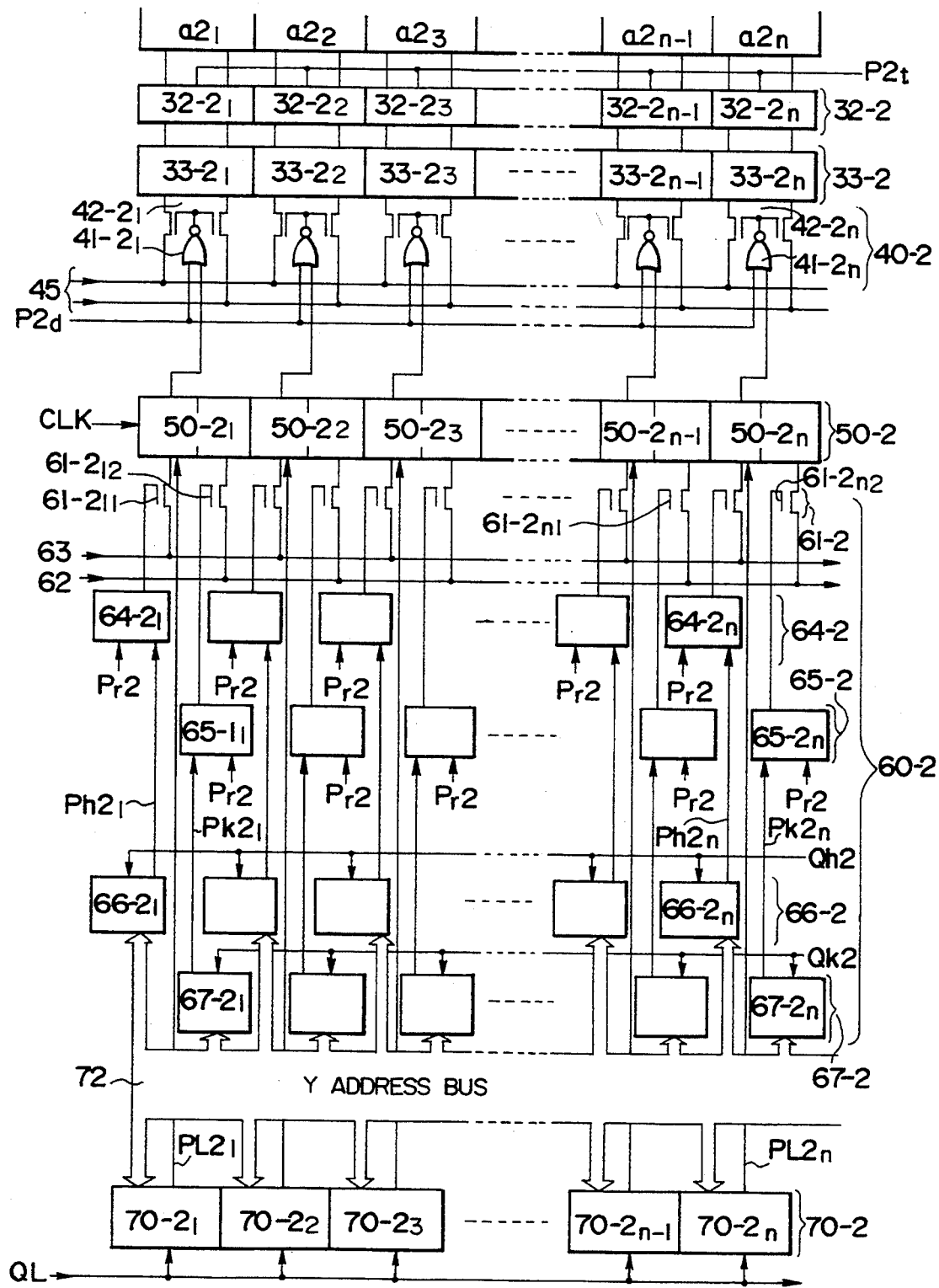
FIG. 7 is a fragmentary circuit diagram on a side of a memory bank A2 in FIG. 5.

FIG. 7 is a circuit diagram of an essential part on the side of the memory bank A2 in FIG. 5.

In a circuit on the side of the memory bank A2, the memory column units $a2_i$ (i=1 to n) are connected, as in the circuit on the side of the memory bank A1, to the second data register 33-2, which is composed of plural registers $33-2_i$ (i=1 to n), via the second transfer means 32-2 which is composed of plural switches $32-2_i$ (i=1 to n) on-off controlled by the signal $P2_t$. Via the second switching means 40-2, the data register 33-2 is connected to the bidirectional data bus 45 via the second switching means 40-2. The switching means 40-2 has a function to open or close according to logical operation of an output signal from the second pointer 50-2 and the signal $P2_d$ and is composed of plural NOR gates $41-2_i$ (i=1 to n) and plural pairs of transistors $42-2_i$ (i=1 to n). This signal $P2_d$ takes low logical level during the period that serial access is being executed on the side of the memory bank A2 but takes high logical level during another period (namely, during the period in which the signal $P2_d$ is at low logical level).

Incidentally, the pointer 50-2 is composed of plural master-slave flip-flops $50-2_i$ (i=1 to n) which are operated by the clock signal CLK. With respect to these master-slave flip-flops $50-2_i$, their construction and operation will be described subsequently with reference to FIG. 9.

The second serial address control 60-2, which controls the pointer 50-2, is composed of a group of switching means 61-2 and address means. The group of switching means 61-2 is formed of third and fourth groups of switching means (for example, transistors) $61-2_{11}, 61-2_{12}$ to $61-2_{n1}, 61-2_{n2}$ for connecting or cutting off the first and second lines 62,63 by which the individual flip-flops $50-2_1$ to $50-2_n$ are connected mutually. The address means is formed of a start address setting circuit 64-2, an end address setting circuit 65-2, a start address decoder 66-2 and an end address decoder 67-2. Connected to the serial address control 60-2 are a Y address bus 72 as well as Y address means 70-2 formed of plural latches $70-2_i$ (i=1 to n).

Figure 8:
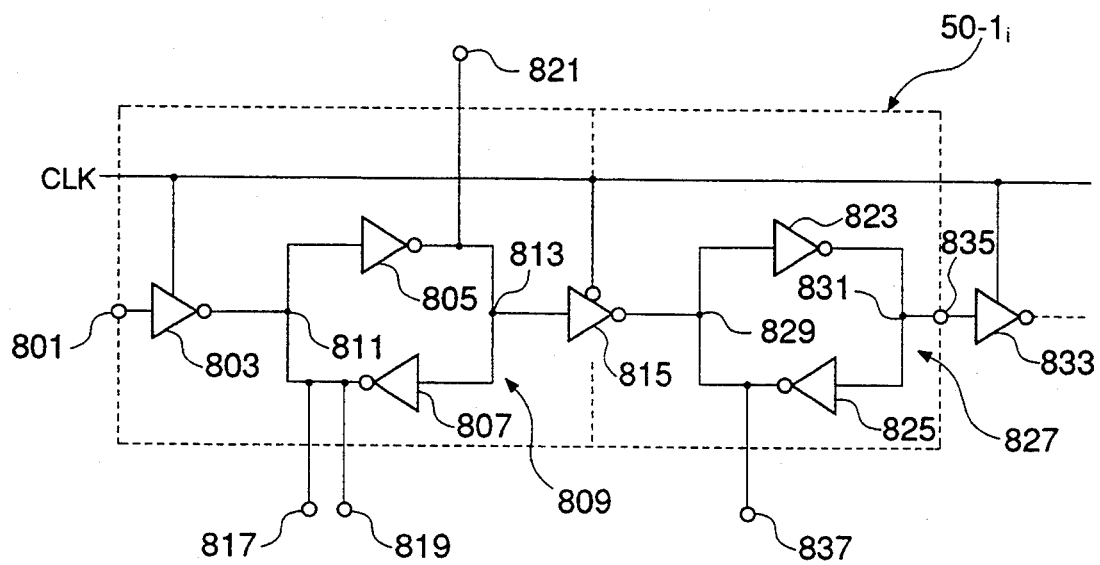
FIG. 8 is a circuit diagram of each master-slave flip-flop 50-1$i$ in FIG. 6.

Input sides of the individual flip-flops $50-2_i$, which make up the pointer 50-2, are connected, different from FIG. 8, to the second line 63 via the transistors $61-2_{11}$ to $61-2_{n1}$ as the third switching means. Output sides of the flip-flops $50-2_i$ are connected to the first line 62 via the transistors $61-2_{12}$ to $61-2_{n2}$ as the fourth switching means. The lines 62,63 serve as routes for allowing each pointer output to move in the orders of 50-1→50-2→, 50-2→50-1.

As in FIG. 8, output signals $PL2_i$ (i=1 to n) of the individual latches $70-2_i$, which make up the Y address means 70-2, are inputted to the flip-flops $50-2_i$ of the pointer 50-2, respectively. The start address decoder 66-2 is formed of plural latches $66-2_i$ (i=1 to n) which latch start addresses on the Y address bus 72 by a latch signal Qh2. The end address decoder 67-2 is formed of plural latches 67-2$_i$ (i=1 to n) which latch end addresses on the Y address bus 72 by a latch signal Qk2.

Outputs Ph2$_i$ (i=1 to n) of the individual latches 66-2$_i$ are inputted to latches 64-2$_i$ (i=1 to n) which make up the start address setting circuit 64-2. Outputs of the latches 64-2$_i$ on-off control the transistors 61-2$_{11}$ to 61-2$_{n1}$. Further, outputs Pk2$_i$ (i=1 to n) of the individual latches 67-2$_i$ are inputted to circuits 65-2$_i$ (i=1 to n) which make up the end address setting circuit 65-2. Outputs of the latches 65-2$_i$ on-off control the transistors 61-2$_{12}$ to 61-2$_{n2}$. The latches 64-2$_i$, 65-2$_i$ are each reset by a reset signal Pr$_2$.

Using FIG. 8 and FIG. 9, a description will next be made of the constructions and operations of the master-slave flip-flops (hereinafter simply called "F.Fs.") 50-1$_i$ and 50-2$_i$.

FIG. 8 illustrates the construction of the i-th F.F. 50-1$_i$ of the pointer 50-1 which has been formed by connecting n pieces of F.Fs. in series. An input terminal 801 of the F.F. 50-1$_i$ is connected to an output terminal of an F.F. 50-1$_{(i-1)}$ of an unillustrated preceding stage and is also connected to an input node of an inverter 803. Operation of the inverter 803 is controlled by a clock signal CLK and, when the clock signal CLK is high in level, outputs a logical level opposite to the logical level of a signal applied to its input node, in other words, is in an operative state. When the clock signal is low in level, on the other hand, the inverter 803 does not respond to the logical level of a signal applied to its input node, in other words, is in an inoperative state.

The output node of the inverter 803 is connected to an input node 811 of a latch 809 formed by reversely parallel-connecting inverters 805 and 807 together, in other words, to a common contact where an input node of the inverter 805 and an output node of the inverter 807 are connected together. The latch 809 temporarily holds each logical level outputted from the inverter 803 and applies to an input node of an inverter 815 a logical level opposite to a logical level applied to the input node 811 from its output node 813, that is, a common contact between an output node of the inverter 805 and an input node of the inverter 807. The input node 811 of the latch 809 is also connected to input terminals 817, 819. This input terminal 817 is connected to the transistor 61-1$_{i1}$, while the input terminal 819 receives each output signal PL1$_i$ of the latch 70-1$_i$. On the other hand, the output node 813 of this latch 809 is also connected to an output terminal 821. This output terminal 821 is connected, as an output of the F.F. 50-1$_i$, to the input node of the NOR gate 41-1$_i$.

Operation of the inverter 815 is controlled by the clock signal CLK. It operates at a timing opposite to the inverter 803. Namely, the inverter 815 becomes operative when the clock signal CLK is low in level but becomes inoperative when the clock signal CLK is high in level.

An output node of the inverter 815 is connected to an input node 829 of a latch 827 which has been formed by reversely parallel-connecting inverters 823 and 825 together. The latch 827 temporarily holds each logical level outputted from the inverter 815 and outputs a logical level, which is opposite to a logical level applied to the input node 829 from an output node 831 thereof, to an inverter 833 of the F.F. 50-1$_{(i+1)}$ of the next stage via an output terminal 835.

Further, the input node 829 of the latch 827 is also connected to an output terminal 837, which is in turn connected to the transistor 61-1$_{i2}$. The pointer 50-1 has been formed by connecting the above-described F.Fs. in n stages in series. Incidentally, it is designed that an input terminal of the F.F. 50-1$_1$ of the first stage is designed to always receive a high logical level, for example, is connected to a power-supply voltage Vcc while an output terminal of the F.F. 50-1$_n$ of the last stage is not connected to any circuit.

Figure 9:
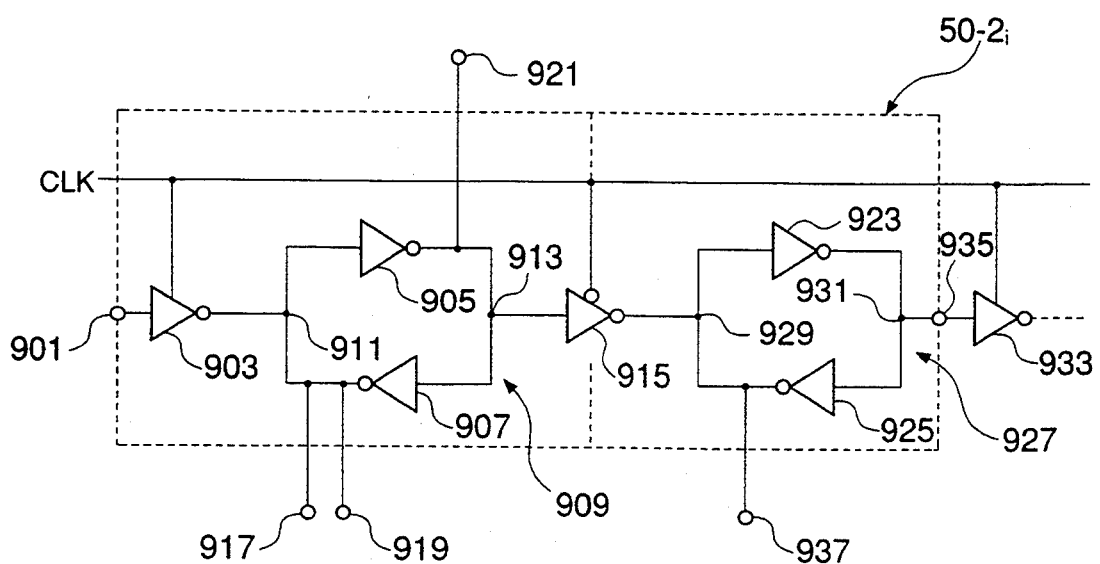
FIG. 9 is a circuit diagram of each master-slave flip-flop 50-2$i$ in FIG. 7.

FIG. 9 illustrates the construction of the i-th F.F. 50-1$_i$ of the pointer 50-2 which has been formed by connecting n pieces of F.Fs. in series.

An input terminal 901 of the F.F. 50-2$_i$ is connected to an output terminal of an F.F. 50-2$_{(i-1)}$ of an unillustrated preceding stage and is also connected to an input node of an inverter 903. Operation of the inverter 903 is controlled by a clock signal CLK and, when the clock signal CLK is high in level, outputs a logical level opposite to the logical level of a signal applied to its input node, in other words, is in an operative state. When the clock signal is low in level, on the other hand, the inverter 903 does not respond to the logical level of a signal applied to its input node, in other words, is in an inoperative state.

The output node of the inverter 903 is connected to an input node 911 of a latch 909 formed by reversely parallel-connecting inverters 905 and 907 together, in other words, to a common contact where an input node of the inverter 905 and an output node of the inverter 907 are connected together. The latch 909 temporarily holds each logical level outputted from the inverter 903 and applies to an input node of an inverter 915 a logical level opposite to a logical level applied to the input node 911 from its output node 913, that is, a common contact between an output node of the inverter 905 and an input node of the inverter 907. The input node 911 of the latch 909 is also connected to input terminals 917, 919. This input terminal 917 is connected to the transistor 61-2$_{i1}$, while the input terminal 919 receives each output signal PL2$_i$ of the latch 70-2$_i$. On the other hand, the output node 913 of this latch 909 is also connected to an output terminal 921. This output terminal 921 is connected, as an output of the F.F. 50-2$_i$, to the input node of the NOR gate 41-2$_i$.

Operation of the inverter 915 is controlled by the clock signal CLK. It operates at a timing opposite to the inverter 903. Namely, the inverter 915 becomes operative when the clock signal CLK is low in level but becomes inoperative when the clock signal CLK is high in level.

An output node of the inverter 915 is connected to an input node 929 of a latch 927 which has been formed by reversely parallel-connecting inverters 923 and 925 together. The latch 927 temporarily holds each logical level outputted from the inverter 915 and outputs a logical level, which is opposite to a logical level applied to the input node 929 from an output node 931 thereof, to an inverter 933 of the F.F. 50-2$_{(i+1)}$ of the next stage via an output terminal 935.

Further, the input node 929 of the latch 927 is also connected to an output terminal 937, which is in turn connected to the transistor 61-2$_{i2}$. The pointer 50-2 has been formed by connecting the above-described F.Fs. in n stages in series. Incidentally, it is designed that an input terminal of the F.F. 50-2$_1$ of the first stage always receives a high logical level, for example, is connected to the power-supply voltage Vcc while an output terminal of the F.F. $50\text{-}2_n$ of the last stage is not connected to any circuit.

Read access operation of the serial access memory constructed as described above will be described with reference to FIG. 10 through FIG. 17.

Figure 10:
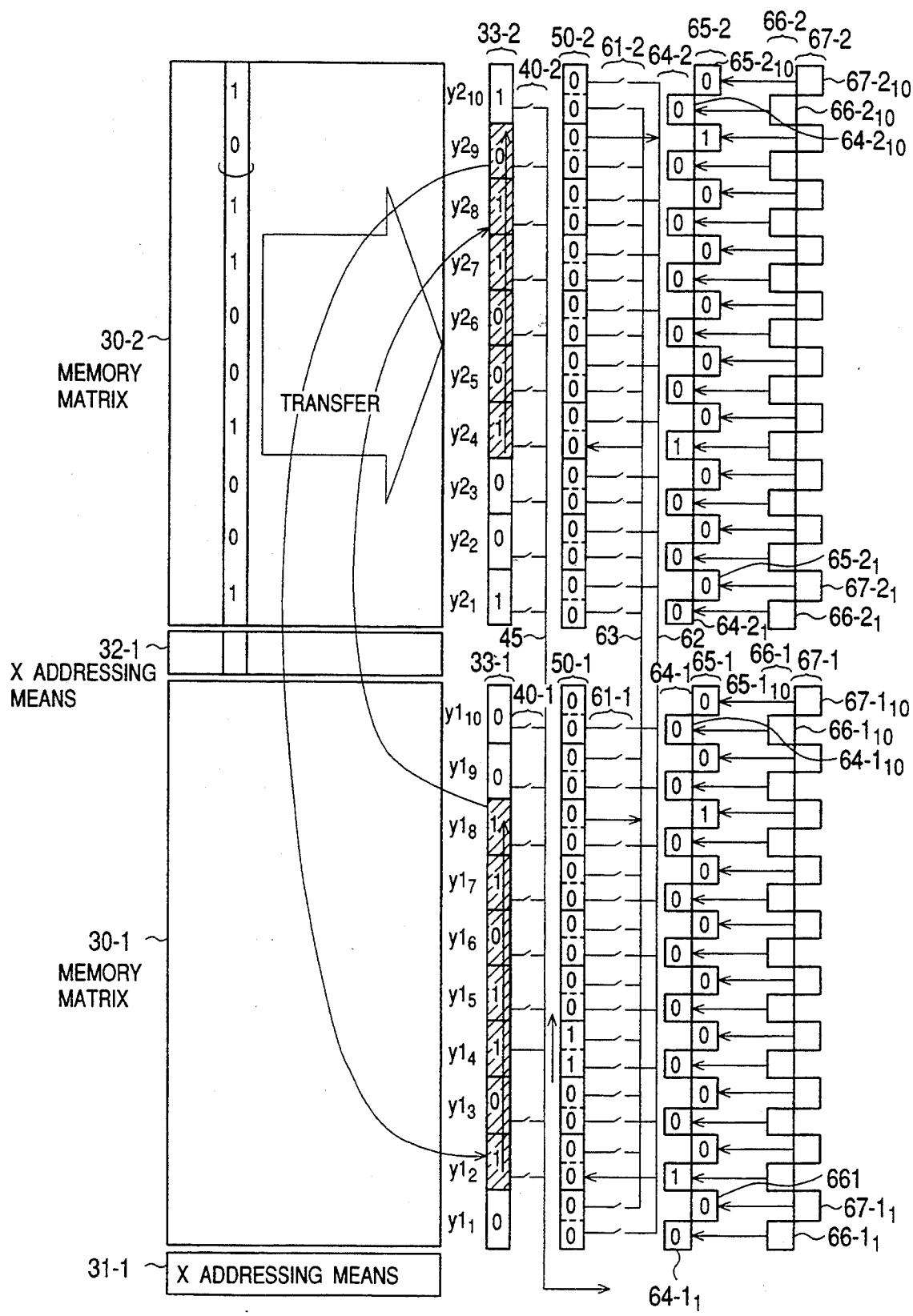
FIG. 10 diagrammatically illustrates operations in FIG. 5, FIG. 6 and FIG. 7.
Figure 15:
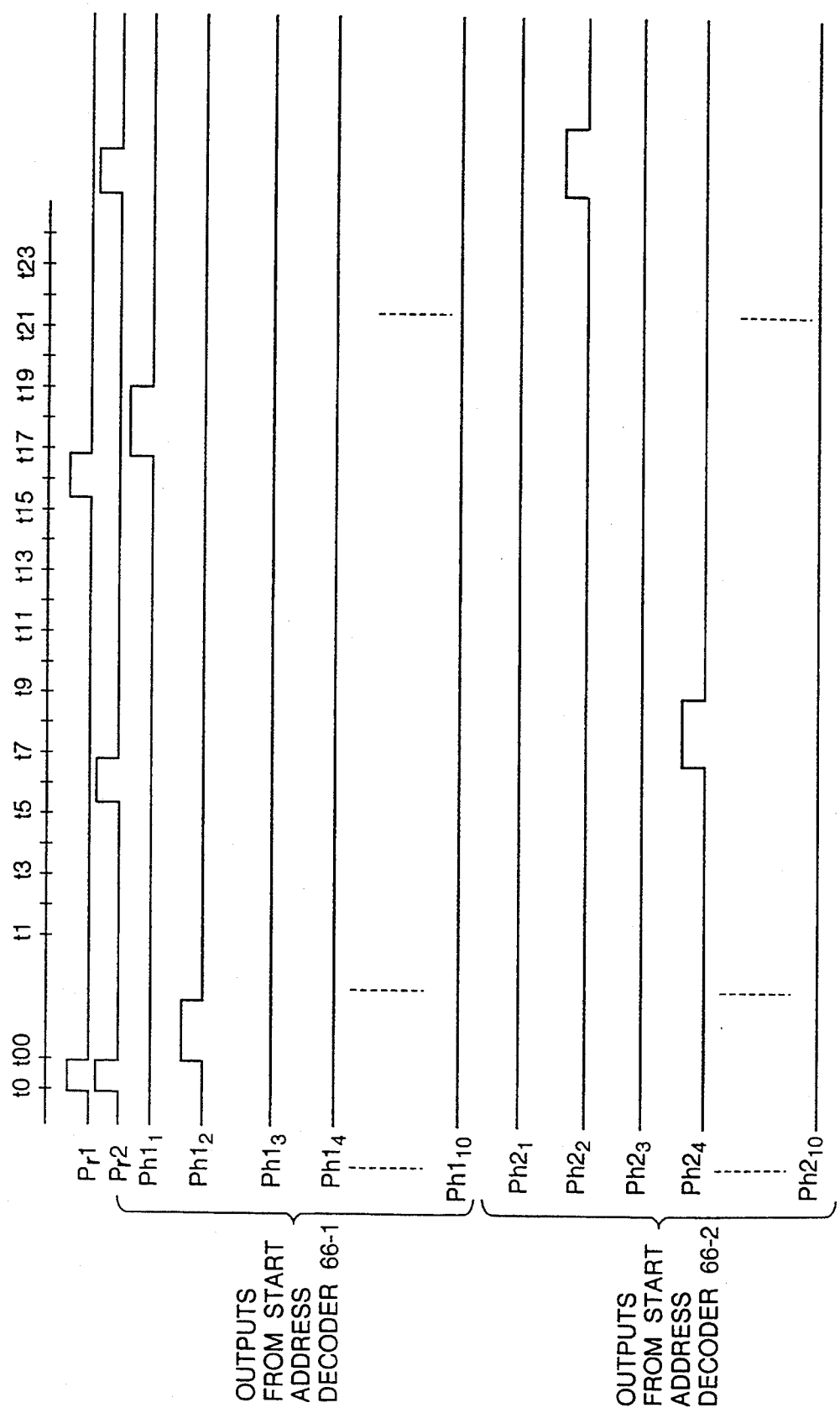
FIG. 15 is a timing chart of the serial access memory, the memory bank A1 and the memory bank A2 shown in FIG. 5, FIG. 6 and FIG. 7, respectively.
Figure 16:
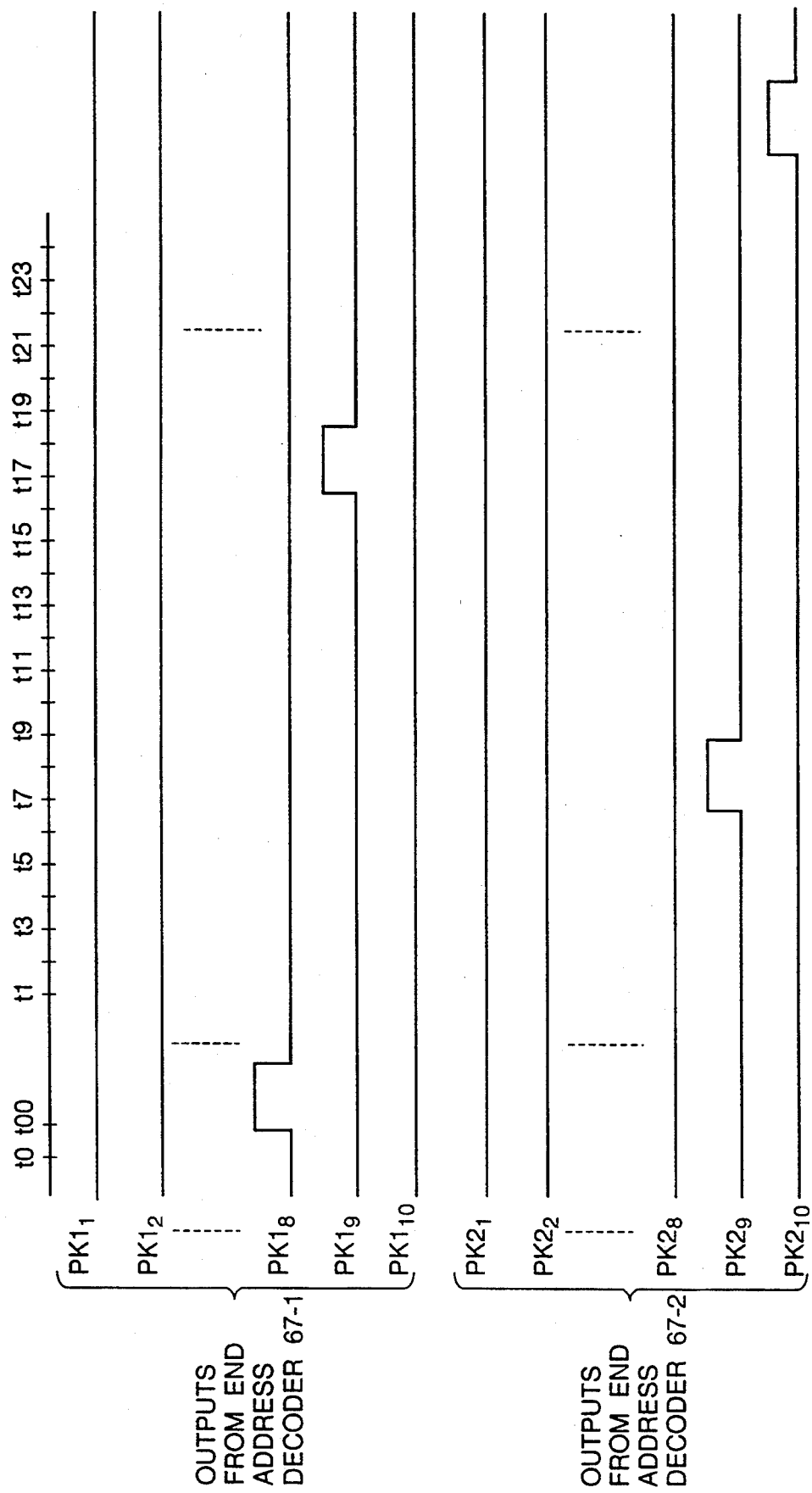
FIG. 16 is another timing chart of the serial access memory, the memory bank A1 and the memory bank A2 shown in FIG. 5, FIG. 6 and FIG. 7, respectively.
Figure 17:
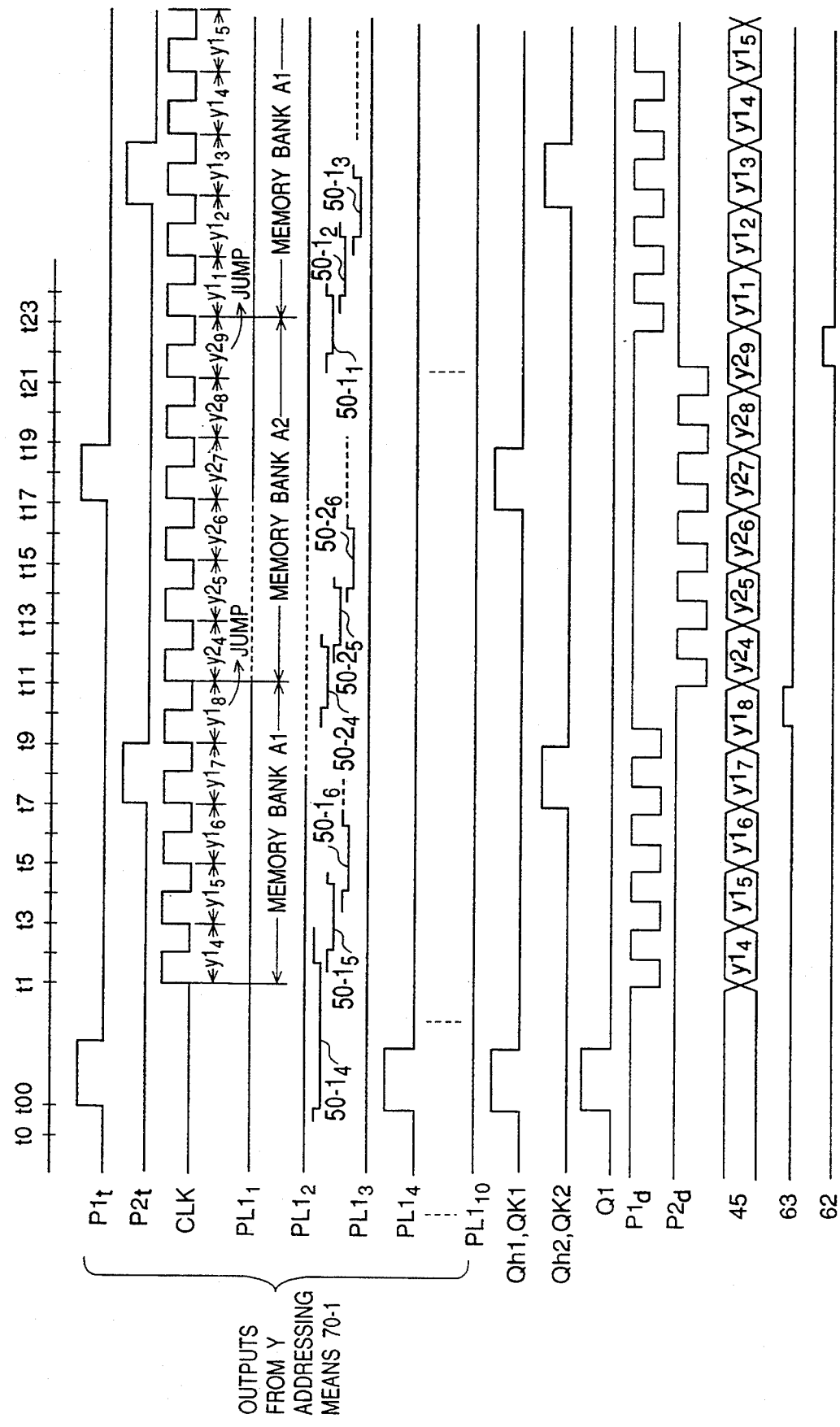
FIG. 17 is a further timing chart of the serial access memory, the memory bank A1 and the memory bank A2 shown in FIG. 5, FIG. 6 and FIG. 7, respectively.

FIG. 10 diagrammatically illustrates operation of the serial access memory of FIG. 5 or FIG. 9 when the total bit number of the data registers 33-1,33-2 has been set, for example, at 20 bits. Symbols $y1_1$ to $y1_{10}, y2_1$ to $y2_{10}$ in FIG. 10 designate addresses. FIG. 11 through FIG. 14 diagrammatically illustrate operation of the pointers 50-1,50-2 in FIG. 10 at times t0 to t24. The master-side output and slave-side output of each of the master-slave F.Fs. $50\text{-}1_i, 50\text{-}2_i$ are indicated by "1" or "0". Symbol "X" in FIG. 11 means "undefined". FIG. 15 through FIG. 17 are timing charts of the serial access memory, the memory bank and the memory bank shown in FIG. 5, FIG. 6 and FIG. 7, respectively.

Upon read access of the serial access memory shown in FIG. 5, memory cell data on the word lines $WL1_i, WL2_i$ selected by the X addressing means 31-1,31-2 are read-transferred to the data registers 33-1,33-2 through the transfer means 32-1,32-2 whenever needed. In this case, when a read access is being effected, for example, on the side of the memory matrix 30-1, a read transfer is performed on the side of the memory matrix 30-2.

It is a characteristic feature of the operation of this embodiment that the shift routes of the pointers 50-1,50-2 can be changed as desired by addressing the start address decoders 66-1,66-2 and the end address decoders 67-1,67-2. Although serial continuous read access is feasible as outputs, actual operations of the F.Fs. $50\text{-}1_i, 50\text{-}2_i$ in the pointers 50-1,50-2 are discontinuous.

For example, upon completion of the access to the hatched registers $33\text{-}1_2$ to $33\text{-}1_8$ (addresses $y1_2$ to $y1_8$) in the data register 33-1 on the side of the memory bank A1 in FIG. 10, the pointer output is not routed to the register $33\text{-}1_9$ (address $y1_9$) but jumps to the hatched register $33\text{-}2_4$ (address $y2_4$) in the data register 33-2 on the side of the memory bank A2, followed by a read access to the registers $33\text{-}2_4$ to $33\text{-}2_9$ (addresses $y2_4$ to $y2_9$) without interruption. When the read access has been completed up to the register $33\text{-}2_9$ (address $y2_9$), the operation continues to an access to any one of the registers $33\text{-}1_1$ to $33\text{-}1_{10}$ on the side of the memory bank A1, said one register having been designated by the start access decoder 66-1 immediately before the completion of the access to the register $33\text{-}2_9$.

The bit length and range of a series of access can be changed by designating them at the start address setting circuits 64-1,64-2 and the end address setting circuits 65-1,65-2. Further, upon starting a read access, the leading address of the serial access can be designated by the Y address outputs 70-1,70-2. A start address in the data register 33-1 on the side of the memory bank A1 is selected by the start address decoder 66-1 and is stored in the start address setting circuit 64-1. An end address is selected by the end address decoder 67-1 and is stored in the end address setting circuit 65-1.

The lines 62,63 in FIG. 6 and FIG. 7 are transfer routes for pointer outputs. As indicated by solid lines in FIG. 10, shift signals from the pointers 50-1,50-2 travel therethrough. It is FIG. 11 through FIG. 14 that illustrate this operation along an advance of the clock CLK. Read operations (1) to (10) in various parts at times t0,t00 to t24 will hereinafter be described with reference to FIG. 15 through FIG. 17.

(1) Time t0

At time t0, the latches $64\text{-}1_i, 64\text{-}2_i, 65\text{-}1_i, 65\text{-}2_i$ (i=1 to n) which make up the start address setting circuits 64-1,64-2 and the end address setting circuits 65-1,65-2, respectively, are reset by reset signals Pr1,Pr2 so that their outputs are all rendered to low level (hereinafter called "L"). At this time, the data of the registers $33\text{-}1_i, 33\text{-}2_i$ in the data registers 33-1,33-2 are undefined.

(2) Time t00

At time t00, certain word lines $WL1_i$ have already been selected by the X addressing means 31-1 on the side of the memory bank A1. Upon changing of the signal $P1_t$ to high level (hereinafter called "H"), data of selected memory cells are transferred in parallel from the memory column units $a1_i$ (i=1 to n) to the data register 33-1 via the transfer means 32-1.

Here, the latch signal Qh1 is inputted to the start address decoder 66-1 while the latch signal Qk1 is inputted to the end address decoder 67-1. As a consequence, the outputs $Ph1_2, Pk1_8$ of the latches $66\text{-}1_2, 67\text{-}1_8$ are rendered "H" and then latched in the latches $64\text{-}1_2, 65\text{-}1_8$, whereby the outputs of the latches $64\text{-}1_2, 65\text{-}1_8$ are held in the "H" state.

Further, at time t00, the latch signal QL becomes "H" so that, for example, the output $PL1_4$ in the Y addressing means 70-1 is rendered "H". The other outputs of the Y addressing means 70-1 are "L" whereby "1" is written only to the F.F. $50\text{-}1_4$ in the pointer 50-1. Then, only the output of the F.F. $50\text{-}1_4$ in the pointer 50-1 becomes "L" whereas the outputs of the other F.Fs. $50\text{-}1_i$ are all rendered "H". When the output of the F.F. $50\text{-}1_4$ changes to "L", the register $33\text{-}1_4$ in the data register 33-1 becomes the leading bit of the serial access. Namely, it is only the output of the F.F. $50\text{-}1_4$ at the address to be lead-addressed that becomes "L". Subsequently, in accordance with the clock signal CLK, the output "L" of the F.F. $50\text{-}1_4$ sequentially advances in the order of F.F. $50\text{-}1_5 \rightarrow$ F.F. $50\text{-}1_6 \rightarrow \ldots$ Data which can be read-accessed in the registers $33\text{-}1_i$ are those of the registers $33\text{-}1_2$ to $33\text{-}1_8$ because the outputs of the latches $64\text{-}1_2, 65\text{-}1_8$ are "H". The leading bit is however the resister $33\text{-}1_4$, so that the read access is executed in the order of registers $33\text{-}1_4 \rightarrow 33\text{-}1_5 \rightarrow 33\text{-}1_6 \rightarrow 33\text{-}1_7\ 33\text{-}1_8$. During this series of serial access cycles, neither the register $33\text{-}1_2$ nor the register $33\text{-}1_3$ are read-accessed.

(3) Time t1

Figure 11:
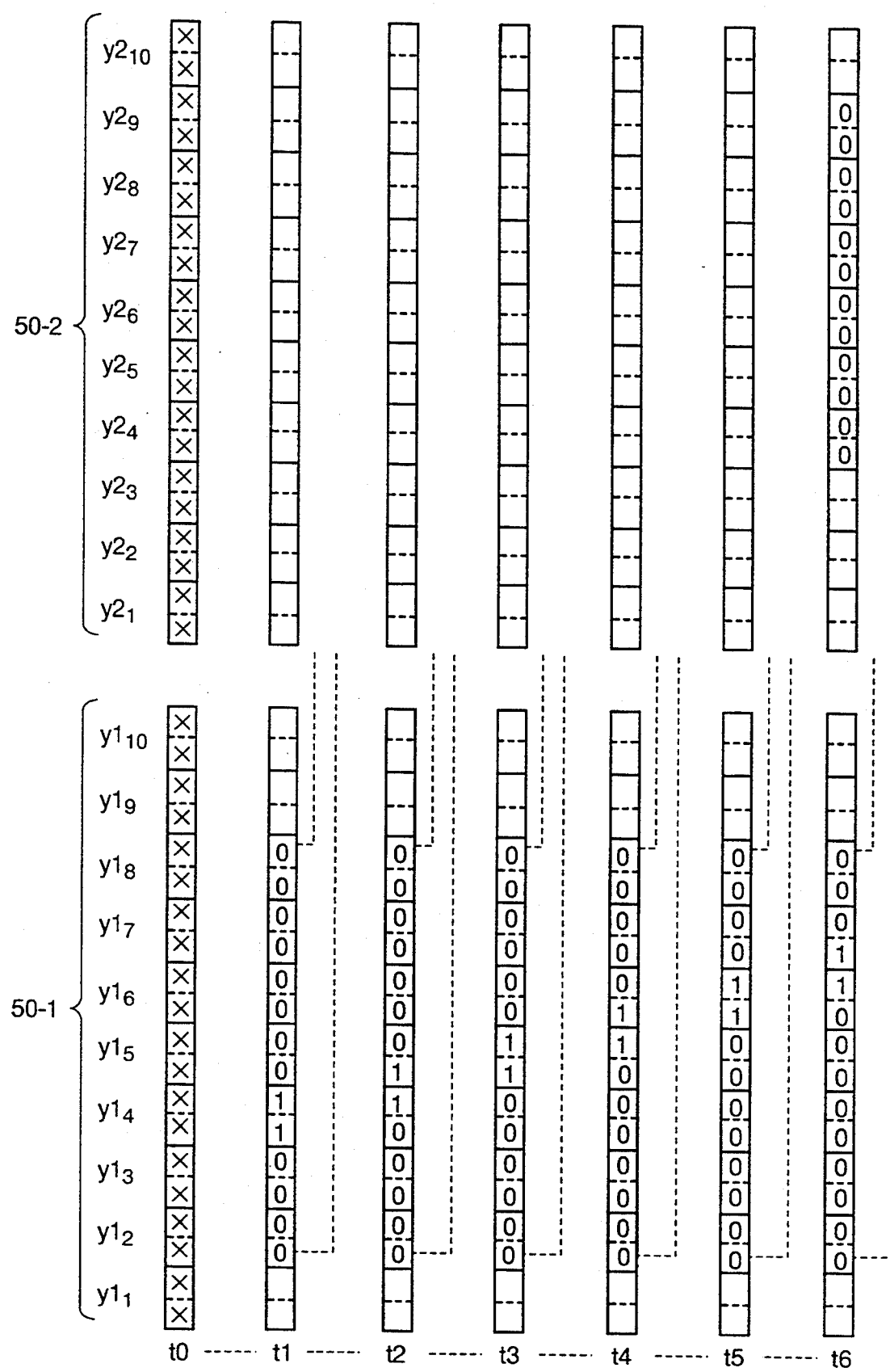
FIG. 11 diagrammatically shows operations of pointers in FIG. 10.

At time t1, the output of the F.F. $50\text{-}1_4$ is "L" on both the master and slave sides and the signal $PL_d$ becomes "L". The transistor $42\text{-}1_4$ is therefore rendered conductive so that the data stored in the register $33\text{-}1_4$ are transferred to the data bus 45. At time t1, as is illustrated in FIG. 11, the F.F. $50\text{-}1_4$ at the address $y1_4$ are held at "1" at both the master and slave sides and the other F.Fs. are all set at "0".

(4) Time t2

At time t2, the clock signal CLK becomes "L". At this time, the master-side output changes from "1" to "0" in the F.F. $50\text{-}1_4$ at the address $y1_4$ so that the master-side output of the F.F. $50\text{-}1_5$ at the address $y1_5$ changes to "1". As a result, it looks, when viewed from the whole F.Fs of the pointer 50-1, as if the F.Fs have advanced half a cycle. When the master-side output of the F.F. 50-1$_5$ changes to "1", the output of the F.F. 50-1$_5$ becomes "L" while that of the F.F. 50-1$_4$ turns to "H".

The above operation takes place because the signal P1$_d$ changes to "L" in synchronization with the rise of the clock signal CLK at time t3 and, before the data of the register 33-1$_5$ are transferred to the data bus 45, the pointer 50-1 is beforehand advanced half a cycle to unable a high-speed serial access.

(5) Time t3

At time t3, the clock signal CLK changes to "H" and in synchronization with this change, the signal p1$_d$ becomes "L". Since the output of the F.F. 50-1$_5$ has been "L" from half a cycle ago, the transistor 42-1$_5$ is rendered conductive so that the data of the resister 33-1$_5$ are transferred to the data bus 45.

(6) Times t4 to t6

Operations similar to the above-described operations at times (4) to (5) are conducted in synchronization with "H" and "L" of the clock signal CLK, whereby the data of the succeeding registers 33-1$_6$,33-1$_7$,33-1$_8$ are transferred to the data bus 45.

(7) Time t7

At a desired time during the read access on the side of the memory bank A1, for example, around t7, certain word lines WL2$_i$ on the side of the memory bank A2 are selected by the X addressing means 31-2 to carry out preparation for transferring memory cell data to the data register 33-2 upon movement of an output of the pointer 50-1 to the pointer 50-2.

Figure 12:
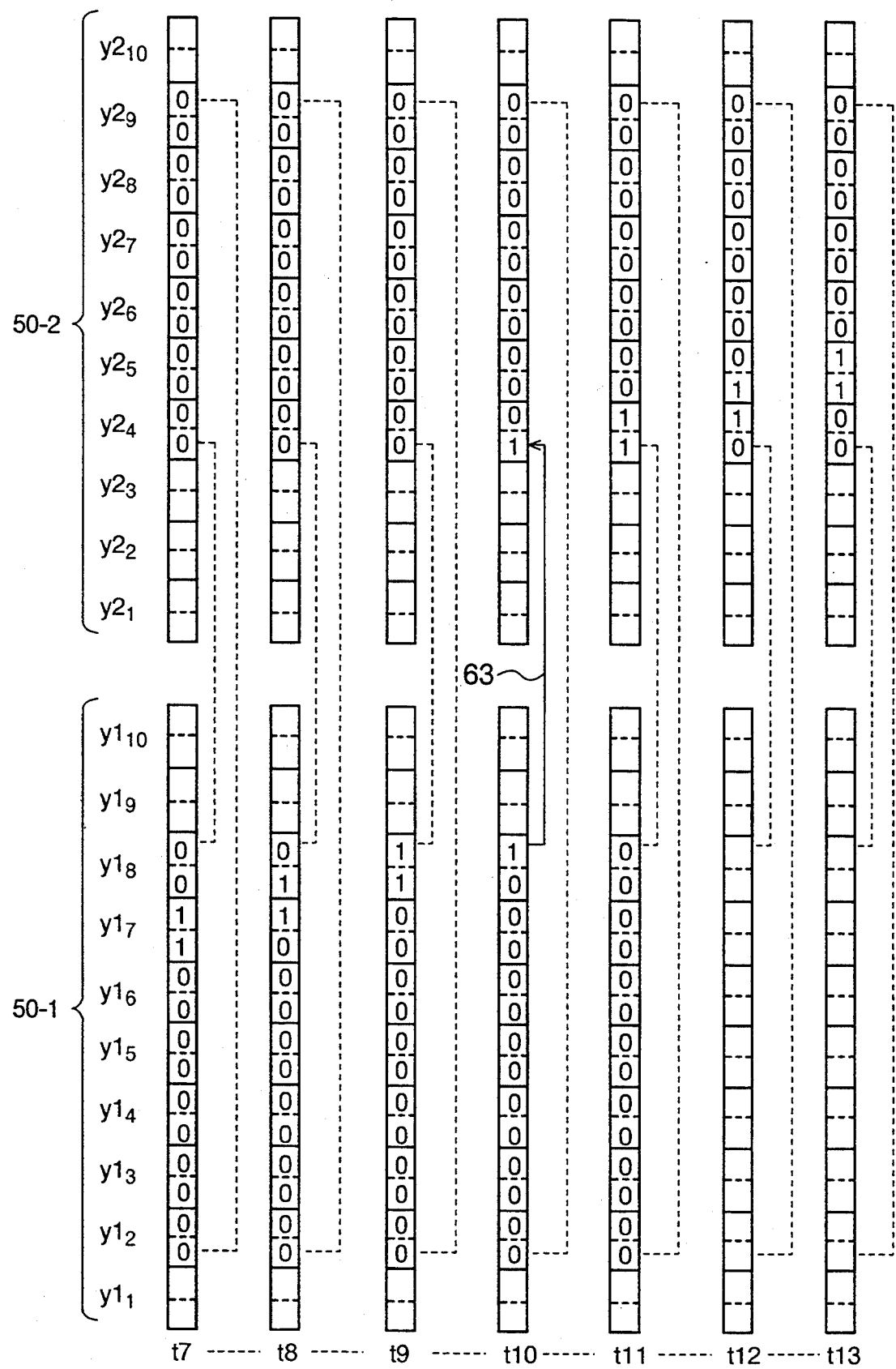
FIG. 12 diagrammatically illustrates operations of the pointers in FIG. 10.
Figure 13:
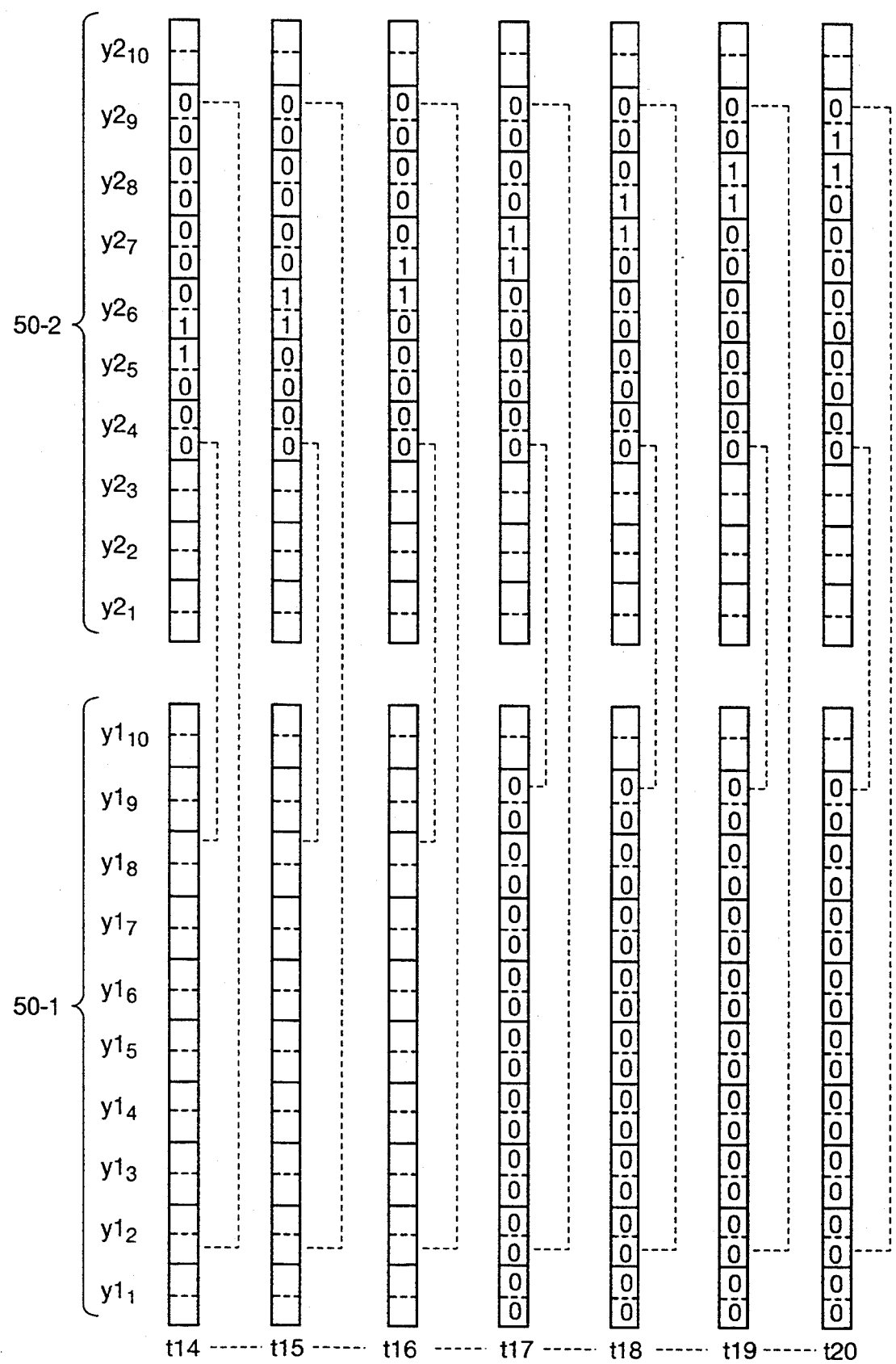
FIG. 13 diagrammatically illustrates operations of the pointers in FIG. 10.
Figure 14:
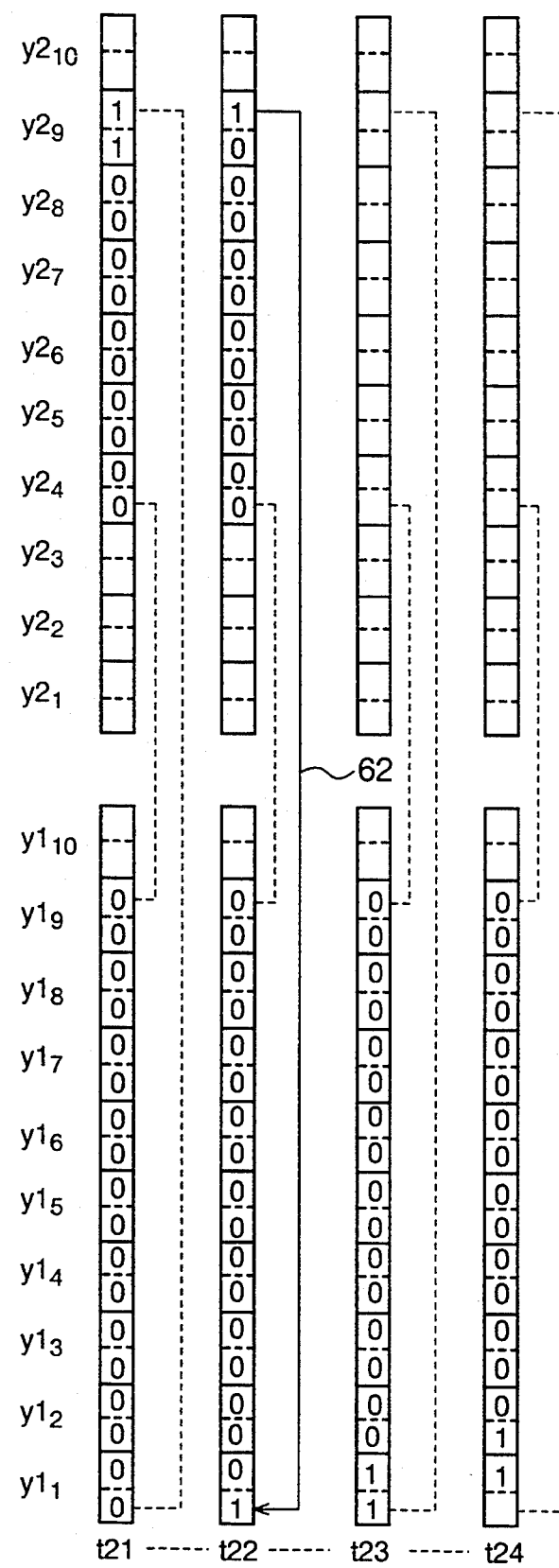
FIG. 14 diagrammatically illustrates operations of the pointers in FIG. 10.

At time t7, the signal P2$_t$ changes to "H" so that data of the memory cells on the side of the memory column units a2$_i$ are transferred in parallel to the data register 33-2 through the transfer means 32-2. Here, the latch signal Qh2 is inputted to the start address decoder 66-2 while the latch signal Qk2 is inputted to the end address decoder 67-2. The outputs of the latches 64-2$_4$,67-2$_9$, for example, are thus rendered "H". As a result, only the outputs of the latches 64-2$_4$,65-2$_9$ become "H" and this "H" state is held. The outputs of the other latches 66-2$_i$,67-2$_i$ are "L". The output of the latch 65-2$_4$ renders the transistor 61-2$_{41}$ conductive while that of the latch 65-2$_4$ makes the transistor 61-2$_{92}$ conductive, whereby the routes for pointer outputs have been set as depicted in FIG. 12. Before the setting of the routes of the pointer outputs, the start address setting circuits 64-1,64-2 and the end address setting circuits 65-1,65-2 are reset every time by the reset signals Pr1,Pr2.

(8) Time t10

The clock signal CLK becomes "L" at time t10, whereby a pointer output from the slave side of the F.F. 50-1$_8$ at the address y1$_8$ is transferred to the line 63 through F.F. 61-1$_{82}$ and is then inputted to the master side of the F.F. 50-2$_4$ at the address y2$_4$ via the F.F. 61-2$_{41}$. As a consequence, the pointer output has moved from 50-1 to 50-2. Thereafter, as in (4) to (5) described above, the data of the registers 33-2$_4$,33-2$_5$, . . . are transferred to the data bus 45 in synchronization of the timing of "L" of the signal P2$_d$.

(9) Time t17

At time t17, it is determined, by a similar operation as in (2) described above, which range of registers in the data register 33-1 on the side of the memory bank A1 should be read-accessed. FIG. 15 and FIG. 16 illustrate one example in which the outputs of the latches 66-1$_1$,67-1$_1$ are rendered "H". In this case, the data of the registers 33-1$_1$,33-1$_9$ can be read-accessed and the routes of transfer of pointer outputs become similar to those shown at time t17 in FIG. 13. On the side of the memory bank A1, memory cell data on the word lines WL1$_i$ selected by the X addressing means 31-1 are transferred in parallel to the data register 33-1 via the transfer means 32-1.

(10) Time t21

At time t21, the data of the register 33-2$_9$ at the address y2$_9$ are transferred to the data bus 45 upon fall of the signal P2$_d$. At the next time t22, a sleeve-side output of the F.F. 50-2$_9$ at the address y2$_9$ is transferred as a pointer output to the side of the pointer 50-1 through the line 62 and the register 33-1$_1$ is selected by the next cycle of the clock signal CLK.

By such a circuit operation, the data of the data registers 33-1,33-2 are serially outputted to the data bus 45 along designated pointer routes in accordance of "H" and "L" of the clock signal CLK.

The read access operation has been described above. A write operation is feasible by substantially the same operation provided that transfer of data from the data registers 33-1,33-2 to memory column units a1$_i$,a2$_i$ are conducted in memory matrix regions, the access to which has been completed, in accordance with signals P1$_t$,P2$_t$. Incidentally, it is not absolutely necessary to reset the start addresses and the end addresses of the pointers 50-1,50-2 every time by the start address setting circuits 64-1,64-2 and the end address setting circuits 65-1,65-2. Once data are latched in the start address setting circuits 64-1,64-2 and the end address setting circuits 65-1,65-2, the routes of movement of pointer outputs are always maintained in the same state so that a cyclic access is possible.

The present embodiment has such merits as will be described next.

The provision of the serial address controls 60-1,60-2 makes it possible to externally control the routes for pointer outputs as desired so that the series of F.Fs. 50-1$_i$,50-2$_i$, which make up the first and second pointers 50-1,50-2 adapted to generate serial addresses, can be designated only over desired ranges. It is hence possible to fetch a certain group of data from a serially continuous set of data and then to output them at a high speed, leading to a substantial improvement in the performance of a serial access memory.

Second Embodiment

Figure 18:
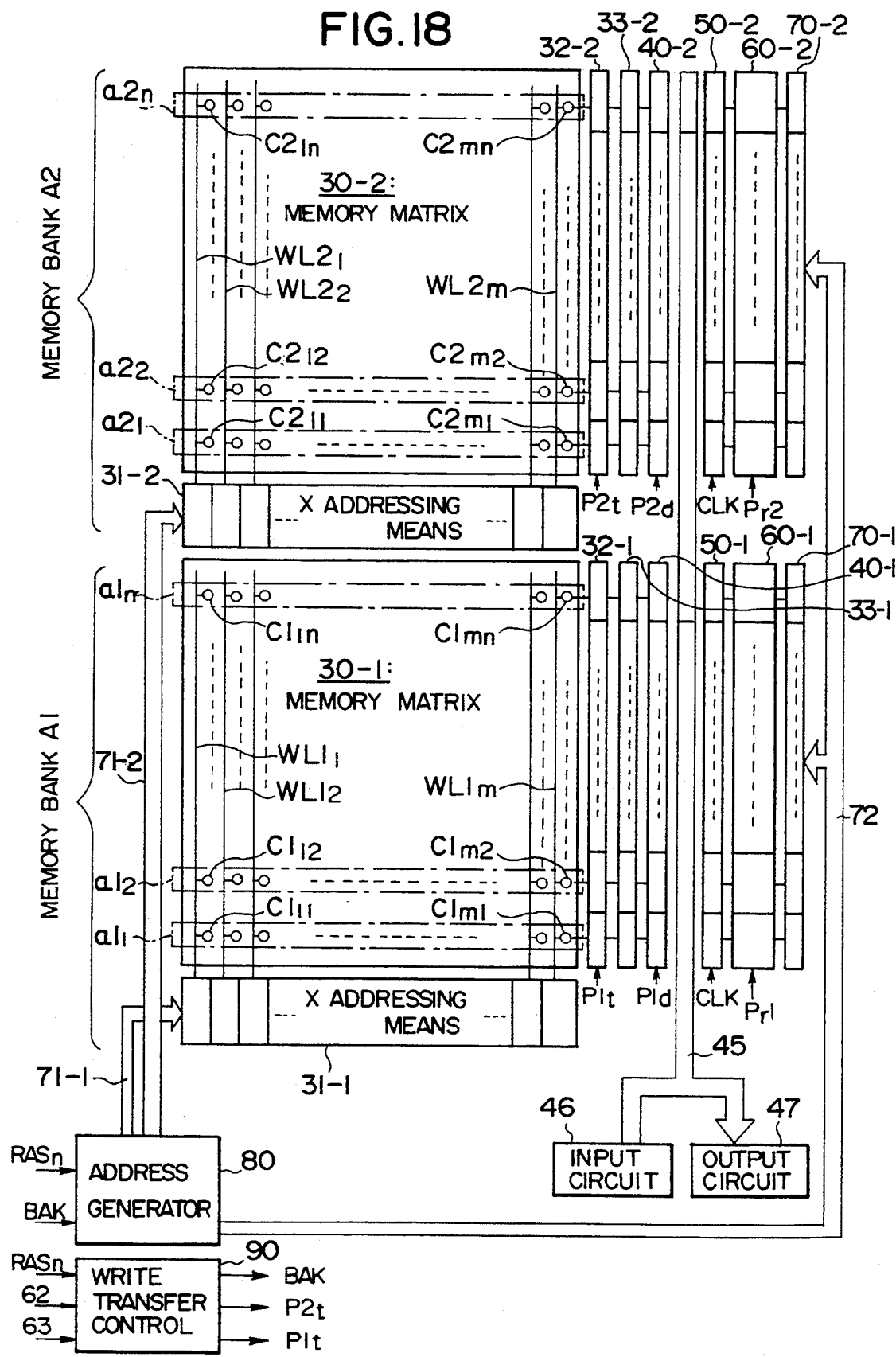
FIG. 18 is a simplified block diagram of a serial access memory according to a second embodiment of the present invention.

FIG. 18 is a block diagram of a serial access memory according to the second embodiment, in which elements common to those in FIG. 5 are designated by like reference symbols.

The serial access memory is provided, instead of the address generator 73 in FIG. 5, with another address generator 80 whose circuit construction is different from that of the address generator 73 and is additionally provided with a write transfer control 90.

The address generator 80 generates activated X addresses and Y addresses according to inverted X address strobe RAS$_n$ and switches the X addresses to the side of the memory bank A1 or the memory bank A2 by a point signal BAK. The X addresses on the side of the memory bank A1 are fed to the first X addressing means 31-1 through the X address bus 71-1, while the X addresses on the side of the memory bank A2 are supplied to the second X addressing means 31-2 through the X address bus 71-2. Further, the Y addresses generated by the address generator 80 are fed to Y addressing means 70-1,70-2 through the Y address bus 72.

The write transfer control 90 is activated by the signal $RAS_n$ and, based on the pointer outputs from the first and second lines 62,63 in FIG. 6, outputs a point signal BAK and signals $P1_t,P2_t$, the latter signals being to be supplied to the first and second transfer means 32-1,32-2 for on-off control thereof, so that the write transfer control 90 has a function to control write transfer.

Figure 19:
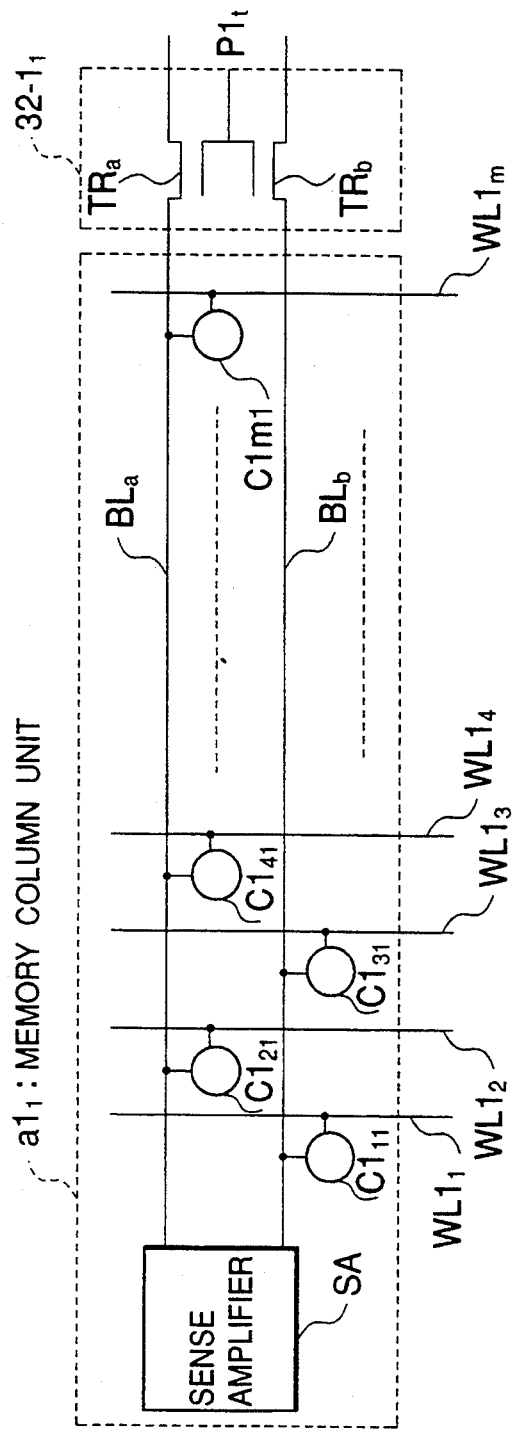
FIG. 19 is a circuit diagram of each memory column unit in FIG. 18.

FIG. 19 is a circuit diagram showing an illustrative construction of a memory column unit, for example, the memory column unit $a1_1$ in FIG. 18.

As the memory column unit $a1_1$, a dynamic RAM is shown by way of example. Memory cells $C1_{i1}$ (i=1 to n) are connected at intersections between the word lines $WL1_i$ (i=1 to n) and complementary bit lines $BL_a,BL_b$. Connected to the bit lines $BL_a,BL_b$ is a sense amplifier SM which serves to detect and amplify each read data.

The bit lines $BL_a,BL_b$ are connected to a switch $32-1_1$ in the first transfer means 32-1. The switching means $32-1_1$ is composed, for example, of transistors $TR_a,TR_b$ which are on-off controlled by the signal $P1_t$.

Figure 20:
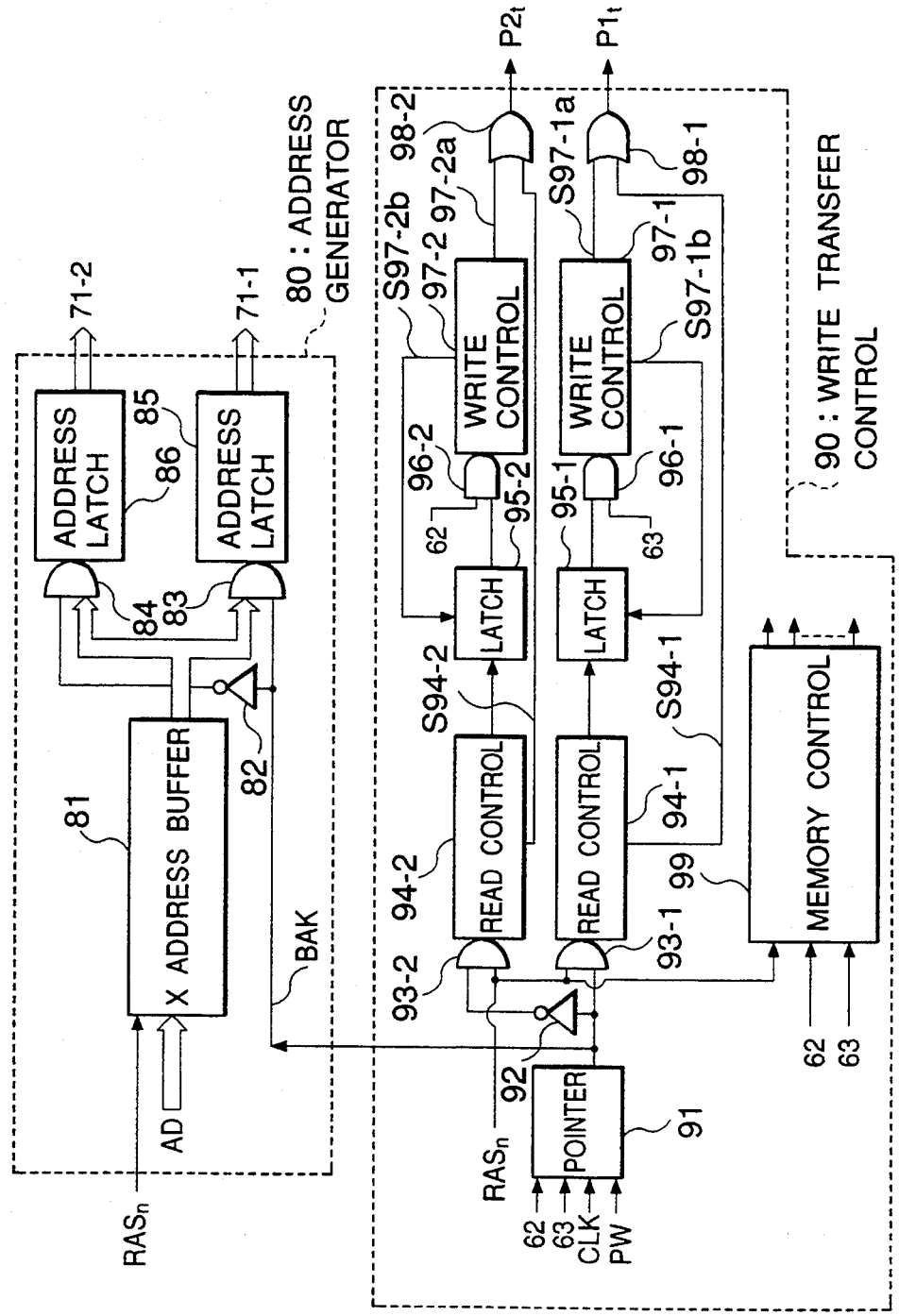
FIG. 20 is a block diagram of an address generator and a write transfer control in FIG. 18.

FIG. 20 is a block diagram of the address generator 80 and the write transfer control 90 in FIG. 18.

The address generator 80 has an X address buffer 81 which is activated by the signal $RAS_n$ to input X addresses out of addresses AD. Connected to the output side of the X address buffer 81 are an AND gate 83 on-off controlled by the point signal BAK and another AND gate 84 on-off controlled by an inverted signal produced as a result of inversion of the point signal BAK by an inverter 82.

By the AND gates 83,84, outputs of the X address buffer 81 are changed over so that X addresses on the side of the memory bank A1 are latched in an address latch 85 and X addresses on the side of the memory bank A2 are latched in an address latch 86. Connected to the output sides of the address latches 85,86 are X address buses 71-1,71-2, respectively.

Although not illustrated in the block diagram, the address generator 80 is also internally provided with a circuit which latches Y addresses out of the addresses AD and outputs them to the Y address bus 72.

The write transfer control 90 has a pointer 91. To the output side of the pointer 91, read controls 94-1,94-2 on the side of the memory banks A1,A2 are connected via an inverter 92 and AND gates 93-1,93-2.

The pointer 91 has a function to receive pointer outputs, a clock signal CLK and a reset signal PW from the lines 62,63, to decide to which one of the memory banks A1 and A2 the data are transferred, and then to output a point signal BAK as a result of the decision. By this point signal BAK, the AND gate 93-1 is opened or closed. Further, the point signal BAK is inverted by the inverter 92 and the AND gate 93-2 is opened or closed by the signal so inverted. The signal $RAS_n$ is selected by the AND gates 93-1,93-2 and is routed to either one of the read controls 94-1,94-2.

The read controls 94-1,94-2 are activated by the signal $RAS_n$ and output read control signals. To the output sides of the read controls 94-1,94-2, write controls 97-1,97-2 on the side of the memory banks A1,A2 are connected via latches 95-1,95-2 and AND gates 96-1,96-2 which are opened or closed by pointer outputs from the lines 63,62, respectively. The write controls 97-1,97-2 receive outputs from the latches 95-1,95-2 and output write control signals S97-1a,S97-2a and reset signals S97-1b,S97-2b for the latches 95-1,95-2.

The write control signal S97-1a and an output signal S94-1 from the read control 94-1 are subjected to logical sum operation at an OR gate 98-1, whereby a signal $P1_t$ is produced. Likewise, the write control signal S97-2a and an output signal S94-2 from the read control 94-2 are subjected to logical sum operation at an OR gate 98-2 so that a signal $P2_t$ is produced.

The write transfer control 90 is also provided with a memory control 99. The memory control 99 is activated by the signal $RAS_n$ and, based on pointer outputs from the lines 62,63 as inputs thereto, outputs control signals which control all primary memory operations.

The operations (A) of the first embodiment will next be compared with the operations (B) of the second embodiment.

(A) Operations of the First Embodiment

Figure 21:
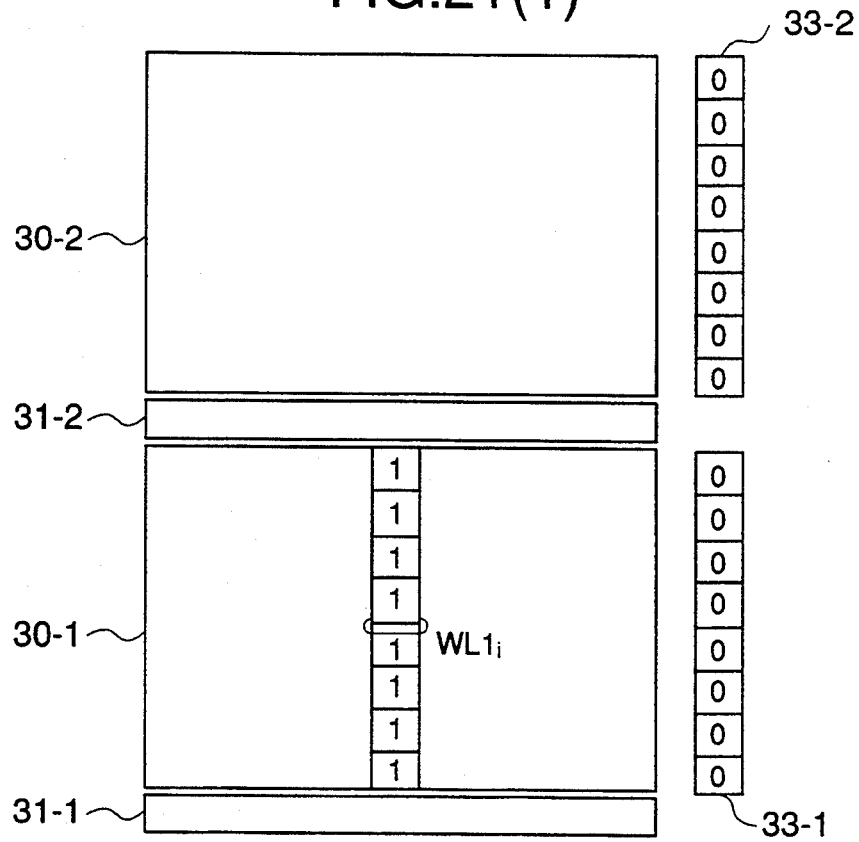
FIG. 21 diagrammatically illustrates a writing operation in the first embodiment of the present invention.
Figure 21:
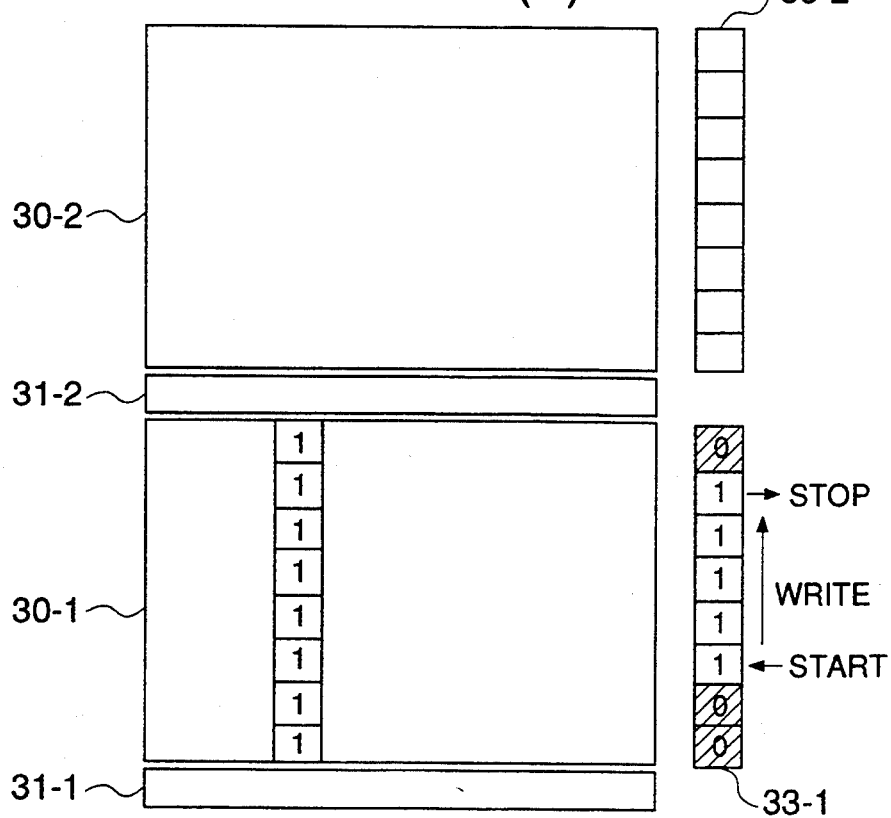
Figure 22:
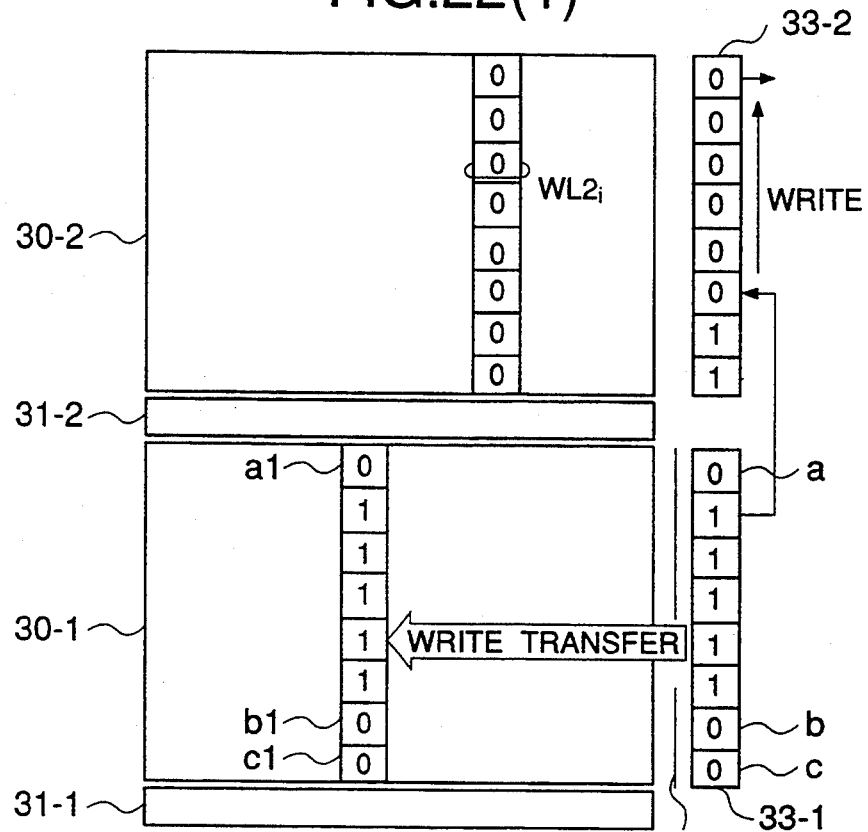
FIG. 22 diagrammatically illustrates another writing operation in the first embodiment of the present invention.
Figure 22:
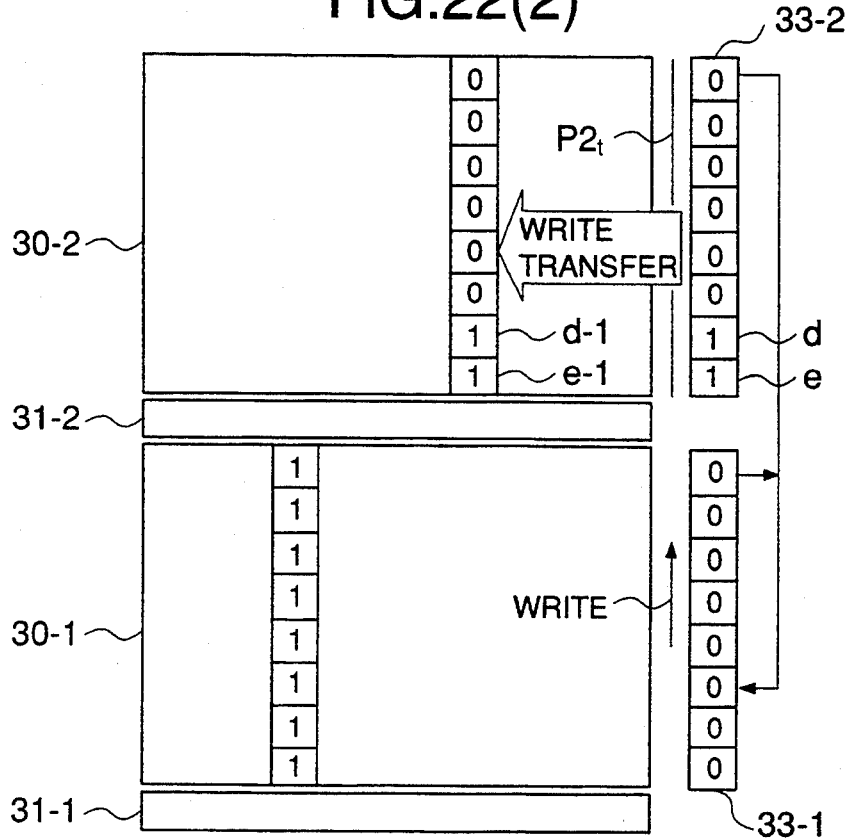

FIG. 21 and FIG. 22 diagrammatically illustrate the write operation of the first embodiment.

A write operation by the access method of the first embodiment develops such inconvenience that the unaccessed data of the data registers 33-1,33-2 are also transferred together with the accessed data to the memory matrices 30-1,30-2.

Namely, as is depicted in FIG. 21(1), the data of memory cells selected by a word line $WL1_i$ are all "1" in the memory matrix 30-1 and "0" is written in all the data registers 33-1,33-2. In FIG. 21(2), an access region of the data register 33-1 is decided and a write operation starts.

In FIG. 22(1), a pointer output moves to the side of the data register 33-2. A word line $WL1_i$ is selected by the X addressing means 31-1, the switching means 32-1 is closed responsive to "H" of the signal $P1_t$, and the data in the data register 33-1, the writing of said data having already been completed, are transferred into the memory cells. At this time, data a,b,c in the data register 33-1, said data a,b,c being not desired to be updated, are also write-transferred to the memory cells so that memory cell data a1,b1,c1 are also updated.

In the write transfer cycle in FIG. 22(2), data d,e in the data register 33-2, said data d,e being not desired to be updated, are also write-transferred as in FIG. 22(1) so that memory cell data d-1,e-1 are updated.

(B) Operations of the Second Embodiment

Figure 24A:
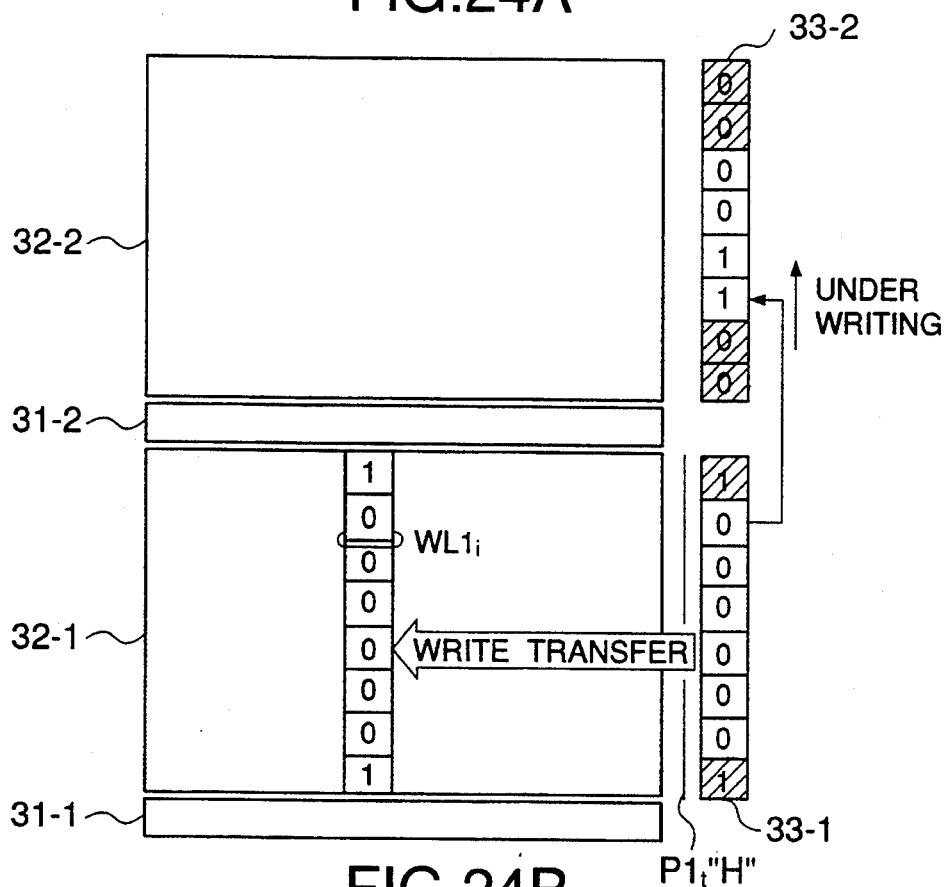
FIG. 24 diagrammatically depicts another writing operation in FIG. 18.
Figure 24B:
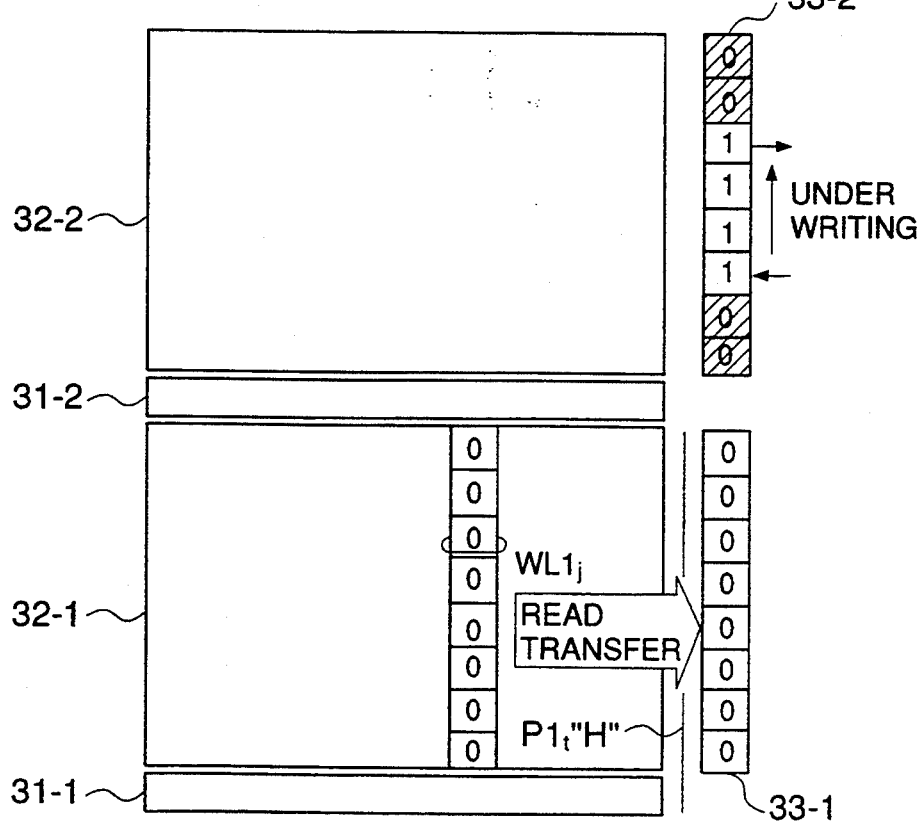
Figure 25:
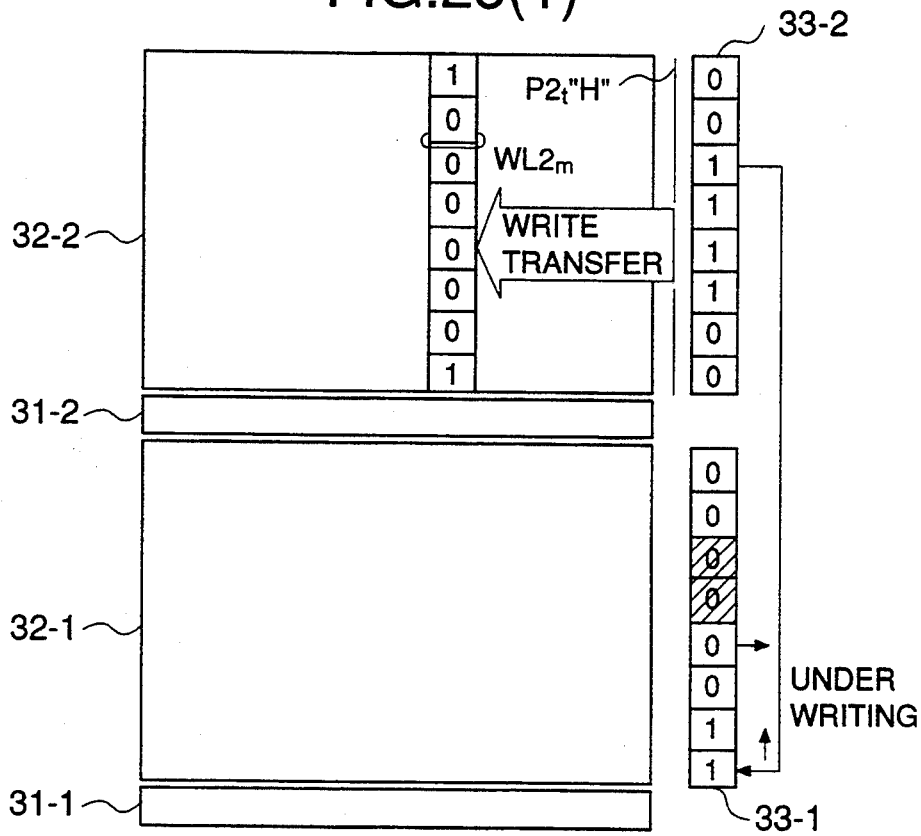
FIG. 25 diagrammatically shows a further writing operation in FIG. 18.
Figure 25:
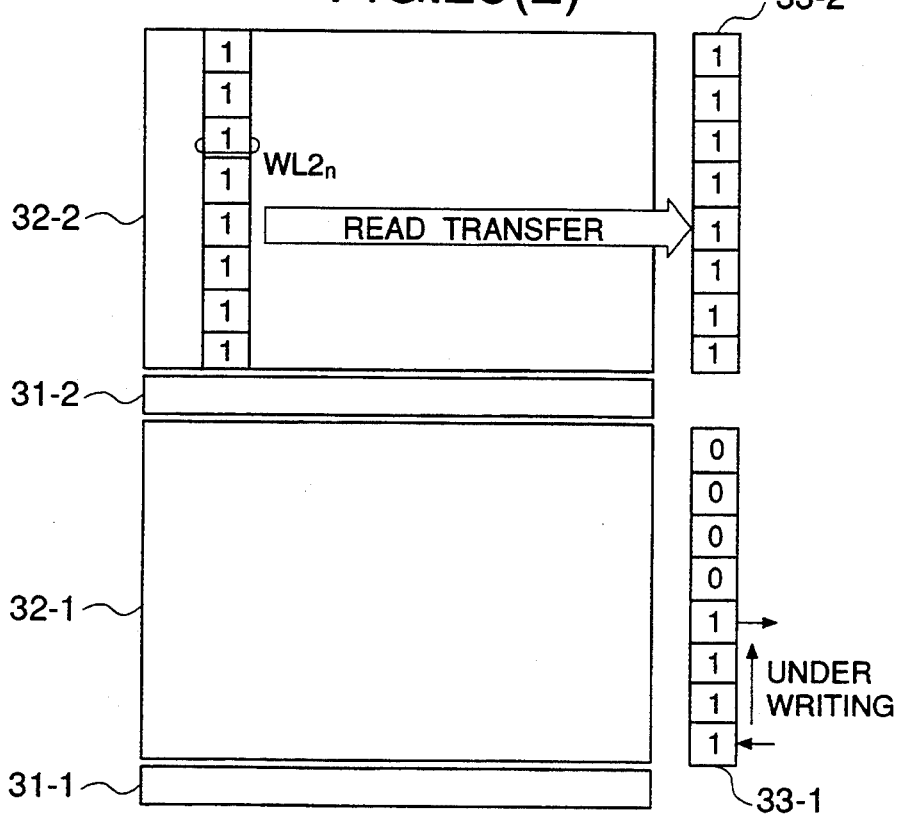
Figure 26:
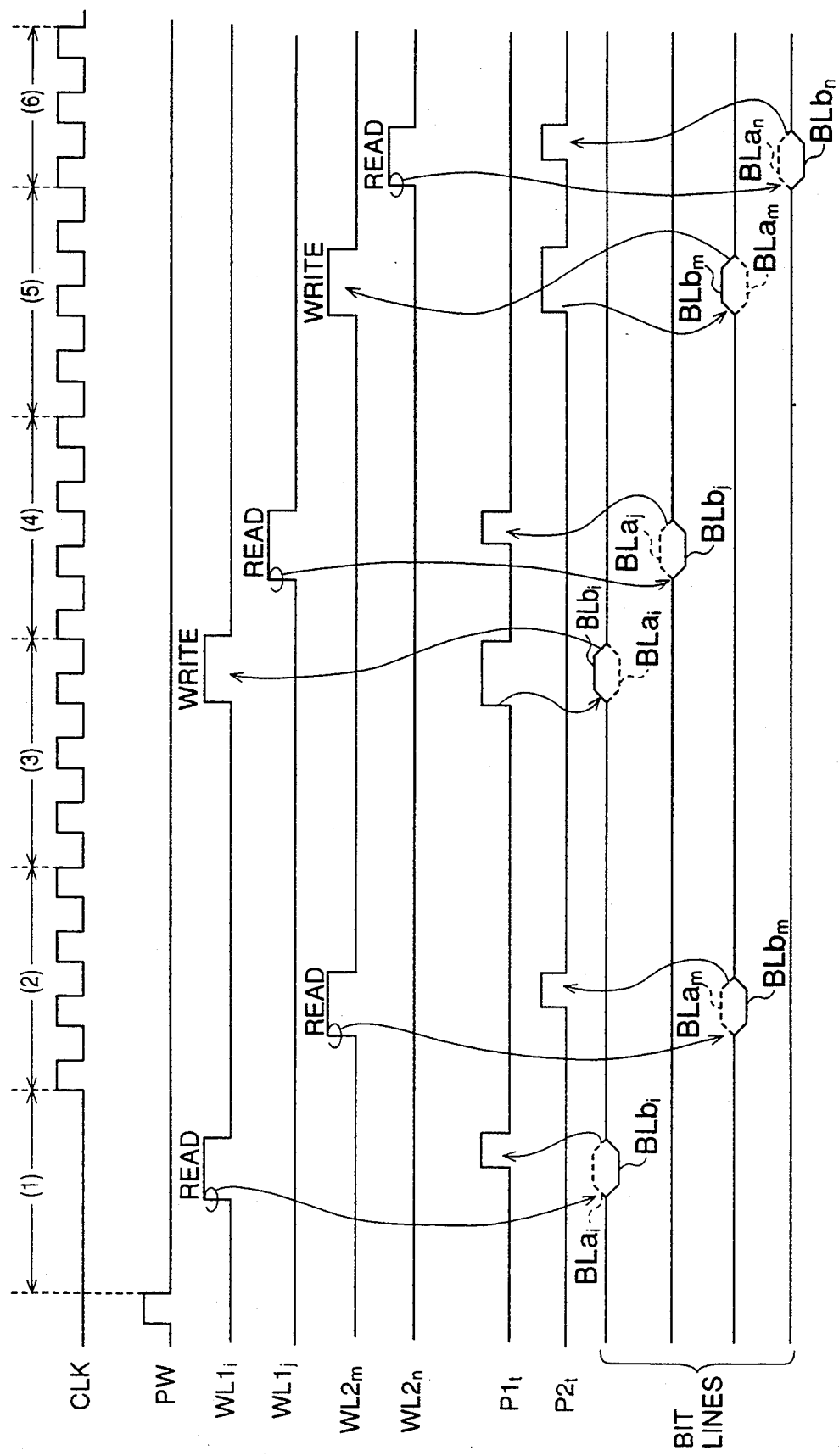
FIG. 26 is a timing chart of the serial access memory in FIG. 18 and of the address generator and write transfer control in FIG. 20.
Figure 27:
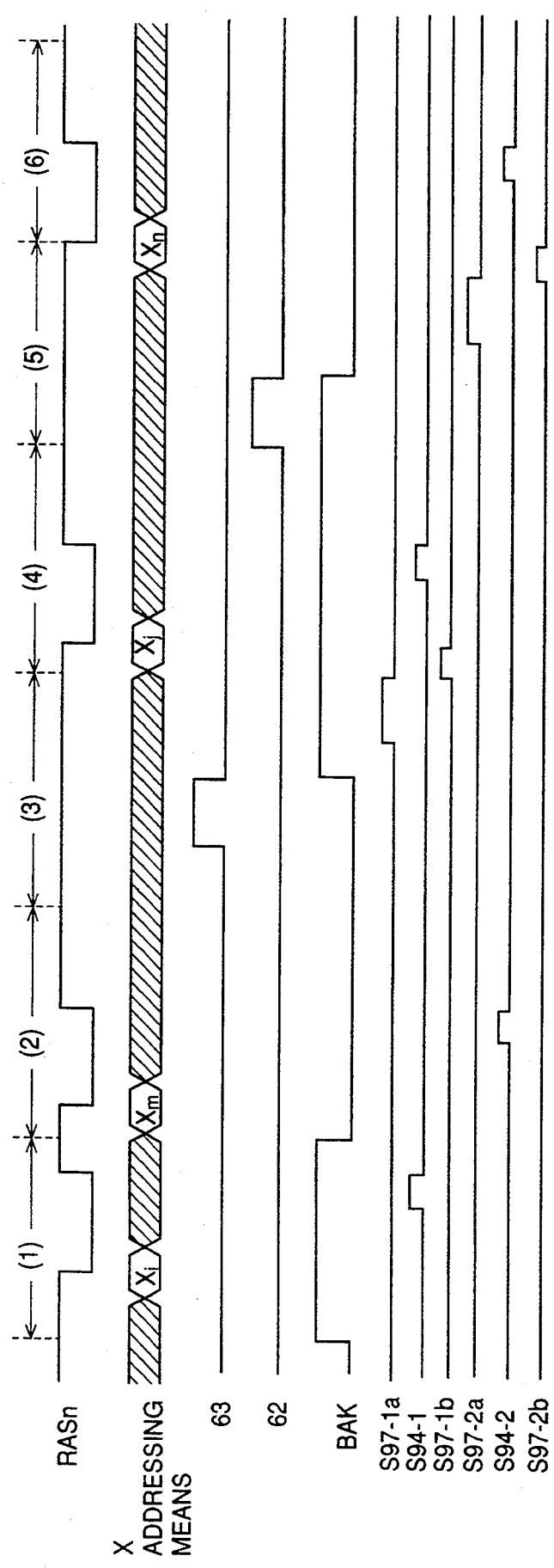
FIG. 27 is another timing chart of the serial access memory in FIG. 18 and of the address generator and write transfer control in FIG. 20.

FIG. 23 and FIG. 25 diagrammatically illustrate the write operation in FIG. 18. FIG. 26 and FIG. 27 are timing charts of the serial access memory in FIG. 18 and FIG. 20. Incidentally, numerals (1) to (6) in lower parts of FIG. 23 to FIG. 25 correspond to periods (1) to (6) on the index lines of clock signals CLK in FIG. 26 and FIG. 27.

Figure 23A:
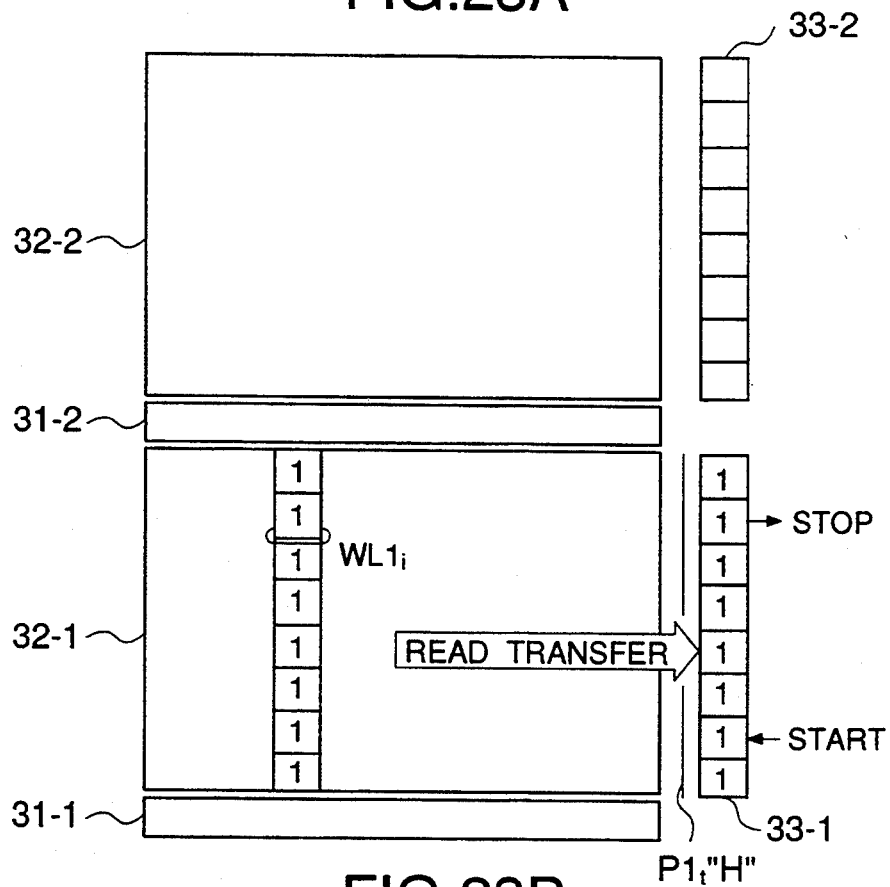
FIG. 23 diagrammatically shows a writing operation in FIG. 18.

(i) FIG. 23A ... (1)

After the pointer 91 in the write transfer control 90 has been reset by the reset signal PW, the point signal BAK outputted from the pointer 91 changes to "H". At the X address buffer 81 in the address generator 80, the X addresses $X_i$ out of the addresses AD is fetched by the signal $RAS_n$. The X addresses $X_i$ so fetched are latched in the address latch 85 via the AND gate 83 which has been opened responsive to "H" of the point signal BAK. The X addresses $X_i$ so latched are routed to the X addressing means 31-1 through the X address bus 71-1.

The X addressing means 31-1 decodes the X addresses $X_i$ and makes the word line $WL1_i$ rise. The data (all "1") stored in the memory cells connected to the word line $WL1_i$ are read out onto the bit lines $BLa_i, BLb_i$, followed by the amplification by the sense amplifier SA in FIG. 19.

When the point signal BAK is rendered "H" on the other hand, the AND gate 93-1 is opened so that the signal $RAS_n$ is inputted to the read control 94-1. Then, the output signal S94-1 of the read control 94-1 is changed to "H" and the output signal $P1_t$ of the OR gate 98-1 becomes "H". At the same time, the output of the read control 94-1 is latched in the latch 95-1 so that the output of the latch 95-1 is rendered "H".

When the signal $P1_t$ becomes "H", the switching means 32-1 is opened and the memory cell data, all "1", are read-transferred to the data register 33-1. The point signal BAK then changes to "L".

Figure 23B:
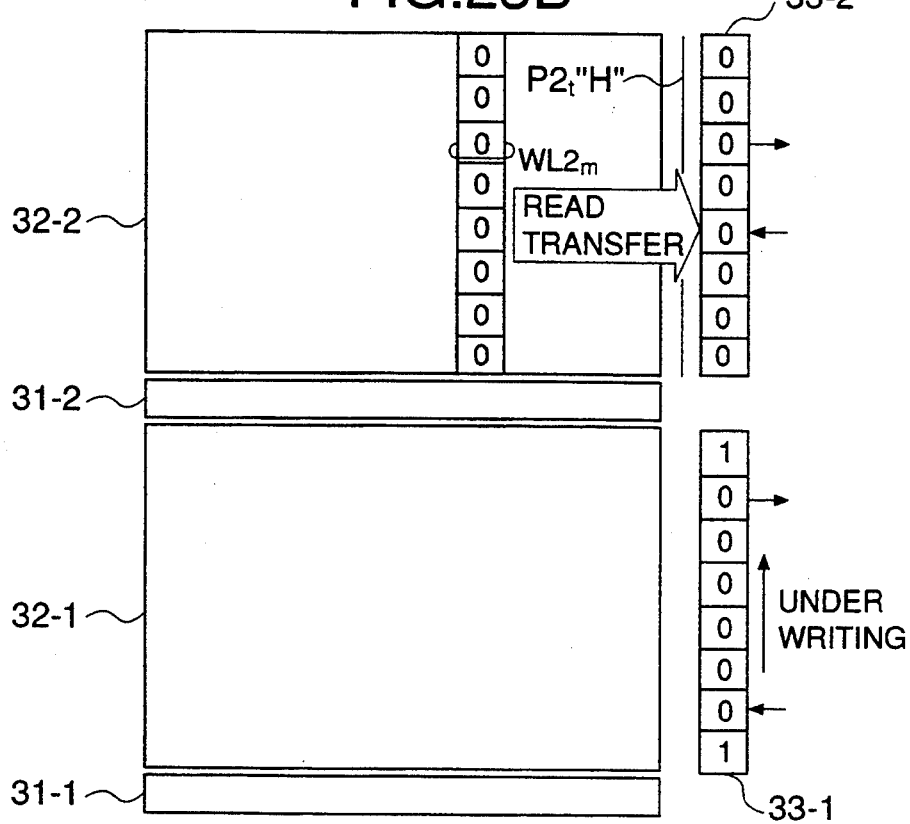

(ii) FIG. 23B ... (2)

By the signal $RAS_n$, the X addresses $X_m$ out of the addresses AD are fetched in the X address buffer 81. The X addresses $X_m$ so fetched are latched in the address latch 86 through the AND gate which has been opened responsive to "L" of the point signal BAK. The X addresses $X_m$ so latched are routed to the X addressing means 31-2 through the X address bus 71-2.

The X addressing means 31-2 decodes the X addresses $X_m$ and makes the word line $WL2_m$ rise. Upon rising of the word line $WL2_m$, the data (all "0") of the memory cells connected to the word line $WL2_m$ are read out onto the bit lines $BLa_m, BLb_m$ and are then amplified by the sense amplifier SA.

Since the point signal BAK is "L" on the other hand, the AND gate 93-2 is opened so that the signal $RAS_n$ is inputted to the read control 94-2. Accordingly, the output signal S94-2 of the read control 94-2 is thus rendered "H" and the output signal $P2_t$ of the OR gate 98-2 is changed to "H". At the same time, the output of the read control 94-2 is latched in the latch 95-2 so that the output of the latch 95-2 becomes "H".

When the signal $P2_t$ becomes "H", the switching means 32-2 is opened so that the memory cell data, all "0", are read-transferred to the data register 33-2. Upon this read transfer, writing is executed responsive to the clock signal CLK to the individual registers at the designated addresses in the data register 33-1.

(iii) FIG. 24A ... (3)

The pointer output from the line 63 becomes "H" and the point signal BAK changes to "H". The X addresses $X_i$ which have been latched in the address latch 85 are then fed to the X addressing means 31-1 so that the same word line $WL1_i$ as in FIG. 23A rises.

On the other hand, the output of the latch 95-1 "H" and the pointer output of the line 63 is "H". The write control 97-1 is therefore activated via the AND gate 96-1. This renders "H" the output signal $S97-1a$ of the write control 97-1 so that the output signal $P1_t$ of the OR gate 98-1 becomes "H". The output signal $S97-1b$ of the write control 97-1 is then rendered "H", whereby the latch 95-1 is reset.

When the transfer means 32-1 opens responsive to "H" of the signal $P1_t$, the writing to the data register 33-1 has already been completed. Upon opening of the transfer means 32-1, the data of the data register 33-1 are therefore write-transferred to the same word line $WL1_i$ as in FIG. 23.

In this write transfer, the register data "1", "1" indicated by hatching in the data register 33-1 are those not to be accessed. These data have already been stored in the corresponding memory cells are written again to the same memory cells by the write transfer. Accordingly, only the register data "0", ..., "0", which are desired to he accessed, are written in the memory cells.

(iv) FIG. 24B ... (4)

The signal $RAS_n$ is rendered "L" an the X addresses $X_j$ are fetched in the X address buffer 81. The X addresses $X_j$ are latched in the address latch 85 through the AND gate 83 which has been opened responsive to "H" of the point BAK. The X addresses $X_j$ so latched are routed to the X addressing means 31-1, whereby the word line $WL1_j$ rises.

The signal $RAS_n$ is inputted to the read control 94-1 through the AND gate 93-1 which has been opened responsive to "H" of the point signal BAK. Then, the output signal S94-1 of the read control 94-1 becomes "H" and the output signal $P1_t$ of the OR gate 98-1 turns to "H", whereby the transfer means 32-1 is opened.

When the transfer means 32-1 is opened, the memory cell data, all "0", selected by the word line $WL1_j$ are read-transferred to the data register 33-1. This is an ordinary read transfer as in the first embodiment. At this time, a writing operation is performed in the data register 33-2.

(v) FIG. 25A, FIG. 25B ... (5), (6)

When the pointer output from the line 62 becomes "H", the pointer signal BAK changes to "L". Since the writing to the data register 33-2 has already been completed at this time, a writing operation to the data register 33-1 is started. On the other hand, the word line $WL2_m$ selected in FIG. 23B rises again, and the transfer means 32-2 is opened responsive to "H" of the signal $P2_t$ so that write-transfer is effected.

In FIG. 25B, read-transfer is thereafter conducted in a similar manner to FIG. 23B on the side of the memory matrix 33-2 as a preparation for the next write to the data register 33-2.

The present embodiment has such merits as will be described next.

Word lines to which memory cells to be written are connected are selected right before a serial write, and the serial write is conducted after read-transferring the data of the memory cells to the data registers 33-1, 33-2 beforehand. Even if a series of serial write is effected to some memory cells in the data registers 33-1, 33-2, data which are not desired to be updated can therefore be retained in the original state after write-transfer.

This embodiment can therefore be used for the following applications. When only a certain region of a displayed image is updated in image processing or a burst access of CPU is executed, for example, the present embodiment is very convenient to conduct a short write over desired 8 bits or 16 bits alone in long serial data so that their data can be updated.

Third Embodiment

Figure 28:
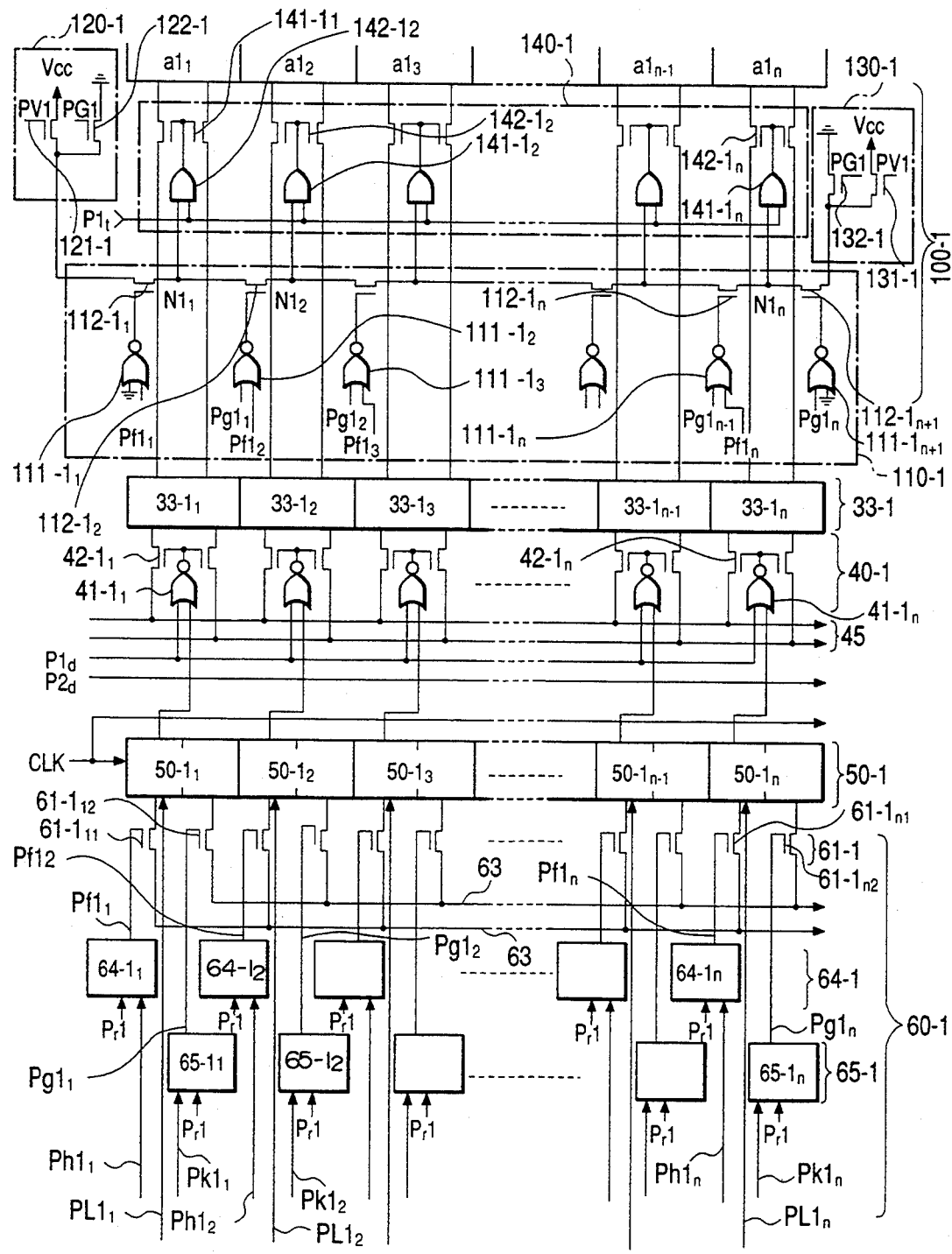
FIG. 28 is a fragmentary circuit diagram on the side of the memory bank A1, showing a third embodiment of the present invention.
Figure 29:
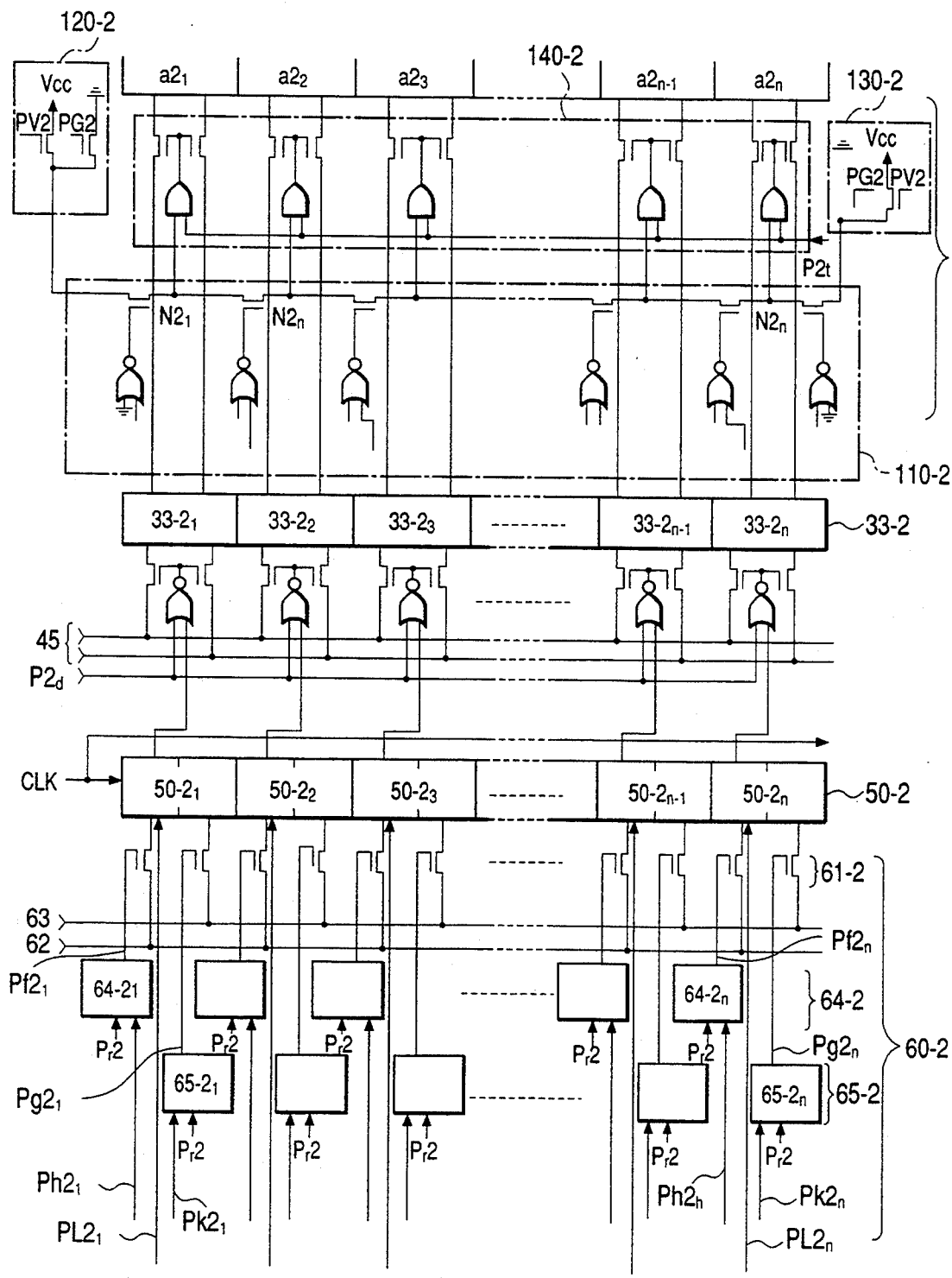
FIG. 29 is a fragmentary circuit diagram on the side of the memory bank A2, showing the third embodiment of the present invention.

FIG. 28 and FIG. 29 illustrate the serial access memory according to the third embodiment. FIG. 28 is a fragmentary circuit diagram on the side of the memory bank A1, while FIG. 29 is a fragmentary circuit diagram on the side of the memory bank A2. Incidentally, elements common to those in FIG. 6 and FIG. 7 are designated by like reference symbols.

In the third embodiment, the serial access memory is constructed to transfer only data, which are desired to be updated, from the data registers 33-1,33-2 to the memory matrices 30-1,30-2 by write transfer only without repeating read transfer→write transfer as in the second embodiment.

Namely, the serial access memory of the present embodiment is provided, instead of the first and second transfer means 32-1,32-2 in FIG. 6 and FIG. 7, with first and second transfer means 100-1,100-2 which are different in circuit construction from the first and second transfer means 32-1,32-2.

The first transfer means 100-1 on the side of the memory bank A1, said transfer means being illustrated in FIG. 28, is composed of a switching control 110-1, charge/discharge circuits 120-1,130-1 and a switching circuit 140-1.

The switching circuit 110-1 has a function to subject each output signal $Pfl_i$ (i=1 to n) of the start address setting circuit 64-1 and its corresponding output signal $Pgl_i$ (i=1 to n) of the end address setting circuit 65-1 to NOR operation and then to output a signal for the selection of a switching circuit from an associated output-side node $N1_i$ (i=1 to n). The switching control 110-1 is composed of an NOR gate 111-1$_1$ for inverting the output signal Pfl$_1$, NOR gates 111-1$_2$ to 111-1$_n$ for subjecting signals Pfl$_2$ to Pfl$_n$ and signals Pgl$_1$ to Pgl$_{n-1}$ to NOR operation, NOR gates 111-1$_{n+1}$ for inverting output signal Pgl$_n$, and switching elements on-off operated by outputs of respective NOR gates 111-1$_1$ to 111-1$_{n+1}$ connected in series via nodes N1$_1$ to N1$_n$ on a signal line, for example, transistors 112-1$_1$ to 112-1$_{n+1}$.

The charge/discharge circuit 120-1 is connected to the side of the nodes N1$_1$ of the transistors 112-1$_1$ to 112-1$_{n+1}$ and has a function to charge or discharge the node $N1_i$ (i=1 to n) on the basis of a charging signal PV1 or a discharging signal PG1. This charge/discharge circuit 120-1 is composed of a charging transistor 121-1 on-off operated by the charging signal PV1 and a charging transistor 122-2 on-off operated by the charging signal PG1. The charge/discharge circuit 130-1 is connected to the side of the nodes N1$_n$ of the transistors 112-1$_1$ to 112-1n+1 and, like the charge/discharge circuit 120-1, is composed of a charging transistor 131-1 and a discharging transistor 132-1.

The switching circuit 140-1 has a function to open or close the connections between memory column units $al_i$ (i=1 to n) and the data register 33-1 on the basis of signals at the nodes $N1_i$ (i=1 to n) and the switching signal P1$_t$. This switching circuit 140-1 is composed of AND gates 141-1$_i$ (i=1 to n) for subjecting the signals at the nodes $N1_i$ (i=1 to n) and the signal P1$_t$ to logical multiplication and plural pairs of transistors 142-1$_i$ (i=1 to n) on-off controlled by outputs from the AND gates 141-1$_i$ to open or close the connections between the memory column units $al_i$ (i=1 to n) and the registers 33-1$_i$ (i=1 to n).

The second transfer means 100-2 on the side of the memory bank A2, said second transfer means being illustrated in FIG. 29, is the same circuit as the first transfer means 100-1 and is composed of a switching control circuit 110-2, charge/discharge circuits 120-2,130-2 and a switching circuit 140-2. The elements of the individual circuits 110-2,120-2,130-2,140-2 are identified by reference symbol "−2" in correspondence to reference symbol "−1" in FIG. 28.

A writing operation will next be described with reference to FIG. 30 to FIG. 33.

Figure 33:
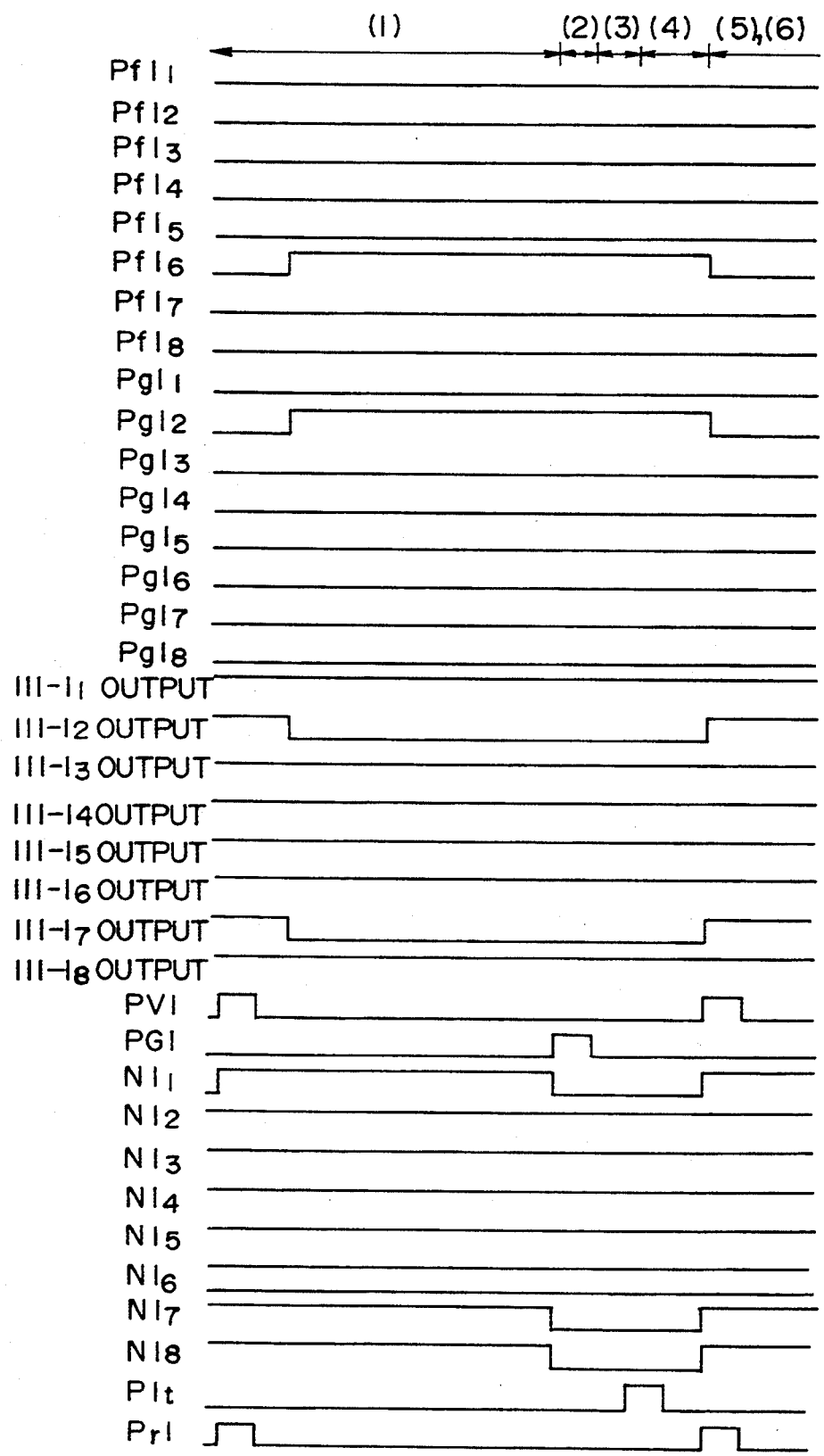
FIG. 33 is a timing chart of the memory bank A1 in FIG. 28.

FIG. 30 to FIG. 32 diagrammatically illustrates a writing operation by the memory banks A1,A2 in FIG. 28 and FIG. 29. Shown in the drawings are column addresses $y1_1$ to $y1_8$,$y2_1$ to $y2_8$ and nodes N1$_1$ to N1$_8$,N2$_1$ to N2$_8$ in the switching controls 110-1,110-2. FIG. 33 is a timing chart of the memory bank A1 in FIG. 28. The periods (1) to (6) in the timing chart correspond to the numerals (1) to (6) in lower parts of FIG. 30 to FIG. 32.

(i) FIG. 30A ... (1)

The reset signal Pr1 is rendered "H" the start address setting circuit 64-1 and the end address setting circuit 65-1 are reset, and their output signals Pfl$_i$,Pgl$_i$ all become "L". As a result, the outputs of the NOR gates 111-1$_i$ (i=1 to n) are all rendered "H" so that the nodes $N1_i$ (i=1 to n) are all rendered conductive.

Assume, for example, a serial write is started from the address yl$_2$ of the memory matrix 30-1. The signal PV1 become "H" concurrently with the reset signal Pr1, so that the respective nodes N1$_1$ to N1$_n$ are charged and all become "H". When the signals Pfl$_6$,Pgl$_2$ are rendered "H", the nodes N1$_2$,N1$_7$ are changed to "L". When the access to the data register 33-1 has been conducted to the address yl$_6$, the next operation is started.

(ii) FIG. 30B ... (2)

Upon completion of the access to the data register 33-1 on the side of the memory matrix 30-1, the pointer output moves to the data register 33-2 on the side of the memory matrix 30-2 so that an access to the data register 33-2 starts. The signal PG1 then becomes "H" and the transistors 122-1,132-1 are rendered conductive, whereby discharge is effected from two directions on the side of the nodes N1$_1$,N1$_n$. Since the NOR gates 111-1,111-7 of the switching control 110-1 are closed, only charges accumulated at the nodes N1$_1$,N1$_7$, N1$_8$ are promptly discharged. The other nodes N1$_2$ to N1$_6$ are held in "H" state.

Figure 31A:
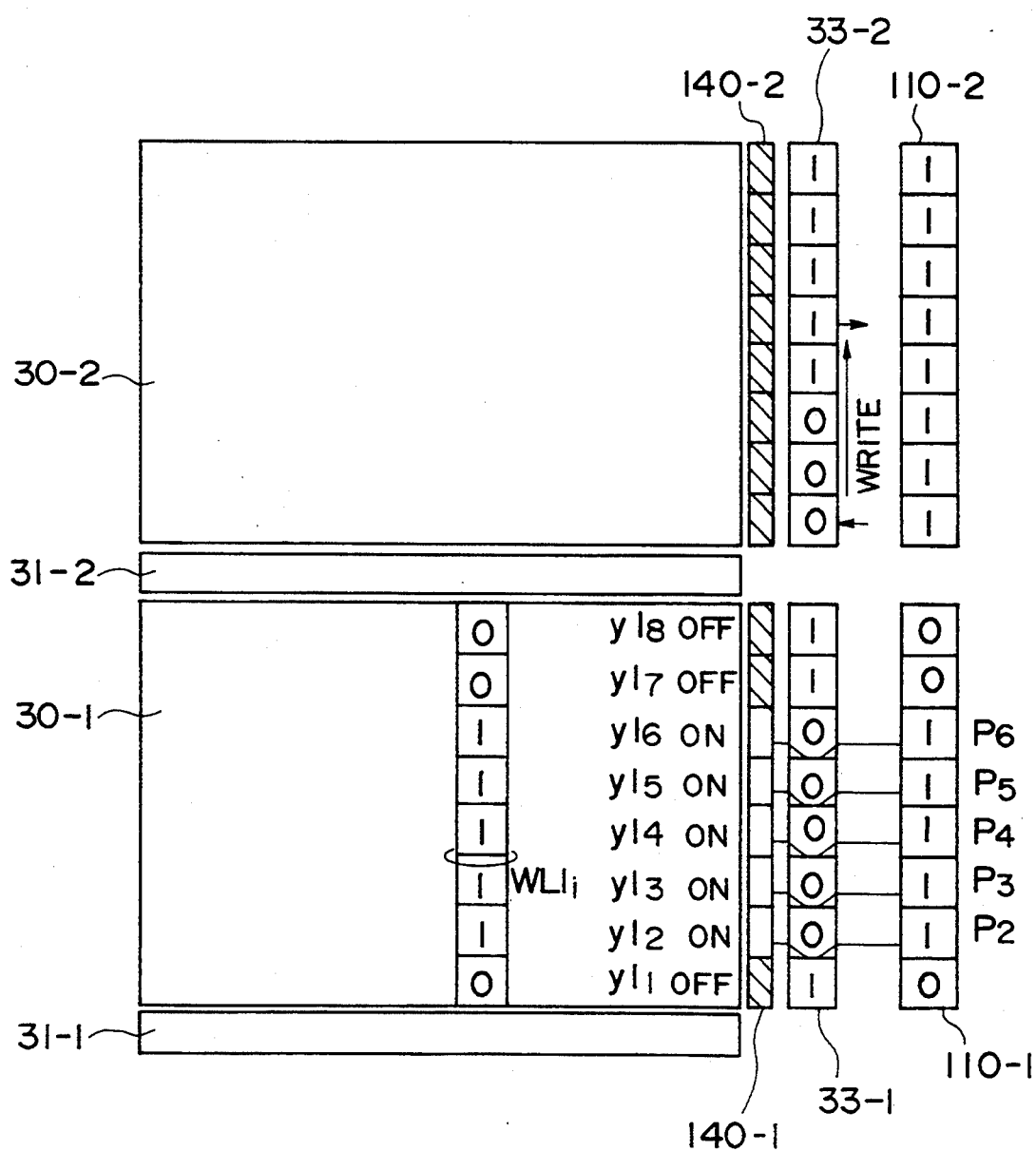
FIG. 31 diagrammatically depicts another writing operation in FIG. 28 and FIG. 29.

(iii) FIG. 31A ... (3)

Figure 31B:
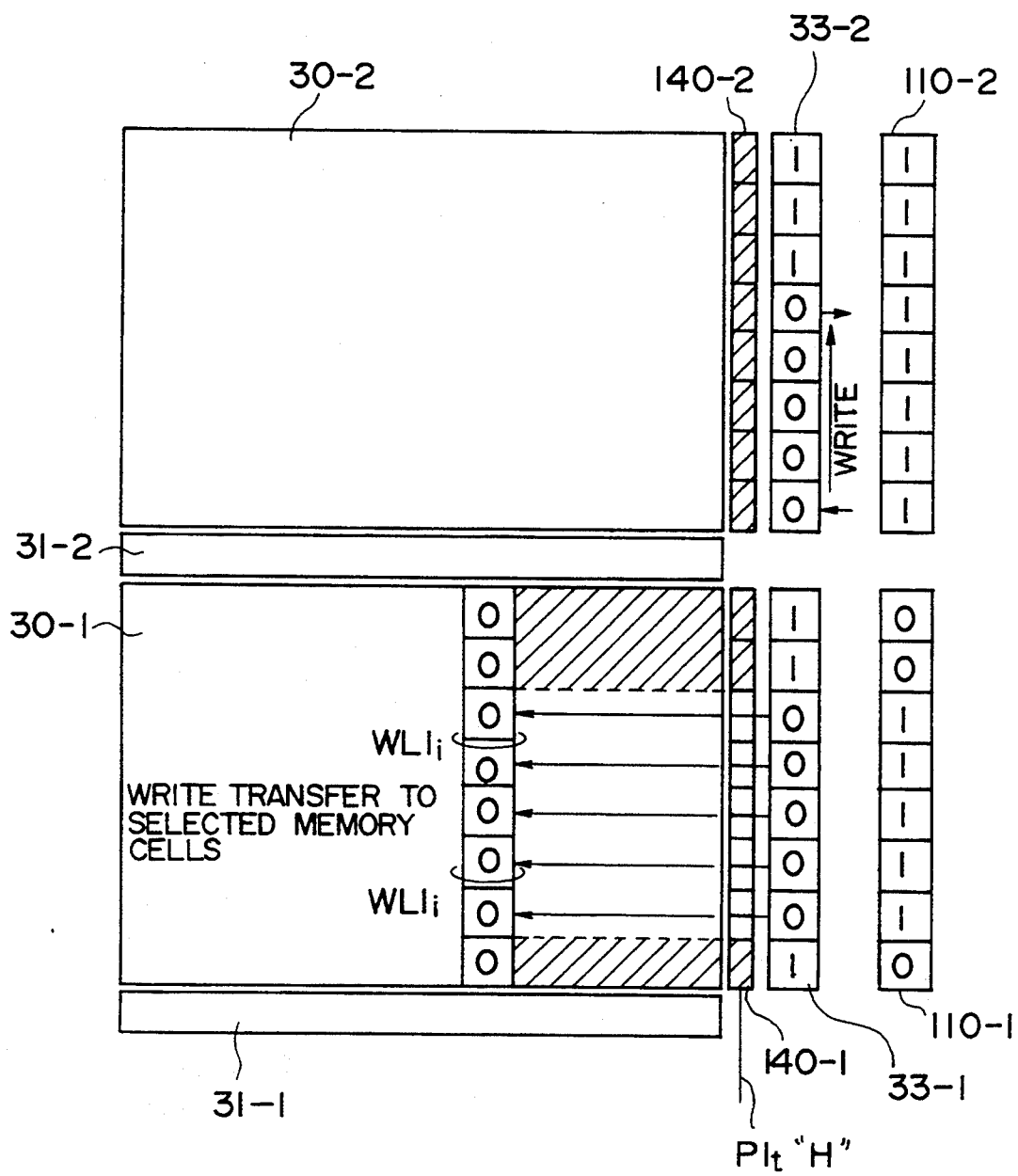

Because the nodes N1$_2$ to N1$_6$ are held in "H" state, the transfer switching circuit 140-2 can be selected to transfer data in the next FIG. 31B, namely, in (4). In other words, the AND gates 141-1$_2$ to 141-1$_6$ in the switching circuit 140-1 are selected here.

(iv) FIG. 31B ... (4)

The signal P1$_t$ becomes "H" and the transistors 142-1$_2$ to 142-1$_6$ in the switching circuit 140-1 are made conductive. Since the non-accessed AND gates 141-1$_1$,141-1$_7$,141-1$_8$ remain closed even after the signal P1$_t$ has become "H" the transistors 142-1$_1$,142-1$_7$,142-1$_8$ are in non-conductive state. Accordingly, only the data of the registers 33-1$_2$ to 33-1$_6$ are write-transferred in parallel to memory cells selected by the word line WL1$_i$. The data of the registers 33-1$_1$,33-1$_7$,33-1$_8$ corresponding to the non-accessed addresses yl$_1$,yl$_7$,yl$_8$ are not write-transferred.

Upon this write transfer, a serial write operation is performed in the data register 33-1.

(v) FIG. 32A, FIG. 32B ... (5),(6)

The reset signals Pr1 and the signal PV1 are again rendered "H". The subsequent operations are as in (1) described above. The start address setting circuit 64-1 and the end address setting circuit 65-1 are reset and their output signals Pfl$_i$,Pgl$_i$ are rendered "L". As a consequence, the outputs of the NOR gates 111-1$_2$,111-1$_7$ become "H" so that all the nodes $N1_i$ are rendered conductive to permit charging by the signal PV1. This operation is next repeated as in FIG. 32B, (6) during the access to the memory matrix 30-2.

This embodiment has such addresses as will be described next. next.

Data written in the data registers 33-1,33-2 at particular successive addresses can be selectively write-transferred to memory cells selected by desired word lines $WL_i,WL2_i$. The operation procedures of the write operation can therefore be simplified.

Although the reset signals Pr1,Pr2 were not required in the first and second embodiments, they are needed in the present embodiment. In the transfer means 100-1,100-2, it is possible to compose, for example, the transistors 112-1$_i$ (i=1 to n),112-2$_i$ (i=1 to n) by other transistors or other elements. The charge/discharge circuits 120-1,120-2,130-1,130-2 can be constructed of combinations of other transistors or can be added with a capacitor, a resistor and/or the like. It is also possible to adopt a circuit construction so that the nodes $N1_i,N2_i$ can each be charged in a discharged state at the time of selection without charging them in an initial state.

Fourth Embodiment

Figure 34:
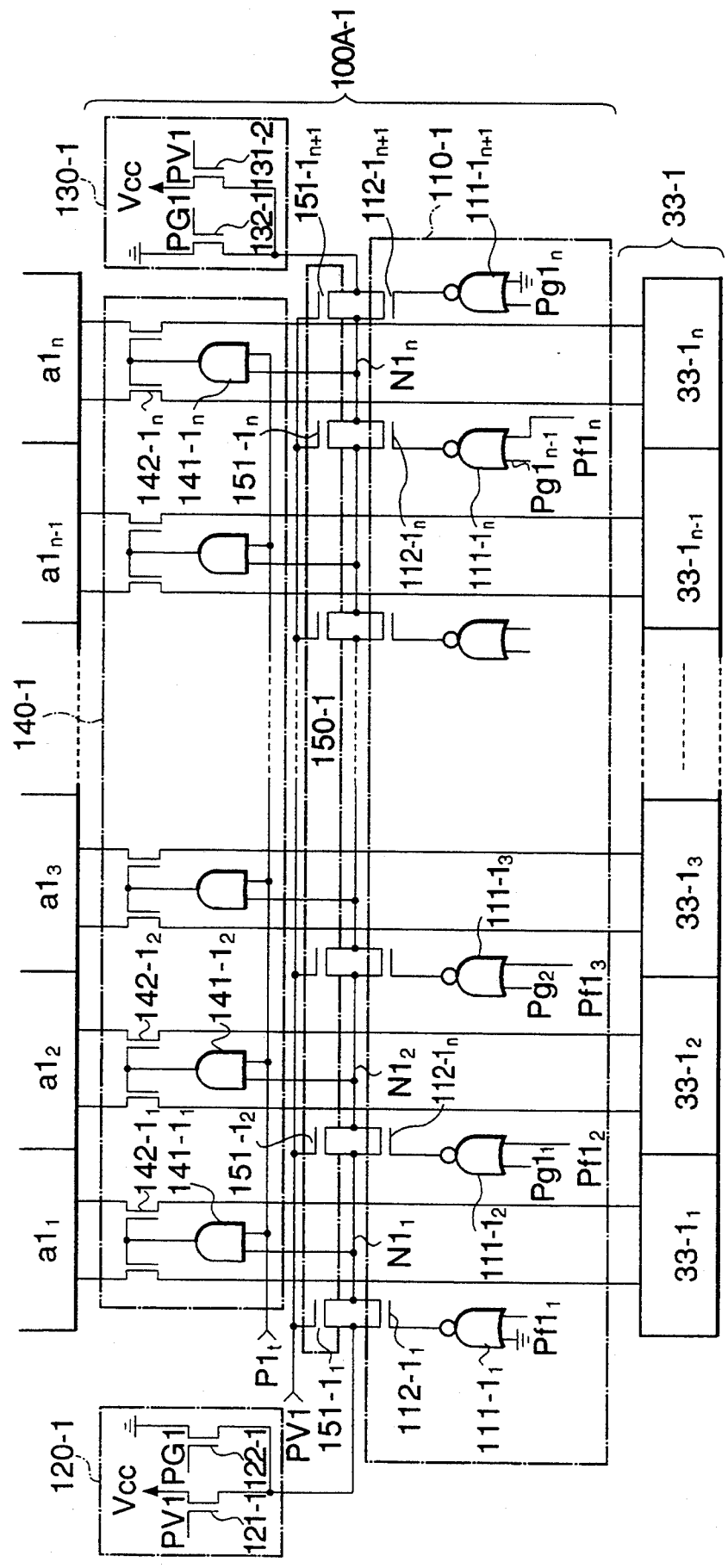
FIG. 34 is a fragmentary circuit diagram on the side of the memory bank A1, illustrating a fourth embodiment of the present Invention.
Figure 35:
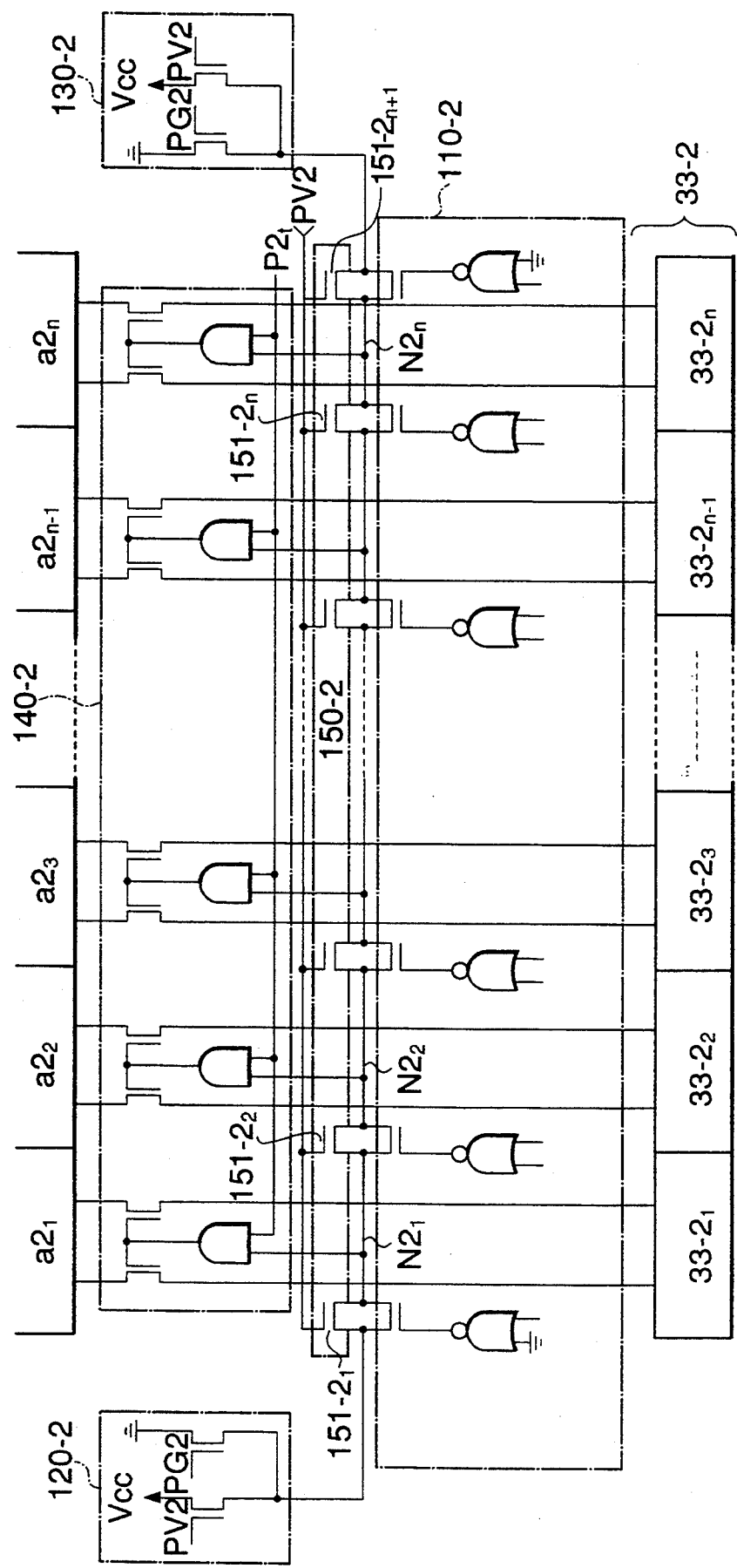
FIG. 35 is a fragmentary circuit diagram on the side of the memory bank A2, illustrating the fourth embodiment of the present invention.

FIG. 34 and FIG. 35 illustrate the serial access memory according to the fourth embodiment. FIG. 34 is a fragmentary circuit diagram on the side of the memory bank A1, while FIG. 35 is a fragmentary circuit diagram on the side of the memory bank A2. Incidentally, elements common to those in FIG. 28 and FIG. 29, which illustrate the third embodiment, are designated by like reference symbols.

This embodiment is provided with first and second transfer means 100A-1,100A-2 which are added with first and second equalizers 150-1,150-2 instead of the first and second transfer means 100-1,100-2.

The first equalizer 150-1 on the side of the memory bank A1 has a plurality of equalizing switching elements, for example, transistors 151-1$_1$ to 151-1$_{n+1}$ connected in series. These transistors 151-1$_1$ to 151-1$_{n+1}$ are parallelly connected with the respective transistors 112-1$_1$ to 112-1$_{n+1}$ in the switching control 110-1. The transistors 151-1$_1$ to 151-1$_{n+1}$ have a function to be rendered conductive responsive to the charging signal PV1 so that the nodes $N1_i$ (i=1 to n) on the signal line are charged.

The second equalizer 150-2 on the side of the memory bank A2 is constructed, like the first equalizer 150-1, of equalizing transistors 151-2$_1$ to 151-2$_{n+1}$ which are rendered conductive responsive to the charging signal PV2.

In the third embodiment, the output signals $Pf1_i,Pf2_i$ of the start address setting circuits 64-1,64-2 and the output signals $Pg1_i,Pg2_i$ of the end address setting circuits 65-1,65-2 are reset to "L" every time, whereby the transistors 112-1$_1$ to 112-1$_{n+1}$,112-2$_1$ to 112-2$_{n+1}$ are turned on to make the individual nodes $N1_i,N2_i$ conductive (be equalized). In this embodiment, on the other hand, the reset signals Pr1,Pr2 are used to reset the start address setting circuits 64-1,64-2 and the end address setting circuits 65-1,65-2 only at the time of start of a serial access, and equalization of the individual nodes to $N1_i,N2_i$ is conducted by the equalizers 150-1,150-2.

This embodiment has such merits as will be described next.

The operation of the third embodiment can be achieved by controlling only the equalizing transistors 151-1$_1$ to 151-1$_{n+1}$,151-2$_1$-151-2$_{n+1}$. According to the third embodiment, however, the signals $Pf1_i,Pf2_i,Pg1_i,Pg2_i$ are rendered "L" by the reset signals Pr1,Pr2 so that the transistors 112-1$_1$ to 112-1$_{n+1}$,112-2$_1$ to 112-2$_{n+1}$ are turned on to equalize the individual nodes $N1_i,N2_i$. As a consequence, the equalization is delayed by an amount of delay in the circuit operation. In this embodiment, in contrast, the equalizing transistors 151-1$_1$ to 151-1$_{n+1}$ are controlled directly by the signals PV1,PV2 so that high-speed equalization is possible. This has made it possible to accelerate the charging speed.

Fifth Embodiment

Figure 36:
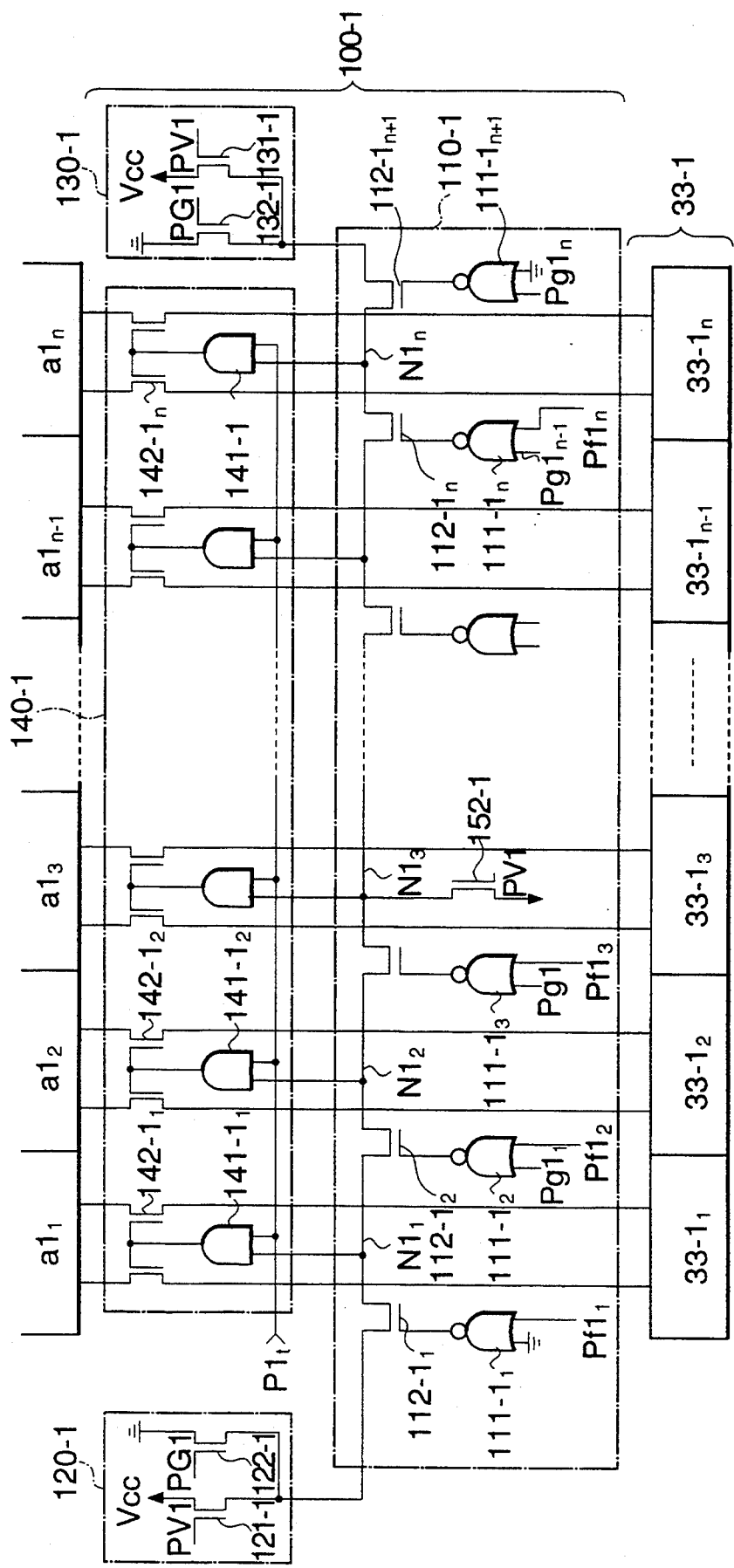
FIG. 36 is a fragmentary circuit diagram on the side of the memory bank A1, illustrating a fifth embodiment of the present invention.
Figure 37:
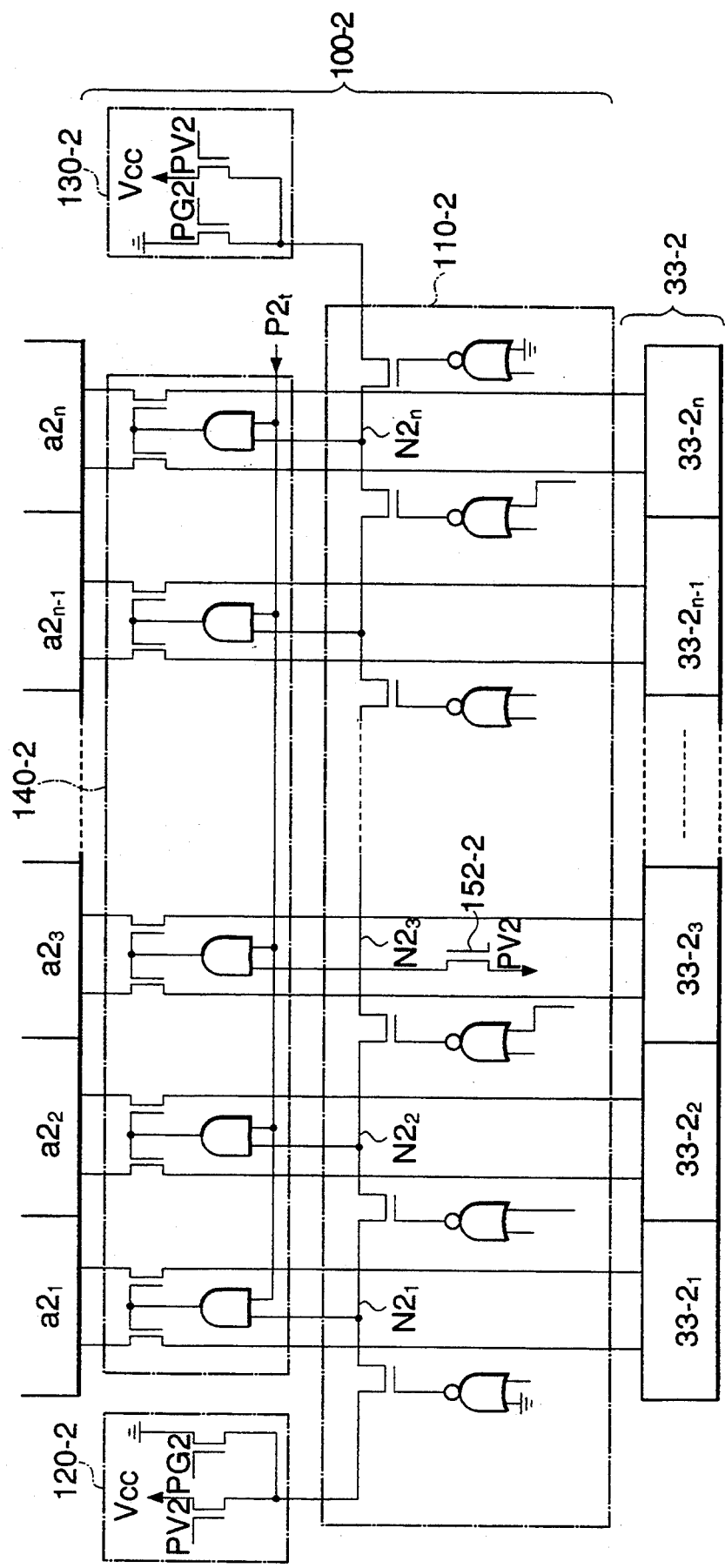
FIG. 37 is a fragmentary circuit diagram on the side of the memory bank A2, illustrating the fifth embodiment of the present invention.

FIG. 36 and FIG. 37 illustrate the serial access memory according to the fifth embodiment. FIG. 36 is a fragmentary circuit diagram on the side of the memory bank A1, while FIG. 37 is a fragmentary circuit diagram on the side of the memory bank A2. Incidentally, elements common to those in FIG. 28 and FIG. 29, which illustrate the third embodiment, are designated by like reference symbols.

In this embodiment, charging circuits which are operated responsive to the charging signals PV1,PV2, for example, transistors 152-1,152-2 are connected to the signal lines of the nodes $N1_i,N2_i$, which are shown in FIG. 28 and FIG. 29, at desired intermediate locations.

In the third embodiment, the respective nodes $N1_i,N2_i$ are charged for initialization only from the two directions, namely, on the side of the nodes $N1_1,N2_1$ and on the side of the nodes $N1_n,N2_n$ through the transistors 112-1$_1$ to 112-1$_{n+1}$,112-2$_1$ to 112-2$_{n+1}$. Because of this, the charging takes time when the time constant of the signal line becomes greater as a result of an increase in the memory capacity. In this embodiment, the charging transistors 152-1,152-2 are connected at desired intermediate locations between the node $N1_1$ and the node $N1_n$ and between the node $N2_1$ and the node $N2_n$ to charge the respective signal lines. It is therefore possible to shorten the charging time.

Incidentally, the charging circuit can be constructed of other devices such as transistors other than the transistors 152-1,152-2, capacitors and/or the like. Further, two or more charging circuits may be connected together in view of the time constant of each signal line.

Sixth Embodiment

Figure 38:
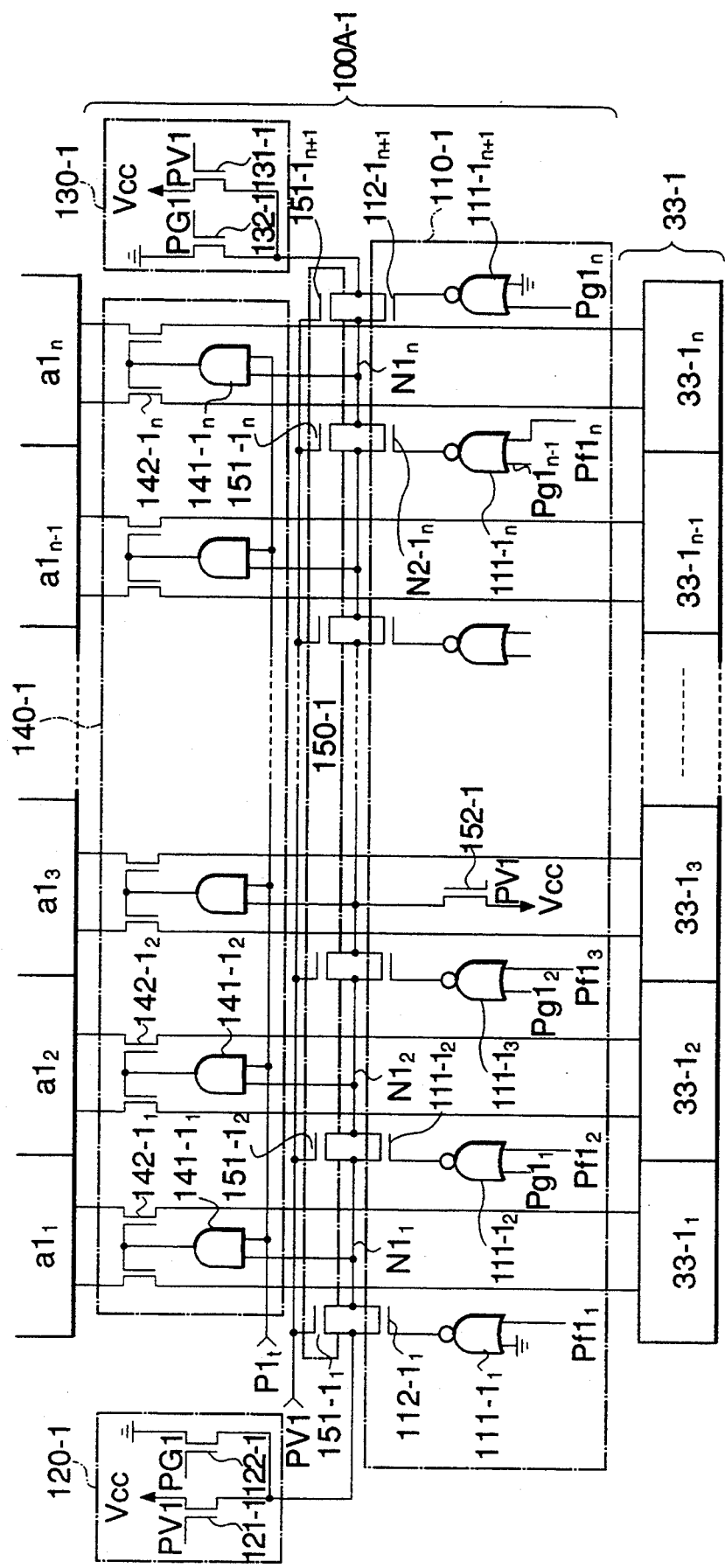
FIG. 38 is a fragmentary circuit diagram on the side of the memory bank A1, illustrating a sixth embodiment of the present invention.

FIG. 38 and FIG. 37 illustrate the serial access memory according to the sixth embodiment. FIG. 38 is a fragmentary circuit diagram on the side of the memory bank A1, while FIG. 37 is a fragmentary circuit diagram on the side of the memory bank A2. Incidentally, elements common to those in FIG. 34 and FIG. 35, which illustrate the fourth embodiment, are designated by like reference symbols.

In this embodiment, the charging circuits in FIG. 36 and FIG. 37, for example, the transistors 152-1,152-2 are connected to the signal lines of the nodes $N1_i,N2_i$ shown in FIG. 34 and FIG. 35 so that the charging time is shortened as in the fifth embodiment.

Seventh Embodiment

Figure 40:
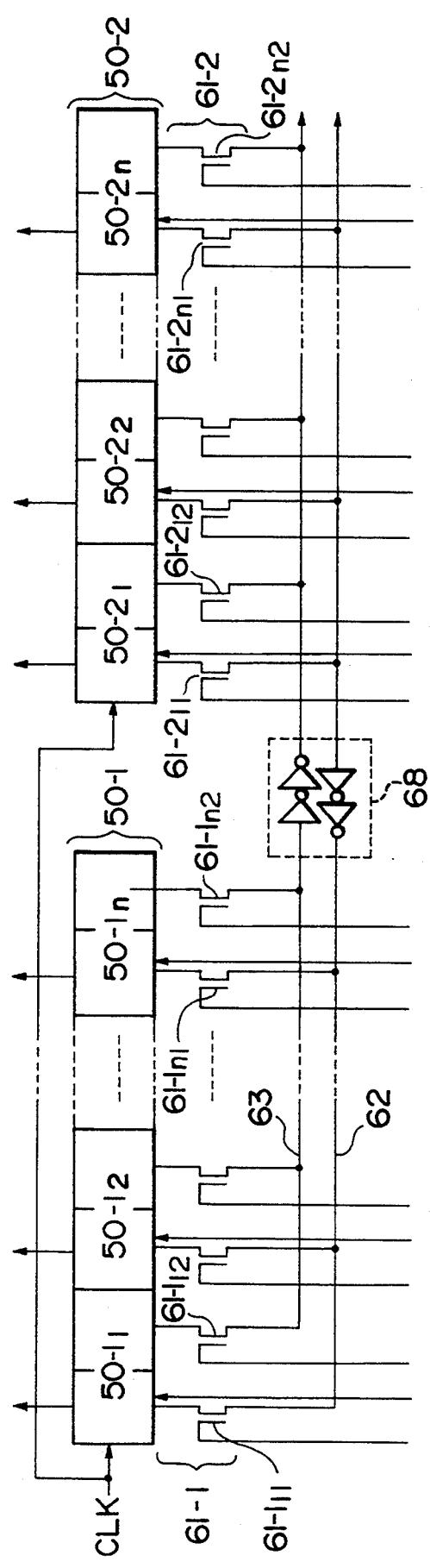
FIG. 40 is a fragmentary circuit diagram of a serial access memory according to a seventh embodiment of the present invention.

FIG. 40 is a fragmentary circuit diagram of the pointers and their peripheral elements, illustrating the serial access memory according to the seventh embodiment. Elements common to those in FIG. 6 and FIG. 7, which depicts the first embodiment, are designated by like reference symbols.

In this embodiment, an amplifier 68 such as that shown in FIG. 40 is connected between the first and second lines 62,63 on the side of the memory bank A1 and the first and second lines 62,63 on the side of the memory bank A2 in FIG. 1. The amplifier 68 is composed of two-stage inverters connected in series in the direction of from the side of the memory bank A1 to the side of the memory bank A2 and two-stage inverters connected in series in the direction of from the side of the memory bank A2 to the side of the memory bank A1.

When the memory capacity becomes great, the parasitic capacities (loads) of the lines 62,63 increase, thereby making it difficult to transfer pointer outputs at high speed. Amplification of each pointer output by the amplifier 68 therefore permits high-speed operation.

Incidentally, the amplifier 68 may be constructed of other devices such buffers.

Eighth Embodiment

FIG. 31 is a block diagram of the address generator in the serial access memory according to the eighth embodiment. Elements common to those in FIG. 5, which shows the first embodiment, are designated by like reference symbols.

In this embodiment, an address generator 200 having a circuit construction different from the address generator 73 in FIG. 5 is provided instead of the latter address generator. The address generator 200 is composed of an X address generator 210 for generating X addresses $X_i$ (i=1 to n) and outputting them to the X address bus 71 and a Y address generator 220 for generating Y addresses and outputting them to the Y address bus 72.

The X address generator 210 has a function to generate the X addresses Xi, which advance according to pointer outputs from the line 63, and to set an initial X address by being reset by the reset signal Pr1 and then resetting the X addressing means 31-1. The X address generator 210 is composed, for example, of an address counter 211 which in turn comprises plural stages of F.Fs. $211_i$ (i=1 to n). The X address generator 210 is reset by the reset signal Pr1 and is advanced by pointer outputs from the line 63.

These operations (i),(ii) will be described with reference to FIG. 42 to FIG. 45 and FIG. 46.

Figure 41:
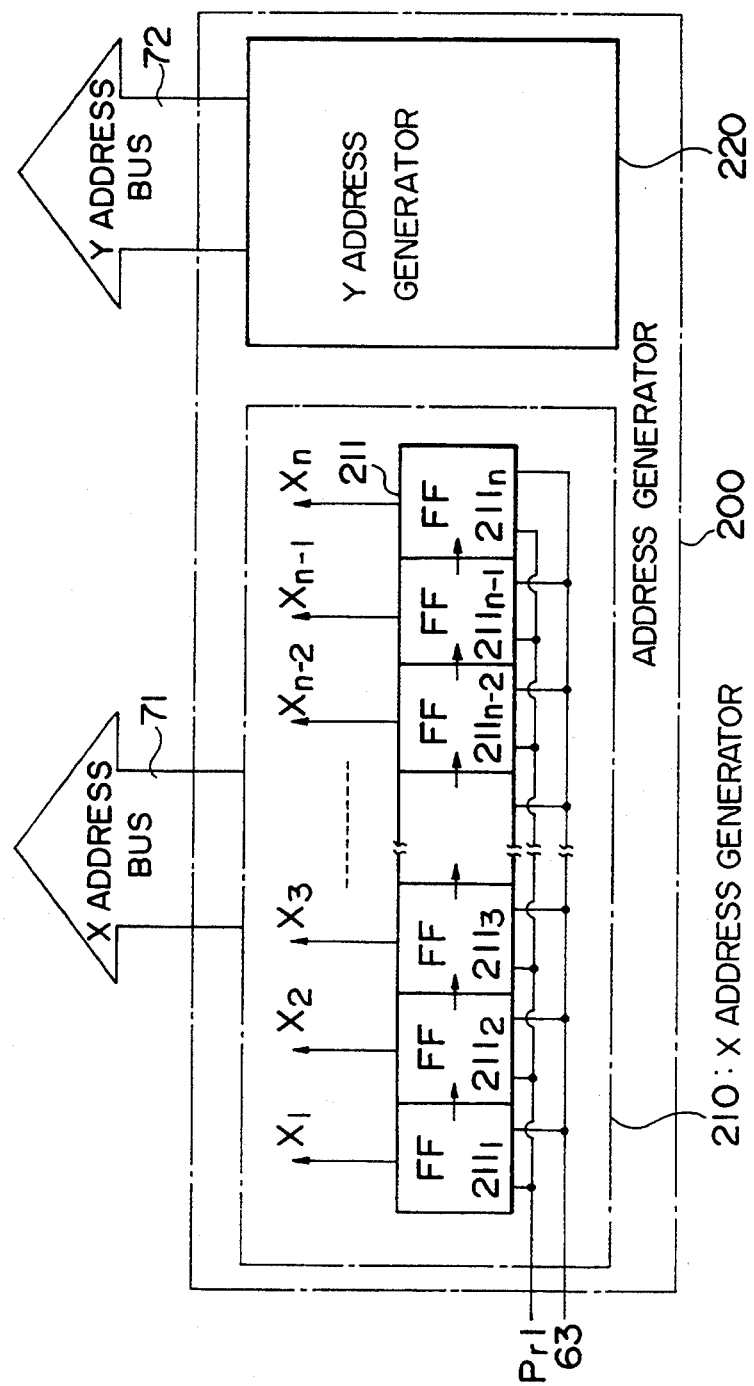
FIG. 41 is a block diagram of an address generator, showing an eighth embodiment of the present invention.
Figure 42:
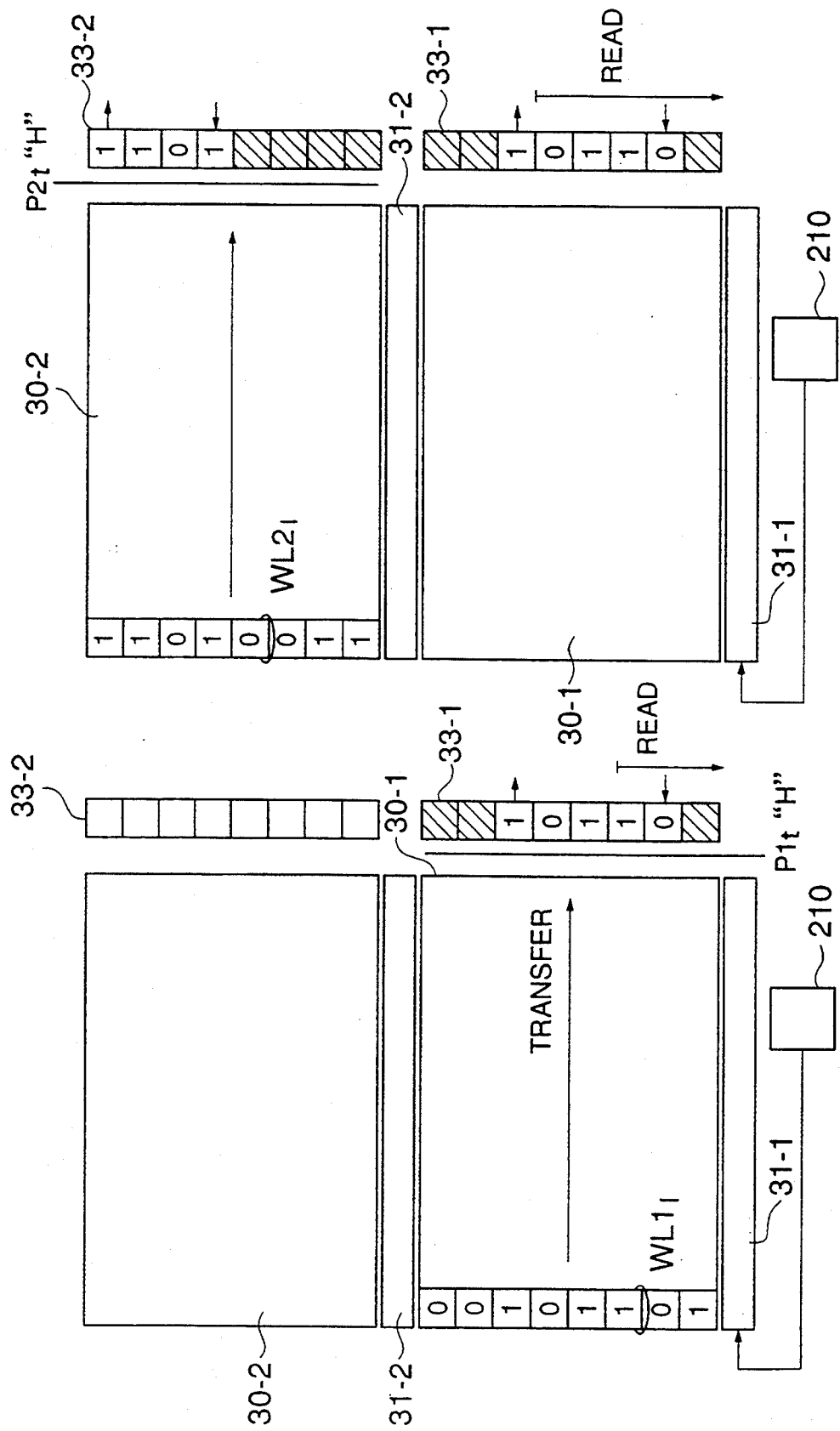
FIG. 42 diagrammatically shows an operation of the address generator in FIG. 41.
Figure 43:
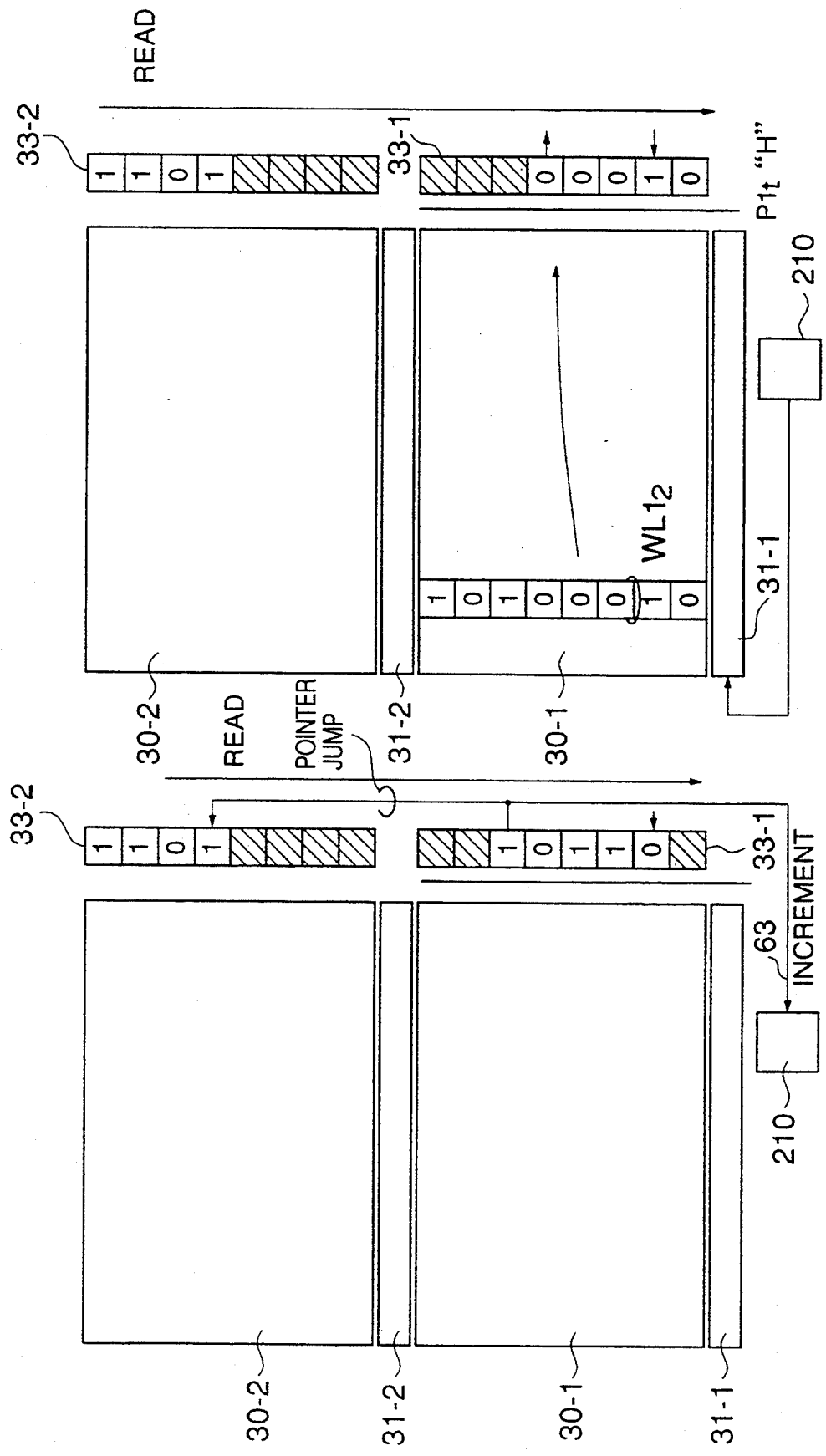
FIG. 43 diagrammatically shows another operation of the address generator in FIG. 41.
Figure 44:
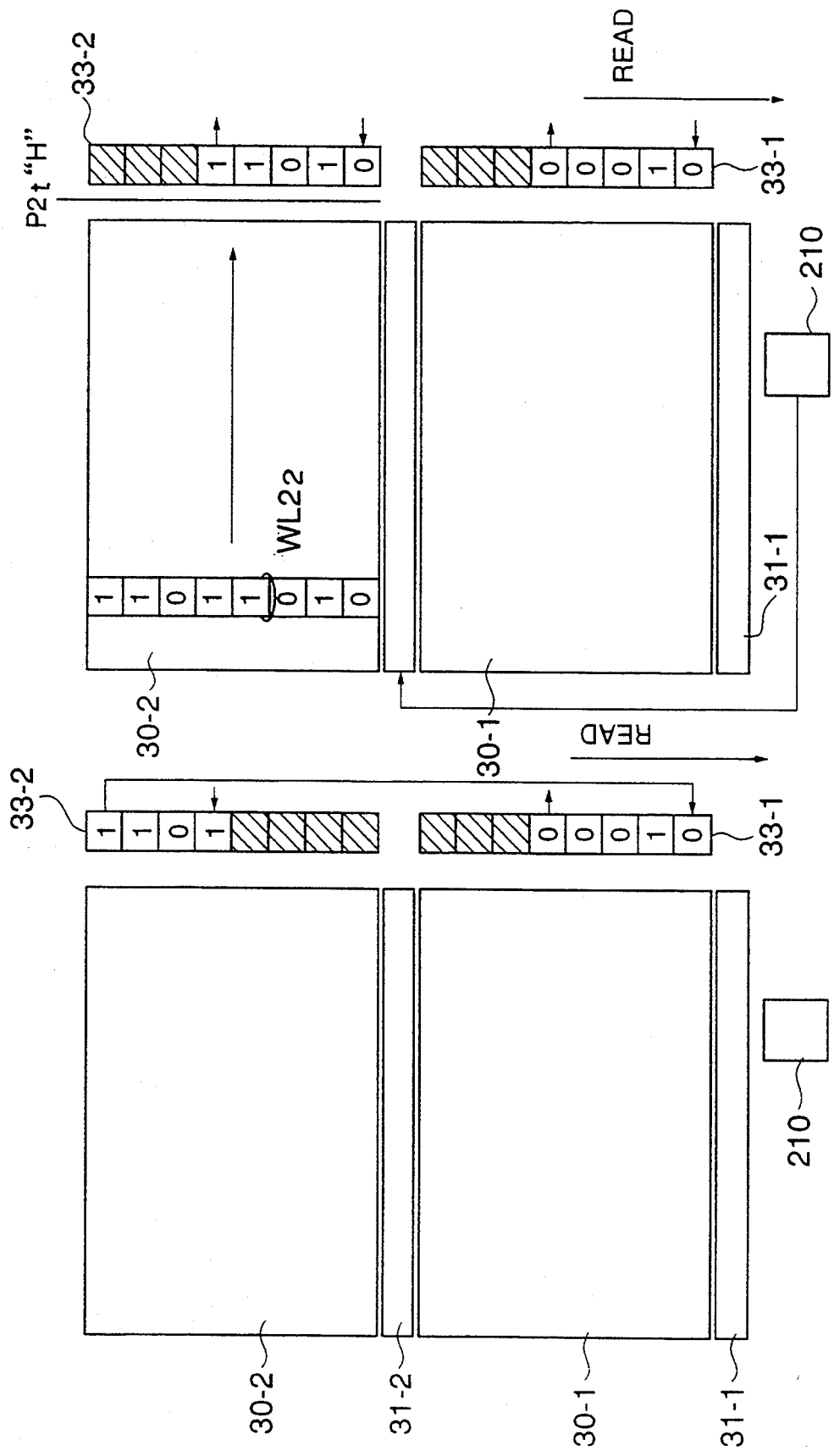
FIG. 44 diagrammatically depicts a further operation of the address generator in FIG. 41.
Figure 45:
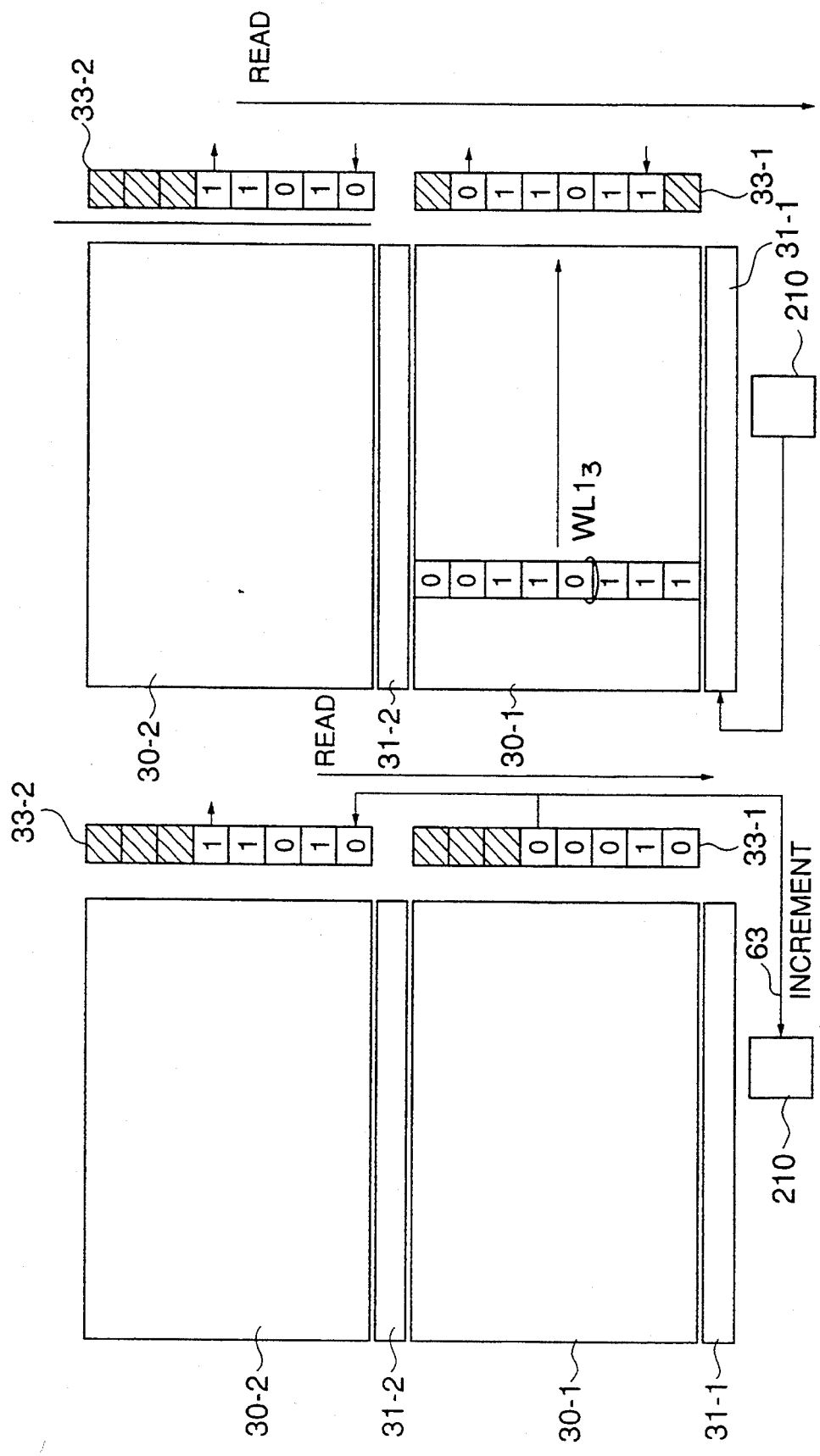
FIG. 45 diagrammatically depicts a still further operation of the address generator in FIG. 41.
Figure 46:
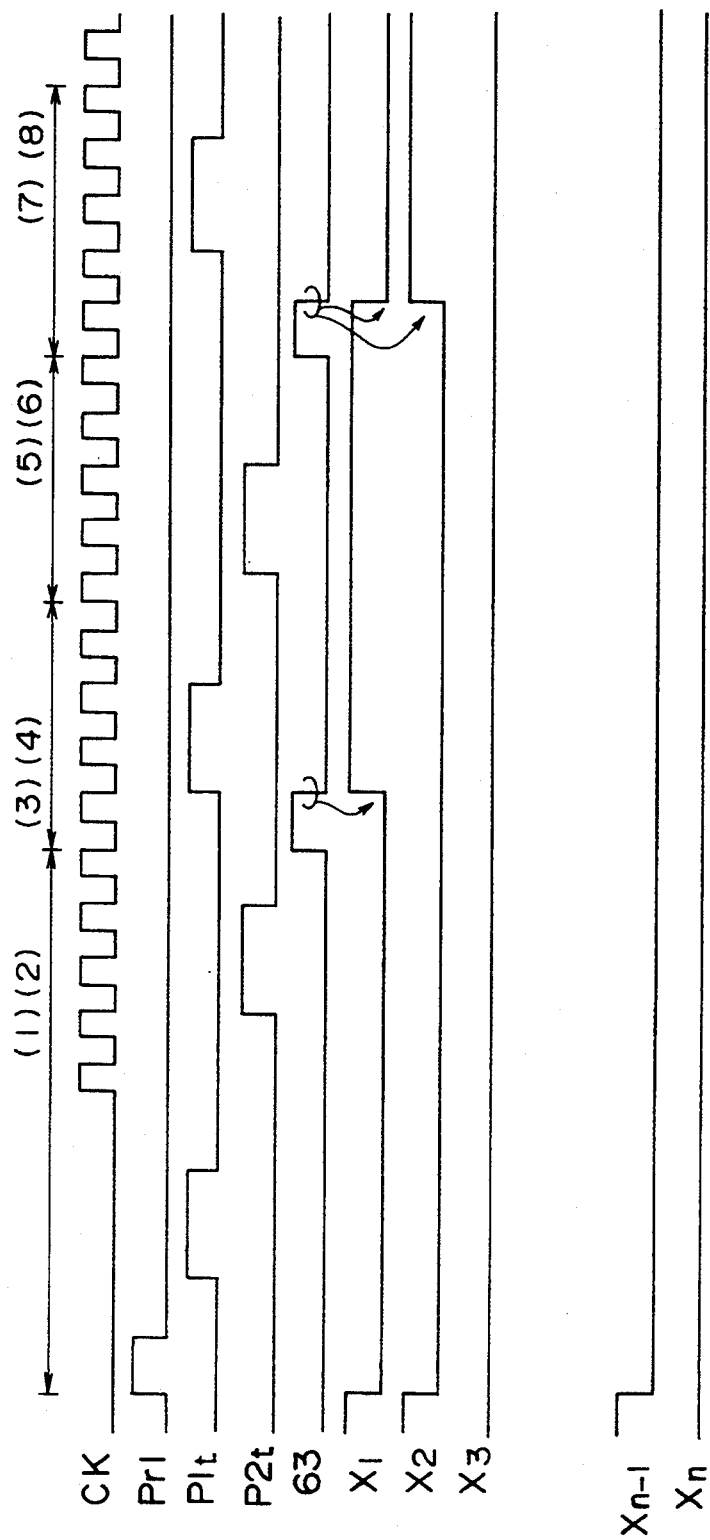
FIG. 46 is a timing chart of the address generator in FIG. 41.

FIG. 42 through FIG. 45 diagrammatically show the operation of the address generators in FIG. 41, while FIG. 46 is a timing chart of the address generators in FIG. 41. Periods (1) to (8) in FIG. 46 correspond to numerals (1) to (8) in lower parts of FIG. 42 through FIG. 45.

(i) FIG. 42A, FIG. 42B ... (1), (2)

In the period (1) of FIG. 46, when the reset signal Pr1 becomes "H", the X address generator 210 is reset and the X addresses $X_i$ (i=1 to n) as its outputs are rendered "L". The word line $WL1_1$ of the memory matrix 30-1, said word line having been selected by the X addressing means 31-1, then rises so that the data of the memory cells connected to the word line are transferred to the data register 33-1 via the transfer means 32-1 opened by a signal $P1_t$. As a result, a serial access to the data in the data register 33-1 is started.

In the period (2) of FIG. 46, the word line $WL2_1$ in the memory matrix 30-2 is caused to rise by the X addressing means 31-2 so that the data of the memory cells connected to the word line are transferred to the data register 33-2 via the transfer means 32-2 opened by signal $P2_t$.

(ii) FIG. 43A, FIG. 43B, FIG. 44A, FIG. 44B, FIG. 45A, FIG. 45B ... (3) to (8)

In the third period (3) of FIG. 46, a pointer output moves to the data register 33-2 through the line 63 (pointer jump) upon completion of access to the side of the data register 33-1 in order to perform a serial access skippingly. At this time, the X address generator 210 is advanced by the pointer output from the line 63.

Accordingly, the X address of the memory matrix 30-1, said address being to be transferred in the next period (4), is shifted by +1 to $X_1$, whereby the next word line $WL1_2$ is selected by the X addressing means 31-1.

After this, a similar operation is repeated in the periods (5)→(8). Whenever a pointer output is delivered through the line 63, the X address generator 210 is advanced.

In this embodiment, no complex random access is needed. Where a simple serial access continues, addresses can be automatically generated inside by a simple circuit construction. This embodiment is therefore convenient.

Ninth Embodiment

Figure 47:
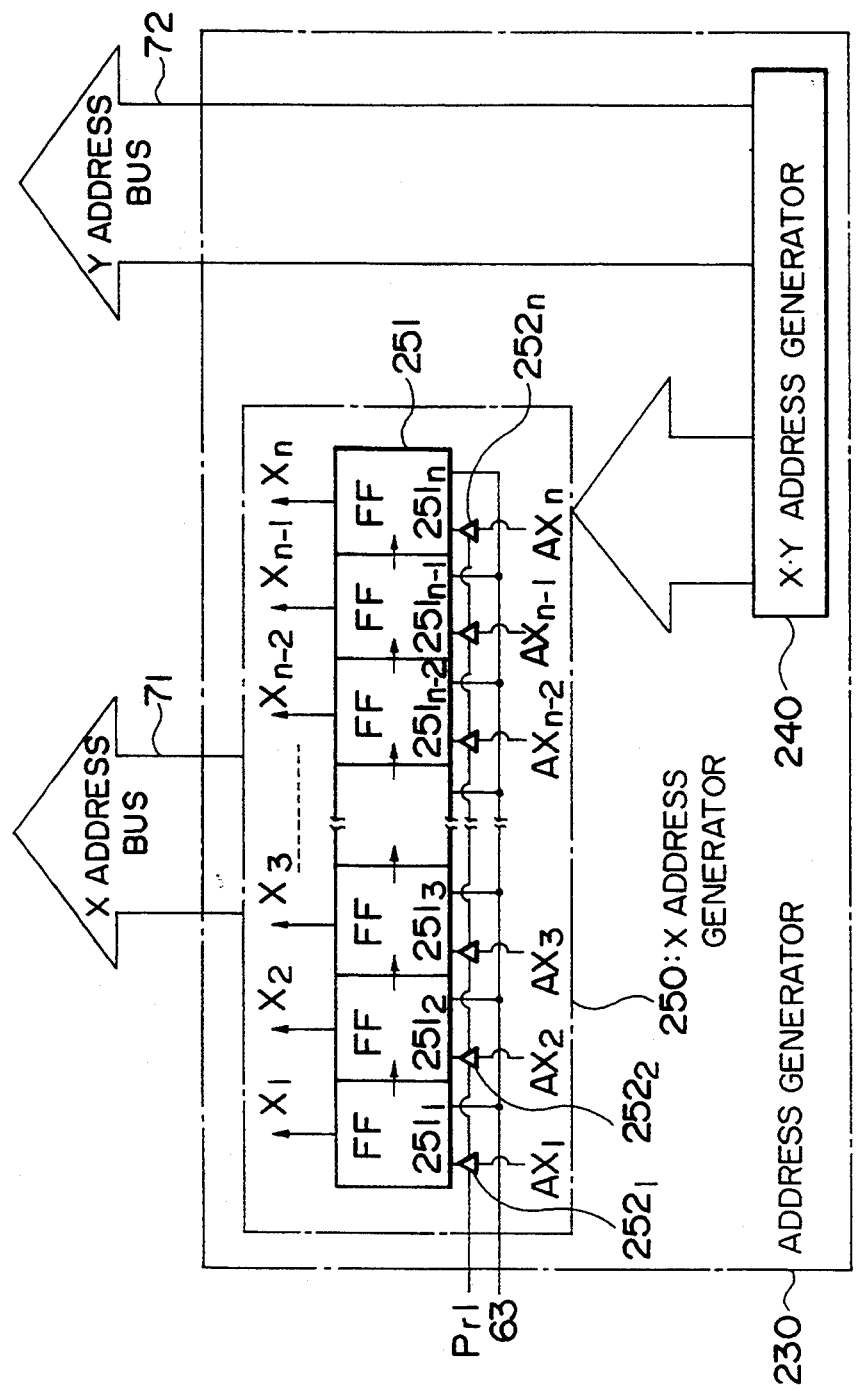
FIG. 47 is a block diagram of an address generator, showing a ninth embodiment of the present invention.

FIG. 47 is a block diagram of address generators in the serial access memory according to the ninth embodiment. Elements common to those in FIG. 5 and FIG. 41, which show the first and eighth embodiments, respectively, are designated by like reference symbols.

In this embodiment, an address generator 230 having a different circuit construction from the address generator 200 in FIG. 41 is provided instead of the latter address generator. The address generator 230 is composed of an X.Y address generator 240 for generating X addresses $AX_i$ (i=1 to n) and Y addresses and outputting the Y addresses to the Y address bus 72 and an X address generator 250 for inputting the X addresses $AX_i$ and outputting X addresses $X_i$ (i=1 to n) to the X address bus 71.

The Y address generator 250 is formed of an address counter 251, which in turn comprises plural stages of F.Fs. $251_i$ (i=1 to n) for generating the X addresses $X_i$ to be advanced by pointer outputs from the line 63, and an initial value input circuit for fetching an X address $AX_i$ as an initial value to the counter 251 responsive to the reset signal Pr1, for example, tristate buffers $252_i$ (i=1 to n).

FIG. 48 through FIG. 51 correspond to FIG. 42 through FIG. 45, respectively, and diagrammatically illustrates the operations in the periods (1) to (8) in FIG. 46. Incidentally, the operation timing in FIG. 47 is the same as that illustrated in FIG. 46.

Figure 48A:
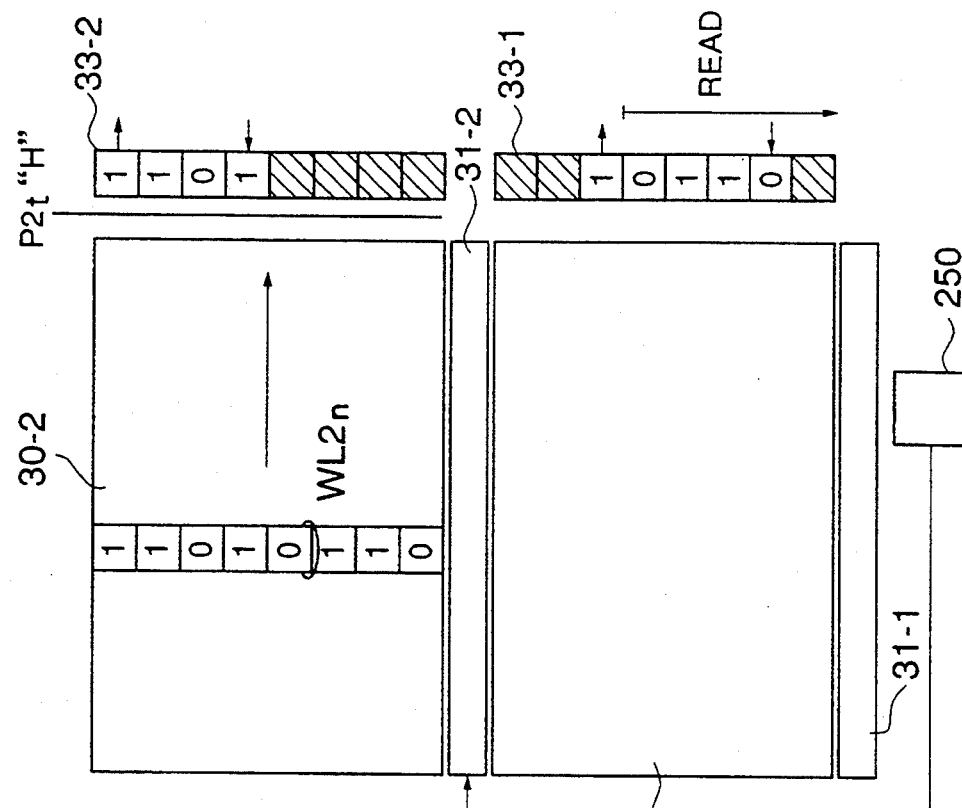
FIG. 48 diagrammatically shows an operation of the address generator in FIG. 47.

In the period (1) of FIG. 48A, when the reset signal Pr1 becomes "H", the tristate buffer $252_i$ (i=1 to n) are rendered conductive so that the X addresses $AX_i$ (i=1 to n) generated by the X.Y address generator 240 are fetched as initial values in the address counter 251. Then, n is set as an initial value for the X address $X_i$ so that the word line $WL1_n$ of the memory matrix 30-1, said word line having been selected by the X address output 31-1, rises. The data of the memory cells connected to the word line are transferred to the data register 33-1 via the transfer means 32-1 opened by the signal $P1_t$, whereby a serial access to the data in the data register 33-1 is started.

Figure 48B:
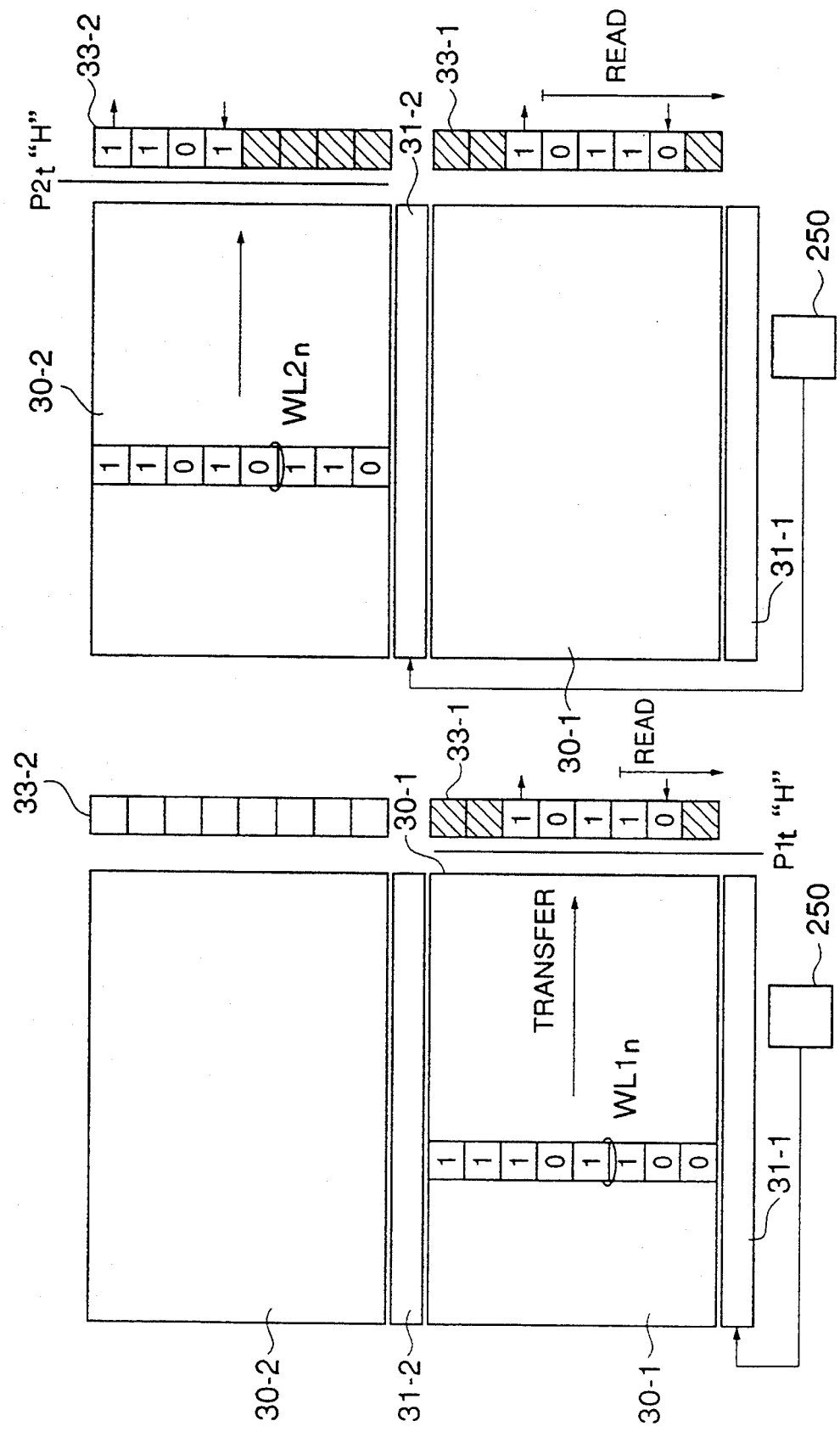

In the period (2) of FIG. 48B, the word line $WL2_n$ in the memory matrix 30-2 is caused to rise by the X addressing means 31-2 so that the data of the memory cells connected to the word line are transferred to the data register 33-2 via the transfer means 32-2 opened by the signal $P2_t$.

In the period (3) of FIG. 49A, a pointer output moves to the data register 33-2 through the line 63 (pointer jump) upon completion of access to the side of the data register 33-1 in order to perform a serial access skippingly. At this time, the address counter 251 in the X address generator 250 is advanced by the pointer output from the line 63. Accordingly, the X address $X_i$ of the memory matrix 30-1, said address being to be transferred in the next period (4), is shifted by +1 to n+1, whereby the next word line $WL1_{n+1}$ is selected by the X addressing means 31-1.

Figure 51B:
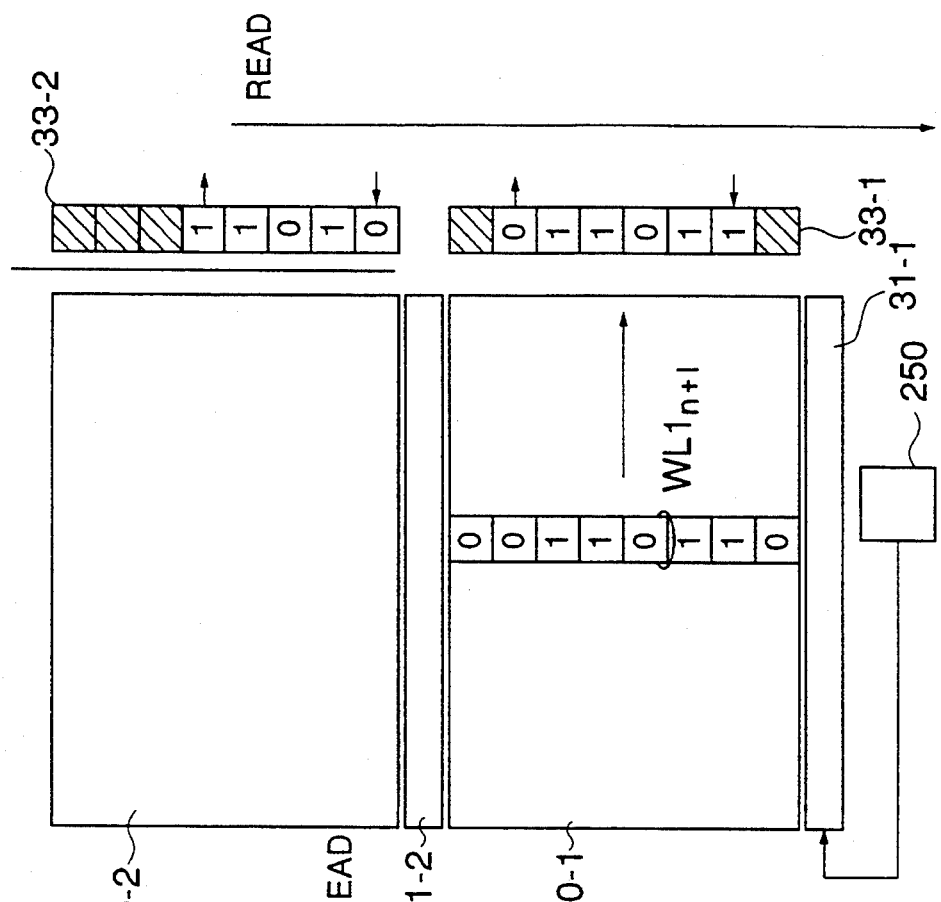
FIG. 51 diagrammatically depicts a still further operation of the address generator in FIG. 47.
Figure 51A:
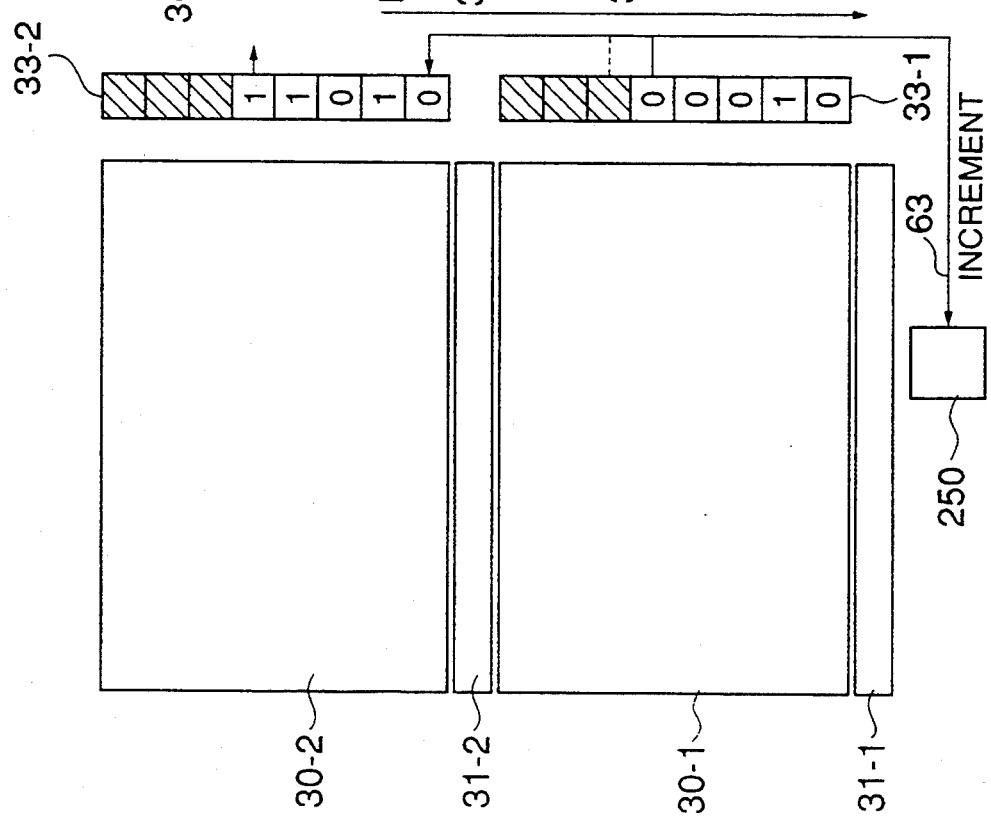

After this, a similar operation is repeated in the periods (5),(6) of FIG. 50A and FIG. 50B→the periods (7),(8) of FIG. 51A and FIG. 51B. Whenever a pointer output is delivered through the line 63, the X address generator 250 is advanced.

In this embodiment, no complex random access is needed as in the eighth embodiment. Where a simple serial access continues, addresses can be automatically generated inside by a simple circuit construction. This embodiment is therefore convenient. Incidentally, the tristate buffers $252_i$ may each be constructed of another initial value input circuit such as a tristate inverter.

Tenth Embodiment

Figure 52:
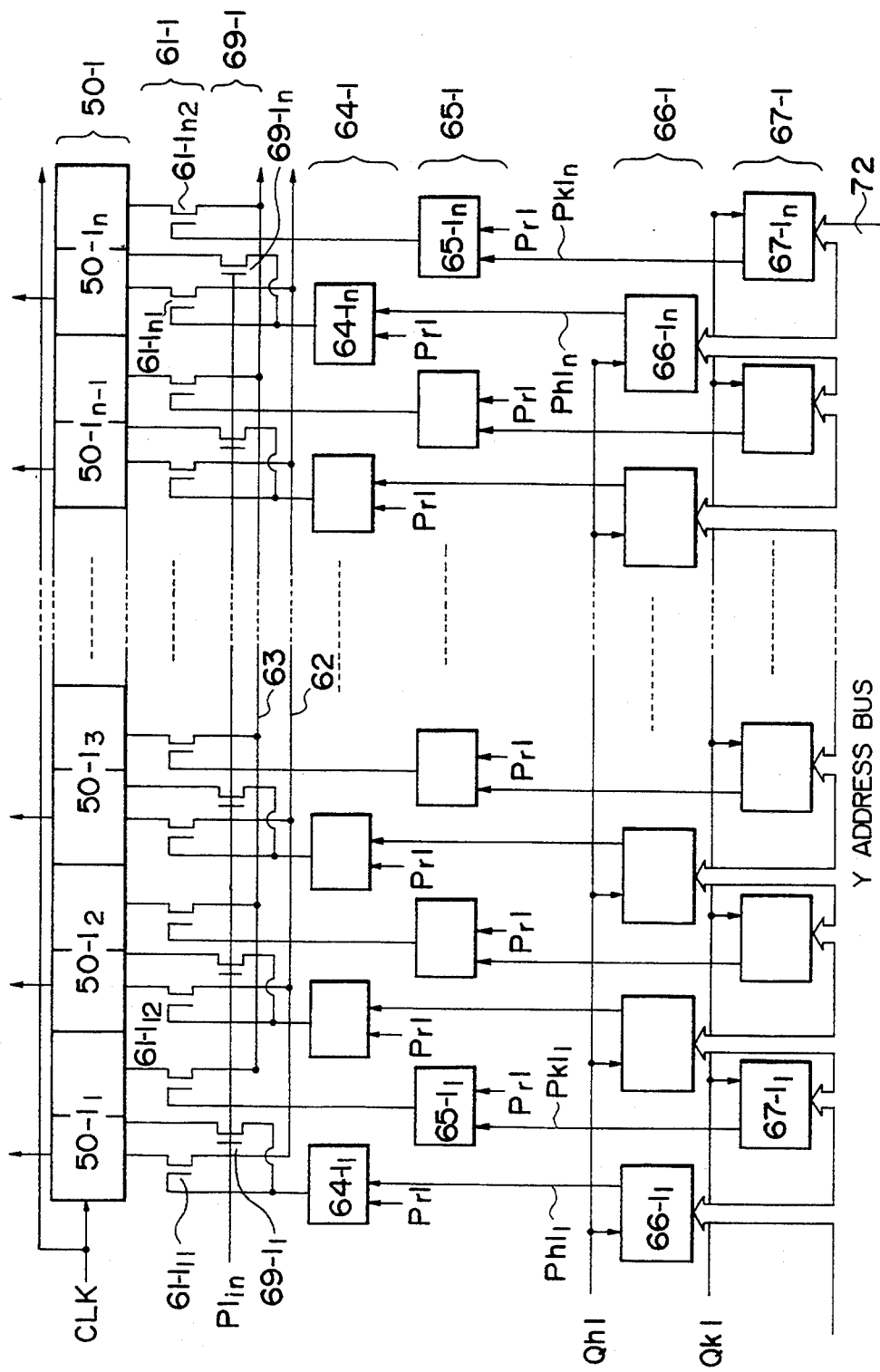
FIG. 52 is a fragmentary circuit diagram on a side of a memory bank A1, illustrating a tenth embodiment of the present invention.
Figure 53:
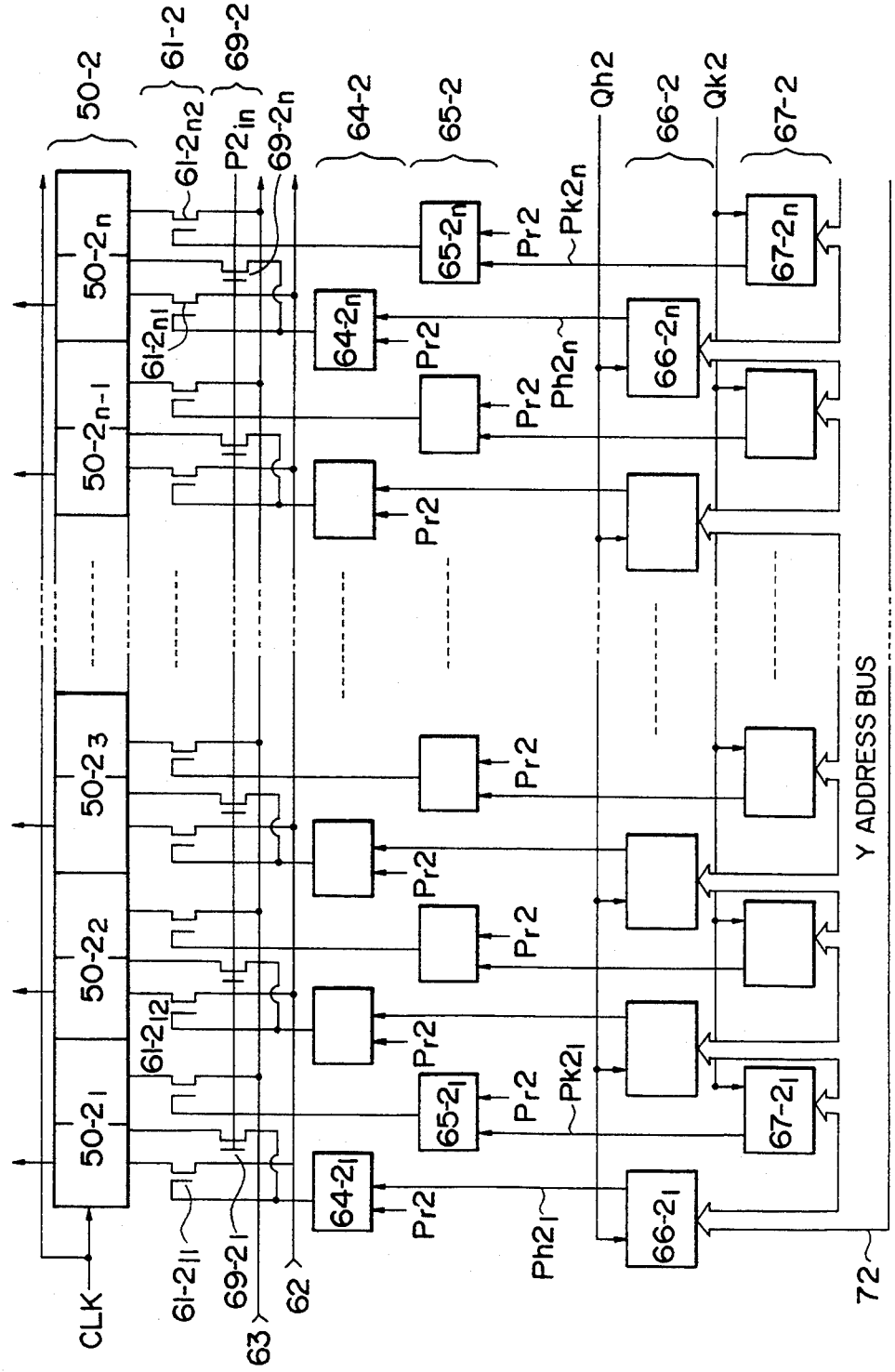
FIG. 53 is a fragmentary circuit diagram on a side of a memory bank A2, illustrating the tenth embodiment of the present invention.

FIG. 52 and FIG. 53 show the serial access memory according to the tenth embodiment. FIG. 52 is a fragmentary circuit diagram on the side of the memory bank A1, whereas FIG. 53 is a fragmentary circuit diagram on the side of the memory bank A2. Incidentally, elements common to those in FIG. 6 and FIG. 7, which show the first embodiment, are designated by like reference symbols.

In this embodiment, the Y addressing means 70-1,70-2 in FIG. 6 and FIG. 7 have been eliminated and, instead, leading bit serial address fetch circuits 69-1,69-2 have been added.

The leading bit serial address fetch circuits 69-1,69-2 are on-off controlled responsive to signals $P1_{in}, P2_{in}$ to perform connection/cut-off between the output sides of the start address setting circuits 64-1,64-2 and the input sides of the pointers 50-1, 50-2. These fetch circuits 69-1,69-2 are composed of switching means which are on-off controlled responsive to the signals $P1_{in}, P2_{in}$, for example, transistors $69\text{-}1_i, 69\text{-}2_i$ (i=1 to n), which are connected to the output sides of the latches $64\text{-}1_i, 64\text{-}2_i$ (i=1 to n) and the input sides of the F.Fs. $50\text{-}1_i, 50\text{-}2_i$ (i=1 to n), respectively.

Figure 54:
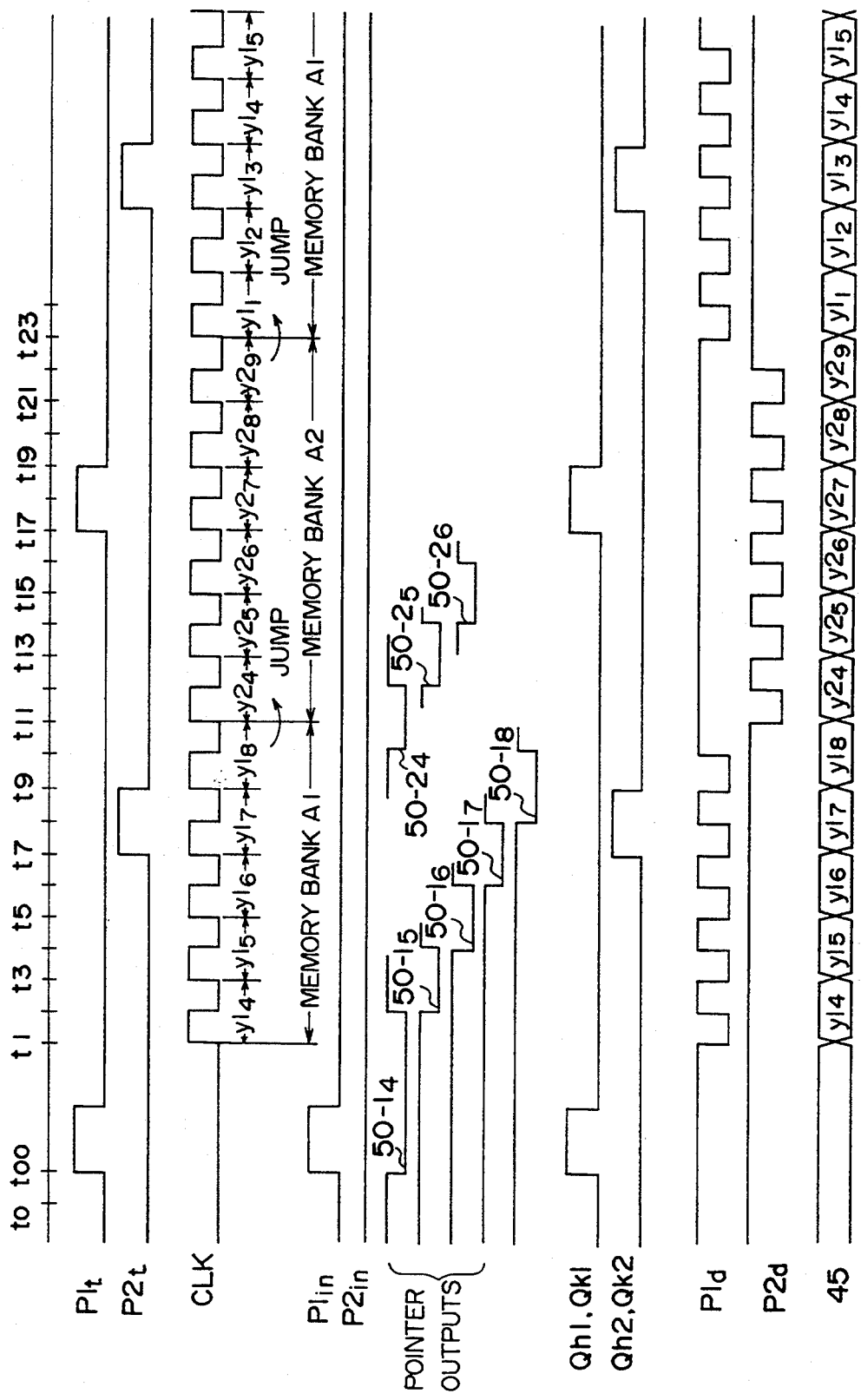
FIG. 54 is a timing chart of the memory banks A1 and A2 in FIG. 52 and 53, respectively.

FIG. 54 is a timing chart of the serial access memory shown in FIG. 52 and FIG. 53. It corresponds to FIG. 17 among the timing charts (FIG. 15 through FIG. 17) of the first embodiment.

In the first embodiment, any of the individual registers $33\text{-}1_i, 33\text{-}2_i$ (i=1 to n) in the data registers 33-1,33-2 as pointer output routes for serial access can be designated as leading bits as desired by the Y addressing means 70-1,70-2. This however results in an increase in the area of the circuit pattern by as much as those of the Y addressing means 70-1,70-2, so that the chip size and the fabrication cost are both increased.

The function to permit free selection of leading bits in the ranges of access bits as in the first embodiment is convenient. Where this function is not needed, however, no problem would arise in use even when the smallest-numbered address in the range of access bits is selected as the leading address in the access addresses of the data register 33-1 or 33-2.

To reduce the circuit pattern area and hence to achieve a reduction in both chip size and fabrication cost, the Y addressing means 70-1,70-2 have been eliminated in this embodiment and the leading bit serial address fetch circuits 69-1,69-2 have been provided.

The operation is substantially the same as in the first embodiment, as illustrated in FIG. 54. It is different only in that at time t00, an output signal $Ph1_4$ in the start address decoder 66-1 is fetched in a transistor $64\text{-}1_4$ responsive to the signal $P1_{in}$ via a latch $64\text{-}1_4$ in the start address setting circuit 64-1. Then, "1" is written in an F.F. $50\text{-}1_4$ in the pointer 50-1 so that the output of the F.F. $50\text{-}1_4$ is rendered "L". As a result, the data in the register $33\text{-}1_4$ are outputted by a similar operation as in the first embodiment. By inputting the signal $P1_{in}$ or $P2_{in}$ before starting the series of serial accesses explained in connection with the first embodiment, "1" can therefore be written in desired F.Fs. $50\text{-}1_i, 50\text{-}2_i$ in the pointers 50-1,50-2.

Eleventh Embodiment

Figure 55:
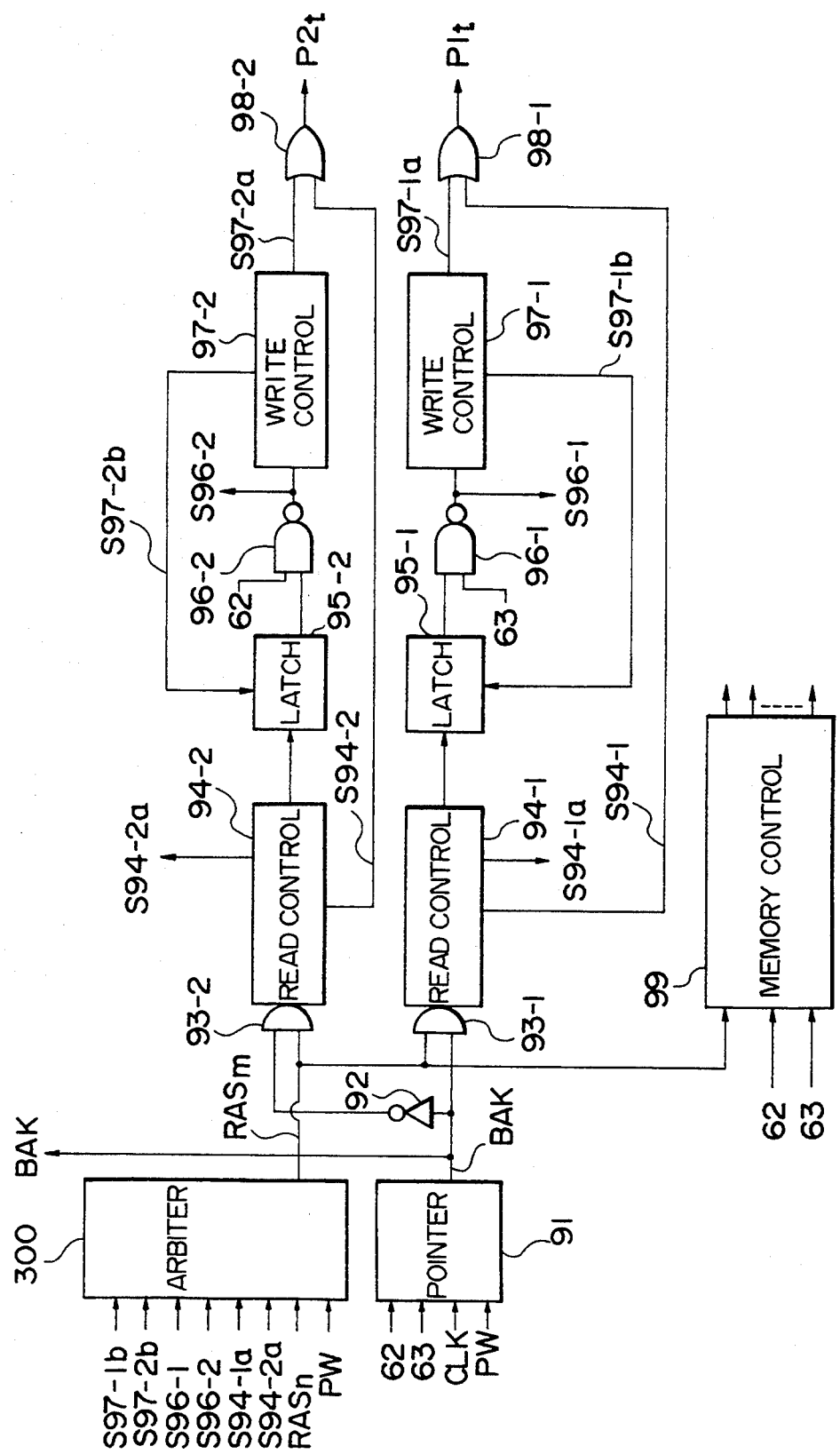
FIG. 55 is a block diagram of a write transfer control, illustrating an eleventh embodiment of the present invention.

FIG. 55 shows the eleventh embodiment and is a circuit diagram of the write transfer control 90 in the second embodiment (FIG. 18).

In the write transfer control 90, an arbiter 300 has been added into the write transfer control of the second embodiment, said write transfer control being illustrated in FIG. 20. An arbiter is such a circuit that when different signals are inputted at the same time, the next input or inputs, if any, are temporarily held until it is decided to which input priority be given or until a circuit operation pertaining to one of the inputs is completed.

The arbiter 300 in FIG. 55 receives, as inputs, output signals S97-1b,S97-2b outputted upon completion of operations of the write controls 97-1,97-2 and composed of one-shot pulses, output signals S96-1,S96-2 from the NANA gates 96-1,96-2, output signals S94-1a, S94-2a outputted upon completion of operations of the read controls 94-1,94-2 and composed of one-shot pulses, the signal $RAS_n$ and the reset signal PW; and outputs signals $RAS_m$ at predetermined timings to the AND gates 93-1,93-2 and the memory control 99.

Figure 56:
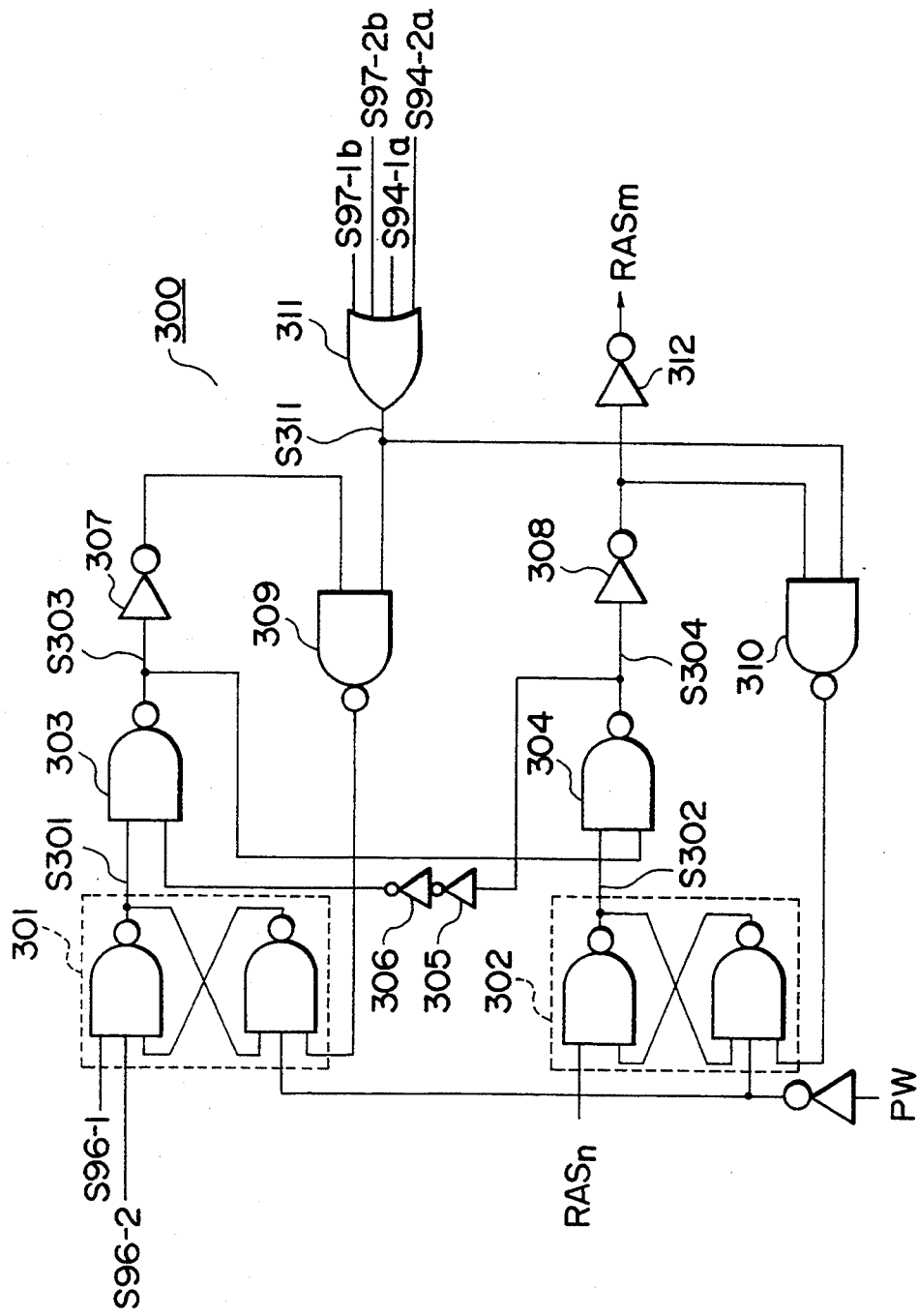
FIG. 56 is a circuit diagram of an arbiter in FIG. 55.

FIG. 56 is a circuit diagram of the arbiter 300 in FIG. 55.

The arbiter 300 is reset by the reset signal PW, and is equipped with F.Fs. 301,302 which are adapted to hold the signals $RAS_n$ and are formed of NAND gates, respectively. Output signals S301,S302 from the F.Fs. 301,302 are routed to NAND gates 303,304, respectively. Their output signals S303,S304 are routed to inverters 307,308, an NAND gate 304, and inverters 305,306.

Outputs of the inverters 307,308 and an output signal S311 are fed back to the F.Fs. 301,302 via NAND gates 309,310, respectively. The signal S311 is generated by an OR gate 311 to which signals S97-1b,S97-2b, S94-1a,S94-2a are inputted. The output of the inverter 308 is inverted to a signal $RAS_m$ by an inverter 312 and is routed to the AND gates 93-1,93-2 and the memory control 99, shown in FIG. 55.

Figure 57:
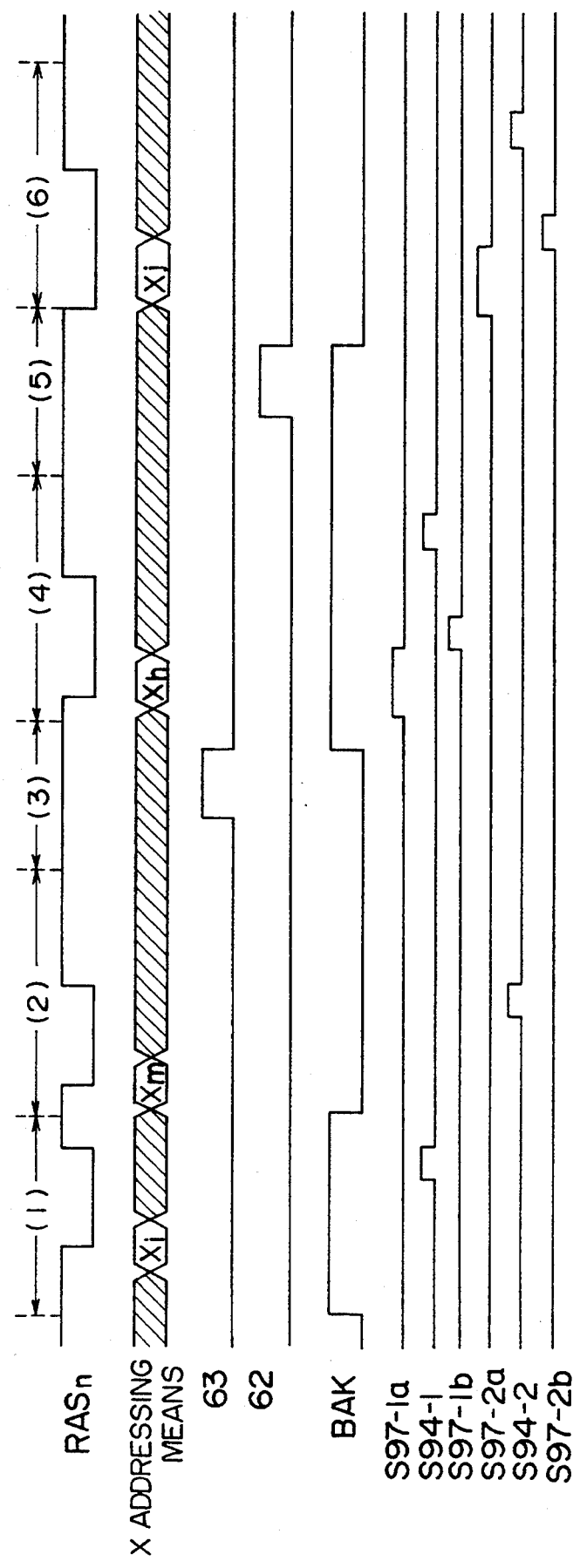
FIG. 57 is a timing chart of the serial access memory in FIG. 18 and of the write transfer control in FIG. 55.
Figure 58:
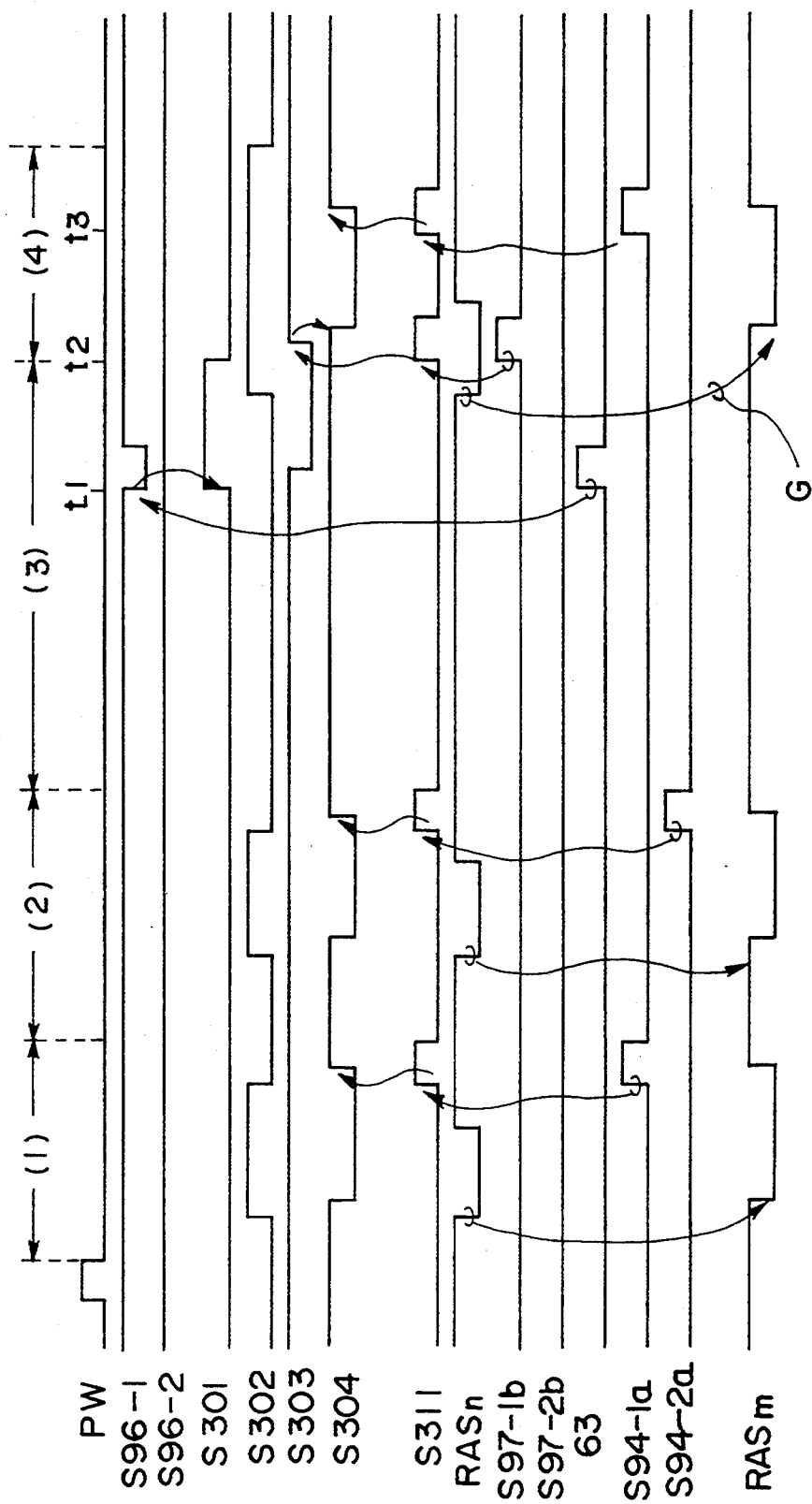
FIG. 58 is a timing chart of the write transfer control in FIG. 55 and of the arbiter in FIG. 56.

FIG. 57 is a timing chart of the write transfer control in FIG. 55, said timing chart corresponding to the timing chart of FIG. 27 out of the timing charts (FIG. 26 and FIG. 27) of the serial access memory of the second embodiment shown in FIG. 18. Further, FIG. 58 is a timing chart of the write transfer control and the arbiter in FIG. 55 and FIG. 56. The periods (1) to (4) in FIG. 58 correspond to the periods (1) to (4) in FIG. 57.

In the second embodiment, it is necessary to set timing so that the X address strobe $RAS_n$ is rendered "L"

responsive to an external input upon completion of a write transfer. From the practical viewpoint, it may be contemplated to determine the timing specification subsequent to observing any change in the pointer output from the line 63 and then to input the signal $RAS_n$ responsive to "L" with a lag equal to or greater than the change. This method however requires the provision of a restriction to the timing of the signal $RAS_n$ and may hence be inconvenient in some instances.

To overcome such inconvenience, the arbiter 300 is provided in the write transfer control 90 in this embodiment as illustrated in FIG. 55. Even when the signal $RAS_n$ is caused to fall in the period (4) right after the pointer signal from the line 63 has changed in the period (3), a series of circuit operations which will be executed continuously subsequent to the fall of the signal $RAS_n$ is temporarily held by the arbiter 300 until the write transfer is completed. This guarantees the operation of the second embodiment.

Operation of the arbiter 300 in FIG. 56 will be described next with reference to FIG. 58.

It is the operations in the periods (2) through (4) in FIG. 58 that are different from the second embodiment. The signal $RAS_n$ remains "L" while the write transfer is being conducted in the period (2). A read transfer command produced by this signal $RAS_n$ is held at the F.F. 302 in FIG. 56 until the output signal S97-1b of the write control 97-1, said output signal indicating the completion of the write transfer, rises.

Namely, the pointer output from the line 63 rises at time t1 in FIG. 58. Responsive to the rise, the output signal S96-1 from the NAND gate in FIG. 55 becomes "L" so that the write transfer operation starts. This operation starts responsive only to a pointer output from the line 63 and is irrelevant to the signal $RAS_n$. In the course of this write transfer, the signal $RAS_n$ changes to "L". If not in a write transfer, the write transfer would be started immediately. The write transfer is however held temporarily because the output signal S303 from the NAND gate 303 in FIG. 56 is "L".

At time t2, the output signal S97-1b from the write control 97-1, said output signal indicating the completion of the write transfer, rises so that the output signal S303 from the NAND gate 303 in FIG. 5 is rendered "H". As a consequence, the above-described holding of the write transfer is canceled so that a read transfer starts.

At time t3, the output signal S94-1a from the read control 94-1 in FIG. 55 rises after completion of the read transfer. To permit input of the signal $RAS_n$, the F.F. 302 is reset via the OR gate 311 and the NAND 310 in FIG. 56.

In this embodiment, it is automatically feasible to perform a read transfer after completion of a write transfer even if the signal $RAS_n$ is caused to fall immediately after a change in the pointer output from the line 63. It is therefore unnecessary to provide any restriction for the timing of the signal $RAS_n$ unlike the second embodiment, leading to simpler signal control.

Twelfth Embodiment

Figure 59:
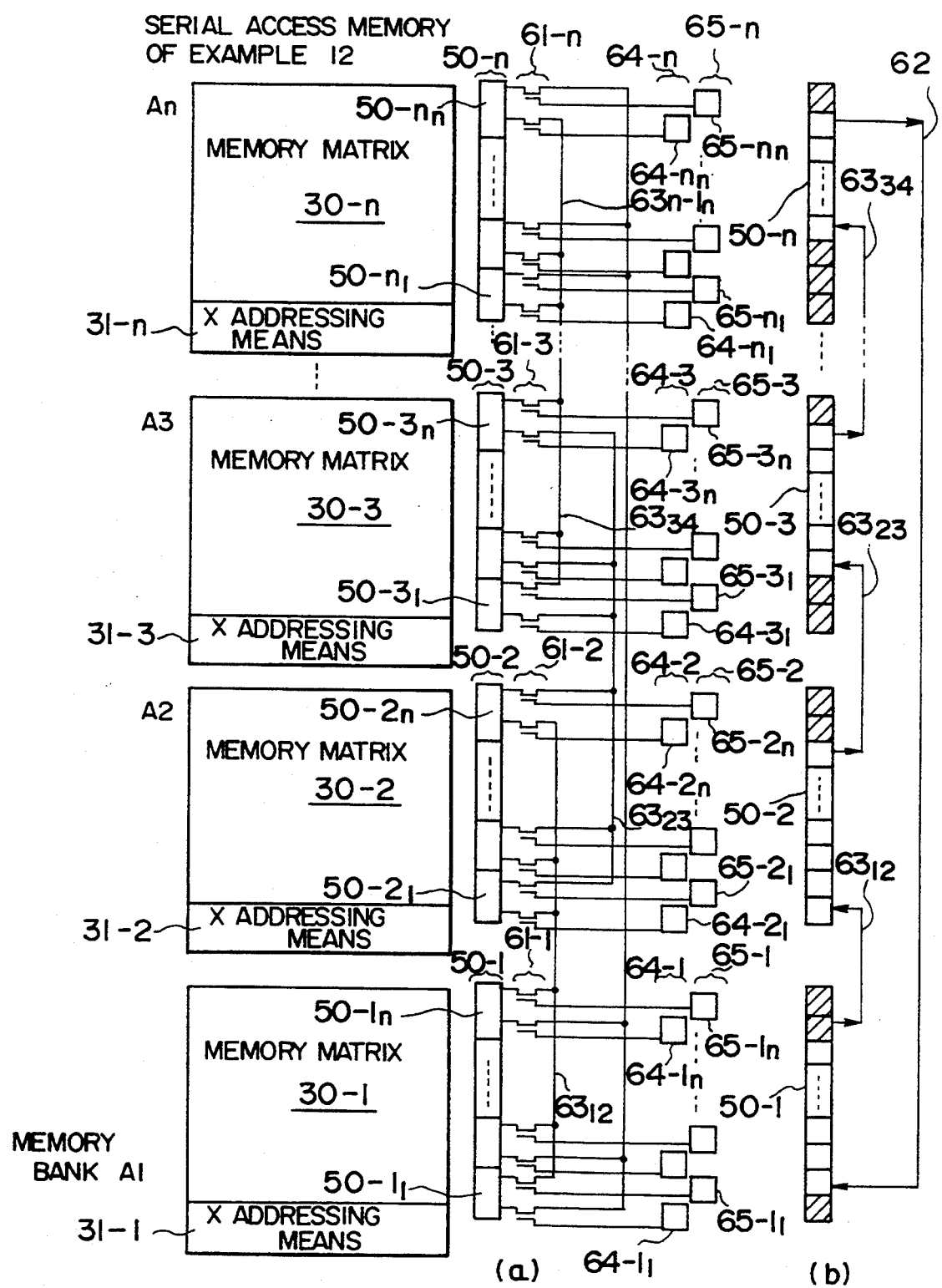
FIG. 59 is a simplified block diagram of a serial access memory according to a twelfth embodiment of the present invention.

FIGS. 59(a) and 59(b) show the serial access memory according to the twelfth embodiment. FIG. 59(a) is a fragmentary circuit diagram whereas FIG. 59(b) depicts one example of the construction of the pointer output routes. Incidentally, elements common to those in FIG. 5, FIG. 6 and FIG. 7, which show the first embodiment, are designated by like reference symbols.

In this embodiment, three or more memory banks A1 to An similar to the memory banks A1,A2 of the first embodiment shown in FIG. 5 are provided. The memory banks A1 to An are provided with memory matrices 30-1 to 30-n, pointers 50-1 to 50-n, groups of switching means 61-1 to 61-n, start address setting circuits 64-1 to 64-n, end address setting circuits 65-1 to 65-n, and the like, respectively. The individual pointers 50-1 to 50-n are corrected via the groups of switching means 61-1 to 62-n and second lines $63_{i-1,i}$ (i=1 to n). Further, the input side of the pointer 50-1 in the first stage and the output side of the pointer 50-n in the last stage are connected via the groups of switching means 61-1 to 61-n and the first line 62.

In this serial access memory, the groups of switching means 61-1 to 61-n are opened or closed by outputs from the start address setting circuits 64-1 to 64-n and the end address setting circuits 65-1 to 65-n. Pointer outputs are transferred along the ines $63_{i-1,i}$ in the order of pointers 50-1→50-2, 50-2→50-3, ..., 50-(n−1)→50-n and the output of the pointer 50-n in the final stage is fed back and inputted to the pointer 50-1 in the first stage through the line 62. This embodiment is therefore effective, for example, in selecting several successive bytes from the plurality of memory banks A1 to An and conducting a high-speed access in a serial manner.

Thirteenth Embodiment

Figure 60:
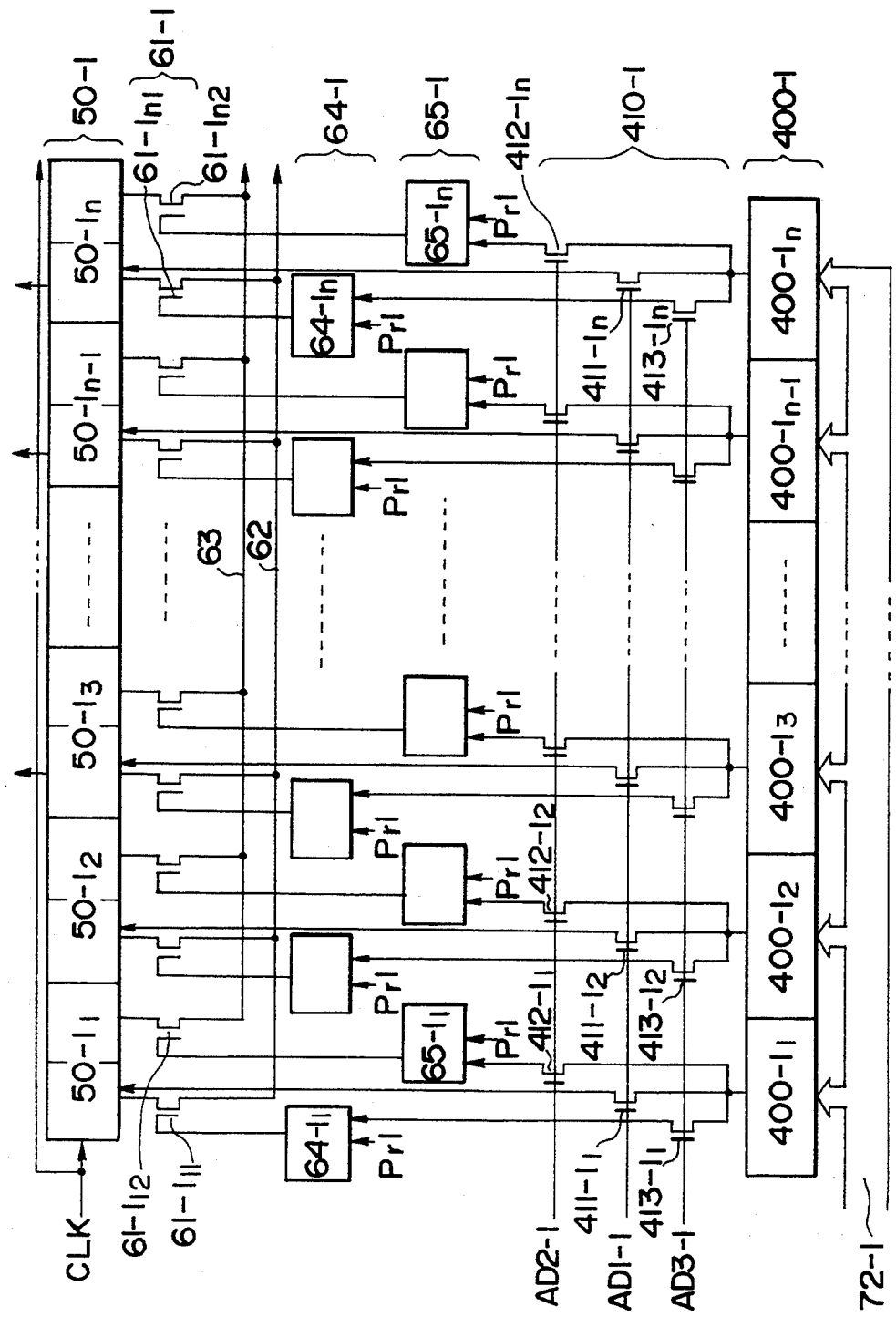
FIG. 60 is a fragmentary circuit diagram on the side of the memory bank A1, showing a thirteenth embodiment of the present invention.
Figure 61:
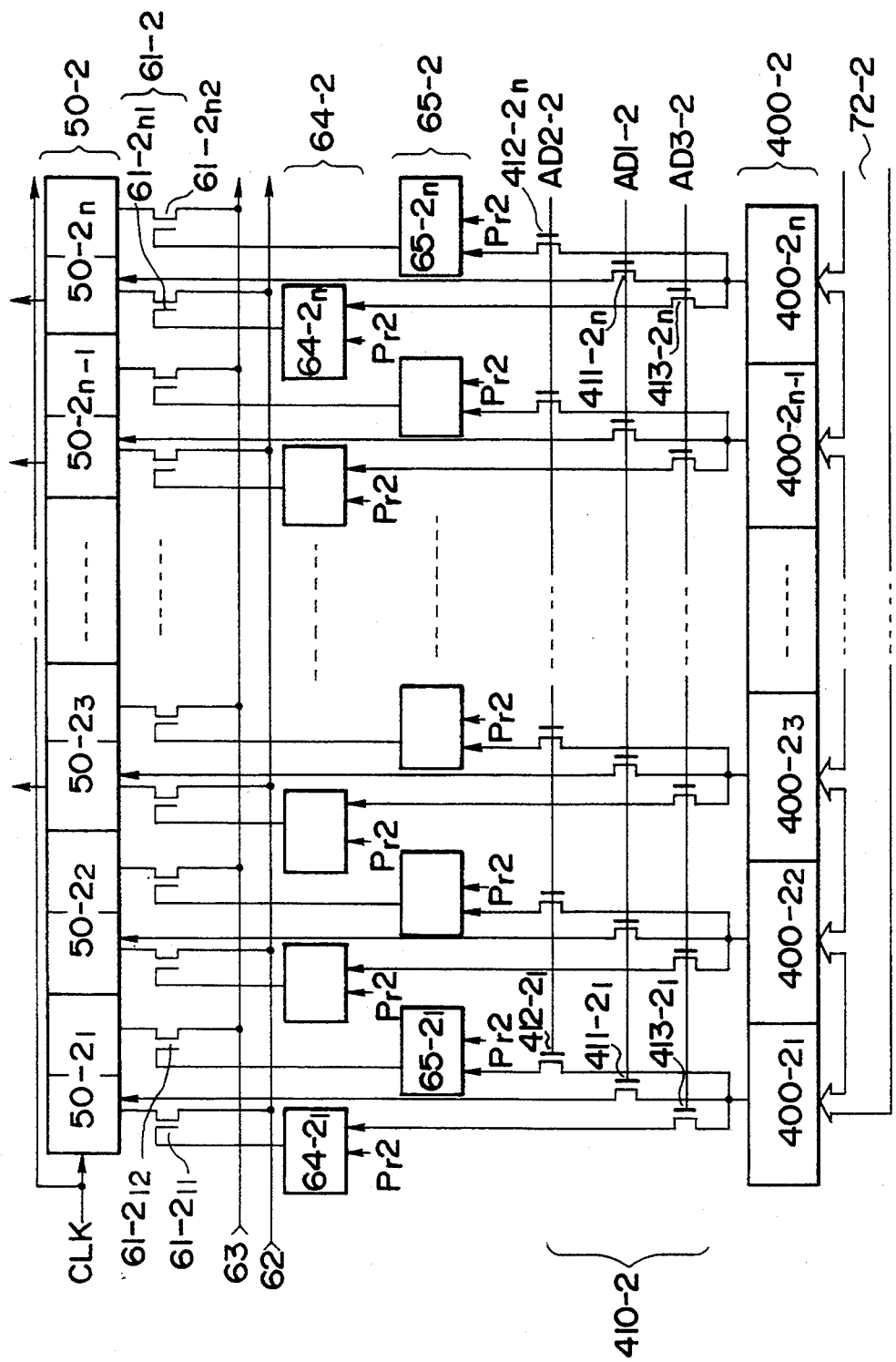
FIG. 61 is a fragmentary circuit diagram on the side of the memory bank A2, showing the thirteenth embodiment of the present invention.

FIG. 60 and FIG. 61 show the serial access memory according to the thirteenth embodiment. FIG. 60 is a fragmentary circuit diagram on the side of the memory bank A1 whereas FIG. 61 is a fragmentary circuit diagram on the side of the memory bank A2. Incidentally, elements common to those in FIG. 5, FIG. 6 and FIG. 7, which show the first embodiment, are designated by like reference symbols.

In place of the Y addressing means 70-1,70-2 in FIG. 6 and FIG. 7, this embodiment is provided with common Y addressing means 400-1,400-2 which decode in a timesharing manner Y addresses fed through the Y address buses 72-1,72-2. Further, instead of the start address decoders 66-1,66-2 and the end address decoders 67-1,67-2 in FIG. 6 and FIG. 7, this embodiment is provided with address selector outputs 410-1,410-2 which select the outputs of common Y addressing means 400-1,400-2 on the basis of address selection signals AD1-1 to 3-1,AD1-2 to 3-2.

The Y address outputs 400-1,400-2 are composed of plural decoders 400-1$_i$,400-2$_i$ (i=1 to n), respectively. The address selector means 410-1,410-2 are on-off controlled by the address selection signals AD1-1 to AD3-1,AD1-2 to AD3-2 and are composed of switching stages for transferring outputs of Y addressing means 400-1,400-2, for example, transistors 411-1$_i$,412-1$_i$, 413-1$_i$,411-2$_i$,412-2$_i$,413-2$_i$ (i=1 to n), respectively. The transistors 411-1$_i$,411-2$_i$ have a function to transfer the outputs of the Y addressing means 400-1,400-2 to the pointers 50-1,502, the transistors 412-1$_i$,412-2$_i$ have a function to transfer the outputs of the Y addressing means 400-1,400-2 to the end address setting circuits 65-1,65-2, and the transistors 413-1$_i$,413-2$_i$ have a function to transfer the outputs of the Y addressing means 400-1,400-2 to the start address setting circuits 64-1,64-2, respectively.

Figure 62:
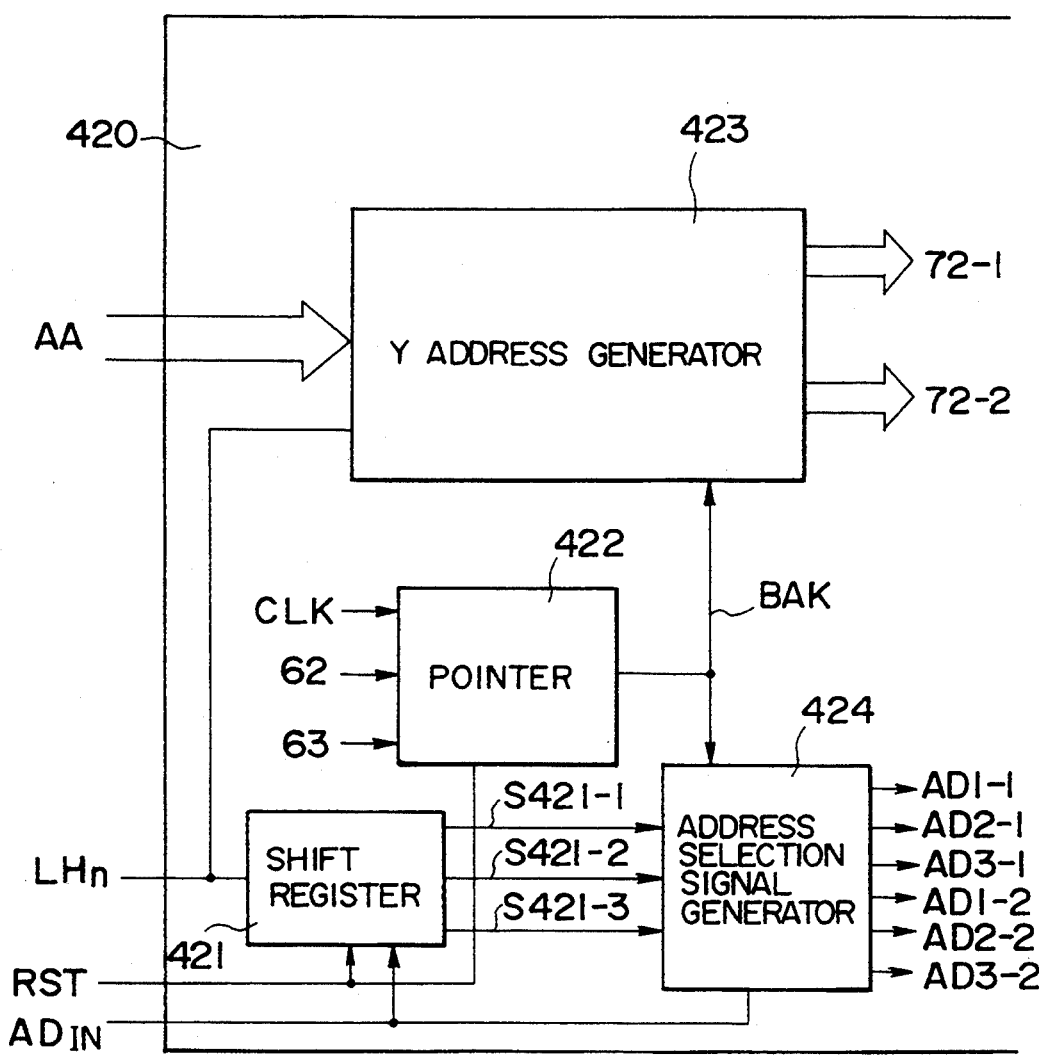
FIG. 62 is a block diagram of an address control, showing the thirteenth embodiment of the present invention.

FIG. 62 is a block diagram of an address control for the Y addressing means 400-1,400-2 and the address selector means 410-1,410-2 in FIG. 60 and FIG. 61.

A serial access memory 420 is internally provided with a shift register 421 and a pointer 422. The shift register 421 receives as inputs an inverted address latch signal $LH_n$, the reset signal RST and an address transfer enable signal ADIN and outputs signals S421-1 to S421-3, while the pointer 422 receives as input the reset signal RST, the signal ADIN, the clock signal CLK and pointer outputs from the lines 62,63 and outputs point signals BAK instructing memory regions to be accessed. To the output side of the pointer 422, a Y address generator 423 and an address selection signal generator 424 are connected.

The Y address generator 423 receives as an input an external input address AA responsive to the inverted address latch signal $LH_n$ and outputs a Y address to the Y address buses 72-1,72-2 responsive to the point signal BAK. The address selection signal generator 422 receives as inputs the signals S421-1 to S421-3 on the basis of the address transfer enable signal ADIN and the point signal BAK and outputs the address selection signals AD1-1 to AD3-1,AD1-2 to AD3-2.

Figure 63:
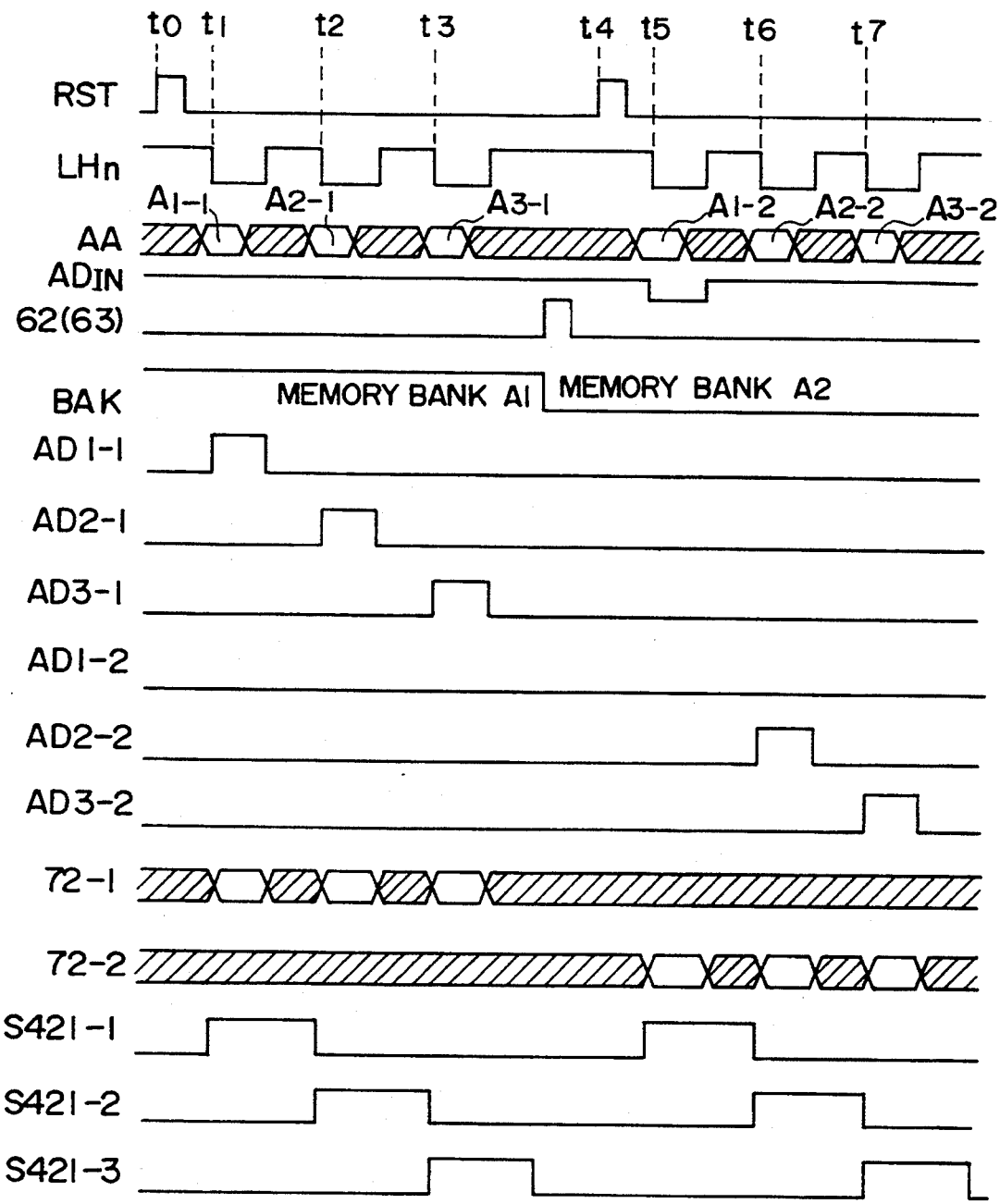
FIG. 63 is a timing chart of the address control in FIG. 62.
Figure 64:
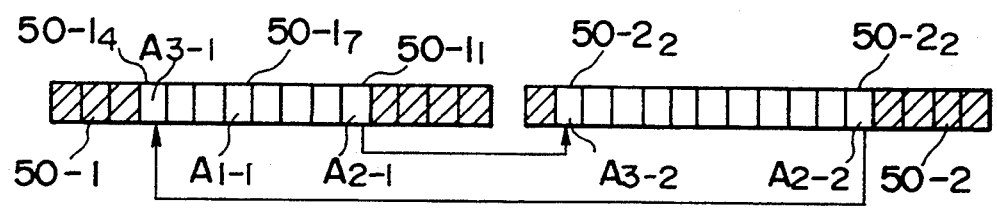
FIG. 64 diagrammatically illustrates routes of movement of pointer outputs in FIG. 60 and FIG. 61.

FIG. 63 is a timing chart of the address control in FIG. 62, and FIG. 64 diagrammatically shows the routes of movement of pointer output in FIG. 60 and FIG. 61. The circuit operation will be described with reference to these drawings.

When the reset signal RST becomes "H" at time t0 in FIG. 63, the shift register 421 and the pointer 422 in FIG. 62 are each reset into an initial state. The output signals S421-1 to S421-3 of the shift register 421 are all rendered "L".

When the latch signal $LH_n$ becomes "L" at time t1, the Y address generator 423 fetches an address A1-1. At this time, assume that the point signal BAK (identical to the BAK in the second embodiment), which decides whether the Y addressing means 400-1 or 400-2 be addressed, is "H" and the Y addressing means 400-1 is to be accessed. Then, the Y address generator 423 outputs a Y address $DA_i$ to the Y address bus 72-1. The Y address $DA_i$ is decoded by the Y addressing means 400-1 in FIG. 60.

Since the signal ADIN is "H" the shift register 421 outputs the signal S421-1 in synchronization with a fall of the latch signal $LH_n$. As a result, the address selection signal AD1-1 outputted from the address selection signal generator 424 becomes "H". When the address selection signal AD1-1 becomes "H", the transistors 411-1$_i$ in FIG. 60 are made conductive so that the outputs of the Y addressing means 400-1 are inputted to the F.Fs. 50-1$_i$ in the pointer 50-1.

At time t2, the latch signal $LH_n$ is rendered "L"and a Y address A2-1 is fetched in the Y address generator 423. The output signal S421-2 of the shift register 421 becomes "H" and the address selection signal AD2-1 of the address selection signal generator 424, which has been activated responsive to "H" of the signal ADIN, is rendered "H". The transistors 412-1$_i$ in FIG. 60 are then rendered conductive and decode outputs of the Y addressing means 400-1 are inputted to the latches 65-1$_i$ in the end address setting circuit 65-1, whereby the outputs of the latches 65-1$_i$ are determined.

At time t3, the latch signal $LH_n$ becomes "L" and a Y address A3-1 is fetched in the Y address generator 423. The output signal S421-3 of the shift register 421 is rendered "H" and the address selection signal SD3-1 of the address selection signal generator 424 becomes "H". The transistors 413-1$_i$ in FIG. 60 are hence rendered conductive, whereby decode outputs of the Y addressing means 400-1 are inputted to the latches 64-1$_i$ in the start address setting circuit 64-1 and the outputs of the latches 64-1$_i$ are determined.

As has been described above, the Y addresses A1-1 to A3-1 are inputted separately in three operations by using the common Y addressing means 400-1 and the decode outputs of the Y addressing means 400-1 can be distributed in a time-sharing manner to the pointer 50-1, the end address setting circuit 65-1 and the start address setting circuit 64-1 via the address selector means 410-1. Owing to this, the circuit sizes of the Y addressing means 400-1 and the address selector means 410-1 are reduced to one-third compared with the serial access memory of the first embodiment, whereby the area required to form the circuit pattern is significantly reduced.

Circuit operations at times t4 to t7 are also similar to those described above except that the memory bank A is accessed responsive to "L" of the point signal BAK. At time t5, however, the signal ADIN is "L" so that the address selection signal AD1-2 does not become "H".

At the timing shown in FIG. 63, the routes of movement of the pointer outputs depicted in FIG. 64 will be described next.

At time t1 in FIG. 63, "1" is set in the F.F. 50-1$_7$ of the pointer 50-1 upon input of the Y address A1-1, so that the leading address of the serial access is decided. At time t2, input of the Y address A2-1 decides the end address of the serial access in the pointer 50-1. At time t3, input of the Y address A3-1 decides the start address of the serial access in the pointer 50-1.

At time t5, the address selection signal AD1-2 does not become "H" because the signal ADIN is "L". For this reason, the Y address A1-2 is eventually not fetched. At time t6, the end address A2-2 of the serial access in the pointer 50-2 is fetched and then, the start address A3-2 of the serial access is fetched at time t7.

According to the circuit operations illustrated in FIG. 63, it is therefore possible to access starting at the address A1-1 as the leading address and in the order of A1-1, ..., A2-1, A3-2, ..., A2-2, A3-1, .... When the individual external input addresses are not fetched while controlling them by the signal ADIN, the previous addresses are stored so that the control of the order of the serial access can be simplified. The order of fetching of the address A1-1, A2-1, A3-1, ... can be changed as desired.

As has been described above, the Y addressing means 400-1 is used commonly as the Y addressing means 400-1 and 400-2 and each decode operation is performed in the time-sharing manner in the present embodiment. This has made it possible to reduce the circuit size and the circuit pattern forming area while enabling similar access operations to the first embodiment.

Fourteenth Embodiment

Figure 65:
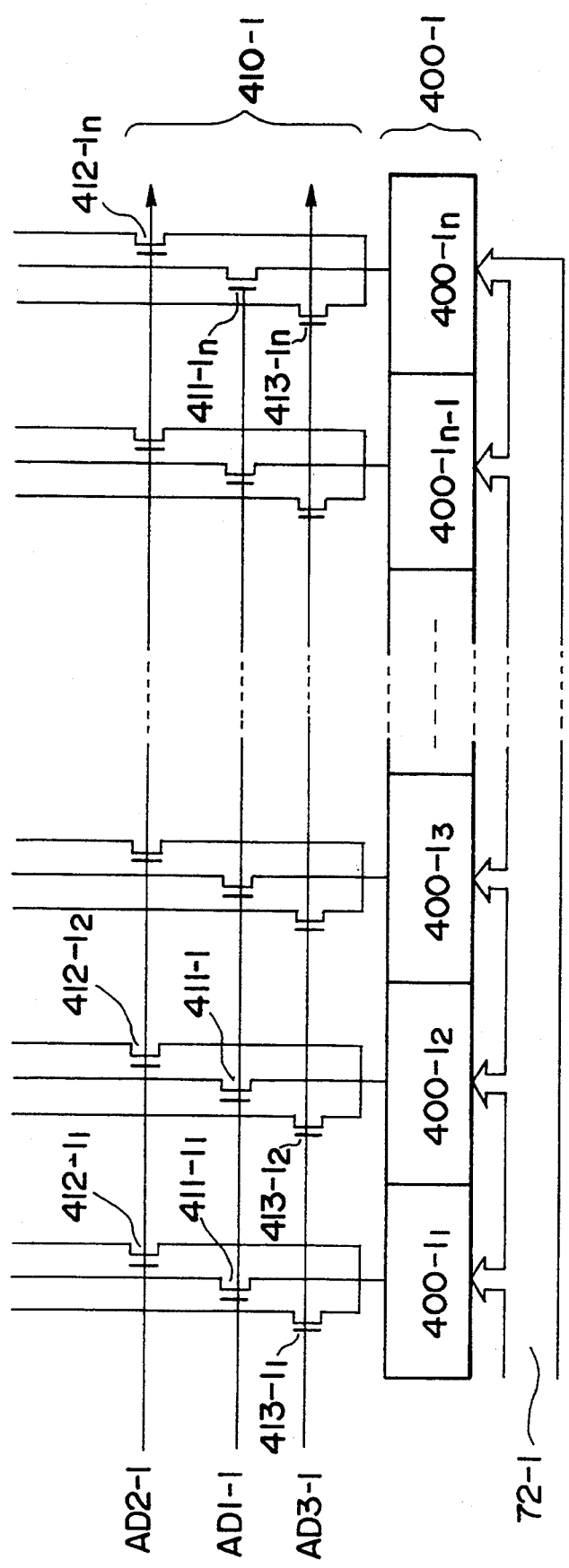
FIG. 65 is a fragmentary circuit diagram on the side of the memory bank A1, showing a fourteenth embodiment of the present invention.
Figure 66:
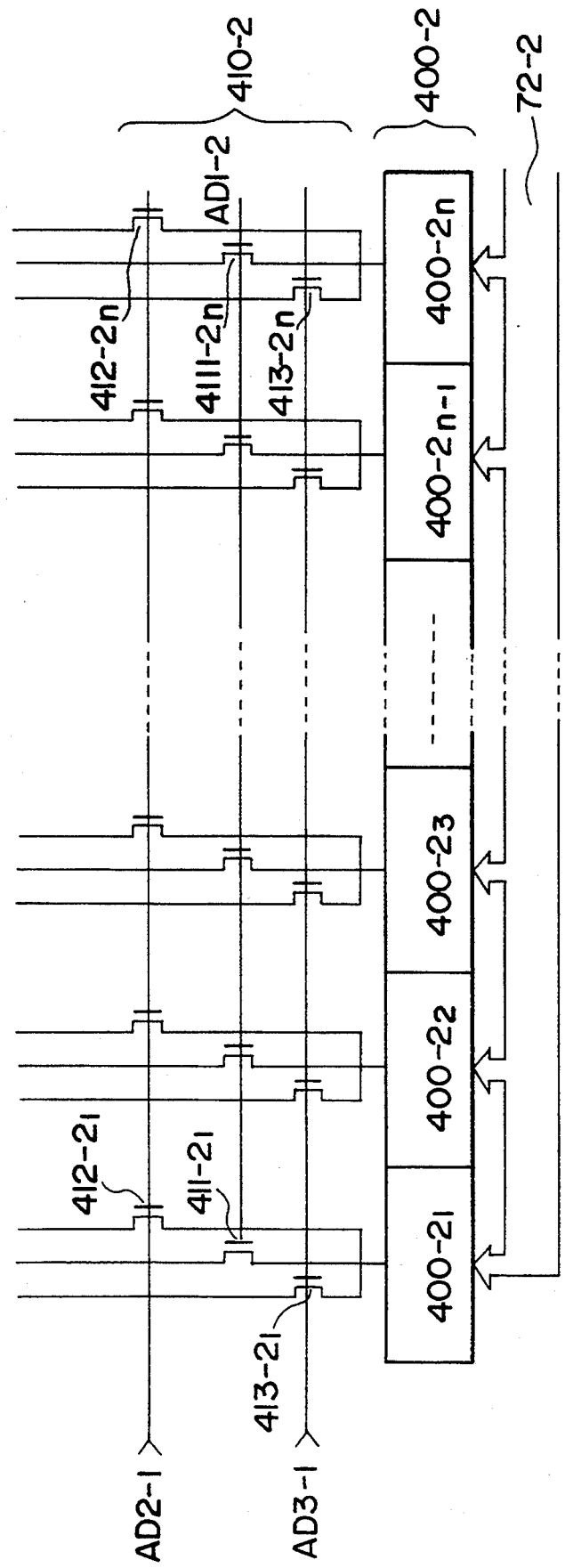
FIG. 66 is a fragmentary circuit diagram on the side of the memory bank A2, showing the fourteenth embodiment of the present invention.

FIG. 65 and FIG. 66 illustrate the serial access memory according to the fourteenth embodiment of the present invention. FIG. 65 is a fragmentary circuit diagram on the side of the memory bank A1, while FIG. 66 is a fragmentary circuit diagram on the side of the memory bank A2. Elements common to those in FIG. 60 and FIG. 61, which show the thirteenth embodiment, are designated by like reference symbols.

Among the address selection signals in FIG. 60 and FIG. 61, the address selection signals AD2-1 and AD2-2 are rendered common to each other and so the address selection signals AD3-1 and AD3-2, in this embodiment. Reflecting this, an address control depicted in FIG. 67 is constructed as follows.

Figure 67:
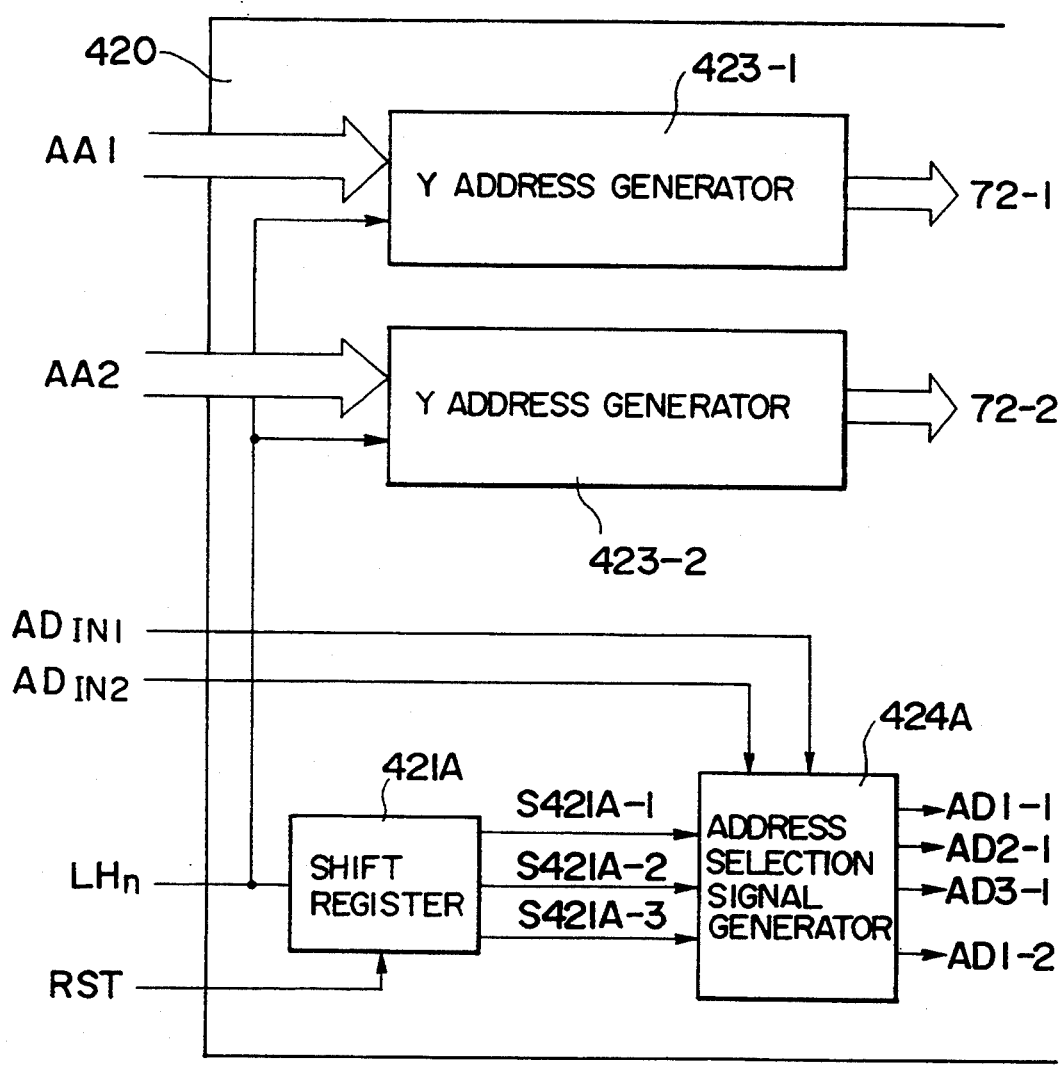
FIG. 67 is a block diagram of an address control, showing the fourteenth embodiment of the present invention.

Namely, the address control of FIG. 67 is provided with Y address generators 423-1,423-2 which are independent of each other. The Y address generators 423-1,423-2 latch mutually-independent external input addresses AA1,AA2, respectively, responsive to the inverted address latch signal $LH_n$ and output independent Y addresses to the Y address buses 72-1,72-2, respectively. A shift register 421A to which the latch signal $LH_n$ and the reset signal RST are inputted feeds output signals S421A-1 to S421A-3 to an address selection signal generator 424A.

The address selection signal generator 424A outputs address selection signals AD1-1,AD1-2,AD2-1,AD3-1 on the basis of leading address fetch control signals ADIN1,ADIN2. Namely, the address control is constructed so that upon decision of the leading address of serial addresses, the leading address fetch control signals ADIN1,ADIN2 decide which one of the Y addressing means 400-1 and 400-2 be selected.

Figure 68:
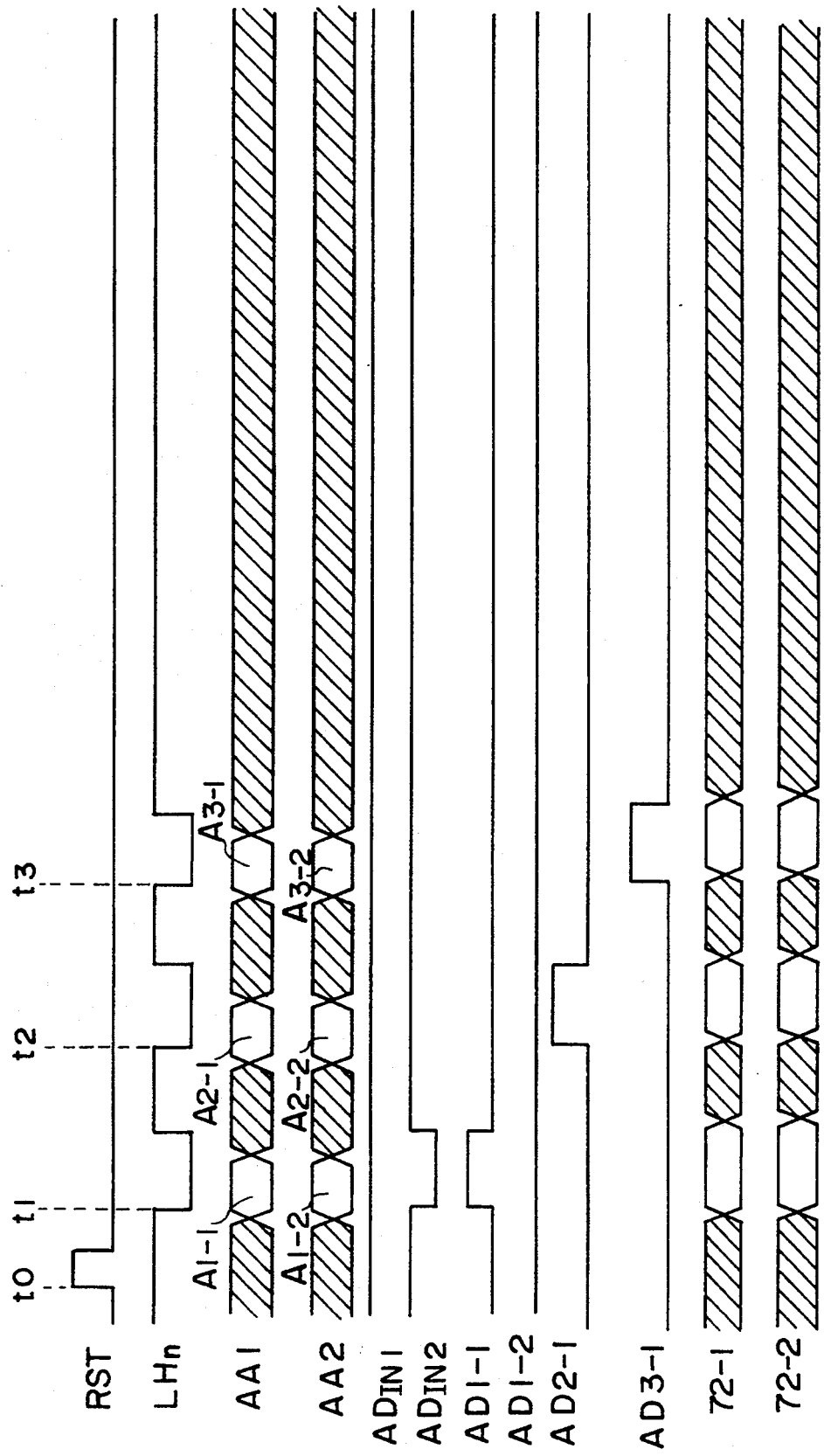
FIG. 68 is a timing chart of the address control in FIG. 67.

FIG. 68 is a timing chart showing the operation of the address control in FIG. 67.

The address control performs the same operation as the thirteenth embodiment except that the start address, end address and leading address of a serial access are set at once by the pointers 50-1,50-2 right before the serial access. Where the leading address is on the side of the pointer 50-1, the signals ADIN1 and ADIN2 are rendered "H" and the signal ADIN2 is rendered "L". Where the leading address is on the side of the pointer 50-2, on the other hand, the signal ADIN 2 is held "H" while the signal ADIN1 is rendered "L". The pointer output routes are the same as those in FIG. 64 which illustrates the thirteenth embodiment.

In this embodiment, pointer output routes for a serial access can be set at once prior to the serial access. When the pointer outputs thereafter are continued in a cyclic manner, this embodiment is very effective because the address control can be simplified and the number of address selection signal lines can be reduced.

Fifteenth Embodiment

Figure 69:
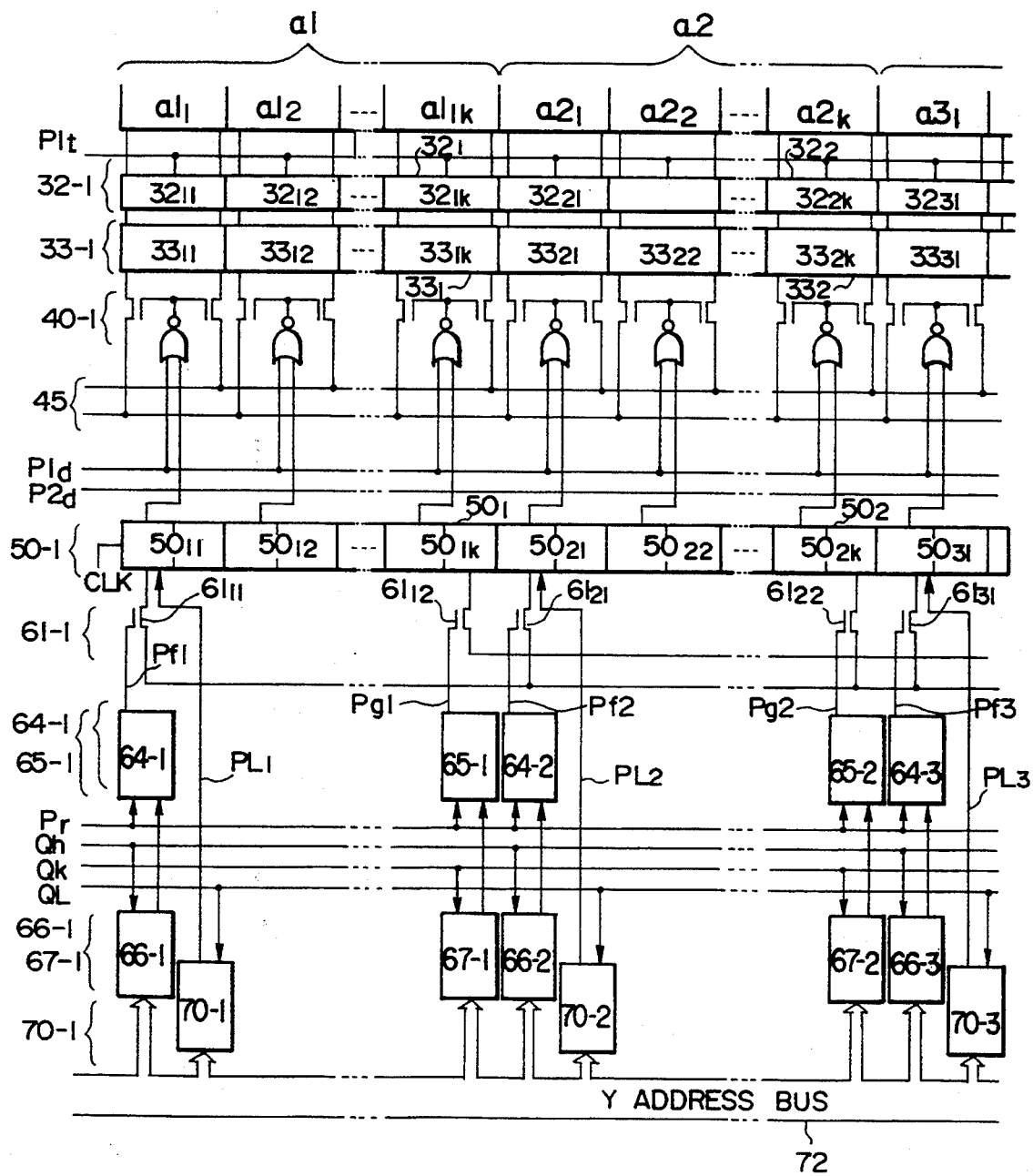
FIG. 69 is a fragmentary circuit diagram of a serial access memory according to a fifteenth embodiment of the present invention.

FIG. 69 is a fragmentary circuit diagram of the serial access memory according to the fifteenth embodiment, in which elements common to those of the first embodiment shown in FIG. 5, FIG. 6 and FIG. 7 are designated by like reference symbols. Incidentally, FIG. 69 shows only a circuit corresponding to the side of the memory bank A1 in FIG. 6 and illustration of a circuit corresponding to the side of the memory bank A2 is omitted.

In FIG. 6 and FIG. 7 directed to the first embodiment, a serial access is performed by changing the routes for pointer outputs. Based on start addresses and end addresses in the pointers 50-1,50-2, registers 33-$1_i$,33-$2_i$ (i=1 to n) in the data registers 33-1,33-2, said registers 33-$1_i$,33-$2_i$ corresponding to the individual memory column units a$1_i$,a$2_i$ (i=1 to n), are selected. In the present embodiment, on the other hand, plural (k) memory column units $a_{ik}$ are selected by the start address setting circuit 64-1 (or 64-2) and one of the latches $64_i$,$64_i$ (i=1 to n) in the end address setting circuit 65-1 (or 65-2).

Namely, the plural F.Fs. which make up the pointer 50-1 are divided in plural blocks $50_1,50_2,\ldots$ in this embodiment. The respective blocks $50_1,50_2,\ldots$ are formed of plural bits of F.Fs. $50_{11}$-$50_{1k}$,$50_{21}$-$50_{2k}$,$\ldots$ and have a function to access the data register 33-1 composed of the plural registers $33_{11}$-$33_{1k}$,$33_{21}$-$33_{2k}$,$\ldots$ which are connected to the respective memory column groups $a_i$ (i=1 to n).

Connected to the Y address bus 72 are the Y addressing means 70-1 for latching Y addresses responsive to each latch signal QL, the end address decoder 67-1 for outputting an end address from the Y addresses responsive to the latch signal Qk, and the start address decoder 66-1 for outputting a start address from the Y addresses responsive to the latch signal Qh. The Y addressing means 70-1, the end address decoder 67-1 and the start address decoder 66-1 are each composed of plural latches $70_i$,$67_i$,$66_i$ (i=1 to n).

The first embodiment is constructed so that one memory column unit $a1_i$ or $a2_i$ is selected by one set of latches 66-$1_i$,67-$1_i$ or 66-$2_i$,67-$2_i$ in the start address decoders 66-1,66-2 and the end address decoders 66-$2_i$, 67-$2_i$. In the present embodiment, on the other hand, a desired number (k) of memory units $a_{11}$-$a_{ik}$,$a_{21}$-$a_{2k}$, $\ldots$ are divided in blocks as memory column groups $a_1,a_2,\ldots$ and the memory units are selected block by block.

The switching means 61-1 which decides routes for pointer outputs is composed of first switching means on an input side, said first switching means being formed of transistors $61_{11}$,$61_{21}$,$61_{31}$, $\ldots$, and second switching means on an output side, said second switching means being formed of transistors $61_{12}$,$61_{22}$, $\ldots$. Similarly, the switching means 61-2 on the side of the memory bank A2 corresponding to FIG. 9 is composed of third switching means on an input side and fourth switching means on an output side. The first switching means formed of the transistors $61_{11}$,$61_{21}$,$61_{31}$,... is connected to the F.Fs. $50_{i1}$ in the blocks $50_1,50_2,\ldots$ of the pointer 50-1. The second switching means formed of the F.Fs. $61_{12}$,$61_{22}$, $\ldots$ are connected to the F.Fs. $50_{ik}$ in the blocks $50_1,50_2,\ldots$ of the pointer 50-1. To the F.Fs.$_{i2}$, F.Fs.$_{i3}$, $\ldots$, and F.Fs.$_{i(k-1)}$ located intermediately, no switching means are connected with respect to the line 62 or 63. The circuit on the side of the memory bank A2 has a similar construction.

Figure 70:
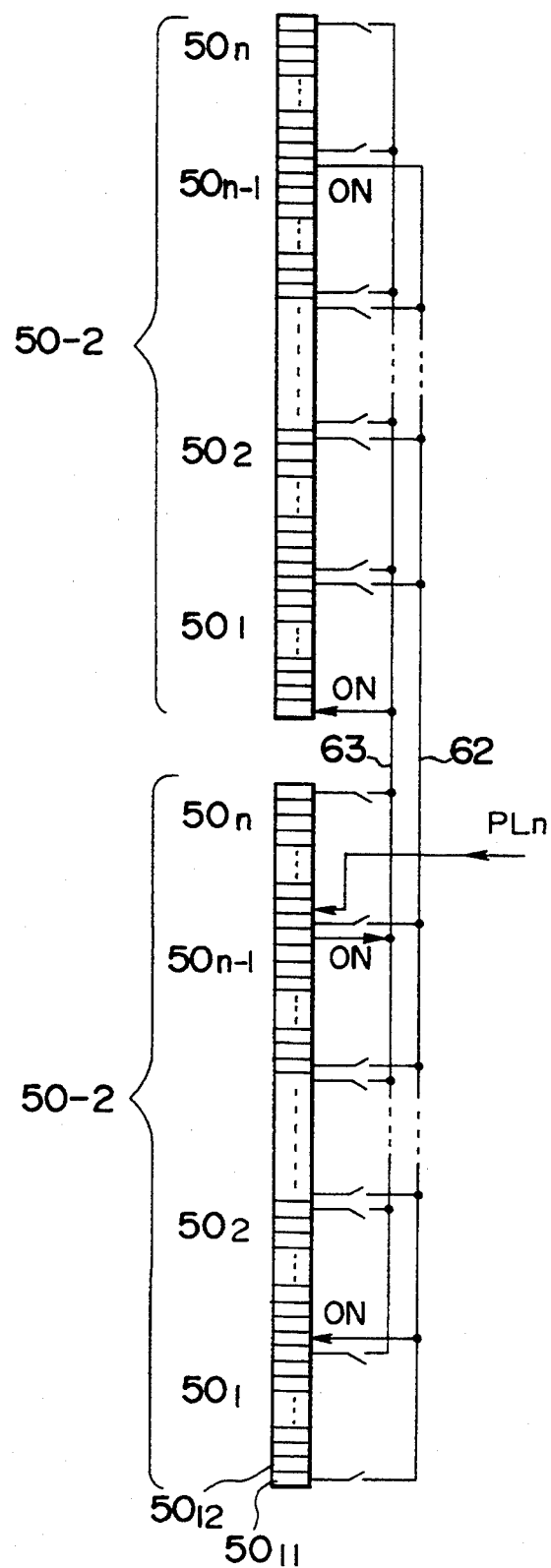
FIG. 70 diagrammatically illustrates routes of movement of pointer outputs in FIG. 69.

FIG. 70 diagrammatically illustrates the routes of movement for pointer outputs in FIG. 69.

Since this embodiment does not permit designation of pointer output routes in so detail as in the first embodiment, routes are separately set for each block $50_i$ (i=1 to n) in the pointers 50-1,50-2. Namely, "1" is written in the lowest F.F. (for example, $50_{i1}$ in $50_i$) in each block $50_i$ in the pointer 50-1, said F.F. having been selected by the Y addressing means 70-1, whereby the leading address of a serial access is designated. The "1" so written is sequentially shifted through the blocks $50_i$ in the pointer 50-1 in accordance with the clock signal CLK.

When the leading address of a serial access is designated, for example, responsive to the output signal $pL_n$ from the Y addressing means 70-1, the register $33_{n1}$ designated by the F.F. $50_{n1}$ in the block $50_n$ of the pointer 50-1 becomes the leading bit. The pointer output is then shifted in the order of F.F. $50_{n2}$, F.F. $50_{n3}$, ..., and F.F. $50_{nk}$ in accordance with the clock signal CLK, moves to the block 501 of the pointer 50-2 through the line 63, and is shifted in the order of F.F. $50_{12}$, F.F. $50_{13}$, ..., and F.F.$_{1k}$.

Where address designation to decide the routes for outputs from the pointers 50-1,50-2 does not select the memory column units $a_{ik}$ (i=1 to n) individually but selects memory column groups $a_1,a_2,\ldots$, which consist of plural (for example, 4, 8, 16, 32, and so on) successive memory column units, as unit blocks in this embodiment as described above, the first F.F. $50_{i1}$ in the block $50_i$ corresponding to one of the unit blocks is inputted with a pointer output from a block $50_i$ in the other pointer 50-2. Further, a pointer output from the n-th F.F. $50_{in}$ is inputted to the block $50_i$ in the other pointer 50-2, whereby addresses are selected unit block by unit block.

Where it is, as in the first embodiment, the discrete registers $33\text{-}1_i, 33\text{-}2_i$ that are controlled by the start address decoders 66-1,66-2 and the end address decoders 67-1,67-2, there is the merit that routes for pointer outputs can be set in detail at random. A large area is, however, required to form the data registers 33-1,33-2 on an IC chip. In the present embodiment, it is therefore designed to set routes for pointer outputs with respect to the individual blocks $50_i$ of the pointers 50-1,50-2 so that the area for the formation of circuits and the fabrication cost have been both reduced. This embodiment is accordingly effective for applications where an serial access is require 8 bits by 8 bits or 16 bits by 16 bits, for example, as in CPU systems.

Sixteenth Embodiment

Figure 71:
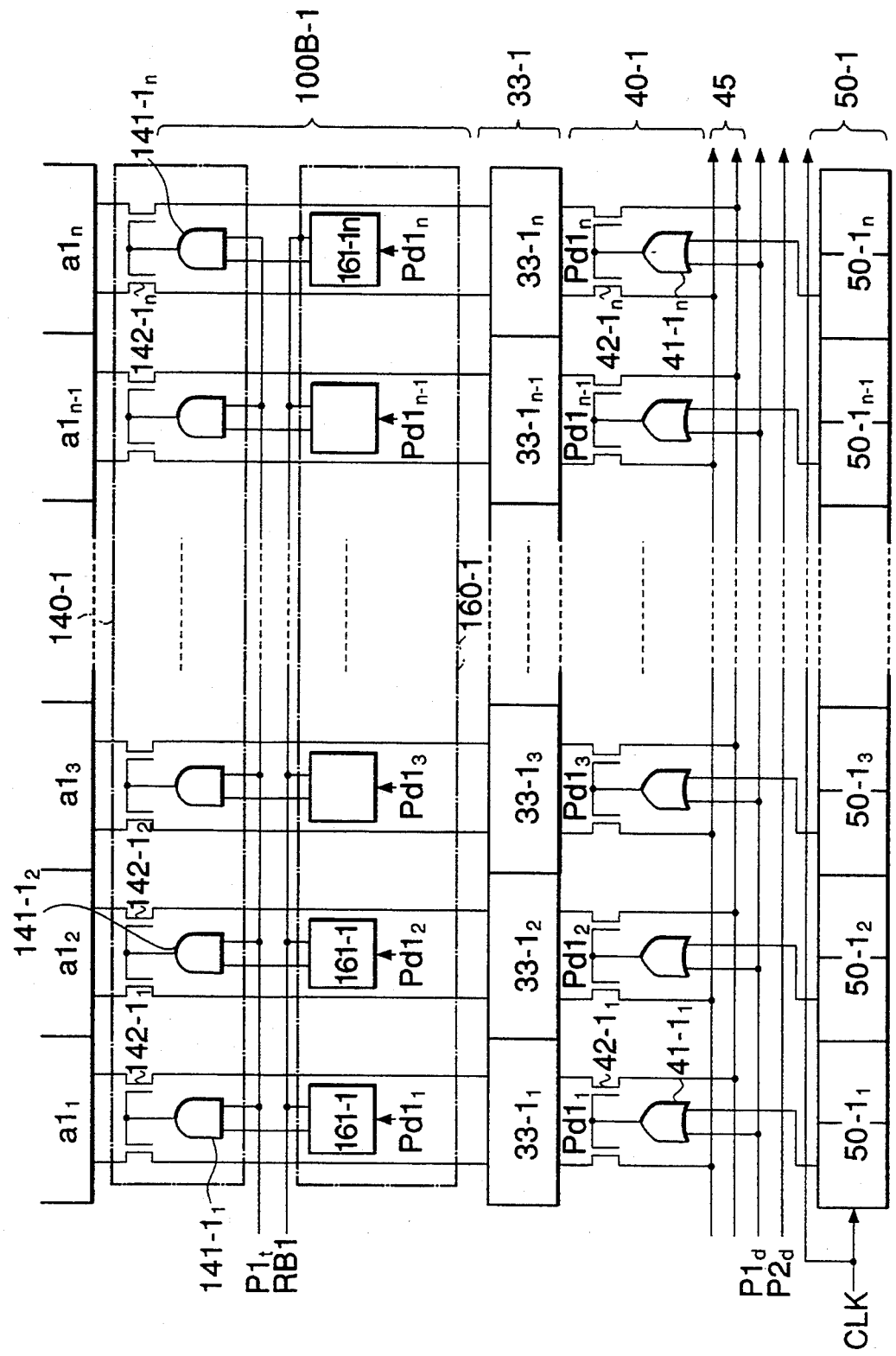
FIG. 71 is a fragmentary circuit diagram on the side of the memory bank A1, showing a sixteenth embodiment of the present invention.
Figure 72:
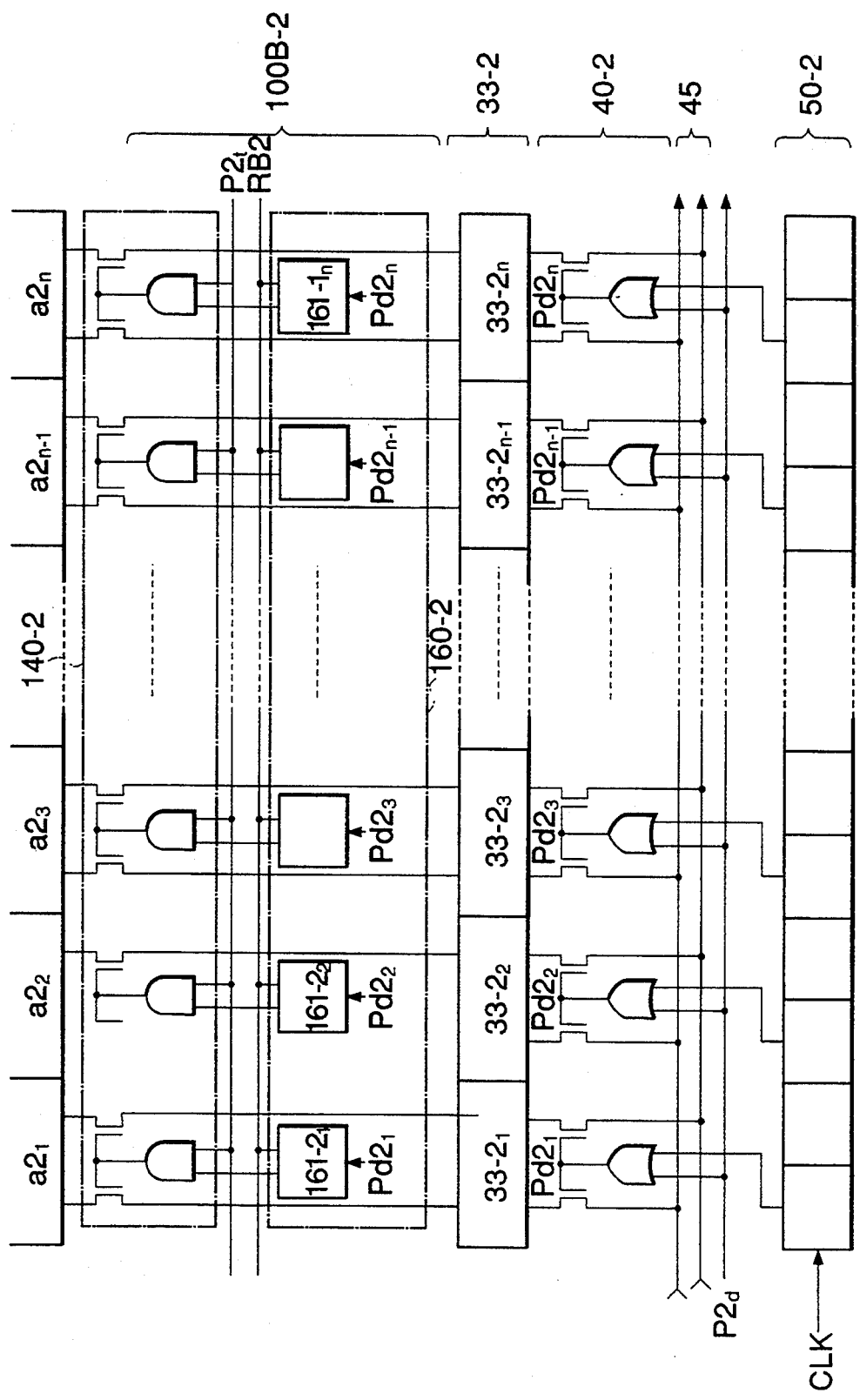
FIG. 72 is a fragmentary circuit diagram on the side of the memory bank A2, showing the sixteenth embodiment of the present invention.

FIG. 71 and FIG. 72 illustrate the serial access memory according to the sixteenth embodiment of the present invention. FIG. 71 is a fragmentary circuit diagram on the side of the memory bank A1, while FIG. 72 is a fragmentary circuit diagram on the side of the memory bank A2. Incidentally, elements common to those of the first embodiment shown in FIG. 5, FIG. 6 and FIG. 7 and also to those of the third embodiment depicted in FIG. 28 and FIG. 29 are designated by like reference symbols.

This embodiment has, as has been explained with reference to FIG. 6 and FIG. 7 directed to the first embodiment, a function to permit setting of routes for pointer outputs as desired. Like the second to sixth embodiments, this embodiment is concerned with write transfer. In particular, this embodiment has a similar write transfer function to the third embodiment. This embodiment is different from the third embodiment in that, in place of the first and second transfer means 100-1,100-2 in FIG. 28 and FIG. 29 directed to the third embodiment, first and second transfer means 100B-1,100B-2 having different in construction are provided.

The transfer means 100B-1,100B-2 are composed of switching circuits 140-1,140-2, which are similar to those employed in the third embodiment, and switching control circuits 160-1,160-2 for controlling the switching circuits, respectively. The switching control circuits 160-1,160-2 are reset by the reset signals PB1,PB2, latch output signals $Pd1_i, Pd2_i$ (i=1 to n) from the NOR gates $41\text{-}1_i, 41\text{-}2_i$ (i=1 to n) in the switching means 40-1,40-2, and send the results of the latching to AND gates $141\text{-}1_i, 141\text{-}2_i$ (i=1 to n) in the switching circuits 140-1,140-2, and are composed of plural latches $161\text{-}1_i, 161\text{-}2_i$ (i=1 to n).

Although this embodiment has a similar write transfer function to the third embodiment, it successively sets, different from the third embodiment, the latches $161\text{-}1_i, 161\text{-}2_i$, which have been reset by the reset signals RB1,RB2, as the pointer outputs shift. Serial addresses so accessed are stored in the latches $161\text{-}1_i, 161\text{-}2_i$ and, upon write transfer, only the accessed bits can be selectively transferred by rendering the transistors $142\text{-}1_i, 142\text{-}2_i$ conductive in the switching circuits 140-1,140-2. This operation will be described with reference to FIG. 73 to FIG. 75.

Figure 73:
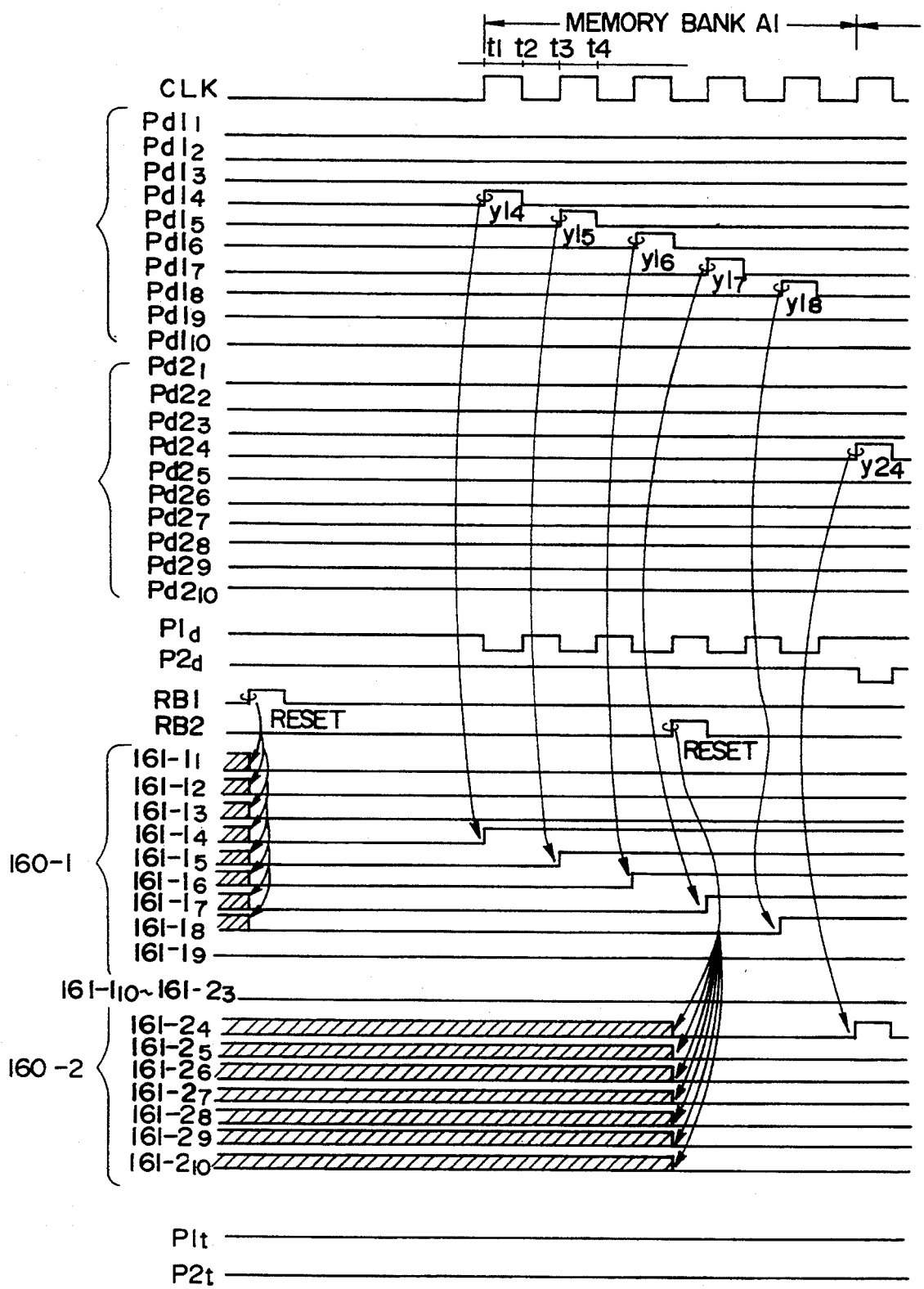
FIG. 73 is a timing chart of the memory banks A1 and A2 in FIG. 71 and FIG. 72, respectively.
Figure 74:
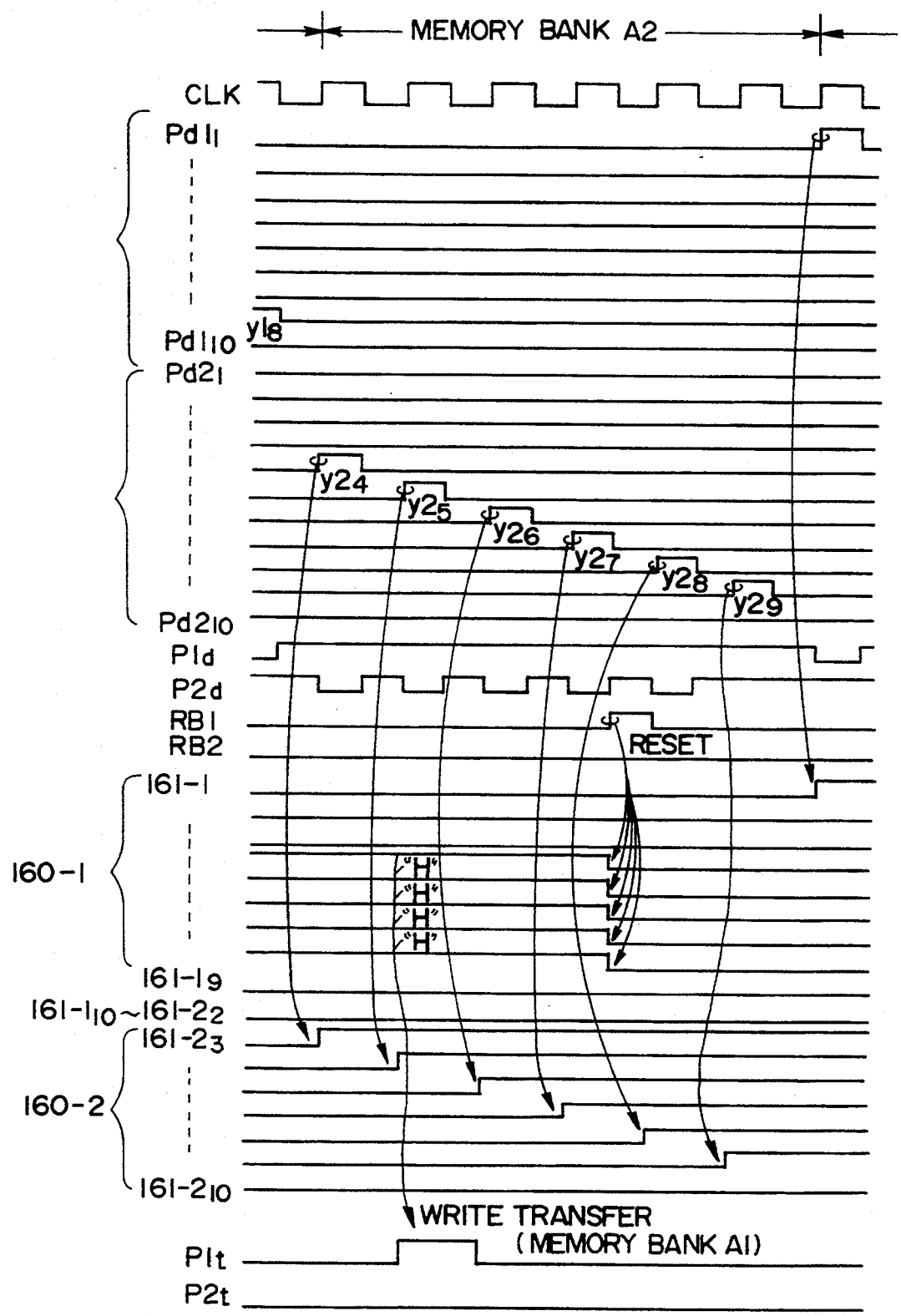
FIG. 74 is another timing chart of the memory banks A1 and A2 in FIG. 71 and FIG. 72, respectively.
Figure 75:
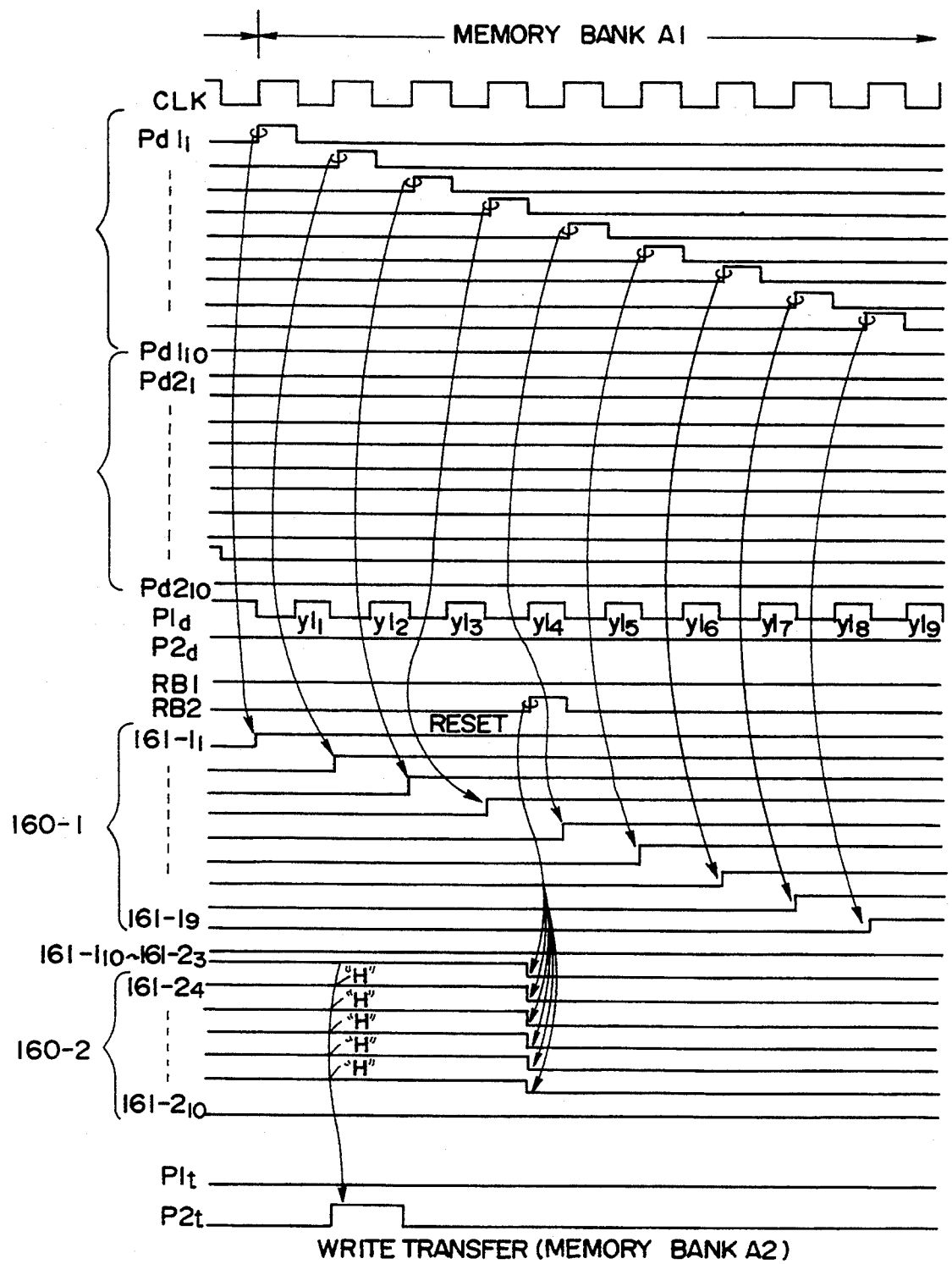
FIG. 75 is a further timing chart of the memory banks A1 and A2 in FIG. 71 and FIG. 72, respectively.

FIG. 73 to FIG. 75 are timing charts which illustrate the write transfer operation in FIG. 71 and FIG. 72.

The fundamental setting operation of pointer output routes is the same as in the first to third embodiments, and shifting of pointer outputs is also the same as in FIG. 11 to FIG. 14 directed to the first embodiment. In addition, the operations of the present invention other than that of the transfer means 100B-1,100B-2 are the same as those illustrated in FIG. 15 through FIG. 17. For example, the timing of the clock CLK is exactly the same as the times t1,t2, . . . ,tn. Operations of only the switching signals $P1_t, P2_t$ are however different because FIG. 15 to FIG. 17 illustrate the read transfer operation while FIGS. 73 to 75 depicts the write operation.

In the write transfer operation, the reset signal RB1 is rendered "H" before time t1 shown in FIG. 73, so that the latches $161\text{-}1_1$ to $161\text{-}1_n$ are reset. From time t1, writing starts in synchronization with the clock signal CLK.

Similarly to FIG. 10 and FIG. 11 to FIG. 14 which are all directed to the first embodiment, the access to the registers $33\text{-}1_4, 33\text{-}1_5, \ldots, 33\text{-}1_8$ corresponding to the Y addresses $y1_4, y1_5, \ldots, y1_8$ of the memory bank A1 begins first. At this time, the signals $Pd1_4, Pd1_5, \ldots, Pd1_8$ successively become "H" so that the corresponding latches $161\text{-}1_4, 161\text{-}1_5, \ldots, 161\text{-}1_8$ are set sequentially.

As a result of shifting of the pointer means through the line 63, an access of the memory bank A2 shown in FIG. 74 is started. The access of registers $33\text{-}2_4, 33\text{-}2_5, \ldots, 33\text{-}2_9$ begins. As the signals $Pd2_4, Pd2_5, \ldots, Pd2_9$ change to "H" one by one, the latches $161\text{-}2_4, 161\text{-}2_5, \ldots, 161\text{-}2_9$ which have been reset by the reset signal RB2 upon the access of the memory bank A1 are set successively.

The switching signal $P1_t$ is rendered "H" upon the access of the memory bank A2, whereby the write transfer from the data register 33-1 in the memory bank A1 to the memory column units $a1_i$ is carried out. Since the latches $161\text{-}1_4, 161\text{-}1_5, \ldots, 161\text{-}1_8$ have been set in this case, the transistors $142\text{-}1_4$ to $142\text{-}1_8$ are rendered conductive. However, the transistors $142\text{-}1_1$ to $142\text{-}1_3, 142\text{-}1_9, 142\text{-}1_{10}$ remain in an off state. As a consequence, only the data of the registers $33\text{-}1_4$ to $33\text{-}1_8$ corresponding to the serial-accessed addresses are selectively write-transferred to the memory column units $a1_i$.

A write transfer to the memory bank A2 is performed in a similar manner. As is illustrated in FIG. 75, upon the next access of the memory bank A1, the switching signal $P2_t$ becomes "H" so that only the data of the registers $33\text{-}2_4$ to $33\text{-}2_9$ are selectively write-transferred to the memory column units $a2_i$.

In the present embodiment, a selective write transfer is feasible as in the third embodiment. The third embodiment is advantageous from the standpoint of the pattern area required for the formation of the circuits but it is necessary to take a large margin in view of process variations such as the mutual conductance $g_m$ of the transistors. In contrast, the present embodiment enables to design a logical circuit without taking such a margin into consideration. This embodiment also has the merit that bits to be selected can be decided at the time of an access, in other words, non-accessed bits are not write-transferred unlike the third embodiment even if such non-accessed bits are located in a pointer output route.

Seventeenth Embodiment

Figure 76:
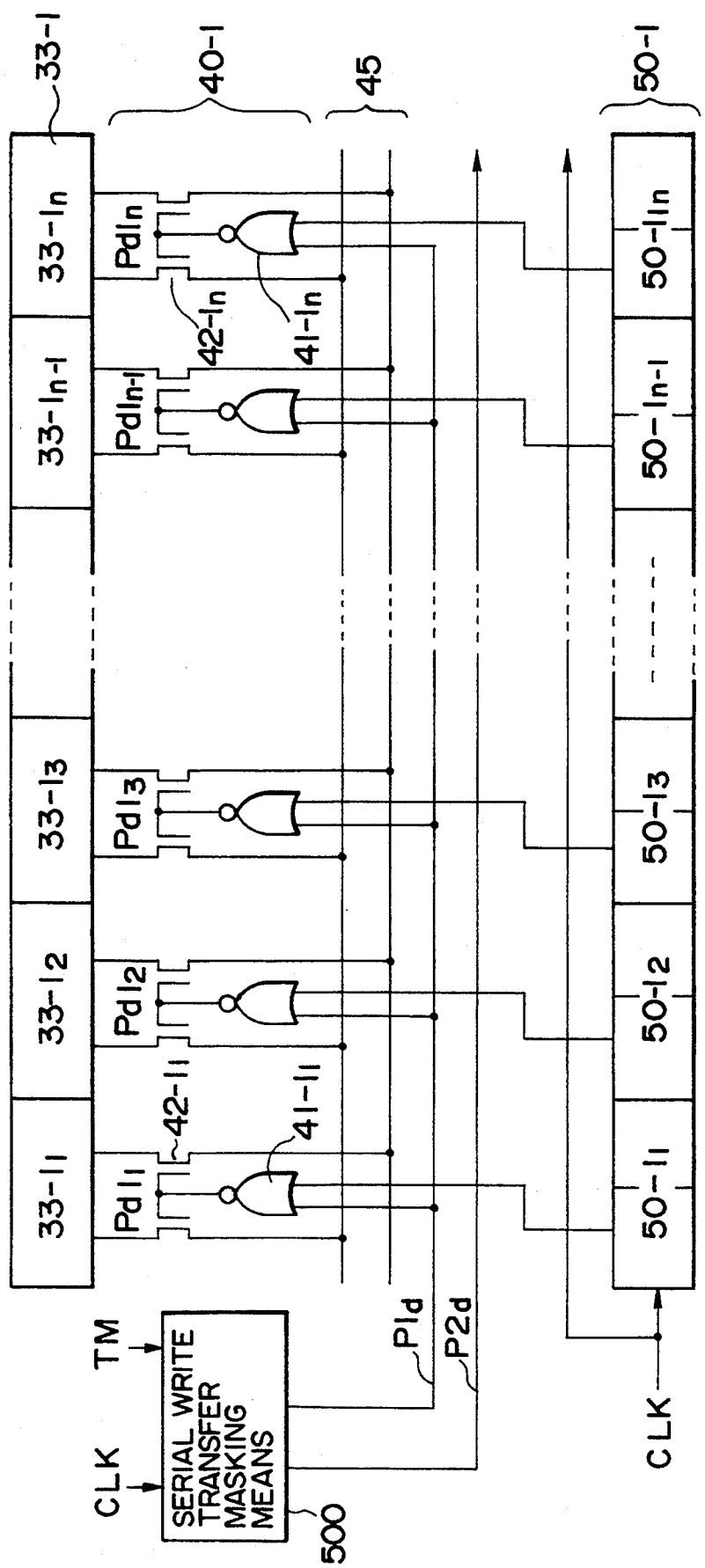
FIG. 76 is a fragmentary circuit diagram of a serial access memory according to a seventeenth embodiment of the present invention.

FIG. 76 is a fragmentary circuit diagram of a serial access memory according to the seventeenth embodiment. Elements common to those of the sixteenth embodiment shown in FIG. 71 and FIG. 72 are designated by like reference symbols.

In this embodiment, serial write transfer masking means 500 is added to the circuit of FIG. 71. The serial write transfer masking means 500 is a circuit, which receives the clock signal CLK and the external signal TM as inputs and outputs the signals P1d,P2d at predetermined timing to the switching means 40-1 (and 40-2).

According to this embodiment, masking can be applied by the external signal TM to the write transfer of desired bits out of successive access bits after a pointer output route has been set as desired. This masking operation will be described with reference to FIG. 77 to FIG. 79.

Figure 77:
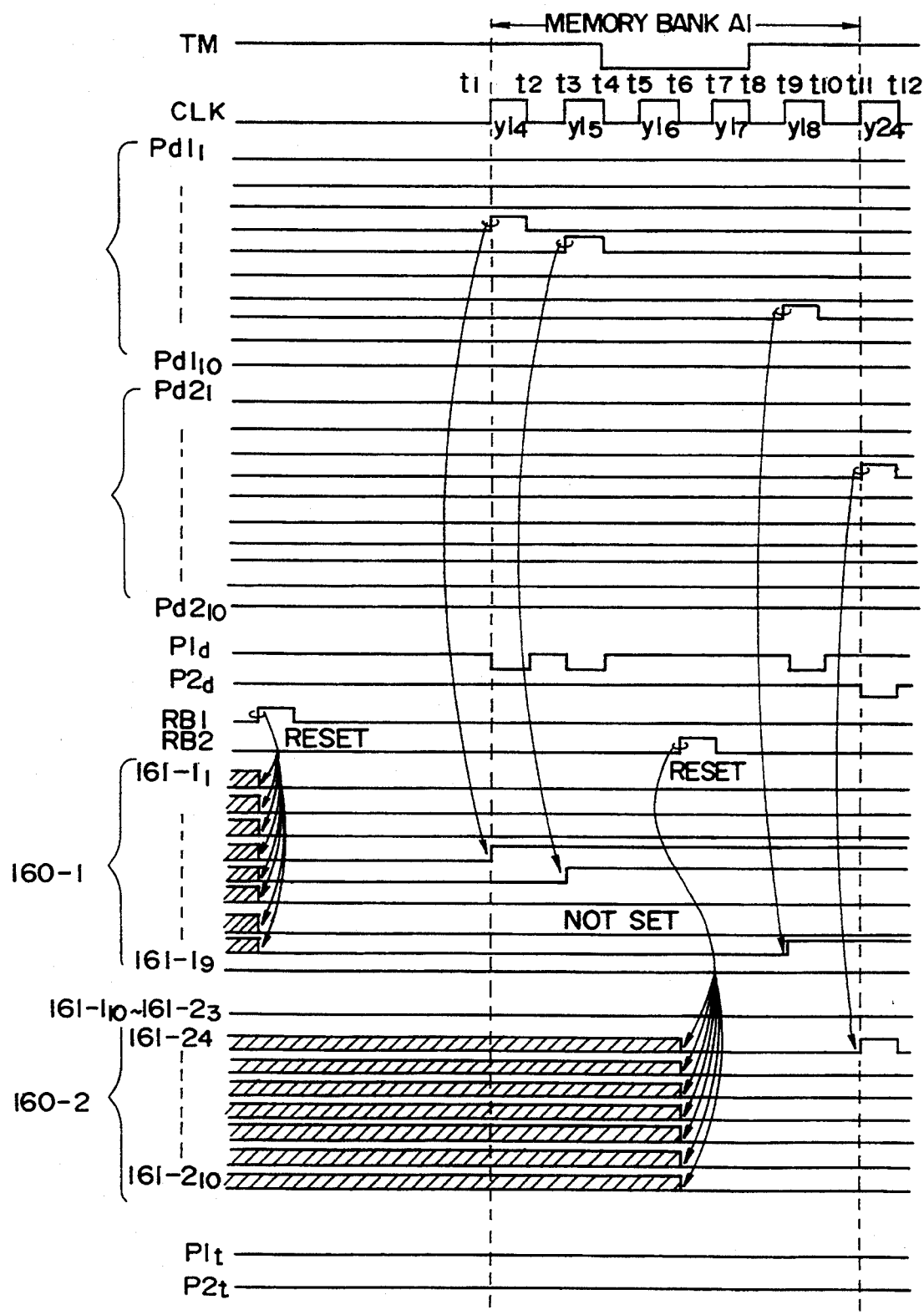
FIG. 77 is a timing chart of the serial access memory in FIG. 76.
Figure 78:
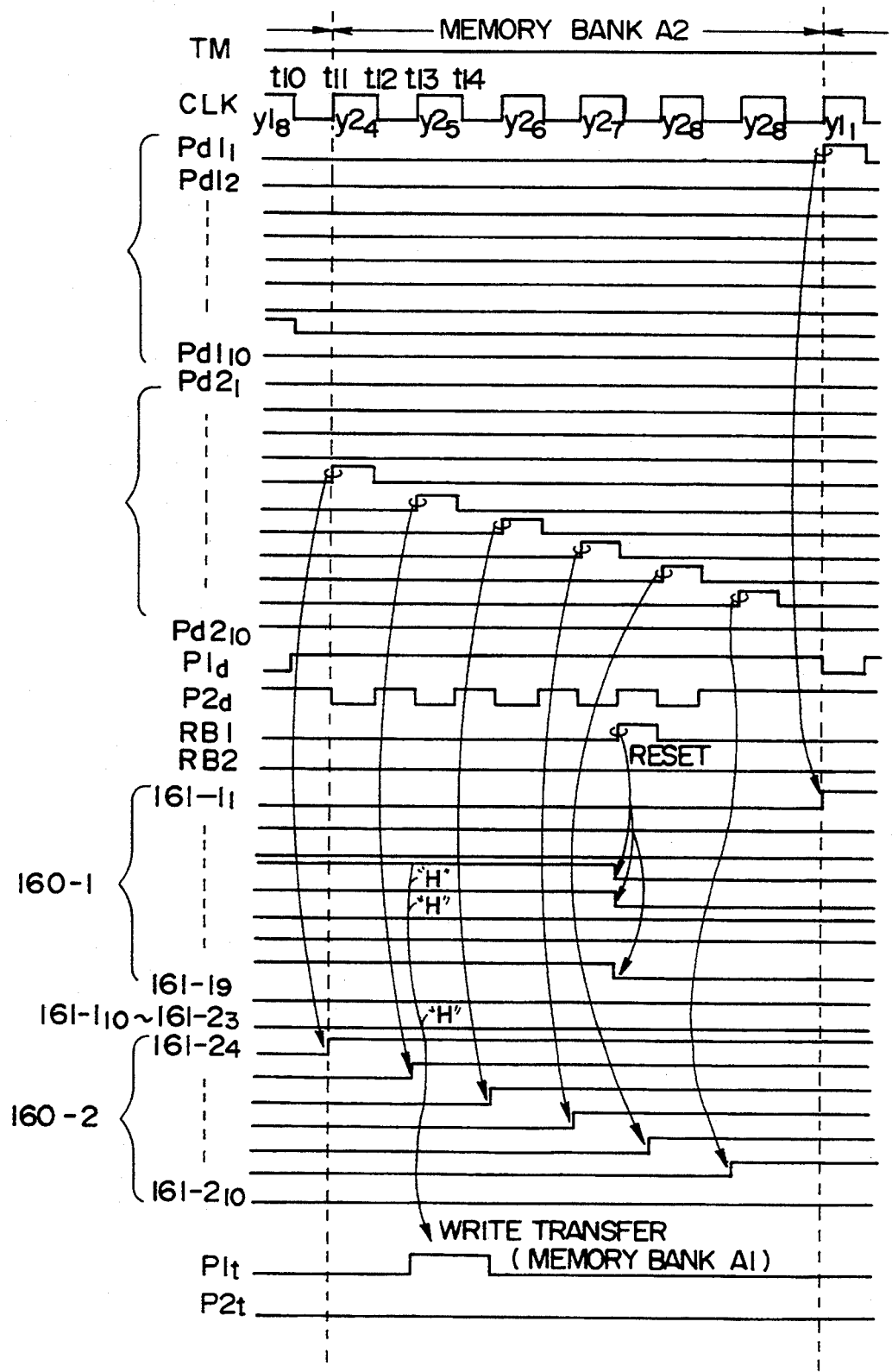
FIG. 78 is another timing chart of the serial access memory in FIG. 76.
Figure 79:
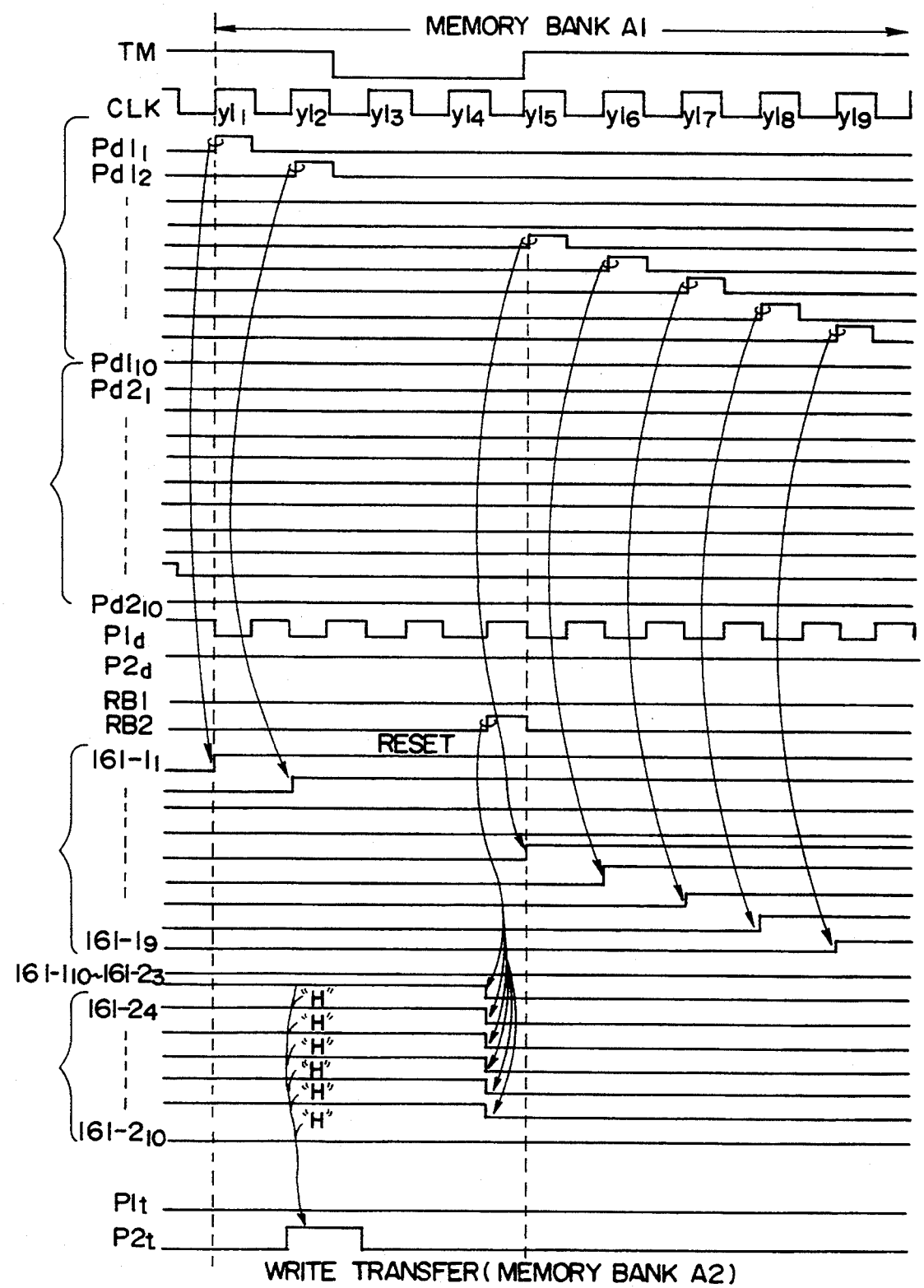
FIG. 79 is a further timing chart of the serial access memory in FIG. 76.

FIG. 77 to FIG. 79 are timing charts showing the write transfer operation in FIG. 76.

The fundamental write transfer operation is as in FIG. 73 to FIG. 75 which are directed to the sixteenth embodiment. A difference is found in the period from time t4, where the external signal TM becomes "L", to time t8 at which the external signal TM returns to "H". No writing is effected to the registers 33-1$_6$,33-1$_7$ corresponding to the serial addresses y1$_6$,y1$_7$ accessed during this period, because the signal P1d does not become "L" at times t5,t7. Further, the latches 161-1$_6$, 161-1$_7$ are not set during the above period since the outputs of the NOR gates 41-1$_6$,41-1$_7$ are not rendered "H". Accordingly, when the signal P1$_t$ becomes "H" at time t13, the data of the registers 33-1$_4$,33-1$_5$,33-1$_8$ are write-transferred to the memory column units a1$_i$ but the data of the registers 33-1$_6$.33-1$_7$ are masked and are not transferred to the memory column units a1$_i$, To achieve this by the sixteenth embodiment, a read transfer is once carried out from the memory column units a1$_i$ to the data register 33-1 prior to a serial write operation. It is then necessary to write-ask bits, whose writing is not desired, to retain the old data without updating, to subject the other bits to serial writing and then to write-transfer them. This however results in a complex circuit operation. This embodiment can achieve it by the simple circuit operation.

Eighteenth Embodiment

The eighteenth embodiment of the present invention has the construction that the address generator 80 and the write transfer control 90 (FIG. 18 and FIG. 20) of the second embodiment, which conducts a write transfer of selected bits only, have been added to the serial access memory (FIG. 69 and FIG. 70) of the fifteenth embodiment which performs selection of addresses in blocks.

In the fifteenth embodiment ((FIG. 69 and FIG. 70), the following construction is employed where address designation to decide the routes for outputs from the pointers 50-1,50-2 does not select the memory column units a$_{ik}$ (i=1 to n) individually but selects memory column groups a$_1$,a$_2$, ... (i=1 to n), which consist of plural (for example, 4, 8, 16, 32, and so on) successive memory column units, as unit blocks. With regard to the individual blocks 50$_i$ (i=1 to n) in the pointers 50-1,50-2, said blocks having been divided corresponding to the memory column groups a$_i$, a pointer output from each block 50$_i$ on the side of the memory bank A2 is inputted to the first F.F. 50$_{i1}$ (i=1 to n) in the block 50$_i$ on the side of the memory bank A1 and pointer outputs from the k-th F.Fs. 50$_{ik}$ (i=1 to n) in the individual blocks 50$_i$ on the side of the memory bank A1 are inputted to the blocks 50$_i$ on the side of the memory bank A2. This has made it possible to select addresses block by block.

Addition of the address generator 80 and the write transfer control 90 (FIG. 18 and FIG. 20), both being of the second embodiment, to such a serial access memory makes it possible to perform a block-by-block writing operation only to the accessed bits other than the non-selected bits.

In the second embodiment, it was necessary to provide the individual memory column units a1$_i$,a2$_i$ with unit circuits which are composed of the Y addressing means 70-1,70-2, the start address decoders 66-1,66-2 and the end address decoders 67-1,67-2. In a CPU system or the like, however, a series of serial bit accesses over certain bit groups such as 4 bits, 8 bits, 16 bits or the like is often performed. There are many applications which can be successfully performed by simple random access designation of the addresses of blocks each of which consists of plural bits. In such a case, use of the serial access memory of the eighteenth embodiment makes it possible to substantially reduce the circuit numbers of the Y addressing means 70-1,70-2, the start address decoders 66-1,66-2 and the end address decoders 67-1,67-2 so that the pattern area required for the formation of the circuits can be decreased. Keeping the step with the trend toward high densification, in particular, it is not easy to form the Y addressing means 70-1,70-2, the start address decoders 66-1,66-2 and the end address decoders 67-1,67-2 in the narrow pitches between the memory column units a1$_i$,a2$_i$. The adoption of the present embodiment however allows to design a pattern while enjoying significant flexibility.

Nineteenth Embodiment

Figure 80:
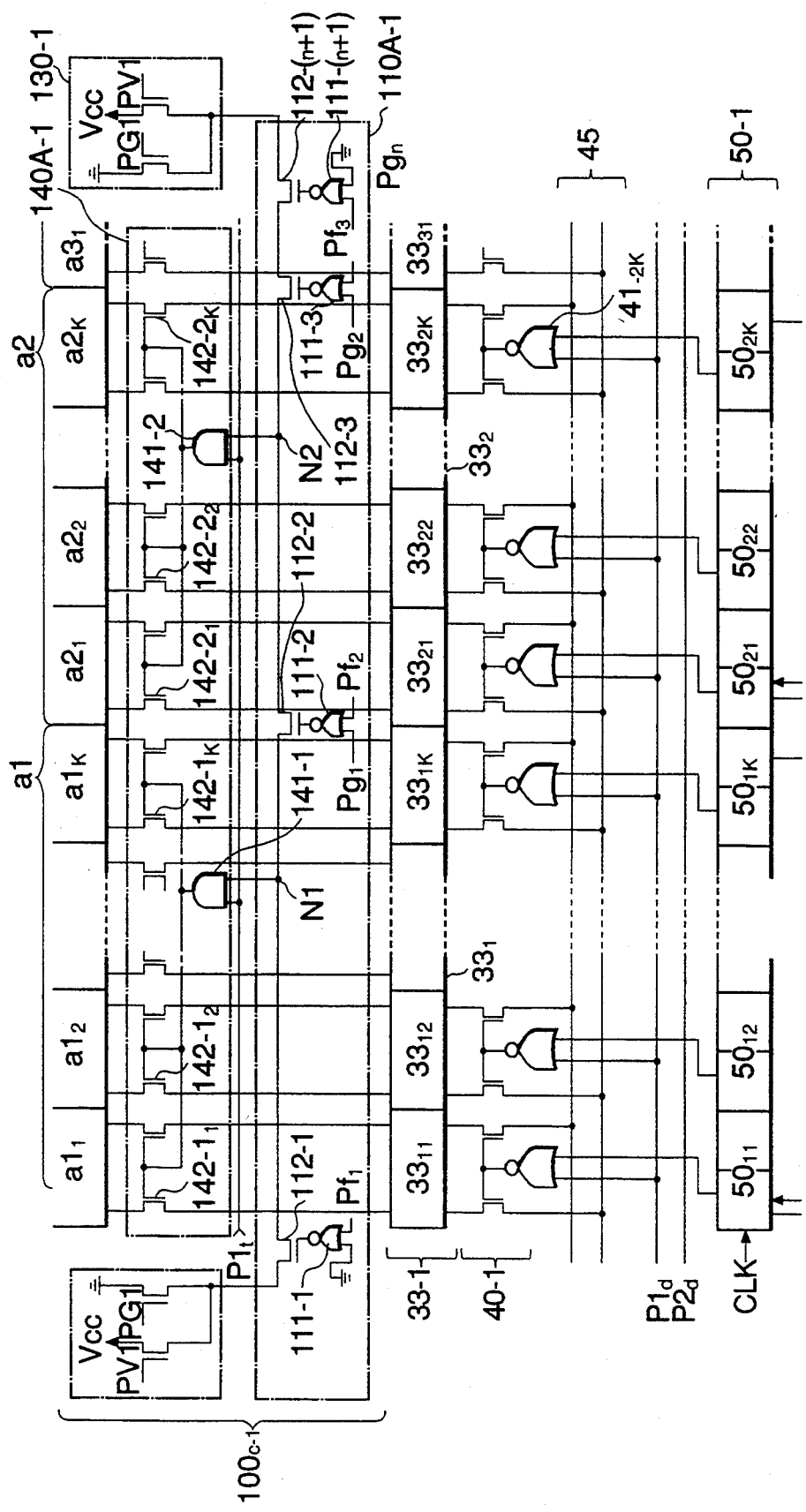
FIG. 80 is a fragmentary circuit diagram of a serial access memory according to a nineteenth embodiment of the present invention.

FIG. 80 is a fragmentary circuit diagram of the serial access memory according to the nineteenth embodiment, in which elements common to those of the fifteenth embodiment shown in FIG. 69 and also to those of the third embodiment depicted in FIG. 28 and FIG. 29 are designated by like reference symbol. Incidentally, only a circuit corresponding to the side of the memory bank A1 in FIG. 28 is illustrated as in FIG. 80 and illustration of a circuit corresponding to the side of the memory bank A2 is omitted therein.

In this embodiment, the transfer means (FIG. 28 and FIG. 29) of the third embodiment adapted to perform a write transfer of selected bits only has been added to the serial access memory (FIG. 69 and FIG. 70) of the fifteenth embodiment which performs selection of addresses block by block.

Namely, the serial access memory of this embodiment is provided, as illustrated in FIG. 80, with transfer means 100C-1, which corresponds to the transfer means 100-1 in FIG. 28, in place of the transfer means 32-1 in FIG. 69. The transfer means 100C-1 is composed of a switching control 110A-1, charge/discharge circuits 120-1,130-1 similar to those of the third embodiment, and a switching circuit 140-A1.

The switching control 110A-1 has a function to perform a logical operation on output signals Pf$_1$, Pf$_2$, ... from the start address setting circuit 64-1 and output signals Pg$_1$,Pg$_2$, ... from the end address setting circuit 65-1 and then to outputs a switching-circuit-selecting signal. The switching control 110A-1 is composed of a NOR gate 111-1 for reversing the output signal Pf$_1$, NOR gates 111-2,111-3, ... for conducting NOR operations between the output signals Pf$_2$,Pf$_3$, ... and the output signals $Pg_1, Pg_2, \ldots$, a NOR gate 111-(n+1) for reversing the output signal $Pg_n$, and switching elements connected in series through nodes N1,N2, ... on a signal line and on-off controlled by outputs from the respective NOR gates 111-1 to 111-(n+1), for example, transistors 112-1 to 112-(n+1). The output-side nodes N1,N2, ... correspond to the memory column groups $a_1, a_2, \ldots$ arranged in unit blocks.

The charge/discharge circuits 120-1,130-1 are connected to opposite sides of the nodes N1,N2, ... and have a function to charge or discharge the nodes N1,N2, ... on the basis of the signals PV1,PG1.

The switching circuit 140A-1 has a function to open or close the connections between the memory column groups $a_1, a_2, \ldots$, disposed in blocks, and the blocks $33_1, 33_2, \ldots$ in the data register 33-1 on the basis of signals on the nodes N1,N2, ... and the switching signal $P1_t$. This switching circuit 140A-1 is composed of AND gates 141-1,141-2, ..., which are provided corresponding to the memory column groups $a_1, a_2, \ldots$ and are adapted to take logical products of the signals on the nodes N1,N2, ... and the signal $P1_t$, and plural pairs of transistors $142-1_1$ to $142-1_k, 142-2_1$ to $142-2_k, \ldots$ which are on-off controlled by outputs from the AND gates 141-1,141-2, ... to open or close the connections between the memory column units $a_{ik}$ (i=1 to n) and the registers $33_{ik}$ (i=1 to n).

The foregoing is the construction on the side of the memory bank A1. The circuit on the side of the memory bank A2 is constructed likewise.

In the third embodiment, selection of addresses is conducted memory column unit by memory column unit and only the bits so selected are write-transferred. In this embodiment, on the other hand, the operation for the selection and connection of routes for pointer outputs is performed in a similar manner to the third embodiment but selection of addresses is performed block by block by the pointer 50-1 and the bits so selected are write-transferred block by block by the transfer means 100C-1.

In the third embodiment, it was necessary, as depicted in FIG. 6 and FIG. 7, to provide the individual memory column units $a1_1, a2_2$ with unit circuits which are composed of the Y addressing means 70-1,70-2, the start address decoders 66-1,66-2 and the end address decoders 67-1,67-2. In a CPU system or the like, however, a series of serial bit accesses over certain bit groups such as 4 bits, 8 bits, 16 bits or the like is often performed. There are not a few applications which do not require to designate leading bits in detail at random. In such a case, use of the serial access memory of the nineteenth embodiment permits a block-by-block selective write transfer. Since the selection of addresses and the designation of routes for pointer outputs are conducted block by block, it is also possible to substantially reduce the circuit element numbers of the Y addressing means 70-1,70-2, the start address decoders 66-1,66-2, the end address decoders 67-1,67-2, the switching control 110A-1 and the switching circuit 140A-1 so that the pattern area required for the formation of the circuits and the fabrication cost can be reduced.

Twentieth Embodiment

Figure 81:
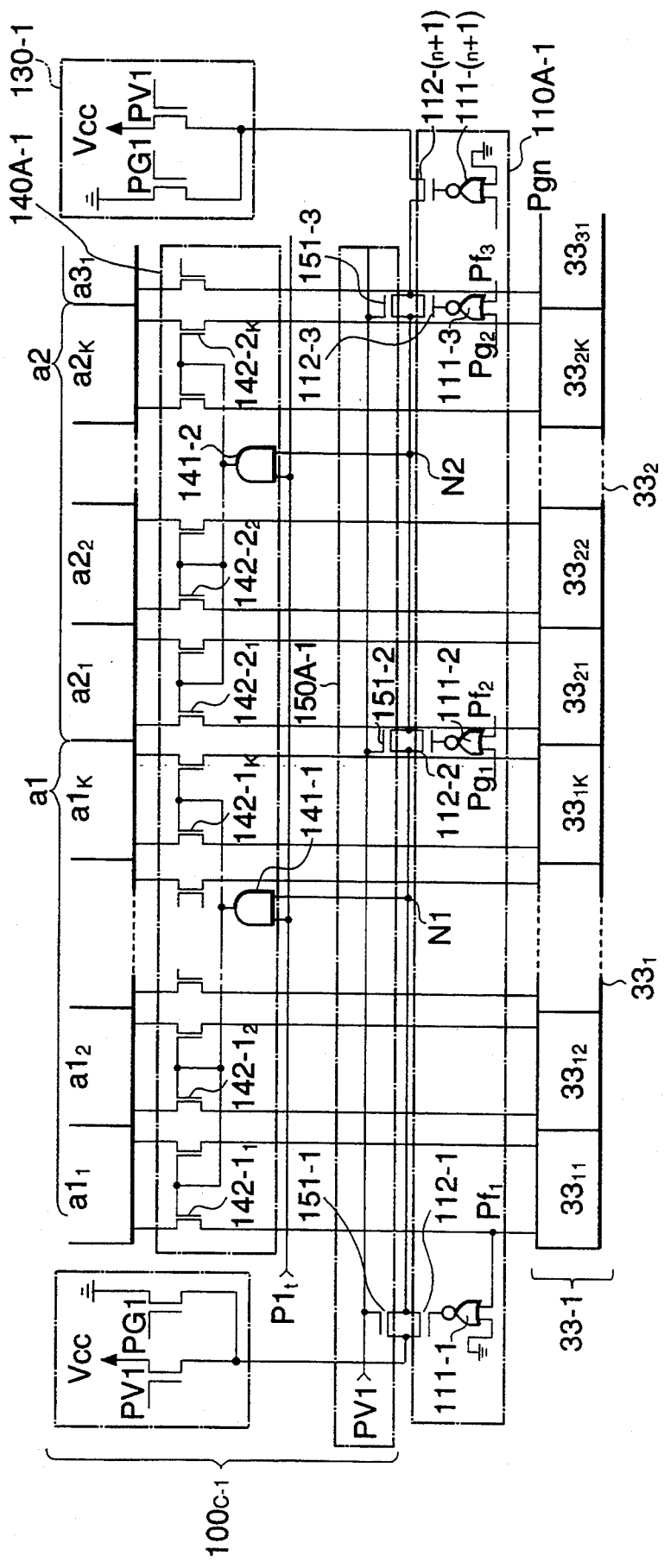
FIG. 81 is a fragmentary circuit diagram of a serial access memory according to a twentieth embodiment of the present invention.

FIG. 81 is a fragmentary circuit diagram of the serial access memory according to the twentieth embodiment, in which elements common to those of the fifteenth embodiment shown in FIG. 69, to those of the fourth embodiment illustrated in FIG. 34 and FIG. 35 and also to those of the nineteenth embodiment depicted in FIG. 80 are designated by like reference symbols. In FIG. 81, only a circuit corresponding to the side of the memory bank A1 in FIG. 34 is illustrated as in FIG. 80 and illustration of a circuit corresponding to the side of the memory bank A2 is omitted therein.

In this embodiment, the first and second transfer means (FIG. 34 and FIG. 35) of the fourth embodiment adapted to perform a write transfer of selected bits only has been added to the serial access memory (FIG. 69 and FIG. 70) of the fifteenth embodiment which performs block-by-block selection of addresses.

Namely, the serial access memory of this embodiment is provided, as illustrated in FIG. 81, with first transfer means 100D-1, which corresponds to the first transfer means 100A-1 in FIG. 34, in place of the transfer means 32-1 in FIG. 69. The first transfer means 100D-1 is a circuit formed by adding a first equalizer 150A-1 to the transfer means 100C-1 in FIG. 80.

The first equalizer 150A-1 has a plurality of equalizing switching elements, for example, transistors 151-1,151-2, ... connected together in series, which are connected in parallel with the individual transistors 112-1,112-2, ... in the switching control 110A-1. The transistors 151-1,151-2, ... have a function to be rendered conductive responsive to the charging signal PV1 and to charge the nodes N1,N2, ... on the signal line.

The first equalizer 150A-1 constructed as described above is disposed as a second equalizer in the second transfer means on the side of the memory bank A2.

Since it is possible to conduct a block-by-block write transfer of the bits in selected blocks by controlling only the equalizing transistors 151-1,151-2, ... in the present embodiment, this embodiment has substantially the same merits as the ninth embodiment:. In the nineteenth embodiment, equalization is delayed by a lag in the circuit operation because the signals $Pf_1, Pf_2, \ldots$ and the signals $Pg_1, Pg_2, \ldots$ are rendered "L" by the reset signals Pr1,Pr2 so that the transistors 112-1,112-2, ... are rendered conductive to equalize the respective nodes N1,N2, ... In this embodiment, on the other hand, the equalizing transistors 151-1,151-2, ... are controlled directly by the signal PV1, whereby high-speed equalization is feasible and the charging speed can hence be accelerated.

Twenty-First Embodiment

Figure 82:
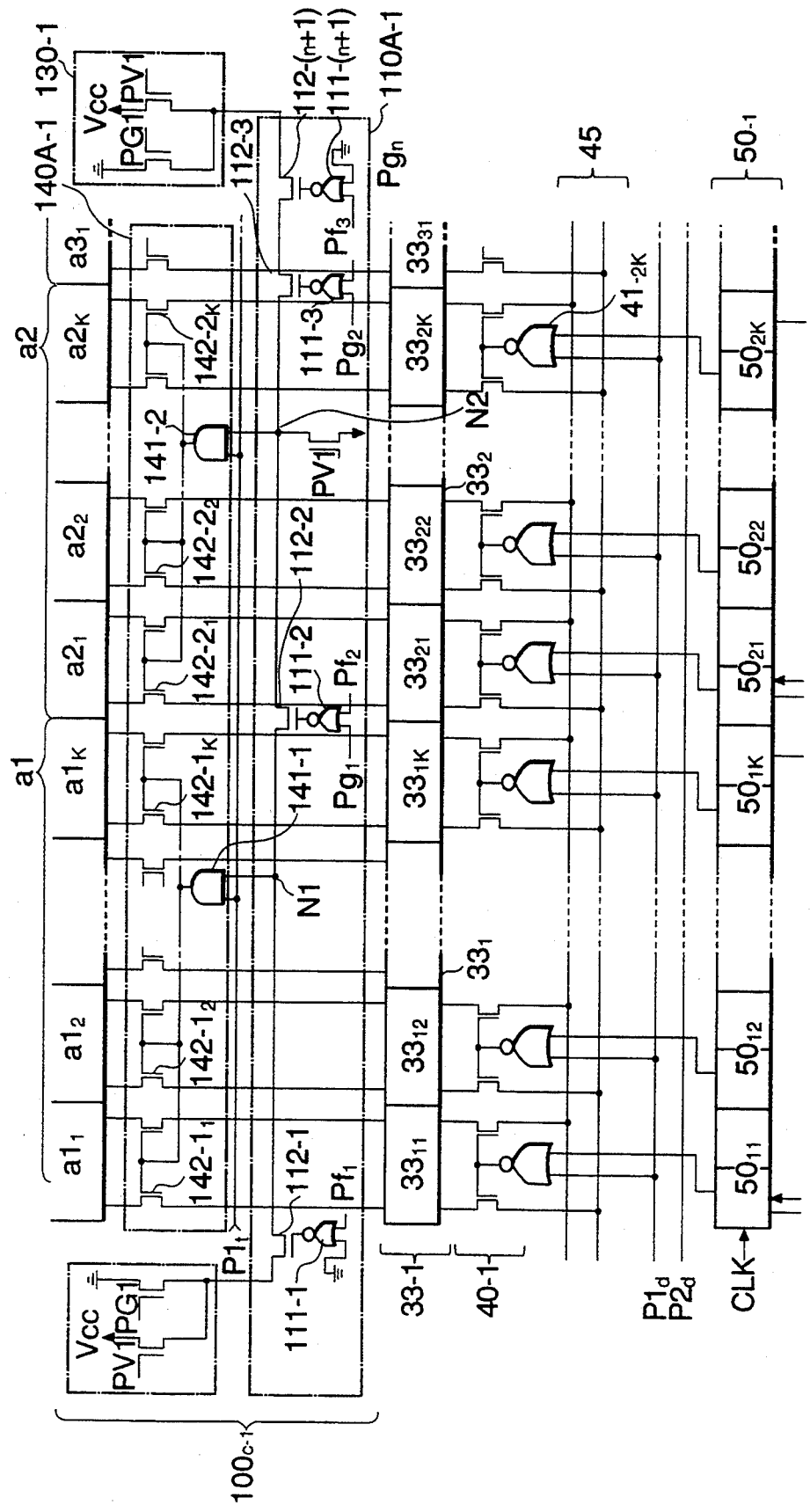
FIG. 82 is a fragmentary circuit diagram of a serial access memory according to a twenty-first embodiment of the present invention.

FIG. 82 is a fragmentary circuit diagram of the serial access memory according to the twenty-first embodiment, in which elements common to those of the fifteenth embodiment shown in FIG. 69, to those of the fifth embodiments depicted in FIG. 36 and FIG. 37 and also to those of the twentieth embodiment illustrated in FIG. 80 are designated by like reference symbols. In FIG. 82, only a circuit corresponding to the side of the memory bank A1 in FIG. 36 is illustrated as in FIG. 80 and illustration of a circuit corresponding to the side of the memory bank A2 is omitted therein.

In this embodiment, the first and second transfer means (FIG. 36 and FIG. 37) of the fifth embodiment adapted to perform a write transfer of selected bits only has been added to the serial access memory (FIG. 69 and FIG. 70) of the fifteenth embodiment which performs block-by-block selection of addresses.

Namely, the serial access memory of this embodiment is provided, as illustrated in FIG. 82, with first transfer means 100C-1, which corresponds to the first transfer means 100A-1 in FIG. 36 and is equipped with a charging circuit, in place of the transfer means 32-1 in FIG. 69. The first transfer means 100C-1 equipped with the charging circuit has been constructed by connecting a charging circuit operable responsive to the charging signal PV1, for example, a transistor 152-1 to a desired location on the signal line of the nodes N1,N2, . . . in the first transfer means 100C-1 shown in FIG. 80.

Such a charging circuit is also arranged in the second transfer means on the side of the memory bank A2.

In the nineteenth embodiment, charging is effected from the opposite ends of the signal line of the individual nodes N1,N2, . . . via the transistors 112-1,112-2, . . . connecting the individual nodes N1,N2, . . . of the signal line so that the signal line can be initialized. When the time constants, such as turn-on resistances, of the transistors 112-1,112-2, . . . become greater as the memory capacity increases, the charging therefore takes time so that the serial access memory is inconvenient for high-speed operations. Since charging is conducted for example from an intermediate location of the signal line by using the transistor 152-1 in this embodiment, it is possible to shorten the charging time so that a high-speed operation is feasible.

Twentieth-Second Embodiment

Figure 39:
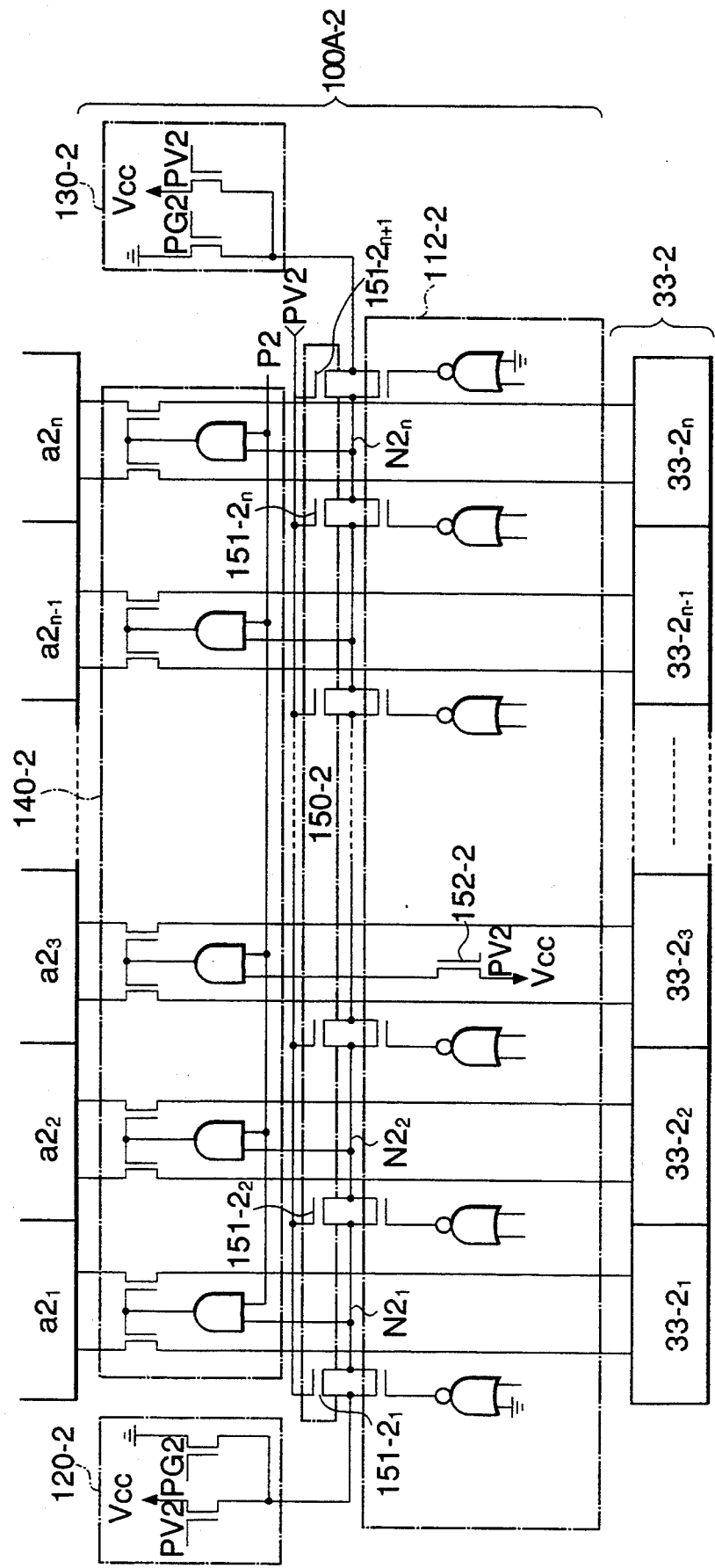
FIG. 39 is a fragmentary circuit diagram on the side of the memory bank A2, illustrating the sixth embodiment of the present invention.
Figure 83:
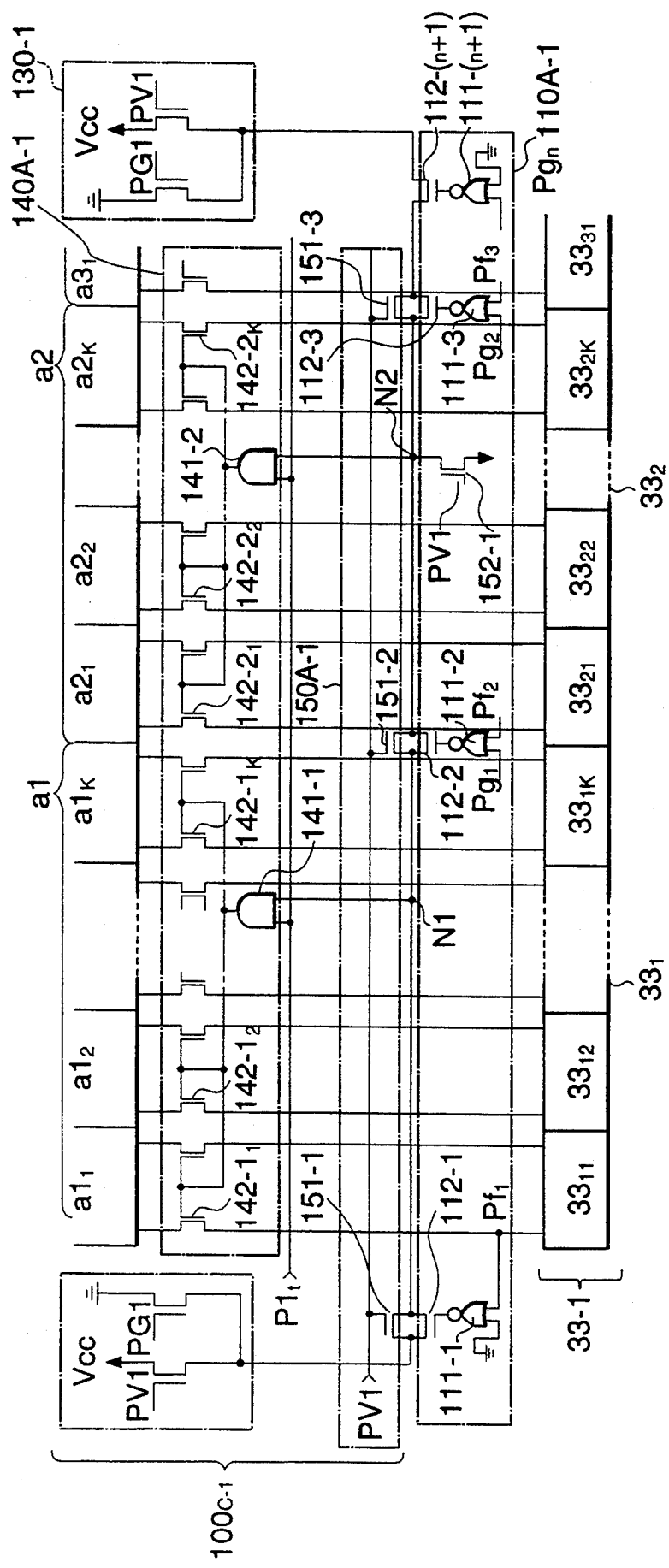
FIG. 83 is a fragmentary circuit diagram of a serial access memory according to a twenty-second embodiment of the present invention.

FIG. 83 is a fragmentary circuit diagram of the serial access memory according to the twenty-second embodiment, in which elements common to those of the fifteenth embodiment shown in FIG. 69, to those of the sixth embodiment depicted in FIG. 38 and FIG. 39 and also to those of the twentieth embodiment illustrated in FIG. 81 are designated by like reference symbols. In FIG. 83, only a circuit corresponding to the side of the memory bank A1 in FIG. 38 is illustrated as in FIG. 81 and illustration of a circuit corresponding to the side of the memory bank A2 is omitted therein.

In this embodiment, the first and second transfer means (FIG. 38 and FIG. 39) of the sixth embodiment adapted to perform a write transfer of selected bits only has been added to the serial access memory (FIG. 69 and FIG. 70) of the fifteenth embodiment which performs block-by-block selection of addresses.

Namely, the serial access memory of this embodiment is provided, as illustrated in FIG. 83, with the first transfer means 100D-1, which corresponds to the first transfer means 100A-1 in FIG. 38 and is equipped with the charging circuit, in place of the first transfer means 32-1 in FIG. 69. The first transfer means 100D-1 equipped with the charging circuit has been constructed by connecting a charging circuit operable responsive to the charging signal PV1, for example, the transistor 152-1 to a desired location on the signal line of the nodes N1,N2, . . . in the first transfer means 100D-1 shown in FIG. 81.

Such a charging circuit is also arranged in the second transfer means on the side of the memory bank A2.

Since charging can be conducted for example from an intermediate location of the signal line by using the transistor 152-1 in this embodiment, it is possible to shorten the charging time as in the twenty-first embodiment.

Twenty-Third Embodiment

The twenty-third embodiment has the construction that, in the serial access memory of the fifteenth embodiment (FIG. 69 and FIG. 70) adapted to perform block-by-block selection of addresses, the amplifier 68 of the seventh embodiment (FIG. 40) is connected between the first and second lines 62,63 as routes for pointer outputs on the side of the memory bank A1 and the first and second lines 62,63 as routes for pointer outputs on the side of the memory bank A2.

In this embodiment, similarly to the fifteenth embodiment, pointer output routes are decided block by block and memory addresses are also designated block by block. As a consequence, an access is performed block by block. This can decrease the load capacities of the lines 62,63 and each pointer output is amplified by the amplifier 68, so that a still faster serial access memory is possible.

Twenty-Fourth Embodiment

The twenty-fourth embodiment has the construction that the serial access memory of the fifteenth embodiment (FIG. 69 and FIG. 70) adapted to perform block-by-block selection of addresses is provided with the address generator 200 formed of the X address generator 210 and the Y address generator 220 in the eighth embodiment (FIG. 41).

The provision of the address generator 200 has made it possible to internally and entirely perform the generation of serial addresses in the fifteenth embodiment. Owing to a reduction in pattern as the merit of the fifteenth embodiment and the internal generation of addresses by the eighth embodiment, a small and low-cost serial access memory can be provided.

Twenty-Fifth Embodiment

The twenty-fifth embodiment has the construction that the serial access memory of the fifteenth embodiment (FIG. 69 and FIG. 70) adapted to perform block-by-block selection of addresses is provided with the address generator 230 formed of the X.Y address generator 240 and the X address generator 250 in the ninth embodiment (FIG. 47). The X address generator 250 is composed of the address counter 251 and an initial value input circuit which may be formed, for example, of the tristate buffers $252_i$ (i=1 to n).

In this embodiment, addresses can be automatically and internally generated by such a simple circuit construction as in the twenty-fourth embodiment. This embodiment is therefore convenient.

Twenty-Sixth Embodiment

Figure 84:
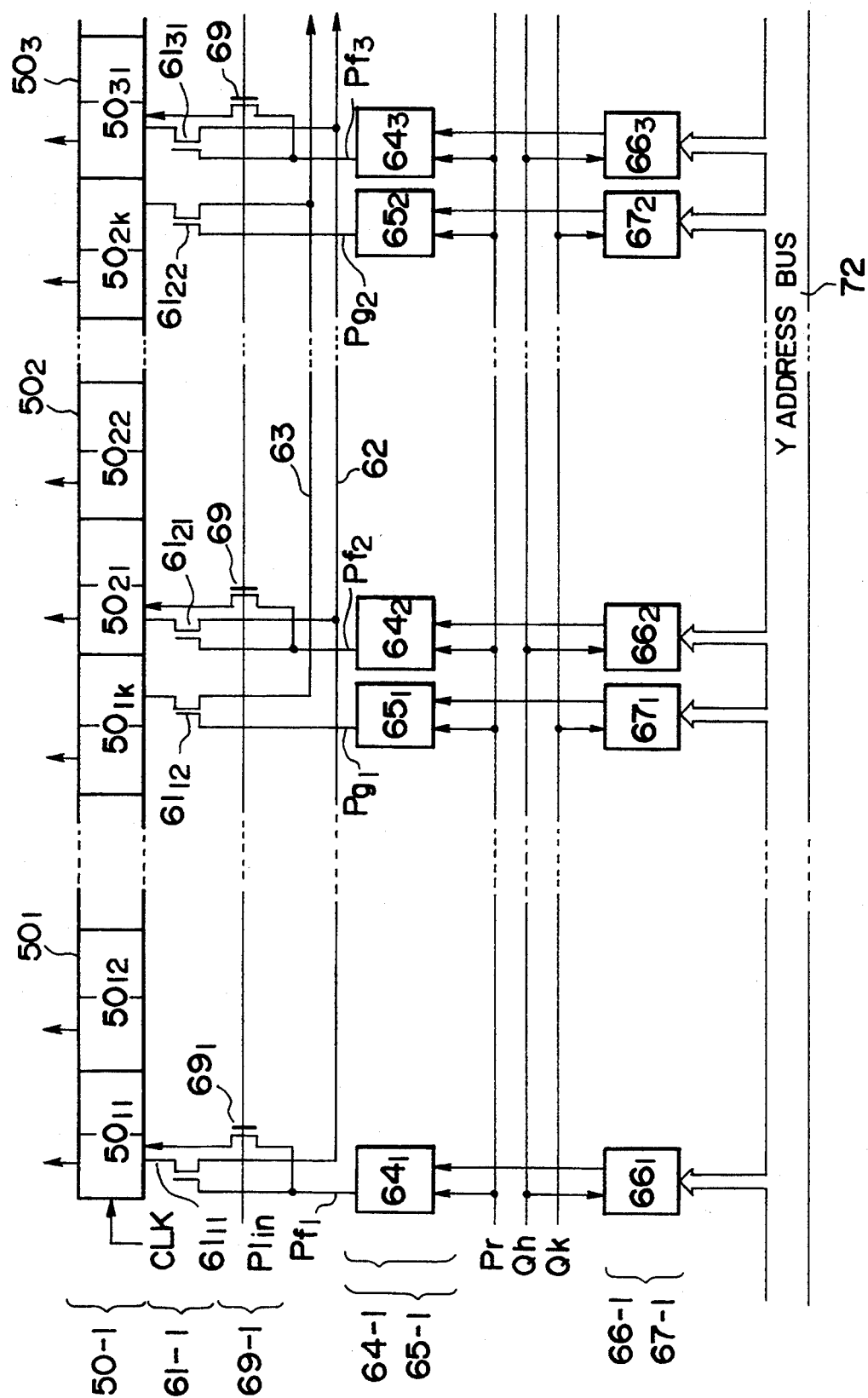
FIG. 84 is a fragmentary circuit diagram of a serial access memory according to a twenty-sixth embodiment of the present invention.

FIG. 84 is a fragmentary circuit diagram of the serial access memory according to the twenty-sixth embodiment, in which elements common to those of the fifteenth embodiment shown in FIG. 69 and also to those of the tenth embodiment depicted in FIG. 52 are designated by like reference symbols. In FIG. 84, only a circuit corresponding to the side of the memory bank A1 in FIG. 52 is illustrated as in FIG. 69 and illustration of a circuit corresponding to the side of the memory bank A2 is omitted therein.

In this embodiment, the tenth embodiment is applied to the serial access memory of the fifteenth embodiment (FIG. 69) which is adapted to perform block-by-block selection of addresses. Namely, the Y addressing means 70-1 in FIG. 69 has been eliminated and a circuit substantially the same as the leading bit serial address fetch circuit 69-1 in FIG. 52 has been added.

The leading bit serial address fetch circuit 69-1 in FIG. 84 is a circuit which is on-off controlled by the signal $P1_{in}$ and performs connection/cut-off between an input side of the start address setting circuit 64-1 and input sides of the individual blocks $50_1, 50_2, \ldots$ (the input sides of the first F.Fs. $50_{11}, 50_{21}, \ldots$) in the pointer 50-1. This fetch circuit 69-1 is composed of switching means on-off controlled by the signal $P1_{in}$, for example, the transistors $69_1, 69_2, \ldots$, which are connected between the output sides of the latches $64_1, 64_2, \ldots$ and the input sides of the blocks $50_1, 50_2, \ldots$ respectively.

Such a fetch circuit 69-1 is also provided on the side of the memory bank A2.

Like the tenth embodiment, the transistors $61_1, 69_2, \ldots$ of the serial access memory are rendered conductive to decide leading addresses of a serial access concurrently with the decision of start addresses of the pointer 50-1 by the output signals $Pf_1, Pf_2, \ldots$ from the start address setting circuit 64-1. These leading addresses are the leading addresses (for example, $50_{21}$) in the blocks $50_1, 50_2, \ldots$ selected as the start addresses. Namely, the output $pf_1, pf_2, \ldots$ of the start address setting circuit 64-1 are inputted to the F.Fs. $50_{11}, 50_{21}, \ldots$ in the blocks $50_1, 50_2, \ldots$ via the transistors $69_1, 69_2, \ldots$ so that the initial values of the pointer 50-1 are written in the F.Fs. $50_{11}, 50_{21}, \ldots$, respectively.

The present embodiment makes it possible to omit the Y addressing means 70-1 in FIG. 69 when it is unnecessary to change the leading bits of a serial access every time or to start a serial access from an intermediate one of a designated range of serial access bits in an application which does not require to change the routes for pointer outputs at random. It is hence possible to reduce the pattern area required for the formation of the circuits and hence to cut down the fabrication cost.

Twenty-Seventh Embodiment

Figure 85:
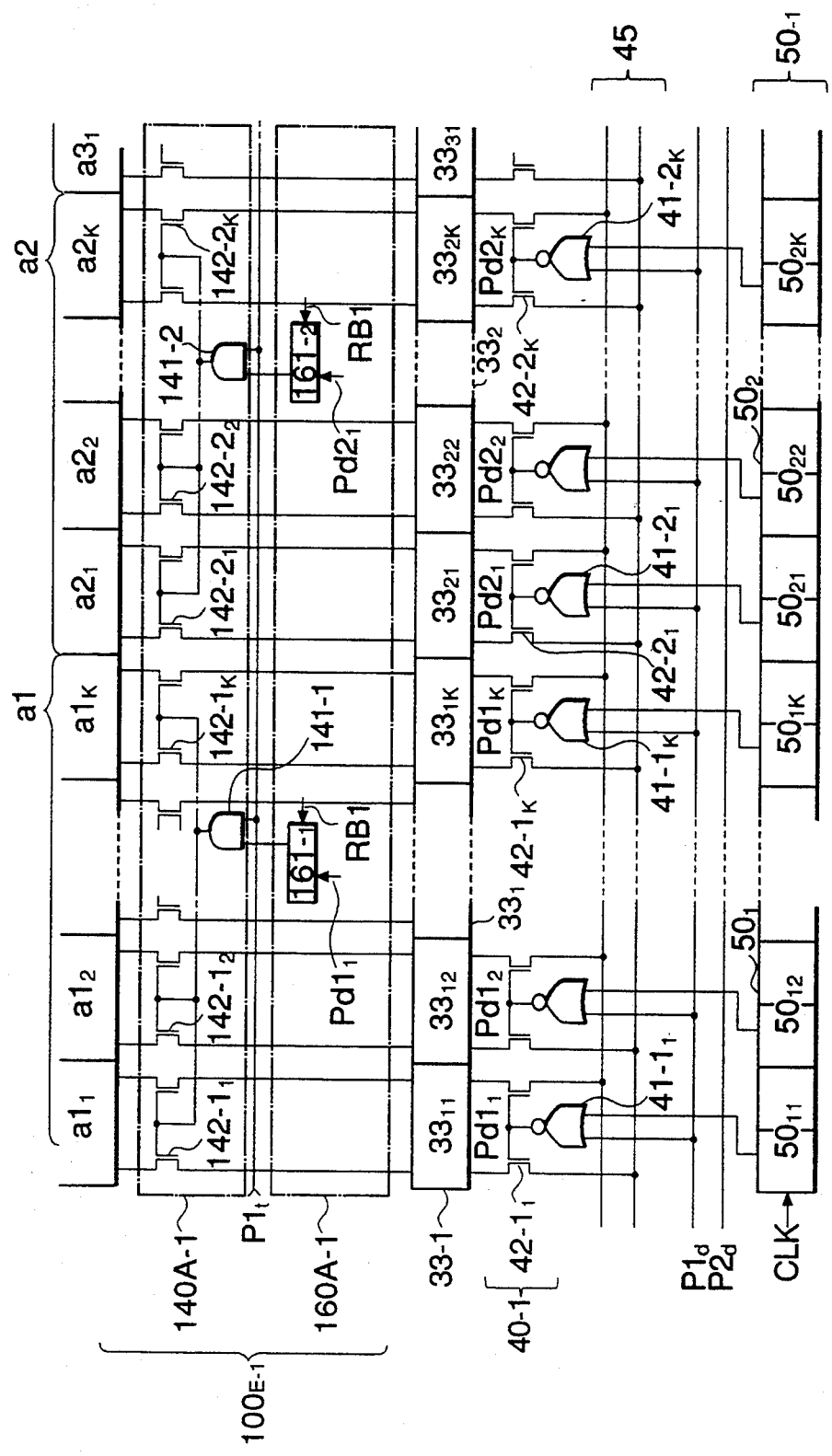
FIG. 85 is a fragmentary circuit diagram of a serial access memory according to a twenty-seventh embodiment of the present invention.

FIG. 85 is a fragmentary circuit diagram of the serial access memory according to the twenty-seventh embodiment.

In the serial access memory of the fifteenth embodiment (FIG. 69) adapted to perform block-by-block selection of addresses, first transfer means 100E-1 substantially the same as the first transfer means 100B-1 in the sixteenth embodiment (FIG. 71 and FIG. 72) is provided in place of the first transfer means 32-1 on the side of the memory bank A1.

The transfer means 100E-1 is composed of a switching circuit 140A-1 similar to that of the twentieth embodiment (FIG. 81) and a switching control 160A-1 for controlling the circuit. The switching control 160A-1 is a circuit which is reset by the reset signal RB1, latches the output signals $pd1_1, pd2_1, \ldots$ from the NOR gates $41\text{-}1_1, 41\text{-}2_1, \ldots$ in the switching means 40-1, and feed the results of the latching to the AND gates 141-1, 141-2, ... in the switching circuit 140A-1. The switching control 160A-1 is composed of latches 161-1, 161-2, ... which correspond to the memory column groups $a_1, a_2, \ldots$ as unit blocks, respectively.

The circuit on the side of the memory bank A2 has a similar construction.

Like the sixteenth embodiment, the present embodiment permits a selective write transfer by using the latches 161-1, 161-2, ... and moreover, the present embodiment allows to perform a block-by-block serial write transfer at a high speed as in the fifteenth embodiment. This embodiment therefore has the merits of both the fifteenth and sixteenth embodiments.

Twenty-Eighth Embodiment

Figure 86:
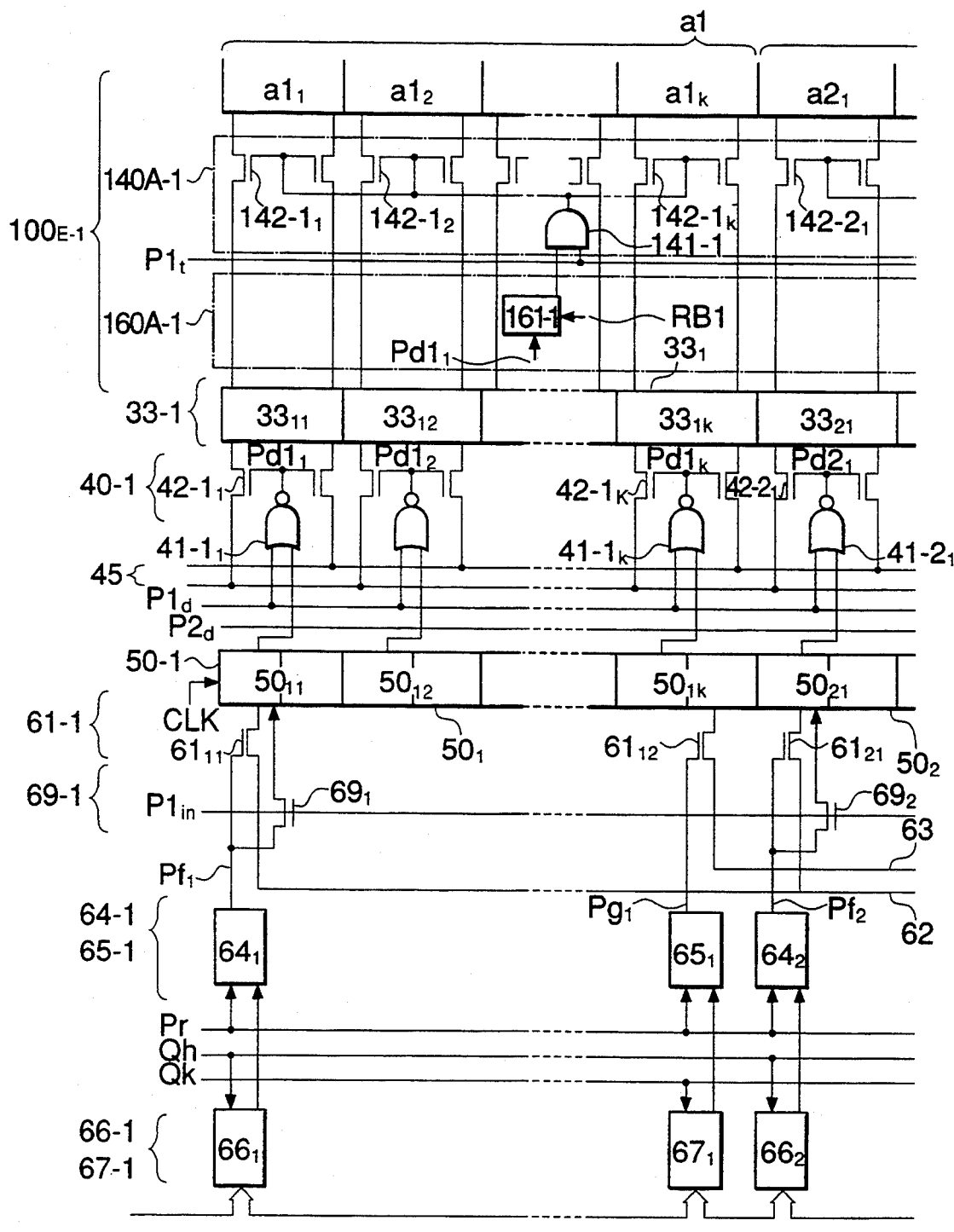
FIG. 86 is a fragmentary circuit diagram of a serial access memory according to a twenty-eighth embodiment of the present invention.

FIG. 86 is a fragmentary circuit diagram of the serial access memory according to the twenty-eighth embodiment.

This embodiment has the construction that, in the serial access memory according to the twenty-seventh embodiment (FIG. 85) adapted to perform a block-by-block selective write transfer, the Y addressing means 70-1 has been eliminated on the side of the memory bank A1 and the leading bit serial address fetch circuit 69-1 in the twenty-sixth embodiment (FIG. 84) has been added.

The circuit on the side of the memory bank A2 has a similar construction to the circuit described above.

This embodiment performs substantially the same operation as the twenty-sixth embodiment and, moreover, can perform a block-by-block selective write transfer like the twenty-seventh embodiment. The Y addressing means 70-1, 70-2 are therefore omitted in applications where block-by-block accesses are only required. This enables to reduce the size of the circuit and also cut down the fabrication cost. Moreover, the latches 160-1, ... receive as inputs output signals $pd1_1, \ldots$ from the NOR gates $41\text{-}1_1, \ldots$ in the switching means 40-1 and surely store block addresses to be accessed, thereby making it to provide a high-performance serial access memory.

Twenty-Ninth Embodiment

Figure 87:
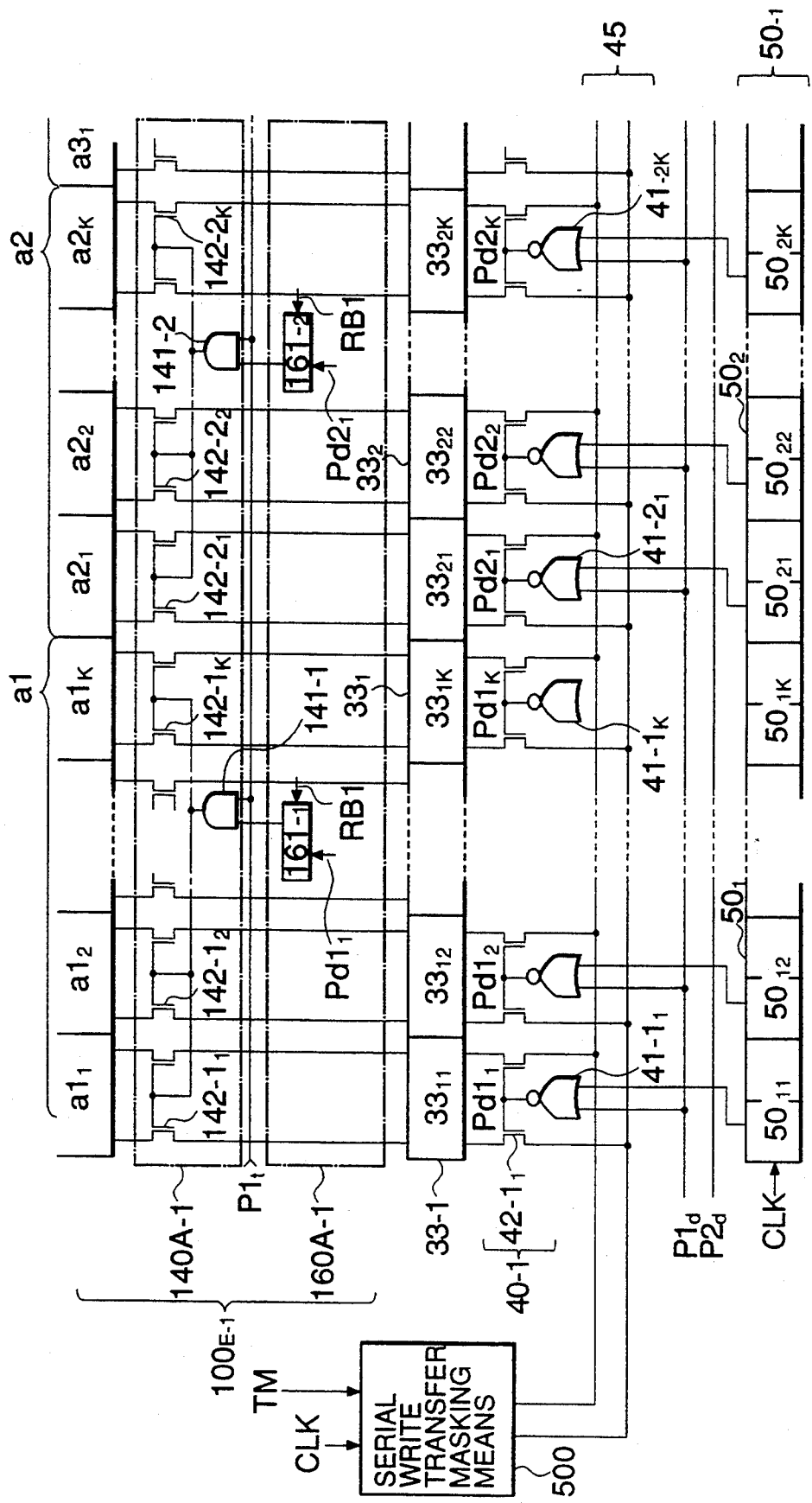
FIG. 87 is a fragmentary circuit diagram of a serial access memory according to a twenty-ninth embodiment of the present invention.

FIG. 87 is a fragmentary circuit diagram of the serial access memory according to the twenty-ninth embodiment.

This embodiment has the construction that the serial write transfer masking means 500 in the seventeenth embodiment (FIG. 76) has been added to the serial access memory according to the twenty-seventh embodiment (FIG. 85) adapted to perform a block-by-block selective write transfer.

The serial write transfer masking means 500 is a circuit which receives as inputs the clock signal CLK and the external signal TM and outputs signals $p1d, p2d$ at a predetermined timing to the switching means 40-1, 40-2.

By controlling the external signal TM to be fed to the serial write transfer masking means 500, a write mask can be applied only to blocks which are not desired to be written, and a write transfer can be selectively performed block by block. Although a write transfer mask was applied bit by bit in the seventeenth embodiment, a write transfer mask is applied block by block in this embodiment. If the external signal TM is rendered "L" upon input of the clock signal CLK at the time of an access to the leading bit in each block (for example, $33_{11}$ in $33_1$), a write transfer mask is therefore applied to the corresponding block $33_1$. Accordingly, a selective write transfer can be conducted block by block by a simple circuit operation.

Thirtieth Embodiment

Figure 88:
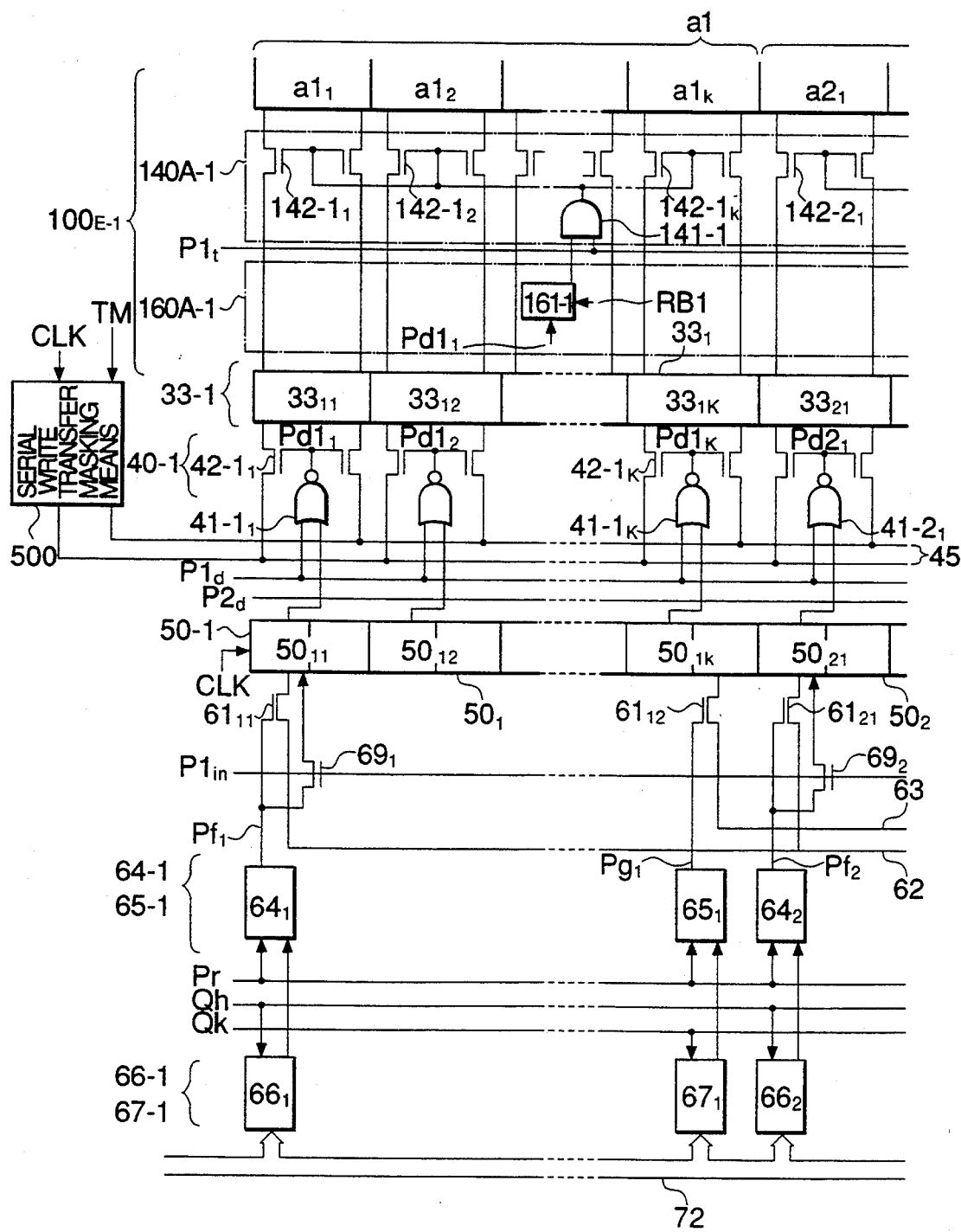
FIG. 88 is a fragmentary circuit diagram of a serial access memory according to a thirtieth embodiment of the present invention.

FIG. 88 is a fragmentary circuit diagram of the serial access memory according to the thirtieth embodiment.

This embodiment has the construction that the serial write transfer masking means 500 in the seventeenth embodiment (FIG. 76) has been added to the serial access memory according to the twenty-eighth embodiment (FIG. 86) adapted to perform a block-by-block selective write transfer. Namely, the Y addressing means 70-1, 70-2 have been eliminated from the twenty-ninth embodiment (FIG. 87) and the leading bit serial address fetch circuits 69-1(69-2) described with respect to the tenth embodiment (FIG. 52 and FIG. 53) or the twenty-sixth embodiment (FIG. 84) have been added.

Each leading bit serial address fetch circuit 69-1 (or 69-2) is on-off controlled responsive to the signal $P1_{in}$ (or P$_{2in}$) as in the tenth embodiment, whereby the start address of each pointer output route is set as a leading address in a wholesale manner. Different from the tenth embodiment, an access is performed block by block in this embodiment. The leading address of a series of a serial access therefore becomes a bit (for example, 33$_{11}$ in 33$_1$) corresponding to the leading address in the leading block to be accessed. Since a block-by-block access is performed without the Y addressing means 70-1,70-2, the area required for the formation of a circuit pattern is reduced, leading to a reduction in the chip size.

Thirty-First Embodiment

Figure 89:
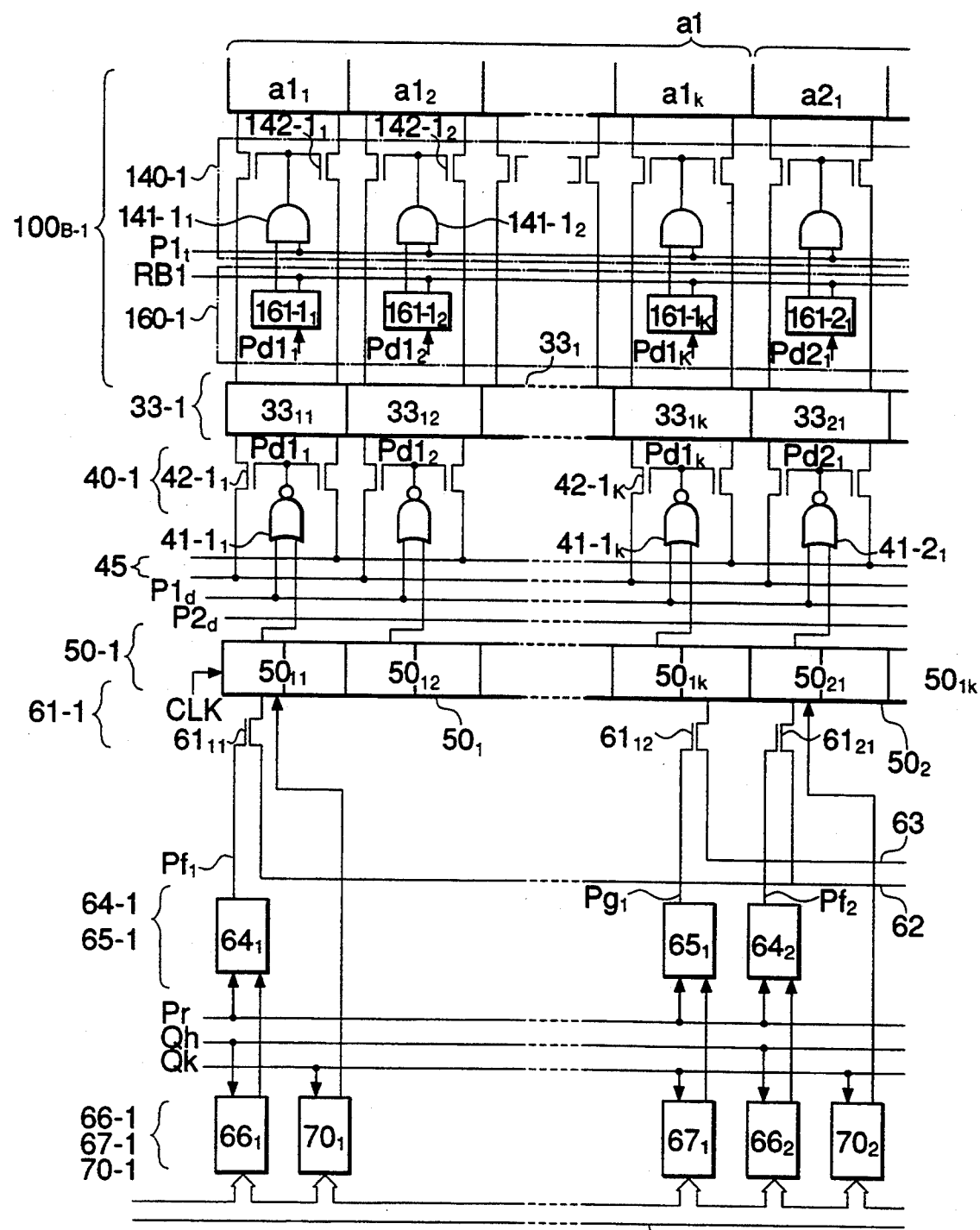
FIG. 89 is a fragmentary circuit diagram of a serial access memory according to a thirty-first embodiment of the present invention.

FIG. 89 is a fragmentary circuit diagram of the serial access memory according to the thirty-first embodiment.

This embodiment has the construction that, in the serial access memory of the fifteenth embodiment (FIG. 69), the first transfer means 100B-1(100B-2) in the sixteenth embodiment (FIG. 71 and FIG. 72) are provided in place of the first transfer means 32-1(32-2).

In each transfer means 100E-1 (or 100E-2) in the tenth-seventh embodiment (FIG. 85), each block is provided with one of the AND gates 141-1,141-2, . . . and also one of the latches 161-1,611-2, . . . , said AND gates and latches being provided to decide write transfer of individual blocks. In each transfer means 100B-1 (or 100B-2) in this embodiment, on the other hand, the AND gates 141-1$_1$,141-1$_2$, . . . and the latches 161-1$_1$,161-1$_2$, . . . are connected to the respective memory column units a$_{11}$-a$_{1k}$,a$_{21}$-a$_{2k}$, . . . which make up the individual memory units a$_1$,a$_2$, . . . divided in blocks. Because of this, even if an access is terminated at an intermediate address in a block, a write transfer of only the accessed bits is feasible.

Thirty-Second Embodiment

Figure 90:
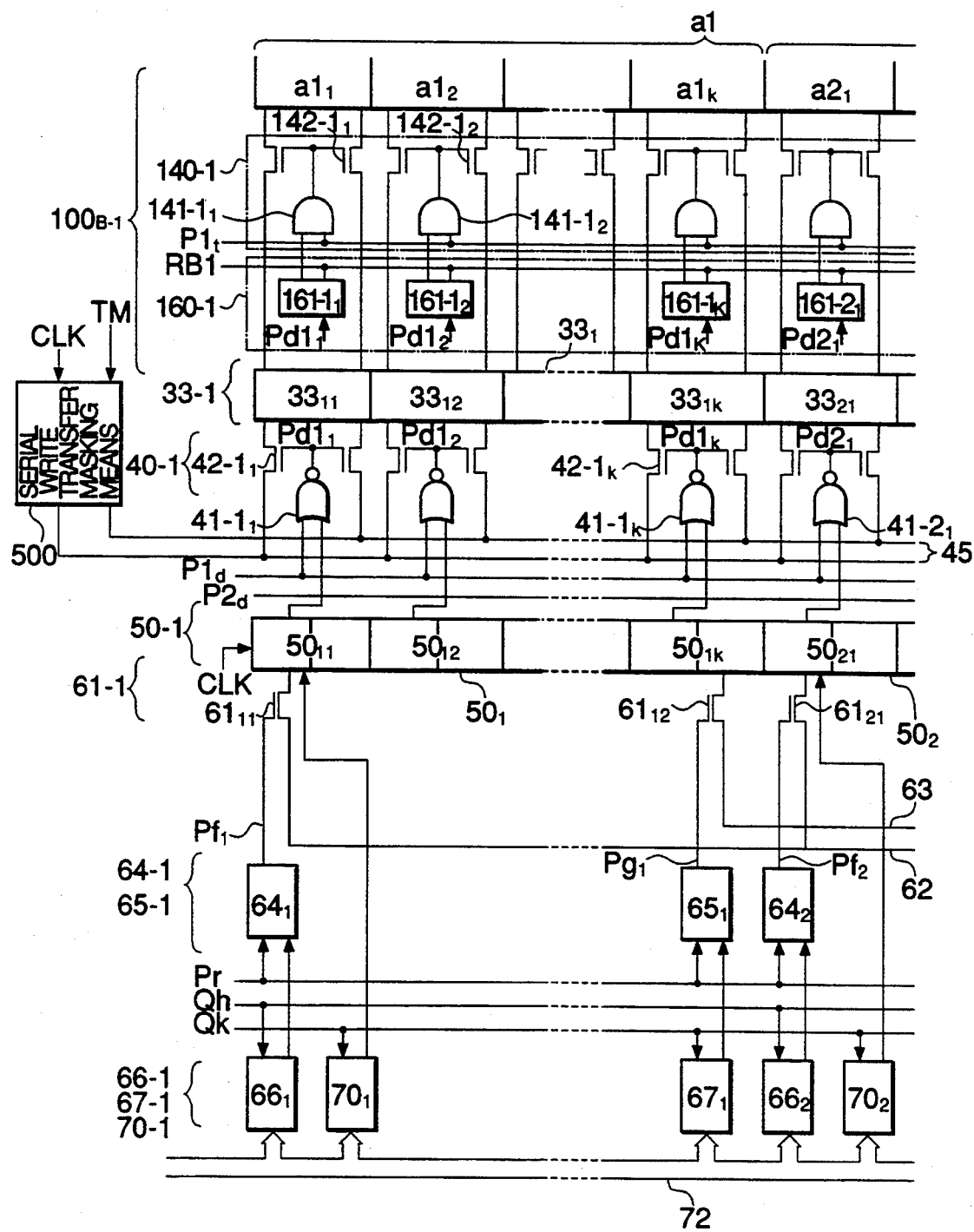
FIG. 90 is a fragmentary circuit diagram of a serial access memory according to a thirty-second embodiment of the present invention.

FIG. 90 is a fragmentary circuit diagram of the serial access memory according to the thirty-second embodiment.

In this embodiment, the circuit operation has been simplified by adding the serial write transfer masking means 500 of the seventeenth embodiment (FIG. 76) to the serial access memory of the thirty-first embodiment (FIG. 89).

Thirty-Third Embodiment

Figure 91:
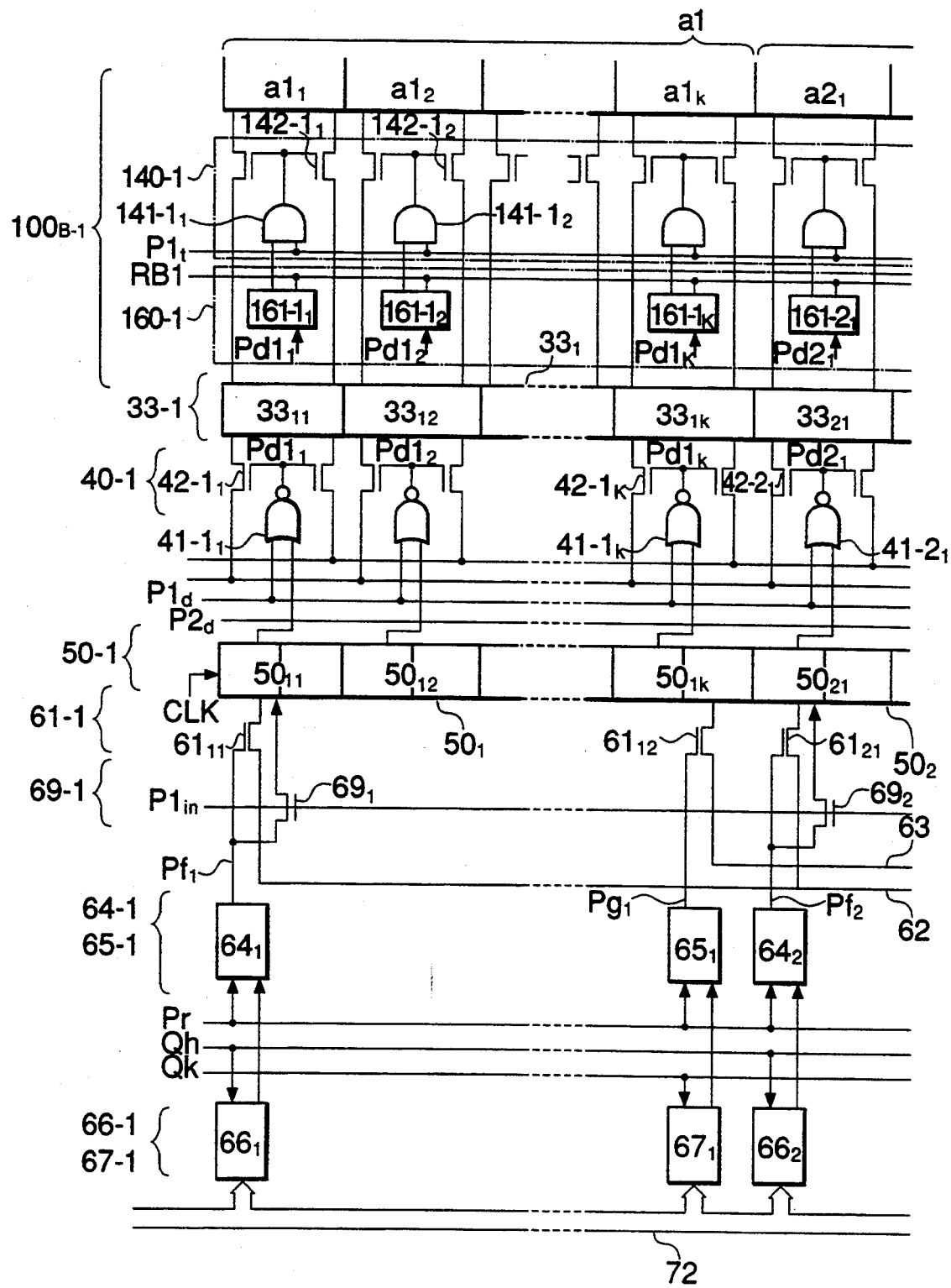
FIG. 91 is a fragmentary circuit diagram of a serial access memory according to a thirty-third embodiment of the present invention.

FIG. 91 is a fragmentary circuit diagram of the serial access memory according to the thirty-third embodiment.

In this embodiment, the Y addressing means 70-1 (70-2) have been eliminated from the serial access memory of the thirty-first embodiment (FIG. 89) and the leading bit serial address fetch circuits 69-1(69-2) of the twenty-sixth embodiment (FIG. 84) have been provided. In the twenty-sixth embodiment, unnecessary data are write-transferred unless the access to each block has been ended completely. This embodiment, on the other hand, can prevent write-transfer of unnecessary data owing to the provision of the leading bit serial address fetch circuits 69-1(69-2).

Thirty-Fourth Embodiment

Figure 92:
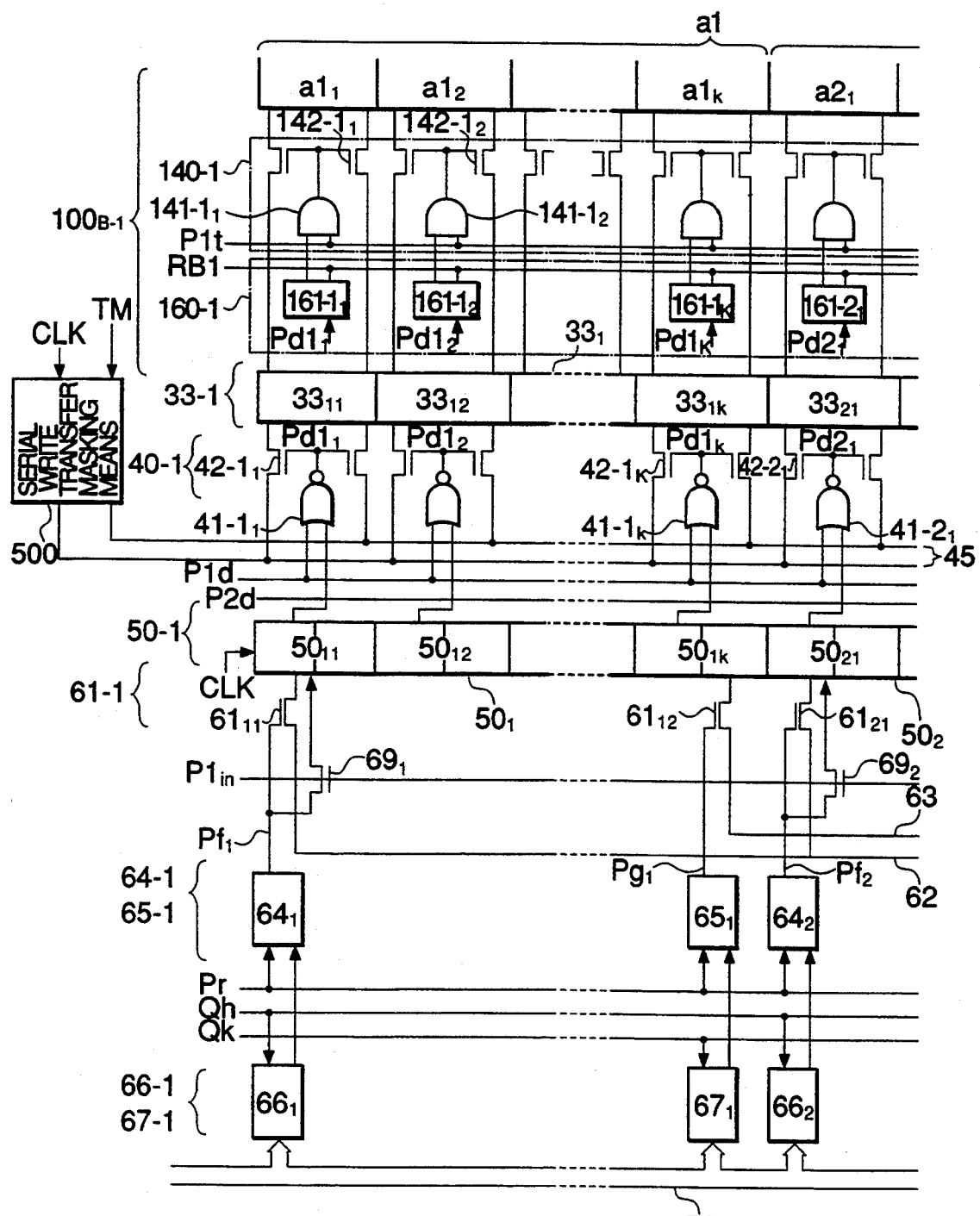
FIG. 92 is a fragmentary circuit diagram of a serial access memory according to a thirty-fourth embodiment of the present invention.

FIG. 92 is a fragmentary circuit diagram of the serial access memory according to the thirty-fourth embodiment.

In this embodiment, the masking operation has been simplified by adding the serial write transfer masking means 500 of the seventeenth embodiment to the thirty-third embodiment (FIG. 91).

Thirty-Fifth Embodiment

Figure 93:
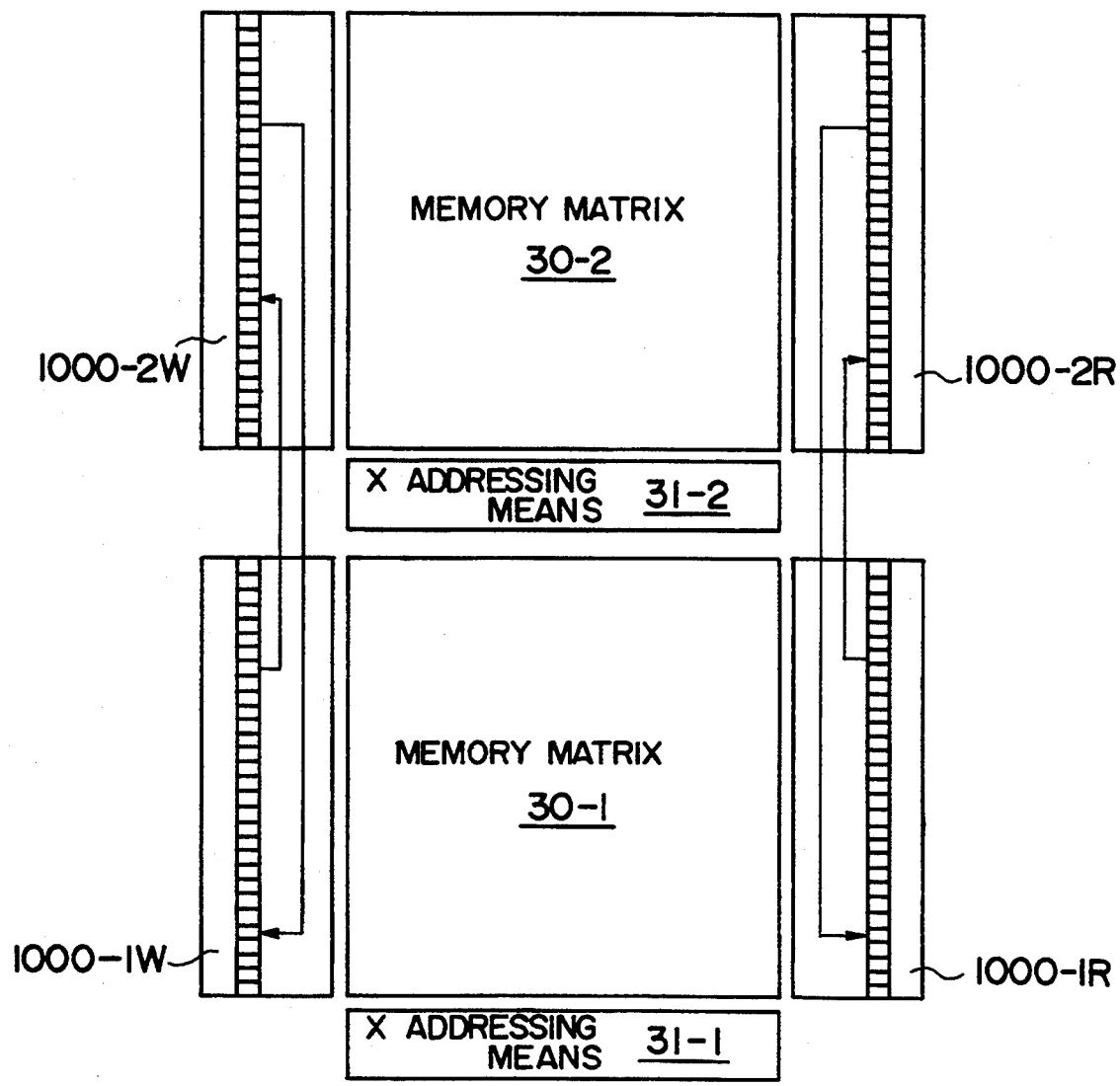
FIG. 93 is a simplified block diagram of a serial access memory according to a thirty-fifth embodiment of the present invention.

FIG. 93 is a simplified block diagram of the serial access memory according to the thirty-fifth embodiment.

This serial access memory has the construction that, in the serial access memory of each of the first to thirty-fourth embodiments, serial read only serial access means 1000-1R,1000-2R and serial write only serial access means 1000-1W,1000-2W are disposed on opposite sides of the first and second memory matrices 30-1,30-2, respectively, to permit a serial write and a serial read at the same time.

The serial access means 1000-1R,1000-2R are composed as in the first to thirty-fourth embodiments other than the second and eleventh embodiments, for example, are composed of the transfer means 32-1,32-2, the data registers 33-1,33-2, the switching means 40-1, 40-2, the pointers 50-1,50-2, the serial address controls 60-1,60-2 and the Y addressing means 70-1,70-2, all shown in FIG. 1. Similarly, the serial write only serial access means 1000-1W,1000-2W have a similar circuit construction to the serial read only serial access means 1000-1R,1000-2R described with respect to the first to thirty-fourth embodiments.

Figure 94:
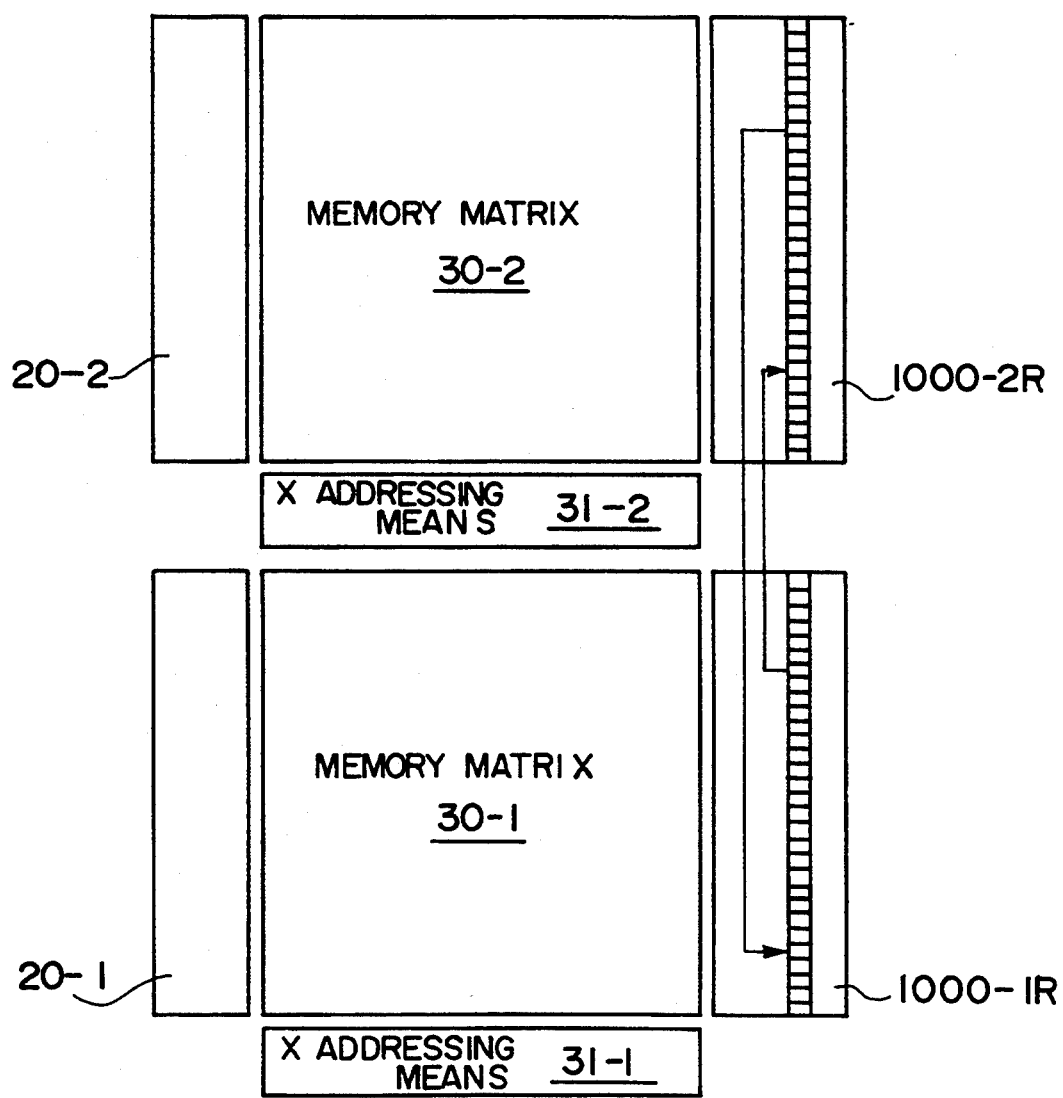
FIG. 94 is a simplified block diagram of a serial access memory according to a thirty-sixth embodiment of the present invention.

Such a construction permits setting of pointer output routes as desired at the serial access means 1000-1R,1000-2R,1000-1W,1000-2W. By skippingly setting addresses, it is possible to simultaneously achieve a read serial access and a write serial access although this was not feasible by conventional serial access memories. This makes it possible to broaden the application field of serial access memories. Thirty-Sixth Embodiment FIG. 94 is a simplified block diagram of the serial access memory according to the thirty-sixth embodiment.

Figure 2:
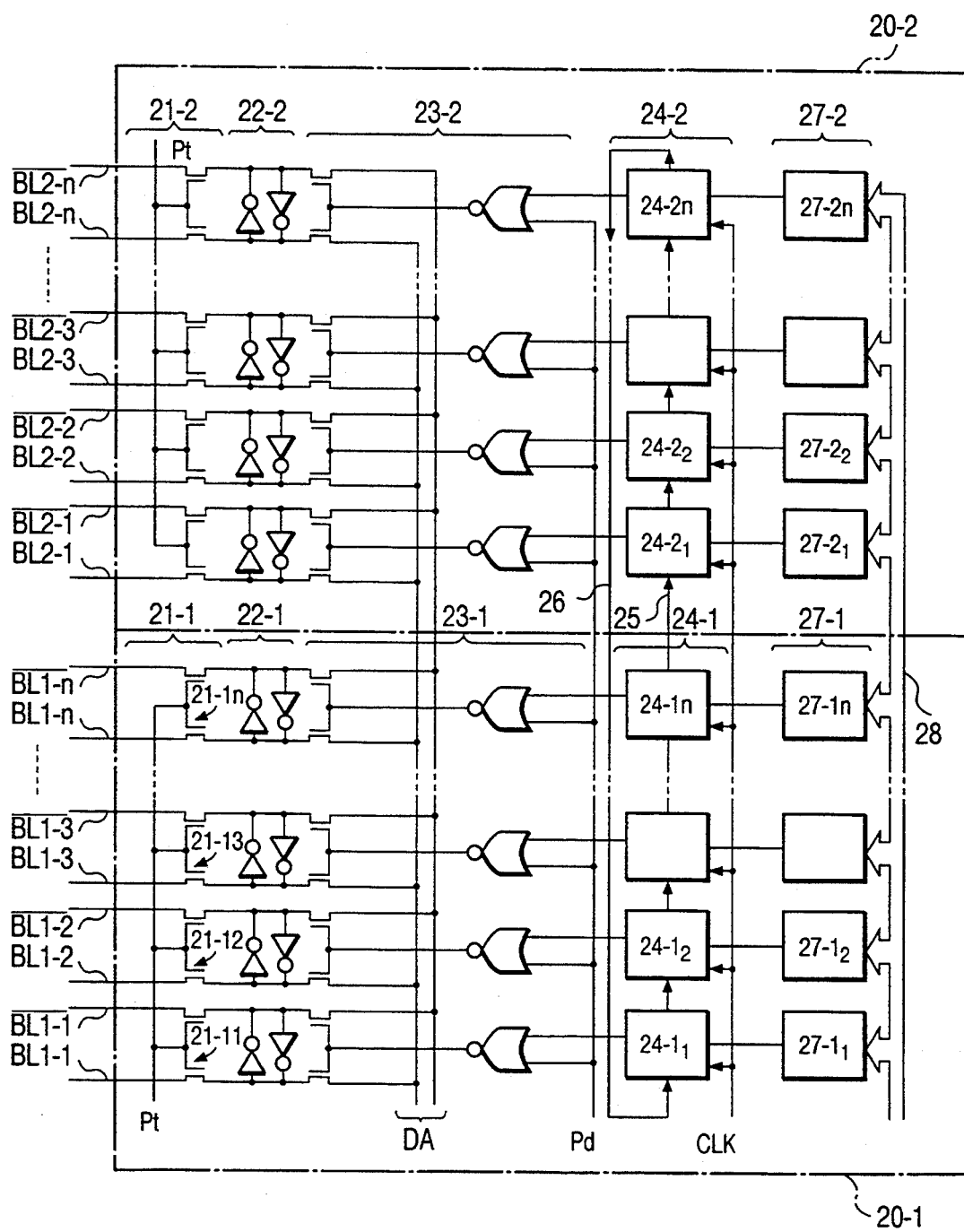
FIG. 2 is a circuit diagram of serial access means in FIG. 1.

This serial access memory has the construction that, in place of the serial write only serial access means 1000-1W,1000-2W of the thirty-fifth embodiment (FIG. 93), serial access means, for example, the serial access means 20-1,20-2 shown in FIG. 2 directed to the conventional serial access memory are provided to use the serial read only serial access means 1000-R,1000-2R and the serial write only serial access means 20-1,20-2 in combination for the memory matrices 30-1,30-2. thereby permitting a serial read and a serial write at the same time.

Such a serial access memory is effective for such image processing as performing a serial read at a high speed and moreover simply to promptly fetch only block data on the memory matrices 30-1,30-2 or for such an application as requiring only simple writing in a CPU system which frequently performs reading of a series of serial data (byte wide data of 8, 16, 32 bits or so).

Thirty-Seventh Embodiment

Figure 95:
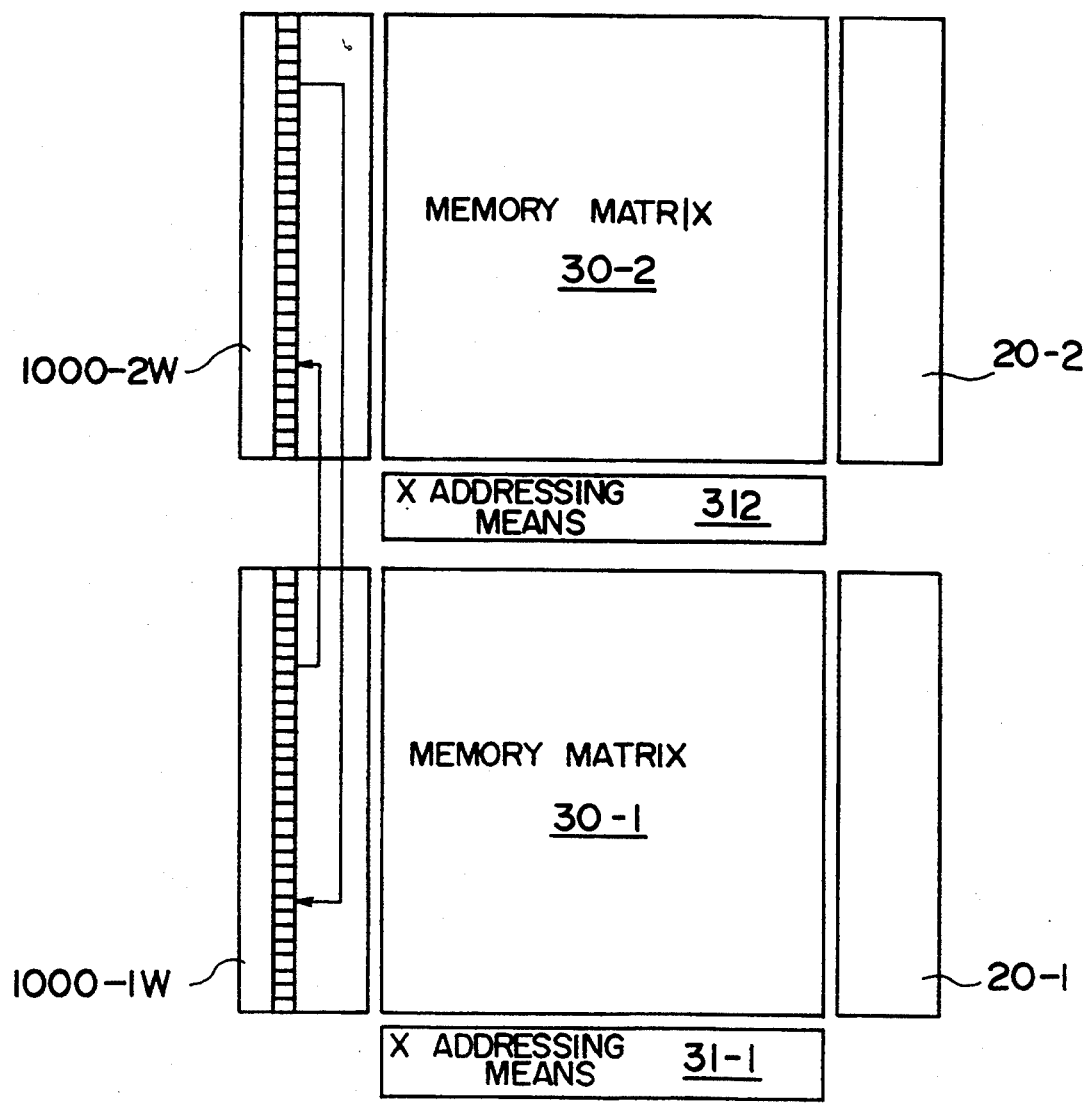
FIG. 95 is a simplified block diagram of a serial access memory according to a thirty-seventh embodiment of the present invention.

FIG. 95 is a simplified block diagram of the serial access memory according to the thirty-seventh embodiment.

This serial access memory has the construction that, in place of the serial read only serial access means 1000-1R,1000-2R of the thirty-fifth embodiment (FIG. 93), serial access means, for example, the serial access means 20-1,20-2 shown in FIG. 2 directed to the conventional serial access memory are provided exclusively for serial reading and the serial read only serial access means 20-1,20-2 and the serial write only serial access means 1000-W,1000-2W are used in combination for the memory matrices 30-1,30-2. thereby permitting a serial read and a serial write at the same time.

Such a construction is very effective where, upon updating the data in a window in image processing or updating block data, a serial write is performed at a high speed while maintaining constant pointer output routes on the side of the serial write only serial access means 1000-W,1000-2W and read data are outputted in a serial manner on the side of the serial read only serial access means 20-1,20-2 to refresh the image on the screen.

Figure 3:
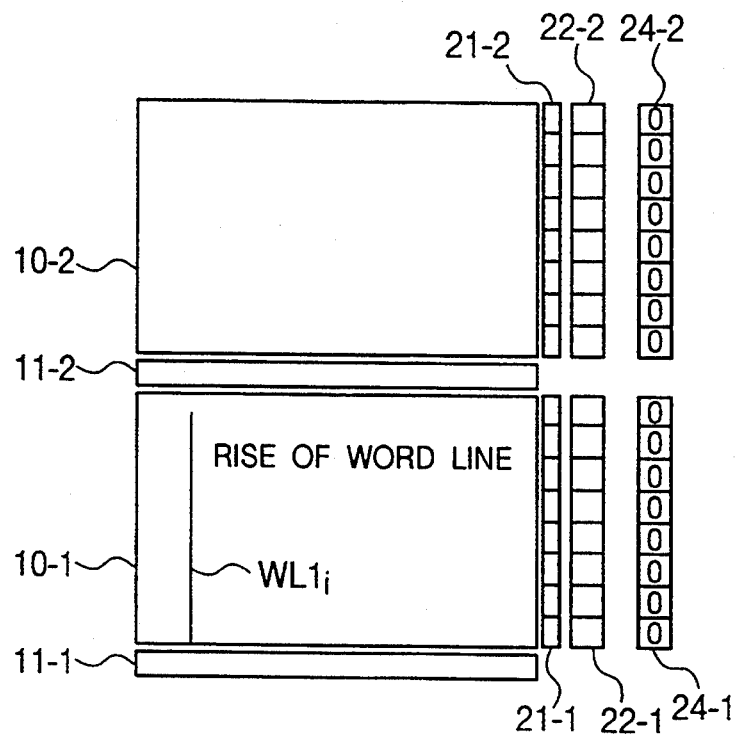
FIG. 3 diagrammatically shows a serial read operation in FIG. 1.
Figure 3:
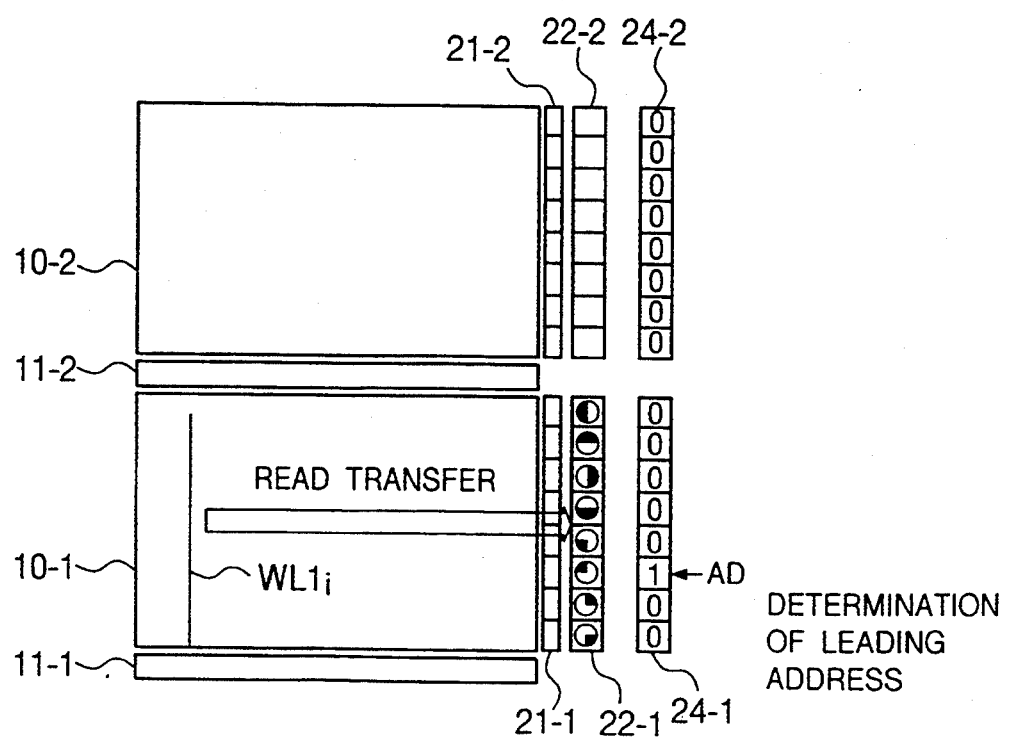
Figure 3:
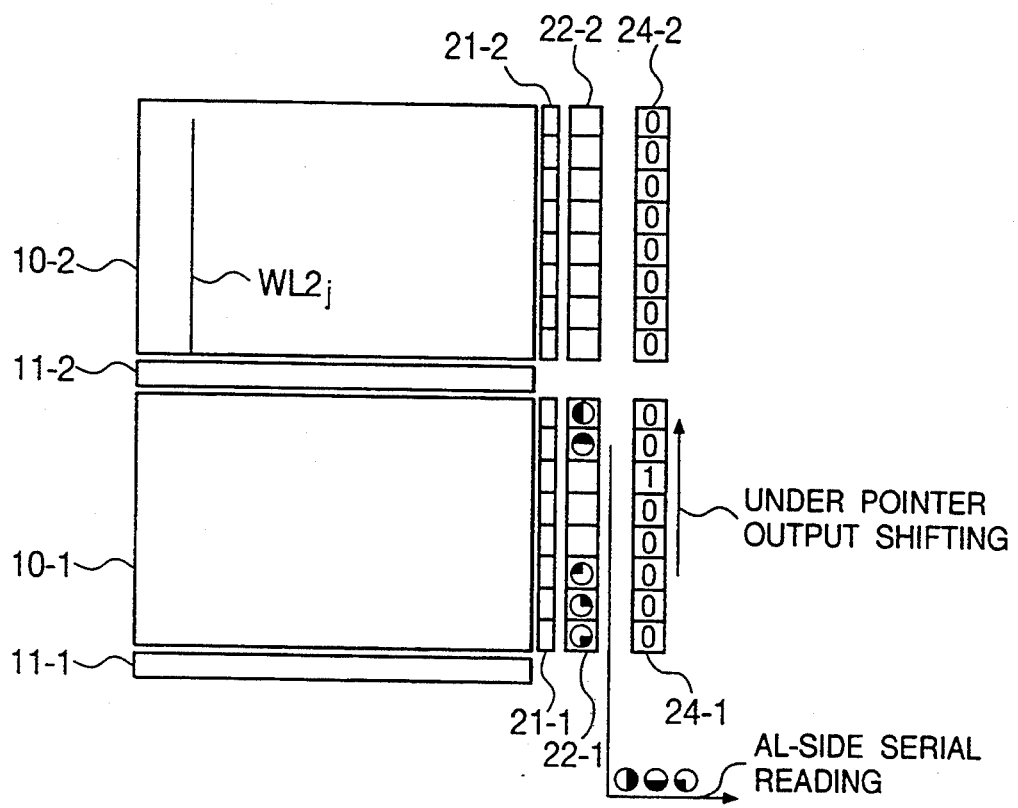
Figure 3:
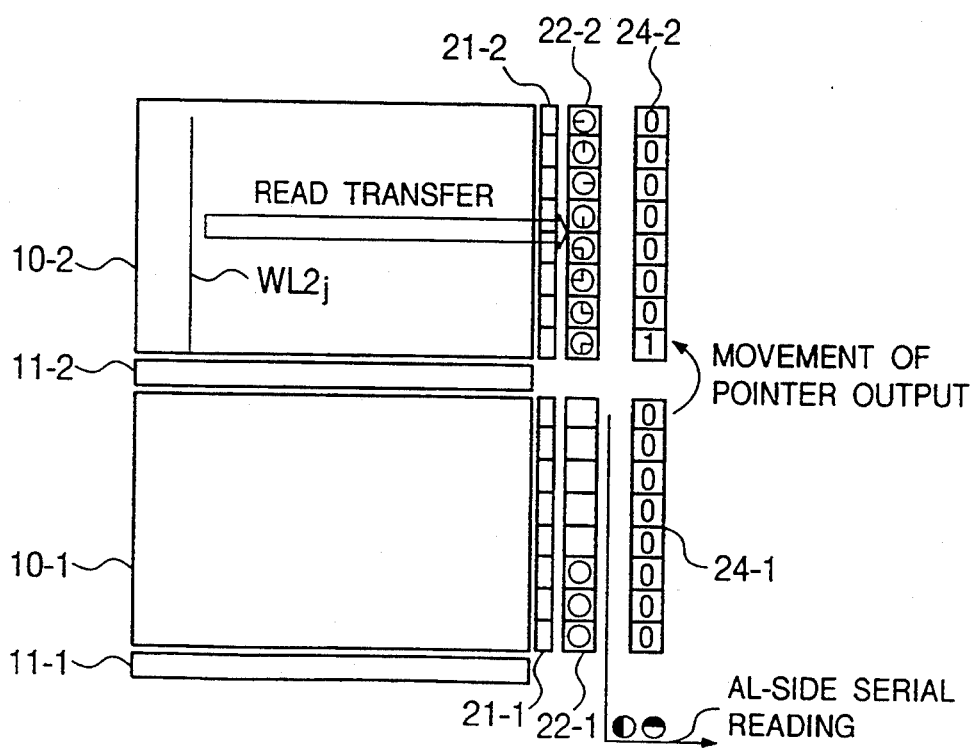
Figure 4:
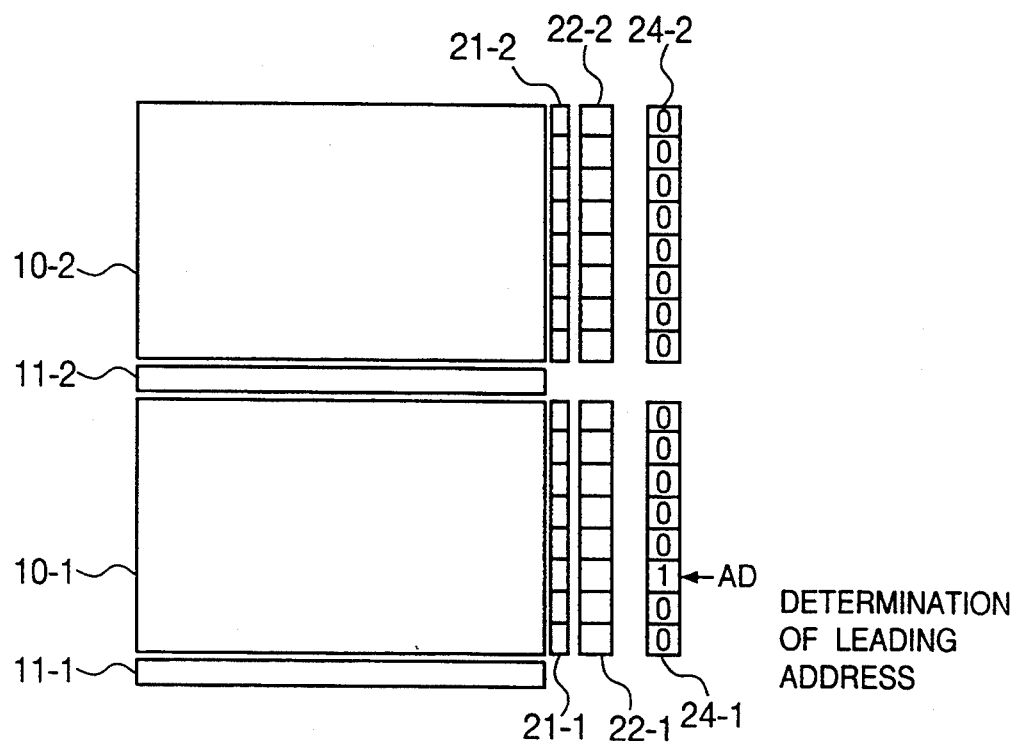
FIG. 4 diagrammatically depicts a serial write operation in FIG. 1.
Figure 4:
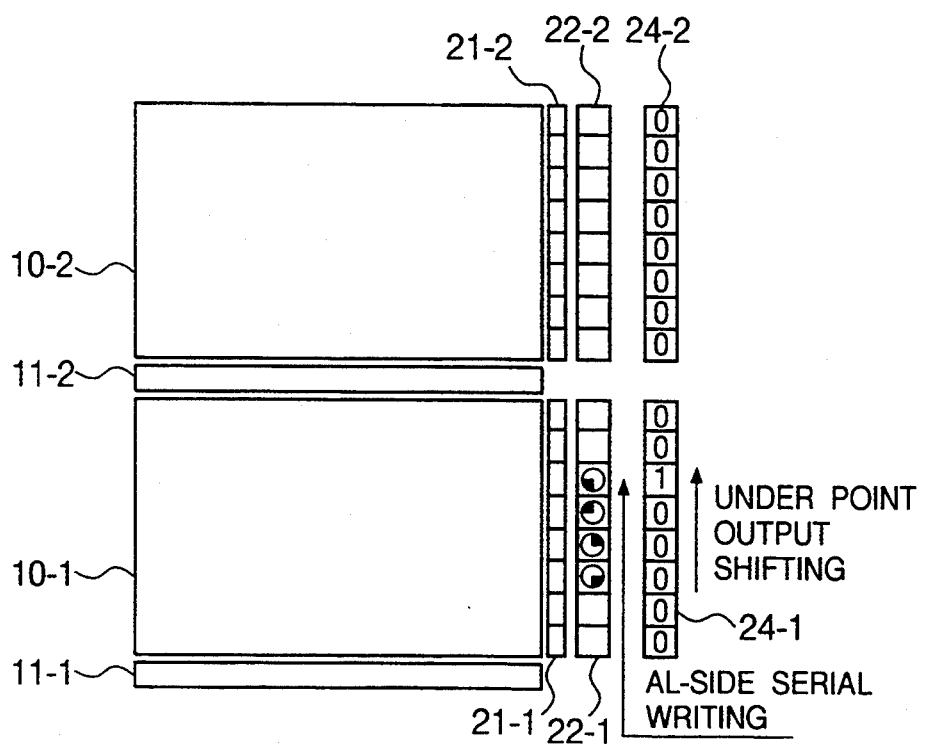
Figure 4:
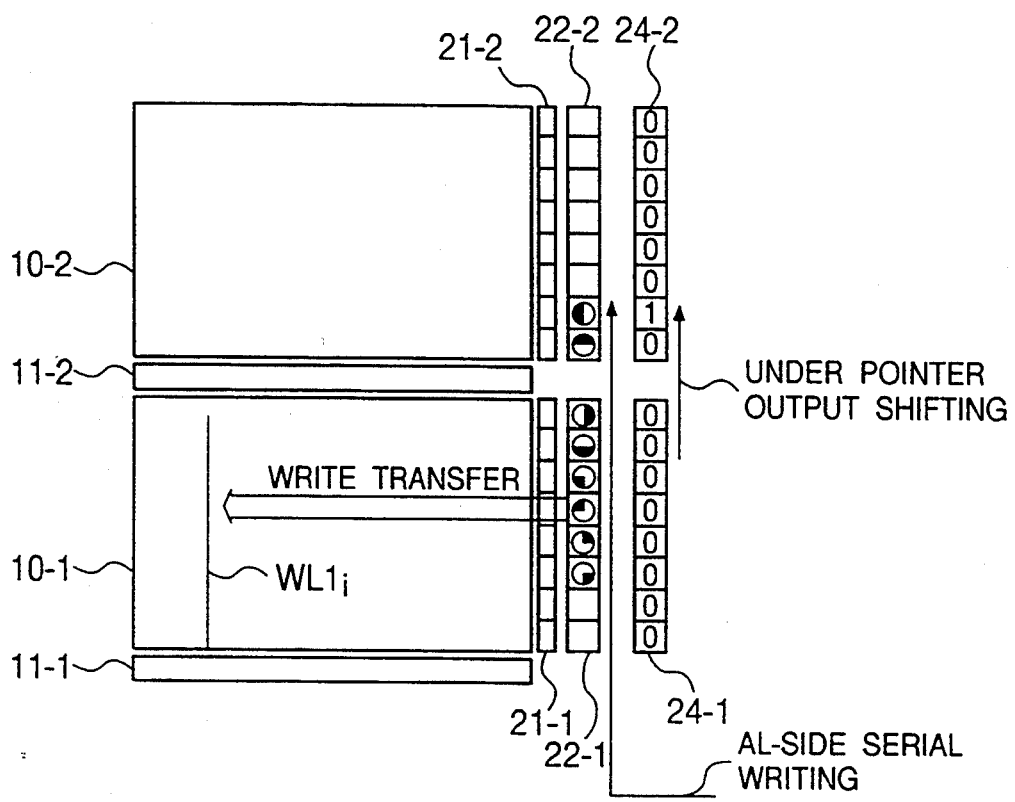
Figure 4:
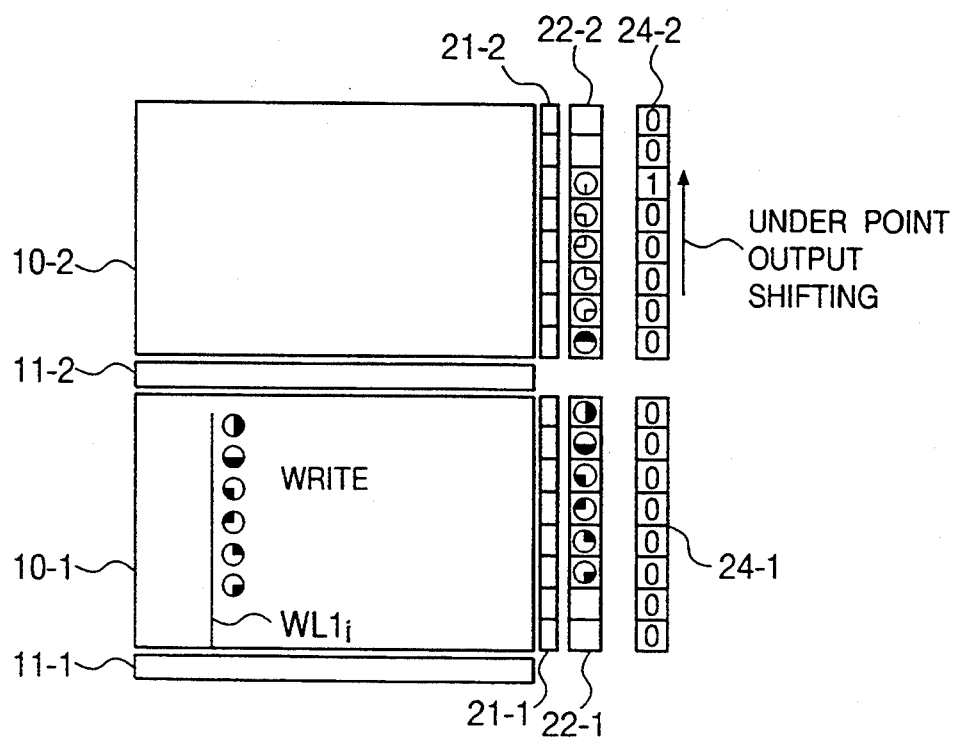

Incidentally, the conventional circuits of FIG. 2 were employed as the serial access means 20-1,20-2 in the thirty-sixth embodiment (FIG. 94) and the thirty-seventh embodiment (FIG. 95). It is however possible to modify their circuit construction to one of the circuit constructions in the drawings other than FIG. 3.

INDUSTRIAL APPLICABILITY

As has been described in detail, the serial access memory according to the first aspect of the present invention is provided with the first to fourth groups of switching means and the address means for selecting the switching means. The output routes of the pointers as address generators for accessing data in a serial manner can be freely controlled by the address means, thereby making it possible to designate the first and second pointers over certain ranges as desired. It is therefore possible to fetch a certain series of data from serially-successive data and to output them at a high speed. The performance of the serial access memory has been significantly improved.

According to the second aspect of the present invention, the address generators and the write transfer controls are provided. After a read transfer is performed from memory cells, which are desired to be written, to the first and second data registers prior to a write transfer to the memory cells, the data of the first and second data registers are therefore write-transferred to the memory cells. Because of this, even when a series of serial write is effected to certain ranges of the successive addresses in the first and second data registers, data which are not desired to be updated can be retained as they were after a write transfer from the first and second data registers to memory cells.

Since only data to be updated can be selectively write-transferred as described above, the serial access memory according to the second aspect of this invention is very convenient, for example, upon updating only a certain region on the screen in the course of image processing or performing a burst access to a CPU or when data are updated by conducting short writing of only a desired number of bits out of long serial data.

According to the third aspect of the present invention, the first and second transfer means in the first aspect of the present invention are constructed of switching means or the like. It is hence possible to selectively write-transfer only data, which have been written at particular successive addresses in the first and second registers and are desired to be updated, from the first and second data registers to desired memory cells without repeating read transfer and write transfer.

According to the fourth aspect of the present invention, the first and second transfer means are individually constructed of the switching control, the charge/discharge circuit, the switching circuit and the like. By controlling such switching controls and charge/discharge circuits, only accessed bits of the switching circuits are turned on so that only data, which are desired to be updated, can be write-transferred form the first and second registers to desired memory cells by a write transfer alone.

According to the fifth aspect of the present invention, the first and second lines are provided with the amplifiers at intermediate locations thereof, respectively. Even when the parasitic loads of the first and second lines become high as a result of an increase in the memory capacity, pointer outputs on the first and second lines are amplified so that the pointer outputs can be transferred at a high speed. The memory is therefore expected to operate at a high speed.

According to the sixth aspect of the present invention, the X address generator is provided. X addresses generated from the X address generator are incremented in accordance with pointer outputs from the second line. No complex random access is therefore needed and, where a simple serial access is continued, X addresses can be produced automatically and internally. This has resulted in a further improvement in the convenience upon using a memory.

According to the seventh aspect of the present invention, the address counter and the initial value input circuit are provided. An X address, which is incremented, is therefore fetched as an initial address responsive to a reset signal. It is therefore possible to automatically and internally generate an initial address, leading to a further improvement in the convenience upon using a memory.

According to the eighth aspect of the present invention, Y address means has been eliminated and, instead, the leading bit serial address fetch circuit is provided. Accessed address in ranges of accessed bits in the first and second data registers, for example, the youngest (smallest) accessed addresses are set as leading addresses and serial accesses are performed based on the leading addresses, respectively. The elimination of the Y addressing means is expected to bring about the effects that the area required for the formation of a circuit pattern can be reduced and the fabrication cost can hence be lowered.

According to the ninth aspect of the present invention, at least three memory matrices of a similar type to the first and second memory matrices and a like number of corresponding access means are provided. Each pointer output is therefore sequentially transferred, for example, in the order of the first→second pointers and the second→third pointers. A pointer output from the last stage is inputted to the first pointer in the first stage. The serial access memory is therefore effective in selecting several successive bytes from plural regions, for example, in a CPU system and accessing the bytes at a high speed in a serial manner.

According to the tenth aspect of the present invention, the first and second transfer means are each composed of the switching control, the switching circuit and the like. As each pointer output is shifted, the serial addresses so accessed are stored in the switching control and, upon write transfer, only the elements of the switching circuit, said elements corresponding to the accessed bits, are rendered conductive, whereby a selective write transfer is feasible. In the tenth aspect of the present invention, routes of pointer outputs can be set as desired as in the first aspect of the present invention. Moreover, the circuit can be designed logically without the need for taking into consideration margins which would otherwise be required due to process variations of the elements in the switching circuit. Even if there are unaccessed bits in a pointer route, such bits are not write-transferred. In other words, bits to be selected can be decided at the time of an access so that a precise write transfer free of any erroneous operation can be conducted.

According to the eleventh aspect of the present invention, the arbiter is provided so that no limitation is needed with respect to the timing of each control signal adapted to control the write transfer control. Even if the control signal is activated right after a change in the pointer output from the first or second line, for example, a read transfer can be automatically executed by the arbiter after completion of a write transfer. Production of a control signal for the write transfer control can therefore be simplified.

According to the twelfth aspect of the present invention, the first and second equalizers are provided. Upon charging the signal lines by the charge/discharge circuits, the signal lines are rendered conductive so that equalization can be conducted at a high speed. A selective write transfer can therefore be performed at a high speed.

According to the thirteenth aspect of the present invention, the charging circuit is provided. Use of the charging circuit for charging the signal lines can shorten the time required for the charging, thereby permitting acceleration of a write transfer operation.

According to the fourteenth aspect of the present invention, the serial write transfer masking means is provided. Responsive to an external signal, a mask can therefore be applied by a simple operation to the write transfer of desired bits out of serial-accessed successive bits subsequent to setting of a route for each pointer output as desired.

According to the fifteenth aspect of the present invention, outputs of the Y addressing means adapted to decode the Y addresses in a time-sharing manner can be selected by the Y address selector means. This allows to commonly use the Y addressing means to input Y addresses in plural portions. The Y addresses can then be subjected to a decoding operation in a time-sharing manner by the Y addressing means, and the results of the decoding operation can be distributed to the address selector means. The circuit size for the Y addressing means can therefore be reduced, leading to a substantial decrease in the area required for the formation of a circuit pattern.

According to the sixteenth aspect of the present invention, the address control means are selectively controlled using a common control signal. Setting of the start address, end address and leading address of a serial access, for example, can be effected at once by the first and second pointers before the serial access. In other words, the pointer routes for the serial access can be set at once before the serial access. This construction is therefore very effective when pointer outputs continue in a cycle subsequent to the setting of the pointer routes.

According to the seventeenth aspect of the present invention, the leading addresses of a serial access are designated block by block for the first and second pointers by the Y addressing means. It is therefore possible to set the route of each pointer output block by block. Block-by-block address selection is hence feasible when memory column units to be selected by the designation of addresses to decide a pointer output route are not discrete but are a group of memory columns formed of plural successive memory column units. The circuit sizes of the first and second data registers can be reduced, thereby making it possible to reduce not only the circuit pattern area but also the fabrication cost.

According to the eighteenth aspect of the present invention, the address generator and write transfer control are provided. It is therefore possible to perform block-by-block selection of addresses and also a selective block-by-block write transfer. In the second aspect of the present invention, it was necessary to provide each memory column unit with Y addressing means and address means. In a CPU system or the like, for example, it is often performed a series of serial bit access over certain plural bits. There are many systems employed for applications where random address designation of blocks consisting each of plural bits is sufficient. Use of the eighteenth aspect of the present invention in such applications makes it possible to substantially reduce the circuit sizes of the Y addressing means and address means. Thereby making it possible to reduce not only the area to be required for the formation of a circuit pattern but also the fabrication cost.

According to the nineteenth aspect of the present invention, the first and second transfer means are each composed of the switching control, the charge/discharge circuit, the switching circuit and the like. It is therefore possible to perform block-by-block selection of addresses and a block-by-block write transfer. In CPU system and the like, for example, plural bits are often accessed in a serial manner. There are hence not a few applications where detailed random designation of leading bits is not required. Use of the nineteenth aspect of the present invention for such applications permits a selective write transfer which has heretofore been impossible. Moreover, addresses and selected block by block and the route for each pointer output is designated block by block. It is therefore possible to reduce the circuit sizes of the Y address means and address means, thereby making it possible to reduce not only the circuit pattern area but also the fabrication cost.

According to the twentieth aspect of the present invention, the first and second lines are provided with the amplifiers at intermediate locations thereof, respectively. When the route for each pointer output is decided block by block by block-by-block selection of addresses, an increase in the memory capacity results in greater load capacities of the first and second lines. Owing to the block-by-block access, the load capacities of the first and second lines are therefore decreased and pointer outputs on the lines are amplified by the amplifiers. As a consequence, a high-speed, serial access memory operation can be expected.

According to the twenty-first aspect of the present invention, the X address generator is provided. Addresses can therefore be selected block by block and serial addresses can all be generated internally. Accordingly, the circuit pattern area can be reduced and, owing to the internal generation of addresses, the fabrication cost can be reduced.

According to the twenty-second aspect of the present invention, the address counter and the initial value input circuit are provided. Hence, addresses can be selected block by block, and the setting of an initial value of X address, said X address being incremented, is facilitated. The convenience upon use of a memory can be improved further.

According to the twenty-third aspect of the present invention, the Y addressing means has been eliminated and, instead, the leading bit serial address fetch circuit has been provided. Therefore, addresses can be selected block by block and the initial value of each pointer can be easily set by the leading bit serial address fetch circuit. Where it is not necessary to change the leading bit of a serial access every time or to start a serial access from an intermediate location of a designated range of serial access bits, for example, in an application which does not require changing of the route for each pointer output at random, use of the twenty-third aspect of the present invention is expected to reduce the circuit size owing to the elimination of the Y addressing means and, accordingly, to reduce not only the area require for the formation of a circuit pattern but also the fabrication cost.

According to the twenty-fourth aspect of the present invention, the first and second transfer means are each constructed of the switching control, the switching circuit and the like. Thus, a block-by-block serial write transfer can be performed accurately at a high speed without the need for taking into consideration any possible reduction in margin which may arise by process variations of the circuit-constituting elements.

According to the twenty-fifth aspect of the present invention, each memory unit is provided with its own switching control and switching circuit. Even if an access is terminated at an intermediate address in a block, the selective write transfer of only the accessed bits is feasible. This aspect can therefore eliminate the inherent inconvenience of block-by-block selection of addresses.

According to the twenty-sixth aspect of this invention, the first and second equalizers are provided. Upon conducting a selective block-by-block write transfer by selecting addresses block by block, equalization of the signal lines can therefore be accelerated so that the access speed can be made still faster and the circuit size can be reduced.

According to the twenty-seventh aspect of the present invention, the charging circuit is provided. Upon conducting a selective block-by-block write transfer by selecting addresses block by block, the charging time of the signal lines can therefore be shortened significantly so that a high-speed operation can be expected.

According to the twenty-eighth aspect of the present invention, the Y addressing means has been eliminated and the leading bit serial address fetch circuit has been provided. Upon conducting a block-by-block access by the selection of accesses in blocks, the omission of the Y addressing means makes it possible to reduce not only the area required for the formation of a circuit pattern but also the fabrication cost. In addition, speed-up of a serial access can be expected because block addresses to be accessed are stored in the switching control.

According to the twenty-ninth aspect of the present invention, the serial write transfer masking means is provided. A block-by-block write transfer can hence be selected by an external signal. Since a write transfer mask is applied block by block, control by external signals makes it possible to easily apply a write transfer mask to blocks corresponding to the external signals. As a consequence, it is possible to decrease the circuit size and hence to reduce not only the area required for the formation of a circuit pattern but also the fabrication cost.

According to the thirtieth aspect of the present invention, the Y addressing means has been eliminated and, instead, the leading bit serial address fetch circuit has been provided. Upon conducting a block-by-block write transfer by the selection of accesses in blocks, write transfer of unnecessary data can be prevented even when the access to each block has not been fully completed.

According to the thirty-first aspect of the present invention, the serial write transfer masking means is provided. It is hence possible to apply a mask by an external signal upon selective block-by-block write transfer, so that a selective write transfer can be performed by a simple circuit operation.

According to the thirty-second aspect of the present invention, two sets of serial access means are provided, one for serial read only and the other for serial write only. It is therefore possible to skippingly set addresses by setting each pointer output route as desired. Accordingly, a serial access in which a serial write access and a serial read access are simultaneously carried out can be achieved at a high speed.

According to the thirty-third aspect of the present invention, one of serial access means is constructed to decode only Y addresses so that a sequential serial access to memory cells can be performed on the basis of the results of the decoding, and the other serial access means is constructed of the serial access means in each of the first, fourteenth and seventeenth aspects of the present invention. It is therefore possible to share the same memory matrices and, moreover, to perform a serial read and a serial write at the same time. When a simple serial access means such as that employed so far is provided for serial write only, the serial access memory is effective, for example, for such image processing as desirably performing a serial read at a high speed and moreover in a simple manner or for such applications as requiring simpler writing of data in such CPU systems that a certain series of serial data is written frequently. Where a simple serial access means such as that employed so far is used for serial read only, the serial access memory is very effective when, upon updating the data of a window in image processing, for example, the updating of its blocks is performed by a high-speed serial write while maintain the same pointer output route and data are read in a serial manner on the serial read only side to refresh the image on the screen.

I claim:

1. A serial access memory having a first and second memory matrices with memory cells thereof connected to plural word lines and bit lines, first and second X addressing means for selecting word lines of the first and second memory matrices on the basis of an X address, a first and second data registers for performing parallel/serial interconversion of data for the first and second memory matrices on the basis of each serial address, first and second transfer means for performing switching of data between the first and second memory matrices and the first and second data registers, first and second pointers composed of plural master-slave flip-flops, respectively, and adapted to generate serial addresses for the first and second data registers, respectively, and Y addressing means for designating a leading address of a serial access for each of the first and second data registers on the basis of a Y address supplied thereto, whereby partitioned access to the first and second memory matrices is feasible, which comprises:

a first group of switching means for connecting input sides of the respective flip-flops of the first pointer with a first line adapted to transfer pointer outputs therethrough;

a second group of switching means for connecting output sides of the respective flip-flops of the first pointer with a second line adapted to transfer pointer outputs therethrough;

a third group of switching means for connecting input sides of the respective flip-flops of the second pointer with the second line;

a fourth group of switching means for connecting output sides of the individual flip-flops of the second pointer with the first line; and address means for selecting one switching means from each of the first, second, third and fourth groups of switching means on the basis of the Y address.

2. A serial access memory of claim 1, further comprising:

an address generator for switching the X address and feeding same to said first or second X addressing means; and a write transfer control for controlling, based on pointer outputs from the first and second lines, the address switching operation of the address generator and switching operations of said first and second transfer means, whereby a read transfer from memory cells in the first and second memory matrices to the first and second data registers is performed before a write transfer from the first and second data registers to the memory cells in the first and second memory matrices.

3. A serial access memory of claim 1, wherein said first and second transfer means have a switching circuit for opening or closing connections between the first and second memory matrices and the first and second data registers, whereby outputs of said address means are subjected to a logical operation and on the basis of the results of the logical operation, only accessed bits in the switching circuit are controlled in an open state upon write transfer from the first and second data registers to the first and second memory matrices.

4. A serial access memory of claim 1, wherein said first and second transfer means comprise:

switching controls having signal lines, along which plural switching elements are connected in series via individual nodes, and adapted to subject outputs of said address means to a logical operation so that the individual switching elements are on-off controlled based on the results of the logical operation;

charge/discharge circuits for charging or discharging the signal lines on the basis of a charge/discharge signal; and switching circuits for transferring, based on a switching signal and signals on the respective nodes, only accessed bits in the first and second data registers upon write transfer from the first and second data registers to the first and second memory matrices.

5. A serial access memory of claim 1, further comprising amplifiers provided at intermediate locations of the first and second lines, respectively, whereby pointer outputs are amplified.

6. A serial access memory of claim 1, further comprising an X address generator for generating an X address, which is incremented by a pointer output from the second line, and inputting same to the first or second X addressing means.

7. A serial access memory of claim 1, further comprising:

an address counter for generating an X address, which is incremented by a pointer output from the second line, and feeding same to said first or second X addressing means; and an initial value input circuit for fetching an initial address in the address counter responsive to a reset signal.

8. A serial access memory of claim 1, wherein the Y addressing means has been eliminated and, instead, a leading bit serial address fetch circuit for fetching each output of said address means to set a start address of the first or second pointer.

9. A serial access memory of claim 1, wherein at least three memory matrices of a similar type to the first and second memory matrices and a like number of corresponding access means are provided, and inputs and outputs of the respective pointers are mutually connected via said groups of switching means and the lines.

10. A serial access memory of claim 1, wherein said first and second transfer means comprises:

switching controls for storing serial addresses accessed from the first and second pointers, respectively; and switching circuits for transferring, based on a switching signal and output signals from the switching controls, only accessed bits in the first and second data registers upon write transfer from the first and second data registers to the first and second memory cells.

11. A serial access memory of claim 2, further comprising an arbiter provided in the write transfer control, said arbiter being adapted to temporarily hold the execution of a switching operation of said first and second transfer means at a predetermined timing.

12. A serial access memory of claim 4, wherein said first and second transfer means are provided with a first and second equalizers, respectively, and each of the first and second equalizers has plural switching elements connected in series with the switching elements and on-off controlled by a charging signal.

13. A serial access memory of claim 4, further comprising a charging circuit connected to the signal lines, said charging circuit being operated based on a charging signal.

14. A serial access memory of claim 10, further comprising serial write transfer masking means for applying, responsive to an external signal, a mask to prescribed bits of serial addresses outputted from the first and second pointers.

15. A serial access memory having a first and second memory matrices with memory cells thereof connected to plural word lines and bit lines, first and second X addressing means for selecting word lines of the first and second memory matrices on the basis of an X address, a first and second data registers for performing parallel/serial interconversion of data for the first and second memory matrices on the basis of each serial address, first and second transfer means for performing switching of data between the first and second memory matrices and the first and second data registers, and first and second pointers composed of plural master-slave flip-flops, respectively, and adapted to generate serial addresses for the first and second data registers, respectively, whereby partitioned access to the first and second memory matrices is feasible, which comprises:
- a first group of switching means for connecting input sides of the respective flip-flops of the first pointer with a first line adapted to transfer pointer outputs therethrough,
- a second group of switching means for connecting output sides of the respective flip-flops of the first pointer with a second line adapted to transfer pointer outputs therethrough,
- a third group of switching means for connecting input sides of the respective flip-flops of the second pointer with the second line,
- a fourth group of switching means for connecting output sides of the individual flip-flops of the second pointer with the first line,
- Y addressing means for decoding in a time-sharing manner Y addresses to be fed, and
- address selector means for selecting outputs of said Y addressing means on the basis of address selection signals;
- whereby based on outputs from said address selector means, leading addresses of a serial access are designated for the first and second pointers, respectively, and the first, second, third or fourth group of switching means are selected.

16. A serial access memory of claim 15, wherein said first, second, third or fourth group of switching means are simultaneously selected by selectively controlling said address selector means in accordance with a common control signal.

17. In a serial access memory having a first and second memory matrices with memory cells thereof connected to plural word lines and bit lines, first and second X addressing means for selecting word lines of the first and second memory matrices on the basis of an X address, a first and second data registers for performing parallel/serial interconversion of data for the first and second memory matrices on the basis of each serial address, first and second transfer means for performing switching of data between the first and second memory matrices and the first and second data registers, first and second pointers composed of plural master-slave flip-flops, respectively, and adapted to generate serial addresses for the first and second data registers, respectively, and Y addressing means for designating a leading address of a serial access for each of the first and second data registers on the basis of a Y address supplied thereto, whereby partitioned access to the first and second memory matrices is feasible, the improvement wherein:
- the individual flip-flops of the first and second pointers are divided into plural blocks and said Y addressing means designates leading addresses of a serial access block by block for the first and second pointers; and
- said serial access memory is provided with first switching means for connecting an input side of each block of the first pointer with a first line adapted to transfer each pointer output therethrough, second group switching means for connecting an output side of each block of the first pointer with a second line adapted to transfer each pointer output therethrough, third switching means for connecting an input side of each block of the second pointer with the second line, fourth switching means for connecting an output side of each block of the second pointer with the first line, and address means for selecting said first, second, third or fourth switching means on the basis of the Y address.

18. A serial access memory of claim 17, further comprising:
- an address generator for switching the X address and feeding same to said first or second X addressing means; and
- a write transfer control for controlling, based on pointer outputs from the first and second lines, the address switching operation of the address generator and switching operations of said first and second transfer means, whereby a read transfer from memory cells in the first and second memory matrices to the first and second data registers is performed before a write transfer from the first and second data registers to the memory cells in the first and second memory matrices.

19. A serial access memory of claim 17, wherein said first and second transfer means comprise:
- switching controls having signal lines, along which switching elements as many as the number of the blocks are connected in series via individual nodes, and adapted to subject outputs of said address means to a logical operation so that the individual switching elements are on-off controlled based on the results of the logical operation;
- charge/discharge circuits for charging or discharging the signal line based on a charge/discharge signal; and
- switching circuits for transferring, based on a switching signal and signals on the respective nodes, only accessed blocks in the first and second data registers upon block-by-block write transfer from the first and second data registers to the first and second memory matrices.

20. A serial access memory of claim 17, further comprising amplifiers provided at intermediate locations of the first and second lines, respectively, whereby pointer outputs are amplified.

21. A serial access memory of claim 17, further comprising an X address generator for generating an X address, which is incremented by a pointer output from the second line, and inputting same to the first or second X addressing means.

22. A serial access memory of claim 17, further comprising:
- an address counter for generating an X address, which is shifted in an ascending order by a pointer output from the second line, and feeding same to said first or second X addressing means; and
- an initial value input circuit for fetching an initial address in the address counter responsive to a reset signal.

23. A serial access memory of claim 17, wherein the Y addressing means has been eliminated and, instead, is replaced with a leading bit serial address fetch circuit for fetching outputs of said address means block by block to set start addresses of the respective blocks in the first or second pointer.

24. A serial access memory of claim 17, wherein said first and second transfer means comprises:
- switching controls for storing serial addresses in blocks accessed from the first and second pointers, respectively; and
- switching circuits for transferring, based on a switching signal and output signals from the switching controls, only accessed blocks in the first and second data registers upon block-by-block write transfer from the first and second data registers to the first and second memory cells.

25. A serial access memory of claim 17, wherein said first and second transfer means comprises:
switching controls for storing bit-by-bit serial addresses accessed from the first and second pointers, respectively; and
switching circuits for transferring, based on a switching signal and output signals from the switching controls, only accessed blocks in the first and second data registers upon write transfer from the first and second data registers to the first and second memory cells.

26. A serial access memory of claim 19, wherein said first and second transfer means are provided with a first and second equalizers, respectively, and each of the first and second equalizers has plural switching elements connected in series with the switching elements and on-off controlled by a charging signal.

27. A serial access memory of claim 19, further comprising a charging circuit connected to the signal lines, said charging circuit being operated based on a charging signal.

28. A serial access memory of claim 24, wherein the Y addressing means has been eliminated and, instead, is replaced with a leading bit serial address fetch circuit for fetching outputs of said address means block by block to set start addresses of the respective blocks in the first or second pointer.

29. A serial access memory of claim 24, further comprising serial write transfer masking means for applying, responsive to an external signal, a mask to prescribed blocks of serial addresses outputted from the first and second pointers.

30. A serial access memory of claim 25, wherein the Y addressing means has been eliminated and, instead, is replaced with a leading bit serial address fetch circuit for fetching outputs of said address means block by block to set start addresses of the respective blocks in the first or second pointer.

31. A serial access memory of claim 25, further comprising serial write transfer masking means for applying, responsive to an external signal, a mask to prescribed bits of serial addresses outputted from the first and second pointers.

32. A serial access memory of claim 1, wherein said serial access memory is provided with the first and second data registers, the first and second transfer means, the first and second pointers and the Y addressing means; the first and second memory matrices are each provided with two sets of serial access means for conducting a serial access of Y addresses with respect to the corresponding memory matrix; and one of the two sets of serial access means is used exclusively for serial reading and the other serial access means is employed exclusively for serial writing.

33. A serial access memory of claim 32, wherein one of the two sets of serial access means decodes Y addresses and, based on the results of the decoding, performs a sequential serial access to the memory cells.

34. A serial access memory comprising:
(a) a first and second memory cell arrays provided individually with plural memory cell groups each of which has a multiplicity of memory cells, a like plural number of word lines corresponding to the respective plural memory cell groups, said word lines being connected with the multiplicity of memory cells in the corresponding memory cell groups, and a like plural number of bit lines which, when any one of the plural word lines has been selected, correspond to and are electrically connected with the multiplicity of memory cells connected with the word line so selected;
(b) first and second word line address means corresponding to the first and second memory cell arrays, respectively, said first and second word line address means being adapted to select any ones of the plural word lines of the corresponding memory cell arrays;
(c) first and second data register means corresponding to the first and second memory cell arrays, respectively, each of said first and second data register means having a like plural number of latches which correspond to the plural bit lines, respectively, and are adapted to hold data to or from the corresponding bit lines;
(d) a data line for transferring data to or from the latches;
(e) first and second switching means corresponding to the first and second memory cell arrays, respectively, each of said first and second switching means having a like plural number of switches which correspond to the plural latches, respectively, and are adapted to electrically connect or disconnect the data line with the corresponding latches; and
(f) a control for sequentially bringing plural switches, which belong to a desired first switch group out of the plural switches of said first switching means, and plural switches, which belong to a desired second switch group out of the plural switches of said switching means, into a connected state for a predetermined period of time.

35. A serial access memory of claim 34, wherein said control comprises:
first and second data pointer means composed individually of plural master-slave flip-flops corresponding to the plural switches and connected in series, each of said flip-flops being composed of a master portion, which has a switch control signal output terminal and a data pointer interconnecting input terminal, and a slave portion having a data pointer interconnecting output terminal;
a first data pointer interconnecting line connecting the data pointer interconnecting output terminal of the final-stage flip-flop of the flip-flops, which correspond to the first switch group of said first data pointer means, with the data pointer interconnecting input terminal of the first-stage flip-flop of flip-flops corresponding to the second switch group of said second data pointer means; and
a second data pointer interconnecting line connecting the data pointer interconnecting output terminal of the final-stage flip-flops, which correspond to the second switch group of said second data pointer means, with the data pointer interconnecting input terminal of the first-stage flip-flop of the flip-flops corresponding to the first switch group of said first data pointer means.

36. A serial access memory of claim 35, wherein the control has an output start control for outputting an output start signal for a switch group control signal to any one of the plural flip-flops corresponding to the first or second switch group and switch control signals are sequentially outputted from flip-flops fed with the output start signal.

37. A serial access memory of claim 34, wherein the control comprises:
   first and second data pointer means composed individually of plural master-slave flip-flops corresponding to the respective plural switches and connected together in series, each of said plural master-slave flip-flops being composed of a master portion, which has a switch control signal output terminal and a data pointer interconnecting input terminal, and a slave portion having a data pointer interconnecting output terminal;
   a first data pointer interconnecting line;
   a second data pointer interconnecting line;
   a third switch group composed of plural switches connected to locations between an inter-data-pointer output terminal of said first data pointer and the first data pointer interconnecting line;
   a fourth switch group composed of plural switches connected to locations between an inter-data-pointer input terminal of said second data pointer and the first data pointer interconnecting line;
   a fifth switch group composed of plural switches connected to locations between an inter-data-pointer input terminal of said first data pointer and the second data pointer interconnecting line;
   a sixth switch group composed of plural switches connected to locations between an inter-data-pointer input terminal of said first data pointer and the second data pointer interconnecting line; and
   means for bringing, into a connected state, one switch of each of the third to sixth switch groups.

38. A serial access memory of claim 37, wherein the control has an output start control for outputting an output start signal for a switch control signal to any one of the plural flip flops corresponding to the first or second switch group, and switch control signals are sequentially outputted from the flip flops fed with the output start signal.

39. A serial writing method of a serial access memory having:
   (a) a first and second memory cell arrays provided individually with plural memory cell groups for storing data, each of said memory cell groups having a multiplicity of memory cells, a like plural number of word lines corresponding to the respective plural memory cell groups, said word lines being connected with the multiplicity of memory cells in the corresponding memory cell groups, and a like plural number of bit lines which, when any one of the plural word lines has been selected, correspond to and are electrically connected with the multiplicity of memory cells connected with the word line so selected,
   (b) first and second word line address means corresponding to the first and second memory cell arrays, respectively, said first and second word line address means being adapted to select any ones of the plural word lines of the corresponding memory cell arrays,
   (c) first and second data register means corresponding to the first and second memory cell arrays, respectively, each of said first and second data register means having a like plural number of latches which correspond to the plural bit lines, respectively, and are adapted to hold data to or from the corresponding bit lines,
   (d) a data line for transferring data to or from the latches,
   (e) first and second switching means corresponding to the first and second memory cell arrays, respectively, each of said first and second switching means having a like plural number of switches which correspond to the plural latches, respectively, and are adapted to electrically connect or disconnect the data line with the corresponding latches, and
   (f) a control for sequentially bringing plural switches, which belong to a desired first switch group out of the plural switches of said first switching means, and plural switches, which belong to a desired second switch group out of the plural switches of said switching means, into a connected state for a predetermined period of time, which comprises the following steps:
   (g) before serial-writing data in selected memory cell groups in the first memory cell array, holding data, which are stored in the selected memory cell groups, in the plural latches corresponding to the first data register means;
   (h) after the step (g), sequentially maintaining the plural switches, which belong to the first switch group, in a connected state for a predetermined period of time to sequentially hold the data from the data line in the plural latches corresponding to the first switch group; and
   (i) after the step (h), storing the data, which are held in the plural latches of the first data register, in the memory cells corresponding to the selected memory cell groups, respectively.

40. A serial writing method of claim 39, which comprises the following steps:
   (j) in the period that the step (h) is performed, holding the data, which are stored in the selected memory cell groups of the second memory cell array, in the corresponding plural latches of the second data register means;
   (k) in the period that the step (i) is performed, sequentially maintaining the plural switches, which belong to the second switch group, in a connected state for a predetermined period of time to sequentially hold the data from the data line in the plural latches corresponding to the second switch group; and
   (l) after the step (k), storing the data, which are held in the plural latches of the second data register, in the memory cells corresponding to the selected memory cell groups, respectively.

41. A serial access memory comprising:
   (a) a first and second memory cell arrays provided individually with plural memory cell groups each of which has a multiplicity of memory cells, a like plural number of word lines corresponding to the respective plural memory cell groups, said word lines being connected with the multiplicity of memory cells in the corresponding memory cell groups, and a like plural number of bit lines which, when any one of the plural word lines has been selected, correspond to and are electrically connected with the multiplicity of memory cells connected with the word line so selected;
   (b) first and second word line address means corresponding to the first and second memory cell arrays, respectively, said first and second word line address means being adapted to select any ones of the plural word lines of the corresponding memory cell arrays;

(c) first and second data register means corresponding to the first and second memory cell arrays, respectively, each of said first and second data register means having a like plural number of latches which correspond to the plural bit lines, respectively, and are adapted to hold data to or from the corresponding bit lines;

(d) a data line for transferring data to or from the latches;

(e) first and second switching means corresponding to the first and second memory cell arrays, respectively, each of said first and second switching means having a like plural number of switches which correspond to the plural latches, respectively, and are adapted to electrically connect or disconnect the data line with the corresponding latches;

(f) a first control for sequentially bringing plural switches, which belong to a desired first switch group out of the plural switches of said first switching means, and plural switches, which belong to a desired second switch group out of the plural switches of said switching means, into a connected state for a predetermined period of time.

(g) third switching means having plural switches adapted to establish an electrically connected or disconnected state between the plural latches of said first data register means and the corresponding bit lines of the first memory cell array;

(h) fourth switching means having plural switches adapted to establish an electrically connected or disconnected state between the plural latches of said second data register means and the corresponding plural bit lines of the second memory cell array;

(i) a second control for maintaining switches of the plural switches of said third switching means, said former switches corresponding to the latches to which data are transferred via the first switch groups, in a connected state and the remaining switches in a disconnected state while data are transferred from the plural latches of the first data register means to the corresponding plural bit lines of the first memory cell array; and (j) a third control for maintaining switches of the plural switches of said fourth switching means, said former switches corresponding to the latches to which data are transferred via the second switch groups, in a connected state and the remaining switches in a disconnected state while data are transferred from the plural latches of the second data register means to the corresponding plural bit lines of the second memory cell array.

42. A serial access memory of claim 41, wherein said controls comprise:

first and second data pointer means composed individually of plural master-slave flip-flops corresponding to the plural switches of said first and second switching means and connected in series, each of said flip-flops being composed of a master portion, which has a switch control signal output terminal and a data pointer interconnecting input terminal, and a slave portion having a data pointer interconnecting output terminal;

a first data pointer interconnecting line connecting the data pointer interconnecting output terminal of the final-stage flip-flop of the flip-flops, which correspond to the first switch group of said first data pointer means, with the data pointer interconnecting input terminal of the first-stage flip-flop of flip-flops corresponding to the second switch group of said second data pointer means; and a second data pointer interconnecting line connecting the data pointer interconnecting output terminal of the final-stage flip-flops, which correspond to the second switch group of said second data pointer means, with the data pointer interconnecting input terminal of the first-stage flip-flop of the flip-flops corresponding to the first switch group of said first data pointer means.

43. A serial access memory of claim 42, wherein the controls have an output start control for outputting an output start signal for a switch group control signal to any one of the plural flip-flops corresponding to the first or second switch group and switch control signals are sequentially outputted from flip-flops fed with the output start signal.

44. A serial access memory of claim 41, wherein the control comprises:

first and second data pointer means composed individually of plural master-slave flip-flops corresponding to the respective plural switches of said first and second switching means and connected together in series, each of said plural master-slave flip-flops being composed of a master portion, which has a switch control signal output terminal and a data pointer interconnecting input terminal, and a slave portion having a data pointer interconnecting output terminal;

a first data pointer interconnecting line;

a second data pointer interconnecting line;

fifth switching means composed of plural switches connected to locations between an inter-data-pointer output terminal of said first data pointer and the first data pointer interconnecting line;

sixth switching means composed of plural switches connected to locations between an inter-data-pointer input terminal of said second data pointer and the first data pointer interconnecting line;

seventh switching means composed of plural switches connected to locations between an inter-data-pointer input terminal of said first data pointer and the second data pointer interconnecting line;

eighth switching means composed of plural switches connected to locations between an inter-data-pointer input terminal of said first data pointer and the second data pointer interconnecting line; and means for bringing, into a connected state, one switch of each of the fifth to eighth switching means.

45. A serial access memory of claim 44, wherein the control has an output start control for outputting an output start signal for a switch control signal to any one of the plural flip flops corresponding to the first or second switch group, and switch control signals are sequentially outputted from the flip flops fed with the output start signal.

* * * * *